(12) United States Patent
Kaneko et al.

(10) Patent No.: US 11,939,459 B2
(45) Date of Patent: Mar. 26, 2024

(54) PHOTOSENSITIVE RESIN COMPOSITION, METHOD FOR PRODUCING CURED PRODUCT OF FLUORORESIN, FLUORORESIN, FLUORORESIN FILM, BANK AND DISPLAY ELEMENT

(71) Applicant: CENTRAL GLASS COMPANY, LIMITED, Ube (JP)

(72) Inventors: Yuzuru Kaneko, Saitama (JP); Satoru Miyazawa, Saitama (JP); Keiko Sasaki, Saitama (JP); Asuka Sano, Saitama (JP); Yusuke Nomura, Saitama (JP)

(73) Assignee: Central Glass Company, Limited, Yamaguchi (JP)

( * ) Notice: Subject to any disclaimer, the term of this patent is extended or adjusted under 35 U.S.C. 154(b) by 477 days.

(21) Appl. No.: 17/296,459

(22) PCT Filed: Nov. 18, 2019

(86) PCT No.: PCT/JP2019/045009
§ 371 (c)(1),
(2) Date: May 24, 2021

(87) PCT Pub. No.: WO2020/110793
PCT Pub. Date: Jun. 4, 2020

(65) Prior Publication Data
US 2023/0027085 A1    Jan. 26, 2023

(30) Foreign Application Priority Data

Nov. 26, 2018 (JP) ................... 2018-219938
Dec. 5, 2018 (JP) ................... 2018-227767
Sep. 20, 2019 (JP) ................... 2019-172138

(51) Int. Cl.
*C08L 27/12*    (2006.01)
*C08F 2/50*    (2006.01)
*C08F 2/54*    (2006.01)
*C08F 14/18*    (2006.01)

(52) U.S. Cl.
CPC ............ *C08L 27/12* (2013.01); *C08F 2/50* (2013.01); *C08F 2/54* (2013.01); *C08F 14/18* (2013.01)

(58) Field of Classification Search
CPC ........ C08F 236/16; C08F 220/22; C08F 8/00; C08F 220/20; C08F 212/24; C08F 14/18; C08L 27/12
See application file for complete search history.

(56) References Cited

U.S. PATENT DOCUMENTS

2016/0334707 A1* 11/2016 Nagai ................ G03F 7/038

FOREIGN PATENT DOCUMENTS

| CN | 105238197 | 1/2016 |
|---|---|---|
| EP | 1 873 174 | 1/2008 |
| JP | 2000-247914 | 9/2000 |
| JP | 2012-108499 | 6/2012 |
| JP | 2015-172742 | 10/2015 |
| JP | 2016-142753 | 8/2016 |
| JP | 2018-158966 | 10/2018 |
| TW | 200922949 | 6/2009 |
| TW | 201140237 | 11/2011 |
| TW | 201421155 | 6/2014 |
| WO | 2006/114958 | 11/2006 |
| WO | 2018/043165 | 3/2018 |

* cited by examiner

*Primary Examiner* — Mark S Kaucher
(74) *Attorney, Agent, or Firm* — Hamre, Schumann, Mueller & Larson, P.C.

(57) ABSTRACT

An object of the present invention is to provide a photosensitive resin composition having good liquid repellency. The photosensitive resin composition of the present invention at least contains a fluororesin having a crosslinking site, a solvent, and a photopolymerization initiator, and the fluororesin contains a repeating unit derived from a hydrocarbon having a fluorine atom.

12 Claims, No Drawings

PHOTOSENSITIVE RESIN COMPOSITION, METHOD FOR PRODUCING CURED PRODUCT OF FLUORORESIN, FLUORORESIN, FLUORORESIN FILM, BANK AND DISPLAY ELEMENT

TECHNICAL FIELD

The present disclosure relates to a photosensitive resin composition and a method of producing a fluororesin cured product.

BACKGROUND ART

An inkjet method is known as a method of forming organic layers having a light emitting function and the like in the production of display elements such as organic EL displays, micro-LED displays, and quantum dot displays. There are several methods for the inkjet method. Specific methods include one in which ink dropped from a nozzle into recesses of a patterned film having recesses and protrusions formed on a substrate is solidified; and one in which a patterned film is formed on a substrate in advance to provide a liquid-affinity portion having wettability with ink and a liquid-repellant portion having repellency to ink, and ink droplets are dropped onto the patterned film, whereby the ink is attached only to the liquid-affinity portion.

Specifically, in the former method in which ink dropped from a nozzle into recesses of a patterned film is solidified, mainly two methods are applicable to produce such a patterned film having recesses and protrusions. One is photolithography in which a surface of a photosensitive resist film applied to a substrate is exposed to light in a pattern form to form exposed portions and non-exposed portions, and either exposed portions or non-exposed portions are dissolved in a developer and removed; and the other is imprinting that uses a printing technique. Generally, after a patterned film having recesses and protrusions is formed, the entire substrate is subjected to UV-ozone treatment or oxygen plasma treatment. With the UV-ozone treatment or oxygen plasma treatment, particularly, residual organic matter in the recesses of the patterned film can be removed, and uneven wetting of the dropped ink is reduced. This can prevent defects in display elements.

The protrusions of the patterned film having recesses and protrusions formed thereon are called banks (partition walls). The banks function as partition walls that prevent ink mixing when ink is dropped into the recesses of the patterned film. To enhance the effect of the partition walls, the substrate surface exposed at the recesses of the patterned film is required to have affinity for ink, and upper surfaces of the banks are required to have liquid repellency.

Patent Literature 1 discloses a photosensitive resin composition containing a vinyl polymer including a side chain having an epoxy group.

Patent Literature 2 discloses a fluorine polymer containing a repeating unit having a fluorine atom on the main chain, which can be thermally cured at low temperatures (room temperature to 150° C.).

In addition, known examples of compositions for forming banks for organic EL include compositions containing, as an ink repellent, a fluorine polymer having an acrylic structure on the main chain (e.g., Patent Literatures 2 and 3).

CITATION LIST

Patent Literature

Patent Literature 1: JP 2016-142753 A
Patent Literature 2: WO 2018/43165
Patent Literature 3: JP 2015-172742 A
Patent Literature 4: JP 2012-108499 A

SUMMARY OF INVENTION

Technical Problem

Resin cured products obtained using the resin compositions described in Patent Literatures 1 and 2 do not have sufficient liquid repellency and are hardly usable in applications that require liquid repellency.

The present disclosure aims to provide a photosensitive resin composition having good liquid repellency.

Solution to Problem

The present inventors conducted extensive studies on the above problems. As a result, they found that the above problems can be solved by a photosensitive resin composition at least containing a fluororesin having a crosslinking site, a solvent, and a photopolymerization initiator, wherein the fluororesin contains a repeating unit derived from a hydrocarbon having a fluorine atom.

A fluororesin cured product obtained by curing the photosensitive resin composition of the present disclosure also has excellent liquid repellency. Thus, when the photosensitive resin composition of the present disclosure is used to form banks for displays such as organic EL displays, micro-LED displays, and quantum dot displays, the banks show excellent ink repellency.

Specifically, the present disclosure is as follows.
[Invention 1]
A photosensitive resin composition at least containing a fluororesin having a crosslinking site; a solvent; and a photopolymerization initiator,
wherein the fluororesin contains a repeating unit derived from a hydrocarbon having a fluorine atom.
[Invention 2]
The photosensitive resin composition according to Invention 1, wherein the repeating unit derived from a hydrocarbon having a fluorine atom has a structure represented by the following formula (1-1):

[Chem. 1]

$$-CR^{1-2}=CRf_2 \qquad (1\text{-}1)$$

wherein each Rf independently represents a C1-C6 linear, C3-C6 branched, or C3-C6 cyclic perfluoroalkyl group or a fluorine atom; and $R^{1-2}$ represents a hydrogen atom or a C1-C6 linear, C3-C6 branched, or C3-C6 cyclic alkyl group.
[Invention 3]
The photosensitive resin composition according to Invention 1 or 2, wherein the repeating unit derived from a hydrocarbon having a fluorine atom has a structure represented by the following formula (1-2):

[Chem. 2]

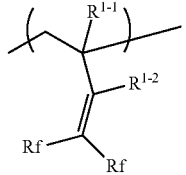

(1-2)

wherein each Rf independently represents a C1-C6 linear, C3-C6 branched, or C3-C6 cyclic perfluoroalkyl group or a fluorine atom; $R^{1-1}$ represents a hydrogen atom, a fluorine atom, or a methyl group; and $R^{1-2}$ represents a hydrogen atom or a C1-C6 linear, C3-C6 branched, or C3-C6 cyclic alkyl group.

[Invention 4]

The photosensitive resin composition according to Invention 2 or 3, wherein Rf in the formula (1-1) or (1-2) is a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, a hexafluoroisopropyl group, a heptafluoroisopropyl group, an n-nonafluorobutyl group, an isononafluorobutyl group, or a tert-nonafluorobutyl group.

[Invention 5]

The photosensitive resin composition according to any one of Inventions 1 to 4, wherein the fluororesin has a fluorine content of 20 to 50 mass %.

[Invention 6]

The photosensitive resin composition according to any one of Inventions 1 to 5, further containing a crosslinking agent.

[Invention 7]

The photosensitive resin composition according to any one of Inventions 1 to 6, further containing an alkali-soluble resin.

[Invention 8]

The photosensitive resin composition according to any one of Inventions 1 to 7, which is cured at a temperature of 140° C. or lower.

[Invention 9]

A method of producing a fluororesin cured product, including:
a baking step of baking the photosensitive resin composition according to any one of Inventions 1 to 8 at a temperature of 140° C. or lower for curing.

[Invention 10]

The method of producing a fluororesin cured product according to Invention 9, wherein in the baking step, the photosensitive resin composition is baked at 60° C. to 130° C.

[Invention 11]

The method of producing a fluororesin cured product according to Invention 9 or 10, wherein the method includes an exposing step of exposing the photosensitive resin composition to high energy rays before the baking step.

[Invention 12]

The method of producing a fluororesin cured product according to Invention 11, wherein the high energy rays are at least one type of rays selected from the group consisting of ultraviolet rays, gamma rays, X-rays, and α-rays.

[Invention 13]

A method of producing a fluororesin cured product, including:
a film forming step of applying the photosensitive resin composition according to any one of Inventions 1 to 8 to a substrate and heating the photosensitive resin composition to form a fluororesin film;
an exposing step of exposing the fluororesin film to high energy rays;
a developing step of developing the fluororesin film after the exposing step in an alkaline aqueous solution to form a patterned fluororesin film; and
a baking step of baking the patterned fluororesin film at a temperature of 140° C. or lower for curing after the developing step to obtain a fluororesin cured product.

[Invention 14]

A fluororesin containing a repeating unit represented by a formula (2-1) and a repeating unit represented by a formula (2-2):

[Chem. 3]

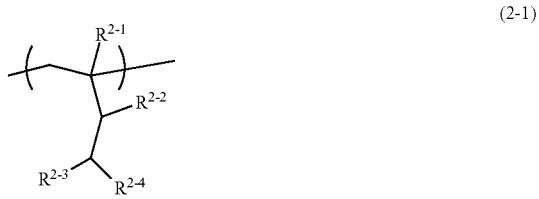

(2-1)

wherein $R^{2-1}$ represents a hydrogen atom, a fluorine atom, or a methyl group; $R^{2-2}$ represents a hydrogen atom or a C1-C6 linear, C3-C6 branched, or C3-C6 cyclic alkyl group; $R^{2-3}$ and $R^{2-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{2-1}$, $R^{2-3}$, and $R^{2-4}$ are fluorine atoms or the fluoroalkyl groups,

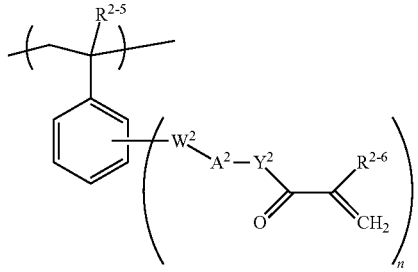

(2-2)

wherein $R^{2-5}$ and $R^{2-6}$ each independently represent a hydrogen atom or a methyl group; $W^2$ is a divalent linking group and represents —O—, —O—C(=O)—, —C(=O)—O—, —O—C(=O)—NH—, —C(=O)—O—C(=O)—NH—, or —C(=O)—NH—; $A^2$ is a divalent linking group and represents a C1-C10 linear, C3-C10 branched, or C3-C10 cyclic alkylene group in which one or more hydrogen atoms in the alkylene group may be substituted by hydroxy groups or —O—C(=O)—CH$_3$; $Y^2$ is a divalent linking group and represents —O— or —NH—; and n represents an integer of 1 to 3.

[Invention 15]

The fluororesin according to Invention 14, wherein $R^{2-3}$ and $R^{2-4}$ each independently represent a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, or a hexafluoroisopropyl group.

[Invention 16]

The fluororesin according to Invention 14 or 15, further containing a repeating unit represented by a formula (2-3):

[Chem. 4]

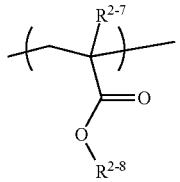

(2-3)

wherein $R^{2-7}$ represents a hydrogen atom or a methyl group; $R^{2-8}$ represents a C1-C15 linear, C3-C15 branched, or C3-C15 cyclic alkyl group in which one or more hydrogen atoms in the alkyl group are substituted by fluorine atoms; and the repeating unit has a fluorine content of 30 mass % or more.

[Invention 17]

The fluororesin according to any one of Inventions 14 to 16, further containing a repeating unit represented by a formula (2-4):

[Chem. 5]

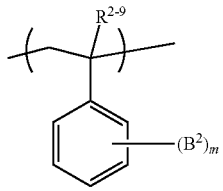

(2-4)

wherein $R^{2-9}$ represents a hydrogen atom or a methyl group; each $B^2$ independently represents a hydroxy group, a carboxy group, —C(=O)—O—$R^{2-10}$ wherein $R^{2-10}$ represents a C1-C15 linear, C3-C15 branched, or C3-C15 cyclic alkyl group in which one or more hydrogen atoms in the alkyl group are substituted by fluorine atoms, and $R^{2-10}$ has a fluorine content of 30 mass % or more, or —O—C(=O)—$R^{2-11}$ wherein $R^{2-11}$ represents a C1-C6 linear, C3-C6 branched, or C3-C6 cyclic alkyl group; and m represents an integer of 0 to 3.

[Invention 18]

A photosensitive resin composition at least containing the fluororesin according to any one of Inventions 14 to 17; a solvent; and a photopolymerization initiator.

[Invention 19]

The photosensitive resin composition according to Invention 18, wherein the solvent is at least one selected from the group consisting of methyl ethyl ketone, cyclohexanone, methyl isoamyl ketone, 2-heptanone, ethylene glycol, ethylene glycol dimethyl ether, ethylene glycol monoacetate, diethylene glycol, diethylene glycol monoacetate, diethylene glycol dimethyl ether, propylene glycol, propylene glycol monoacetate, propylene glycol monomethyl ether (PGME), propylene glycol monomethyl ether acetate (PGMEA), dipropylene glycol, dipropylene glycol monoacetate monomethyl ether, dipropylene glycol monoacetate monoethyl ether, dipropylene glycol monoacetate monopropyl ether, dipropylene glycol monoacetate monobutyl ether, dipropylene glycol monoacetate monophenyl ether, 1,4-dioxane, methyl lactate, ethyl lactate, methyl acetate, ethyl acetate, butyl acetate, methyl methoxypropionate, ethyl ethoxypropionate, γ-butyrolactone, and hexafluoroisopropyl alcohol.

[Invention 20]

The photosensitive resin composition according to Invention 18 or 19, further containing a crosslinking agent and an alkali-soluble resin.

[Invention 21]

A fluororesin film containing a repeating unit represented by a formula (2-1) and a repeating unit represented by a formula (2-2A):

[Chem. 6]

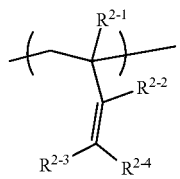

(2-1)

wherein $R^{2-1}$ represents a hydrogen atom, a fluorine atom, or a methyl group; $R^{2-2}$ represents a hydrogen atom or a C1-C6 linear, C3-C6 branched, or C3-C6 cyclic alkyl group; $R^{2-3}$ and $R^{2-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{2-1}$, $R^{2-3}$, and $R^{2-4}$ are fluorine atoms or the fluoroalkyl groups, (2-2A)

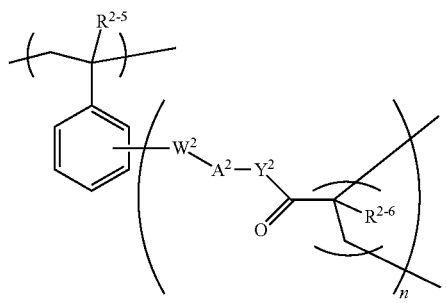

wherein $R^{2-5}$ and $R^{2-6}$ each independently represent a hydrogen atom or a methyl group; $W^2$ is a divalent linking group and represents —O—, —O—C(=O)—, —C(=O)—O—, —O—C(=O)—NH—, —C(=O)—O—C(=O)—NH—, or —C(=O)—NH—; $A^2$ is a divalent linking group and represents a C1-C10 linear, C3-C10 branched, or C3-C10 cyclic alkylene group in which one or more hydrogen atoms in the alkylene group may be substituted by hydroxy groups or —O—C(=O)—$CH_3$; $Y^2$ is a divalent linking group and represents —O— or —NH—; and n represents an integer of 1 to 3.

[Invention 22]

A bank containing a repeating unit represented by a formula (2-1) and a repeating unit represented by a formula (2-2A):

[Chem. 7]

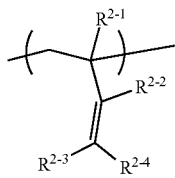

(2-1)

wherein $R^{2-1}$ represents a hydrogen atom, a fluorine atom, or a methyl group; $R^{2-2}$ represents a hydrogen atom or a C1-C6 linear, C3-C6 branched, or C3-C6 cyclic alkyl group; $R^{2-3}$ and $R^{2-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{2-1}$, $R^{2-3}$, and $R^{2-4}$ are fluorine atoms or the fluoroalkyl groups, (2-2A)

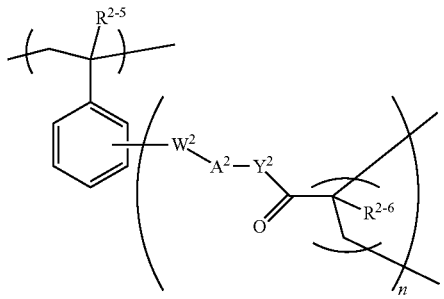

wherein $R^{2-5}$ and $R^{2-6}$ each independently represent a hydrogen atom or a methyl group; $W^2$ is a divalent linking group and represents —O—, —O—C(=O)—, —C(=O)—O—, —O—C(=O)—NH—, —C(=O)—O—C(=O)—NH—, or —C(=O)—NH—; $A^2$ is a divalent linking group and represents a C1-C10 linear, C3-C10 branched, or C3-C10 cyclic alkylene group in which one or more hydrogen atoms in the alkylene group may be substituted by hydroxy groups or —O—C(=O)—CH$_3$; $Y^2$ is a divalent linking group and represents —O— or —NH—; and n represents an integer of 1 to 3.

[Invention 23]

A display element including the bank according to Invention 22.

[Invention 24]

A fluororesin containing a repeating unit represented by a formula (3-1) and a repeating unit represented by a formula (3-2)

[Chem. 8]

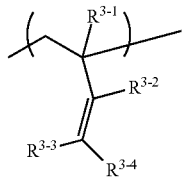

(3-1)

wherein $R^{3-1}$ represents a hydrogen atom, a fluorine atom, or a methyl group; $R^{3-2}$ represents a hydrogen atom or a C1-C6 linear, C3-C6 branched, or C3-C6 cyclic alkyl group; $R^{3-3}$ and $R^{3-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{3-1}$, $R^{3-3}$, and $R^{3-4}$ are fluorine atoms or the fluoroalkyl groups,

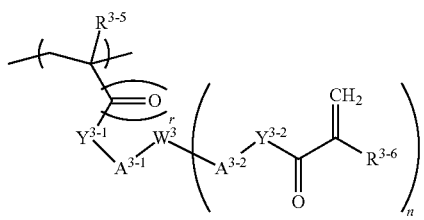

(3-2)

wherein $R^{3-5}$ and $R^{3-6}$ each independently represent a hydrogen atom or a methyl group; $W^3$ is a divalent linking group and represents —O—, —O—C(=O)—, —C(=O)—O—, —O—C(=O)—NH—, —C(=O)—O—C(=O)—NH—, or —C(=O)—NH—; $A^{3-1}$ and $A^{3-2}$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—CH$_3$; $Y^{3-1}$ and $Y^{3-2}$ are divalent linking groups and each independently represent —O— or —NH—; n represents an integer of 1 to 3; and r represents 0 or 1.

[Invention 25]

The fluororesin according to Invention 24, wherein $R^{3-3}$ and $R^{3-4}$ each independently represent a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, or a hexafluoroisopropyl group.

[Invention 26]

The fluororesin according to Invention 24 or 25, further containing a repeating unit represented by a formula (3-3):

[Chem. 9]

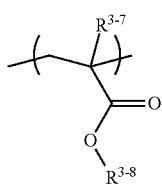

(3-3)

wherein $R^{3-7}$ represents a hydrogen atom or a methyl group; $R^{3-8}$ represents a C1-C15 linear, C3-C15 branched, or C3-C15 cyclic alkyl group in which one or more hydrogen atoms in the alkyl group are substituted by fluorine atoms; and the repeating unit has a fluorine content of 30 mass % or more.

[Invention 27]

The fluororesin according to any one of Inventions 24 to 26, further containing a repeating unit represented by a formula (3-4):

[Chem. 10]

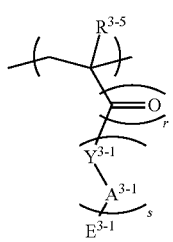

(3-4)

wherein $R^{3-5}$, $Y^{3-1}$, $A^{3-1}$, and r are the same as $R^{3-5}$, $Y^{3-1}$, $A^{3-1}$, and r in the formula (3-2), respectively; $E^{3-1}$ represents a hydroxy group, a carboxy group, or an oxirane group; and s represents 0 or 1.

[Invention 28]

The fluororesin according to any one of inventions 24 to 27, further containing a repeating unit represented by a formula (3-6)

[Chem. 11]

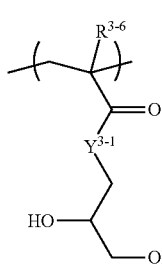

(3-6)

wherein $R^{3-6}$ and $Y^{3-1}$ are the same as $R^{3-6}$ and $Y^{3-1}$ in the formula (3-2), respectively.

[Invention 29]

The fluororesin according to any one of Inventions 24 to 28, further containing a repeating unit represented by a formula (3-5)

[Chem. 12]

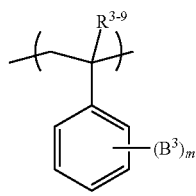

(3-5)

wherein $R^{3-9}$ represents a hydrogen atom or a methyl group; each $B^3$ independently represents a hydroxy group, a carboxy group, —C(=O)—O—$R^{3-10}$ wherein $R^{3-10}$ represents a C1-C15 linear, C3-C15 branched, or C3-C15 cyclic alkyl group in which one or more hydrogen atoms in the alkyl group are substituted by fluorine atoms, and $R^{3-10}$ has a fluorine content of 30 mass % or more, or —O—C(=O)—$R^{3-11}$ wherein $R^{3-11}$ represents a C1-C6 linear, C3-C6 branched, or C3-C6 cyclic alkyl group; and m represents an integer of 0 to 3.

[Invention 30]

A photosensitive resin composition at least containing the fluororesin according to any one of Inventions 24 to 29; a solvent; and a photopolymerization initiator.

[Invention 31]

The photosensitive resin composition according to Invention 30, wherein the solvent is at least one selected from the group consisting of methyl ethyl ketone, cyclohexanone, methyl isoamyl ketone, 2-heptanone, ethylene glycol, ethylene glycol dimethyl ether, ethylene glycol monoacetate, diethylene glycol, diethylene glycol monoacetate, diethylene glycol dimethyl ether, propylene glycol, propylene glycol monoacetate, propylene glycol monomethyl ether (PGME), propylene glycol monomethyl ether acetate (PGMEA), dipropylene glycol, dipropylene glycol monoacetate monomethyl ether, dipropylene glycol monoacetate monoethyl ether, dipropylene glycol monoacetate monopropyl ether, dipropylene glycol monoacetate monobutyl ether, dipropylene glycol monoacetate monophenyl ether, 1,4-dioxane, methyl lactate, ethyl lactate, methyl acetate, ethyl acetate, butyl acetate, methyl methoxypropionate, ethyl ethoxypropionate, γ-butyrolactone, and hexafluoroisopropyl alcohol.

[Invention 32]

The photosensitive resin composition according to Invention 30 or 31, further containing a crosslinking agent and an alkali-soluble resin.

[Invention 33]

A fluororesin film containing a repeating unit represented by a formula (3-1) and a repeating unit represented by a formula (3-2A):

[Chem. 13]

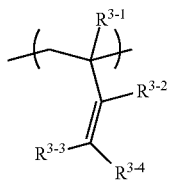

(3-1)

wherein $R^{3-1}$ represents a hydrogen atom, a fluorine atom, or a methyl group; $R^{3-2}$ represents a hydrogen atom or a C1-C6 linear, C3-C6 branched, or C3-C6 cyclic alkyl group; $R^{3-3}$ and $R^{3-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{3-1}$, $R^{3-3}$, and $R^{3-4}$ are fluorine atoms or the fluoroalkyl groups,

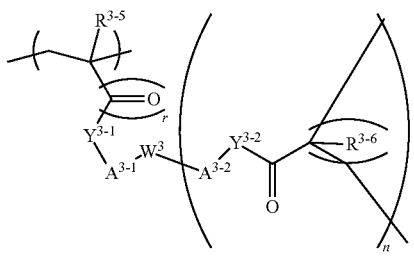

(3-2A)

wherein $R^{3-5}$ and $R^{3-6}$ each independently represent a hydrogen atom or a methyl group; $W^3$ is a divalent linking group and represents —O—, —O—C(=O)—, —C(=O)—O—, —O—C(=O)—NH—, —C(=O)—O—C(=O)—NH—, or —C(=O)—NH—; $A^{3-1}$ and $A^{3-2}$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—$CH_3$; $Y^{3-1}$ and $Y^{3-2}$ are divalent linking groups and each independently represent —O— or —NH—; n represents an integer of 1 to 3; and r represents 0 or 1.

[Invention 34]

A bank containing a repeating unit represented by a formula (3-1) and a repeating unit represented by a formula (3-2A):

[Chem. 14]

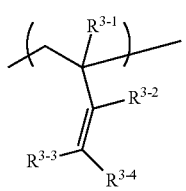

(3-1)

wherein $R^{3-1}$ represents a hydrogen atom, a fluorine atom, or a methyl group; $R^{3-2}$ represents a hydrogen atom or a C1-C6 linear, C3-C6 branched, or C3-C6 cyclic alkyl group; $R^{3-3}$ and $R^{3-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{3-1}$, $R^{3-3}$, and $R^{3-4}$ are fluorine atoms or the fluoroalkyl groups,

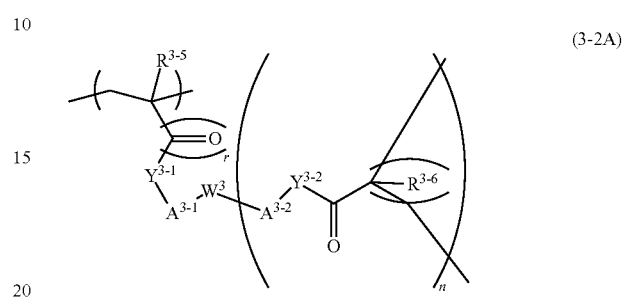

(3-2A)

wherein $R^{3-5}$ and $R^{3-6}$ each independently represent a hydrogen atom or a methyl group; $W^3$ is a divalent linking group and represents —O—, —O—C(=O)—, —C(=O)—O—, —O—C(=O)—NH—, —C(=O)—O—C(=O)—NH—, or —C(=O)—NH—; $A^{3-1}$ and $A^{3-2}$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—$CH_3$; $Y^{3-1}$ and $Y^{3-2}$ are divalent linking groups and each independently represent —O— or —NH—; n represents an integer of 1 to 3; and r represents 0 or 1.

[Invention 35]

A display element including the bank according to Invention 34.

Advantageous Effects of Invention

The present disclosure can provide a photosensitive resin composition having good liquid repellency.

DESCRIPTION OF EMBODIMENTS

The present disclosure is described in detail below. The following description of structural elements provides exemplary embodiments of the present disclosure. The present disclosure is not limited to these specific embodiments. Various modifications can be made within the scope of the gist.

Herein, "[", "]", "<", and ">" in the DESCRIPTION OF EMBODIMENTS are merely symbols and do not mean anything by themselves.

As used herein, the term "polymer" is a synonym to the term "resin", and these terms refer to a high molecular weight compound unless otherwise specified.

Herein, the term "bank" or "banks" is a synonym to the term "partition wall" or "partition walls", and these terms refer to protrusion(s) of a patterned film having recesses and protrusions formed by the inkjet method, unless otherwise specified.

Herein, the expression "upper surfaces of the banks" refers to the upper surfaces (surfaces away from the substrate surface in the vertical direction) of protrusions of a patterned film having recesses and protrusions formed by the inkjet method. The expression does not encompass the wall surfaces of the protrusions.

Herein, the expression "resistance to UV-ozone treatment or oxygen plasma treatment" means that the film loss is small, i.e., the film thickness change is small, before and after UV-ozone treatment or oxygen plasma treatment.

First Embodiment

A photosensitive resin composition according to a first embodiment of the present disclosure at least contains a fluororesin having a crosslinking site, a solvent, and a photopolymerization initiator, wherein the fluororesin contains a repeating unit derived from a hydrocarbon having a fluorine atom.

Such a photosensitive resin composition according to the first embodiment of the present disclosure can be cured at low temperatures, and a cured product of the photosensitive resin composition according to the first embodiment of the present disclosure has good liquid repellency.

The photosensitive resin composition according to the first embodiment of the present disclosure can be cured at low temperatures. Thus, when the photosensitive resin composition according to the first embodiment of the present disclosure is used to form banks for displays such as organic EL displays, micro-LED displays, and quantum dot displays, banks can be formed without causing significant thermal damage on luminescent layers.

The photosensitive resin composition according to the first embodiment of the present disclosure is preferably cured at a temperature of 140° C. or lower, more preferably at a temperature of 60° C. to 130° C.

A fluororesin cured product obtained by curing the photosensitive resin composition according to the first embodiment of the present disclosure also has excellent liquid repellency. Thus, when the photosensitive resin composition according to the first embodiment of the present disclosure is used to form banks for displays such as organic EL displays, micro-LED displays, and quantum dot displays, the banks show excellent ink repellency.

Each constituent of the photosensitive resin composition according to the first embodiment of the present disclosure is described below.

<Fluororesin>

In the photosensitive resin composition according to the first embodiment of the present disclosure, the fluororesin contains a repeating unit derived from a hydrocarbon having a fluorine atom, and the repeating unit preferably has a structure represented by the following formula (1-1), more preferably a structure represented by the following formula (1-2):

[Chem. 15]

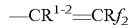

$$—CR^{1-2}=CRf_2 \quad (1\text{-}1)$$

wherein each Rf independently represents a C1-C6 linear, C3-C6 branched, or C3-C6 cyclic perfluoroalkyl group or a fluorine atom; and $R^{1-2}$ represents a hydrogen atom or a C1-C6 linear, C3-C6 branched, or C3-C6 cyclic alkyl group.

[Chem. 16]

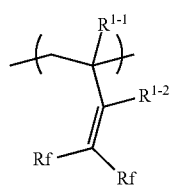

(1-2)

wherein each Rf independently represents a C1-C6 linear, C3-C6 branched, or C3-C6 cyclic perfluoroalkyl group or a fluorine atom; $R^{1-1}$ represents a hydrogen atom, a fluorine atom, or a methyl group; and $R^{1-2}$ represents a hydrogen atom or a C1-C6 linear, C3-C6 branched, or C3-C6 cyclic alkyl group.

In the formula (1-2), preferably, $R^{1-1}$ is a hydrogen atom or a methyl group. Examples of $R^{1-2}$ include a hydrogen atom, a methyl group, an ethyl group, an n-propyl group, an isopropyl group, an n-butyl group, a 1-methylpropyl group, a 2-methylpropyl group, a tert-butyl group, an n-pentyl group, an isopentyl group, a 1,1-dimethylpropyl group, a 1-methylbutyl group, a 1,1-dimethylbutyl group, an n-hexyl group, a cyclopentyl group, and a cyclohexyl group. A hydrogen atom, a methyl group, an ethyl group, an n-propyl group, and an isopropyl group are preferred. A hydrogen atom and a methyl group are more preferred.

Rf in the formula (1-1) or (1-2) is preferably a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, a hexafluoroisopropyl group, a heptafluoroisopropyl group, an n-nonafluorobutyl group, an isononafluorobutyl group, or a tert-nonafluorobutyl group; more preferably a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, or a hexafluoroisopropyl group; particularly preferably a fluorine atom, a difluoromethyl group, or a trifluoromethyl group.

The following are examples of preferred structures of the repeating unit derived from a hydrocarbon having a fluorine atom in the fluororesin of the photosensitive resin composition according to the first embodiment of the present disclosure.

[Chem. 17]

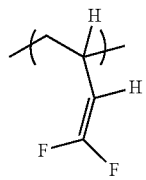 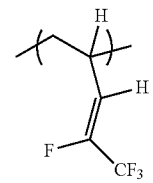

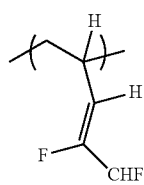 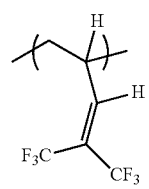

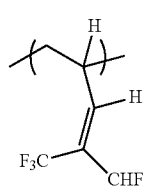 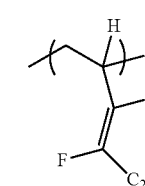

-continued
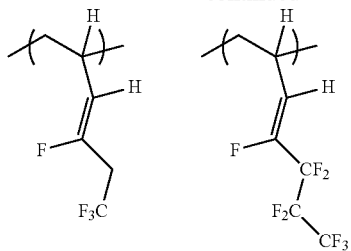
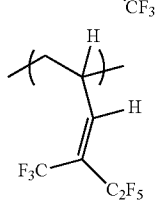
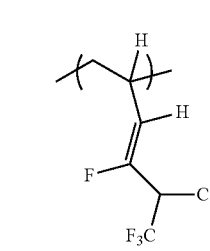
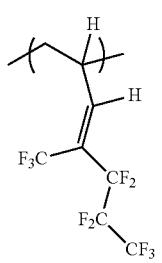
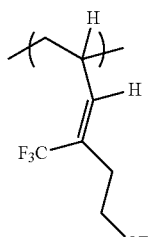
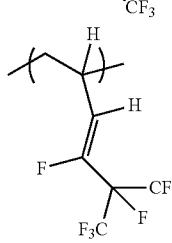
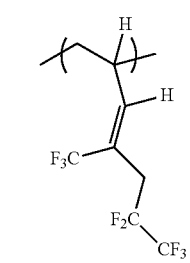
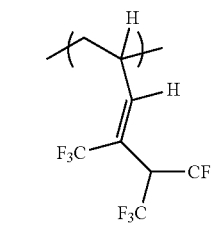
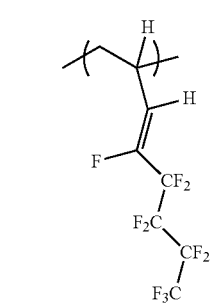
-continued
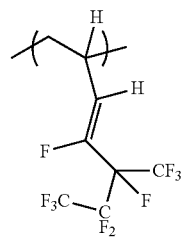
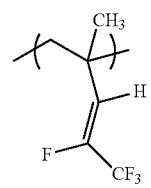
[Chem. 18]
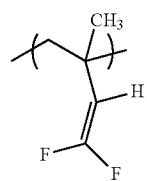
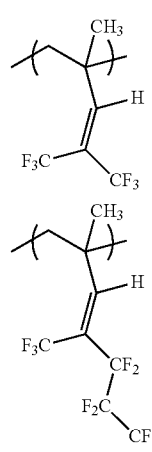
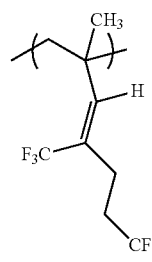
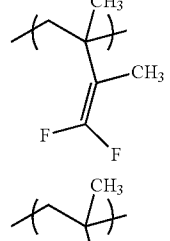
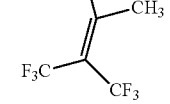
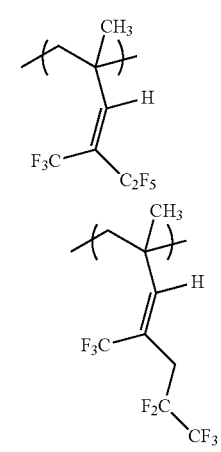
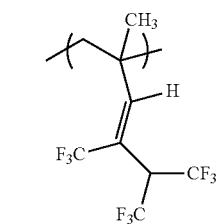
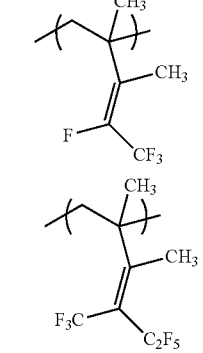

-continued

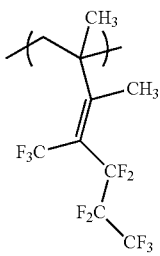
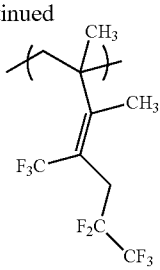

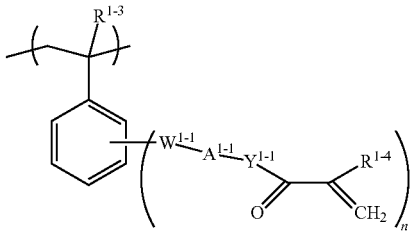

(1-3)

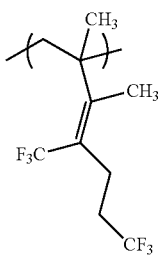
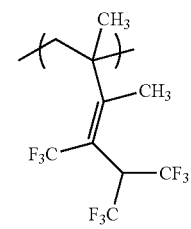

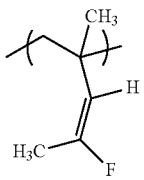
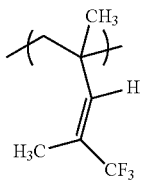

The amount of the repeating unit represented by the formula (1-2) in the fluororesin is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (1-2) is more than 70 mass %, the fluororesin tends to be hardly soluble in solvents. When the amount of the repeating unit represented by the formula (1-2) is less than 5 mass %, the resistance against UV-ozone treatment or oxygen plasma treatment tends to decrease.

Depending on use, for example, a method in which the fluororesin is directly pressed under heat without being dissolved in solvents (i.e., a hot-press method) can be used to form a fluororesin film. In this case, use of the repeating unit represented by the formula (1-2) in an amount of more than 70 mass % does not result in either poor resistance of the whole fluororesin to UV-ozone treatment or oxygen plasma treatment, or poor ink repellency after UV-ozone treatment or oxygen plasma treatment, and such use is thus not avoided in the present disclosure.

In the photosensitive resin composition according to the first embodiment of the present disclosure, the fluororesin may include a structure represented by the following formula (1-3).

[Chem. 19]

In the formula (1-3), $R^{1-3}$ and $R^{1-4}$ each independently represent a hydrogen atom or a methyl group.

In the formula (1-3), $W^{1-1}$ is a divalent linking group and represents —O—, —O—C(=O)—, —C(=O)—O—, —O—C(=O)—NH—, —C(=O)—O—C(=O)—NH—, or —C(=O)—NH—. Preferred of these are —O—C(=O)—NH—, —C(=O)—O—C(=O)—NH—, and —C(=O)—NH—.

The fluororesin in which $W^{1-1}$ is —O—C(=O)—NH— has better ink repellency after UV-ozone treatment or oxygen plasma treatment, and is thus one particularly preferred embodiment.

In the formula (1-3), $A^{1-1}$ is a divalent linking group and represents a C1-C10 linear, C3-C10 branched, or C3-C10 cyclic alkylene group in which one or more hydrogen atoms in the alkylene group may be substituted by hydroxy groups or —O—C(=O)—CH₃.

When the divalent linking group $A^{1-1}$ is a C1-C10 linear alkylene group, examples thereof include a methylene group, an ethylene group, a propylene group, an n-butylene group, an n-pentylene group, an n-hexalene group, an n-heptalene group, an n-octalene group, an n-nonalene group, and an n-decalene group.

When the divalent linking group $A^{1-1}$ is a C3-C10 branched alkylene group, examples thereof include an isopropylene group, an isobutylene group, a sec-butylene group, a tert-butylene group, an isopentalene group, and an isohexalen group.

When the divalent linking group $A^{1-1}$ is a C3-C10 cyclic alkylene group, examples thereof include two-substituted cyclopropane, two-substituted cyclobutane, two-substituted cyclopentane, two-substituted cyclohexane, two-substituted cycloheptane, two-substituted cyclooctane, two-substituted cyclodecane, and two-substituted 4-tert-butylcyclohexane.

When one or more hydrogen atoms in these alkylene groups are substituted by hydroxy groups, examples of these hydroxy group-substituted alkylene groups include a hydroxyethylene group, a 1-hydroxy-n-propylene group, a 2-hydroxy-n-propylene group, a hydroxy-isopropylene group (—CH(CH₂OH)CH₂—), a 1-hydroxy-n-butylene group, a 2-hydroxy-n-butylene group, a hydroxy-sec-butylene group (—CH(CH₂OH)CH₂CH₂—), a hydroxy-isobutylene group (—CH₂CH(CH₂OH)CH₂—), and a hydroxy-tert-butylene group (—C(CH₂OH)(CH₃)CH₂—).

When one or more hydrogen atoms in these alkylene groups are substituted by —O—C(=O)—CH₃, examples of these substituted-alkylene groups include those in which hydroxy groups of the hydroxy group-substituted alkylene groups exemplified above are substituted by —O—C(=O)—CH₃.

The divalent linking group $A^{1-1}$ is preferably a methylene group, an ethylene group, a propylene group, an n-butylene group, an isobutylene group, a sec-butylene group, a cyclohexyl group, a 2-hydroxy-n-propylene group, a hydroxy-isopropylene group (—CH(CH₂OH)CH₂—), a 2-hydroxyn-butylene group, or a hydroxy-sec-butylene group (—CH(CH$_2$OH)CH$_2$CH$_2$—); more preferably an ethylene group, a propylene group, a 2-hydroxy-n-propylene group, or a hydroxy-isopropylene group (—CH(CH$_2$OH)CH$_2$—); particularly preferably an ethylene group or a 2-hydroxy-n-propylene group.

In the formula (1-3), $Y^{1-1}$ is a divalent linking group and represents —O— or —NH—, with —O— being more preferred.

In the formula (1-3), n represents an integer of 1 to 3, with n of 1 being particularly preferred.

The substituents are each independently in the ortho, meta, or para position of the aromatic ring, with the para position being preferred.

The following are examples of preferred structures of the repeating unit represented by the formula (1-3). In the examples, the substituent position in the aromatic ring is the para position. Yet, the substituents may be each independently in the ortho or meta position.

[Chem. 20]

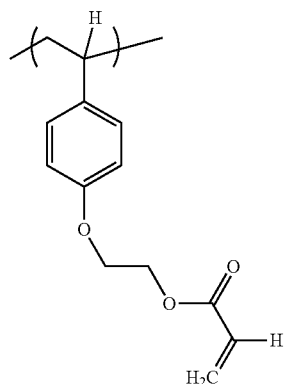

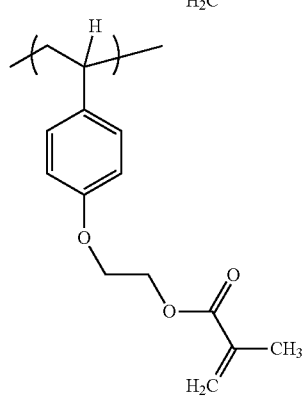

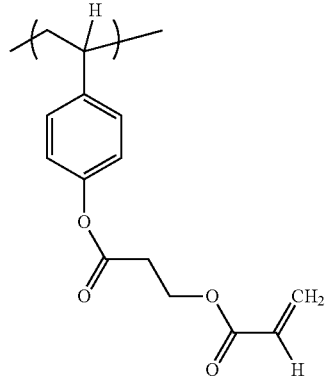

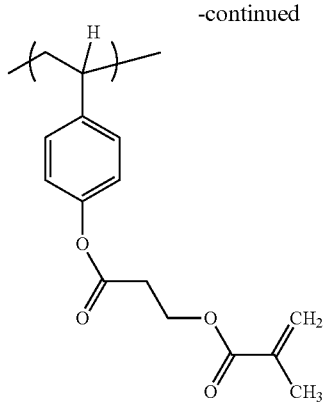

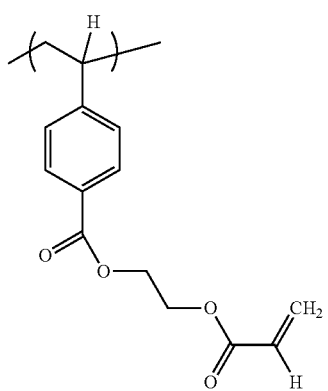

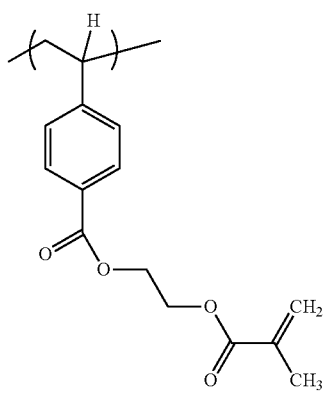

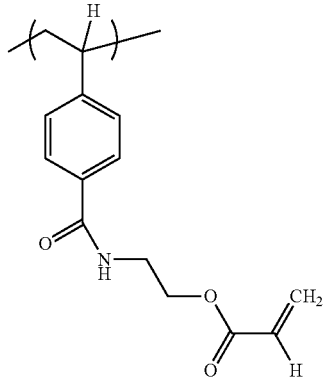

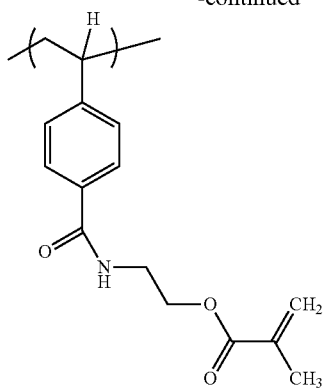
[Chem. 21]
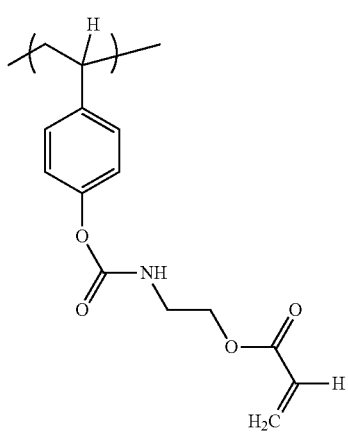
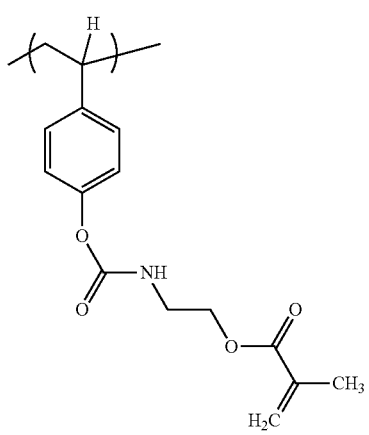
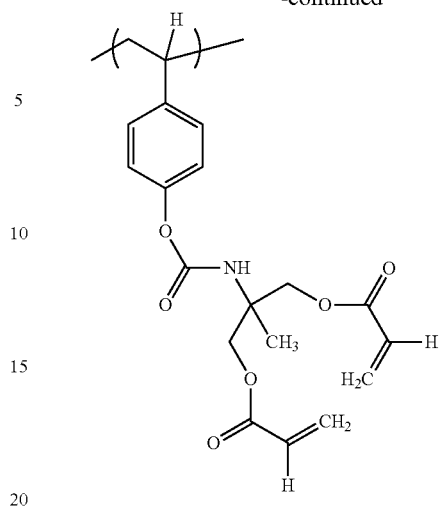
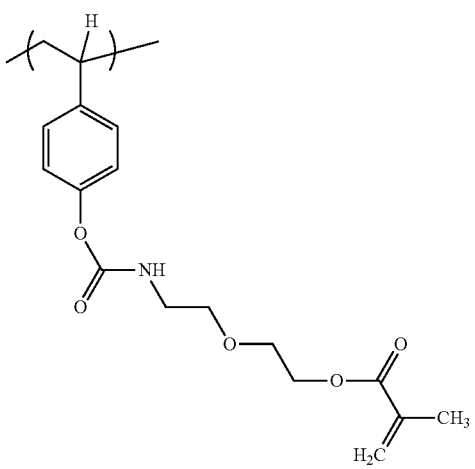
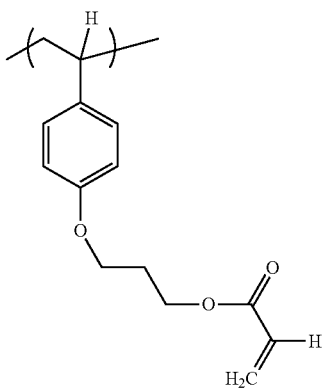

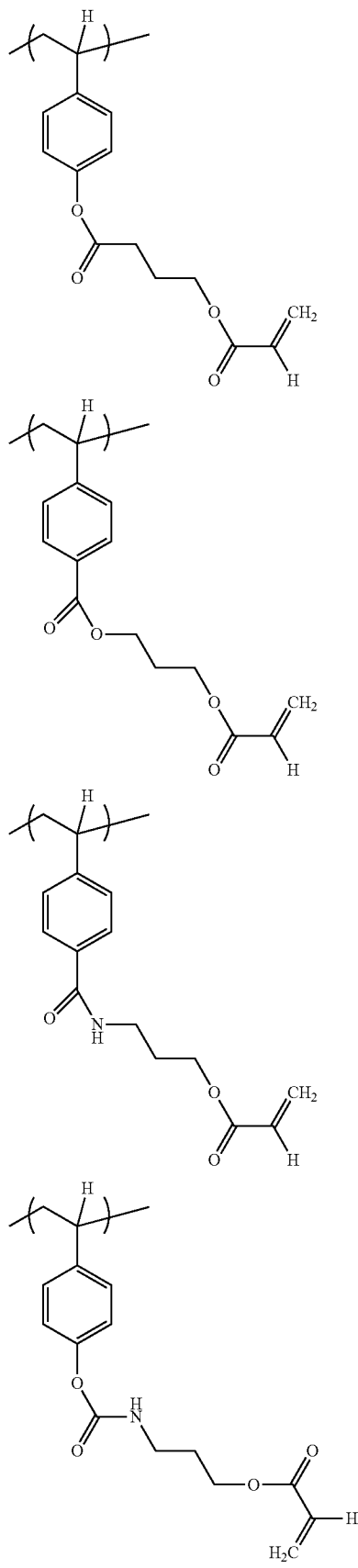
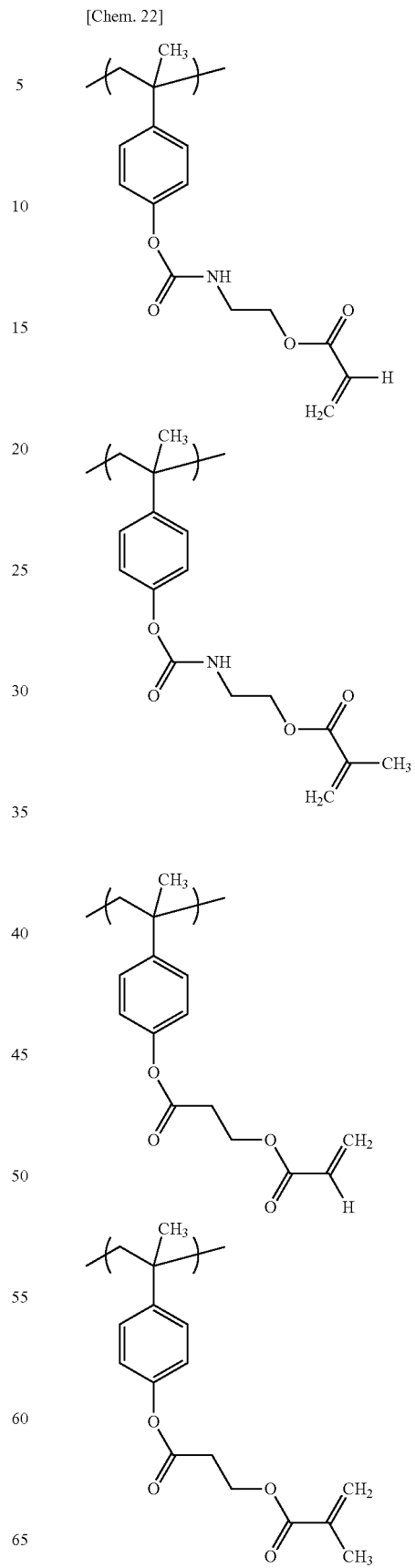

25
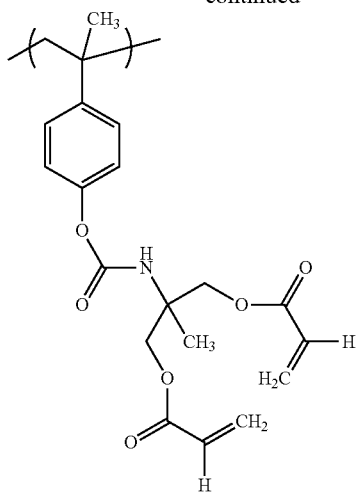
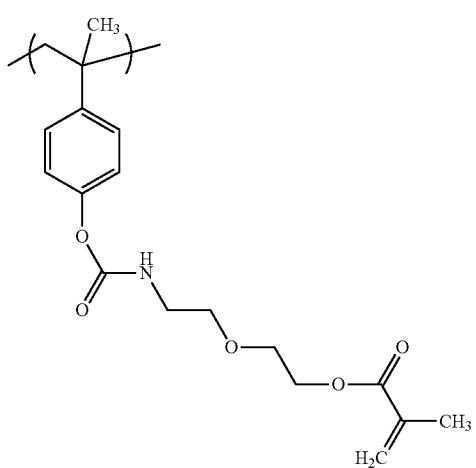
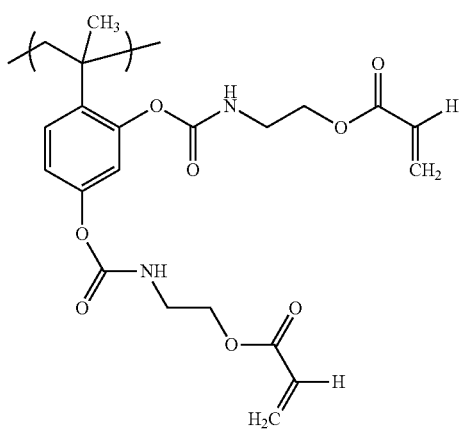
26
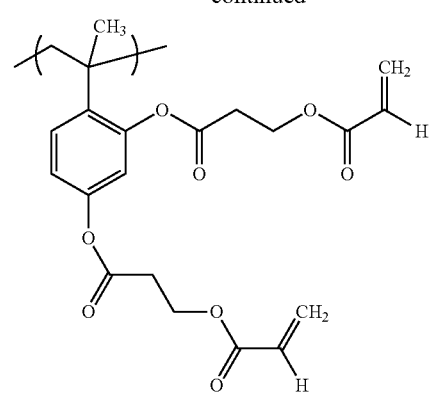
[Chem. 23]
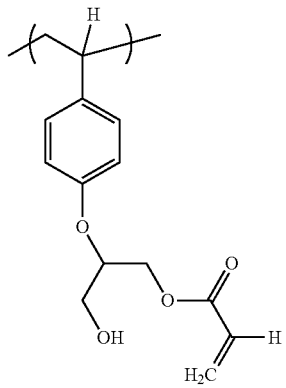
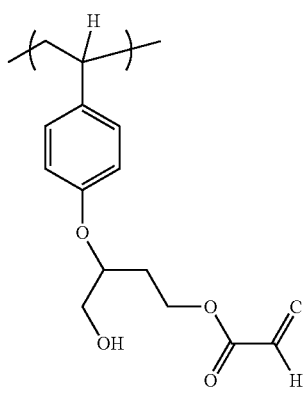

-continued

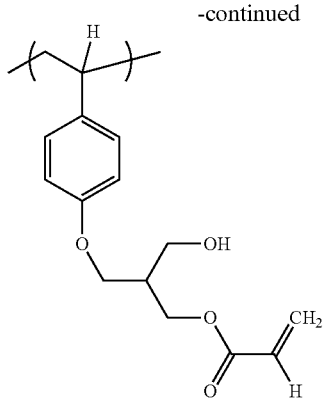

The amount of the repeating unit represented by the formula (1-3) in the fluororesin is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (1-3) is more than 70 mass %, the fluororesin tends to be hardly soluble in solvents. When the amount of the repeating unit represented by the formula (1-3) is less than 5 mass %, the resistance against UV-ozone treatment or oxygen plasma treatment tends to decrease.

Here, it is assumed, although not confirmed, that the repeating unit represented by the formula (1-3) according to the first embodiment of the present disclosure has an effect of exhibiting resistance to UV-ozone treatment or oxygen plasma treatment. The effects of the present disclosure described herein are not intended to be exhaustive.

The fluororesin according to the first embodiment of the present disclosure may be, as described above, a mixture (blend) of a copolymer containing a repeating unit represented by the formula (1-2) and a repeating unit represented by the formula (1-3) and another copolymer containing a repeating unit represented by the formula (1-2) and a repeating unit represented by the formula (1-3). Specifically, in one preferred embodiment of the present disclosure, the fluororesin according to the first embodiment of the present disclosure is a mixture of a fluororesin containing a repeating unit represented by the formula (1-3) wherein $W^{1-1}$ is —O—C(=O)—NH— and a fluororesin containing a repeating unit represented by the formula (1-3) wherein $W^{1-1}$ is —C(=O)—NH—.

In the photosensitive resin composition according to the first embodiment of the present disclosure, the fluororesin may include a structure represented by the following formula (1-4).

[Chem. 24]

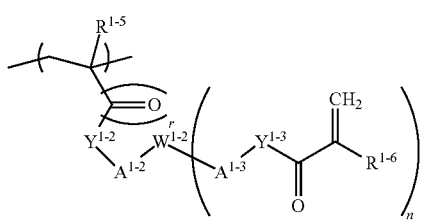

(1-4)

In the formula (1-4), $R^{1-5}$ and $R^{1-6}$ each independently represent a hydrogen atom or a methyl group.

In the formula (1-4), $W^{1-2}$ is a divalent linking group and represents —O—, —O—C(=O)—, —C(=O)—O—, —O—C(=O)—NH—, —C(=O)—O—C(=O)—NH—, or —C(=O)—NH—. Preferred of these are —O—C(=O)—NH—, —C(=O)—O—C(=O)—NH—, and —C(=O)—NH—.

The fluororesin according to the first embodiment of the present disclosure in which $W^{1-2}$ is —O—C(=O)—NH— has better ink repellency after UV-ozone treatment or oxygen plasma treatment, and is thus one particularly preferred embodiment.

In the formula (1-4), $A^{1-2}$ and $A^{1-3}$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—$CH_3$.

When the divalent linking groups $A^{1-2}$ and $A^{1-3}$ each independently represent a C1-C10 linear alkylene group, examples thereof include a methylene group, an ethylene group, a propylene group, an n-butylene group, an n-pentylene group, an n-hexalene group, an n-heptalene group, an n-octalene group, an n-nonalene group, and an n-decalene group.

When the divalent linking groups $A^{1-2}$ and $A^{1-3}$ each independently represent a C3-C10 branched alkylene group, examples thereof include an isopropylene group, an isobutylene group, a sec-butylene group, a tert-butylene group, an isopentalene group, and an isohexalene group.

When the divalent linking groups $A^{1-2}$ and $A^{1-3}$ each independently represent a C3-C10 cyclic alkylene group, examples thereof include two-substituted cyclopropane, two-substituted cyclobutane, two-substituted cyclopentane, two-substituted cyclohexane, two-substituted cycloheptane, two-substituted cyclooctane, two-substituted cyclodecane, and two-substituted 4-tert-butylcyclohexane.

When one or more hydrogen atoms in these alkylene groups are substituted by hydroxy groups, examples of these hydroxy group-substituted alkylene groups include a 1-hydroxyethylene group (—CH(OH)$CH_2$—), a 2-hydroxyethylene group (—$CH_2$CH(OH)—), a 1-hydroxy-n-propylene group, a 2-hydroxy-n-propylene group, a hydroxy-isopropylene group (—CH($CH_2$OH)$CH_2$—), a 1-hydroxy-n-butylene group, a 2-hydroxy-n-butylene group, a hydroxy-sec-butylene group (—CH($CH_2$OH)$CH_2$$CH_2$—), a hydroxy-isobutylene group (—$CH_2$CH($CH_2$OH)$CH_2$—), and a hydroxy-tert-butylene group (—C($CH_2$OH)($CH_3$)$CH_2$—).

When one or more hydrogen atoms in these alkylene groups are substituted by —O—C(=O)—$CH_3$, examples of these substituted-alkylene groups include those in which hydroxy groups of the hydroxy group-substituted alkylene groups exemplified above are substituted by —O—C(=O)—$CH_3$.

Preferably, the divalent linking groups $A^{1-2}$ and $A^{1-3}$ each independently represent a methylene group, an ethylene group, a propylene group, an n-butylene group, an isobutylene group, a sec-butylene group, a cyclohexyl group, a 1-hydroxyethylene group (—CH(OH)$CH_2$—), a 2-hydroxyethylene group (—$CH_2$CH(OH)—), a 2-hydroxy-n-propylene group, a hydroxy-isopropylene group (—CH($CH_2$OH)$CH_2$—), a 2-hydroxy-n-butylene group, or a hydroxy-sec-butylene group (—CH($CH_2$OH)$CH_2$$CH_2$—); more preferably, an ethylene group, a propylene group, a 1-hydroxyethylene group (—CH(OH)$CH_2$—), a 2-hydroxyethylene group (~$CH_2$CH(OH)—), a 2-hydroxy-n-propylene group, or a hydroxy-isopropylene group (—CH(CH$_2$OH)CH$_2$—); particularly preferably an ethylene group, a 1-hydroxyethylene group (—CH(OH)CH$_2$—), or a 2-hydroxyethylene group (—CH$_2$CH(OH)—).

In the formula (1-4), Y$^{1-2}$ and Y$^{1-3}$ are divalent linking groups and each independently represent —O— or —NH—, with —O— being preferred.

In the formula (1-4), n represents an integer of 1 to 3, with n of 1 being particularly preferred.

In the formula (1-4), r represents 0 or 1. When r is 0, (—C(=O)—) represents a single bond.

The following are examples of preferred structures of the repeating unit represented by the formula (1-4).

[Chem. 25]

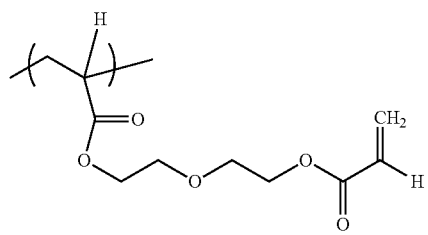

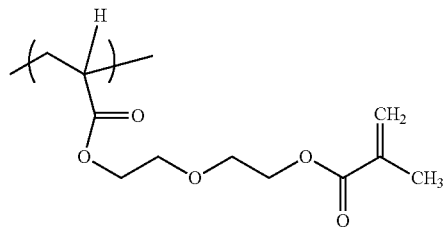

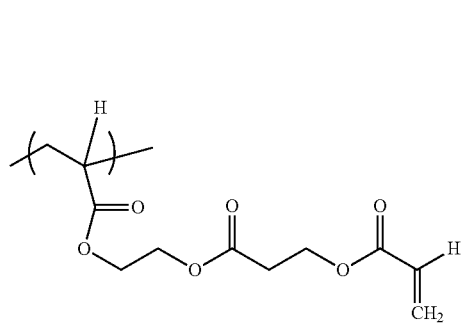

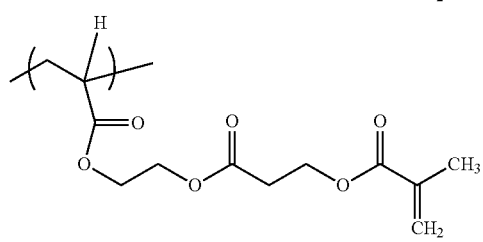

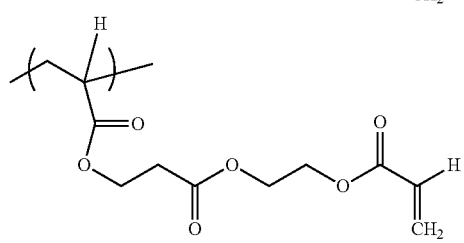

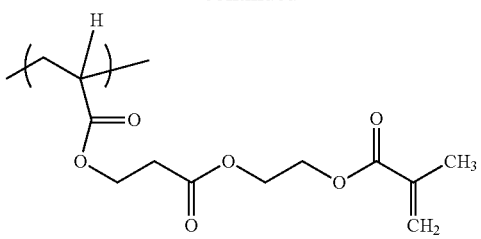

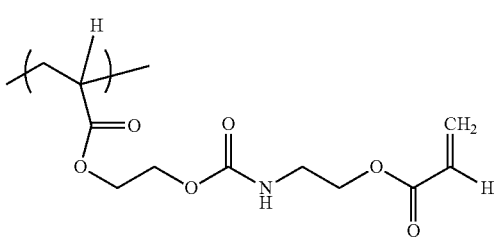

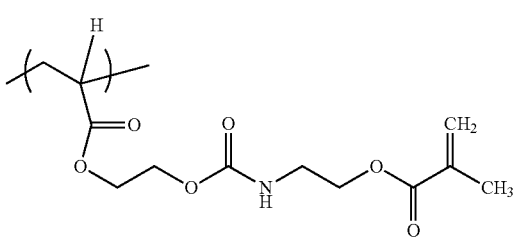

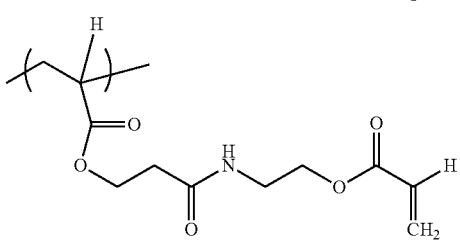

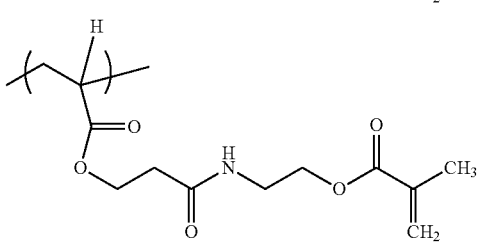

[Chem. 26]

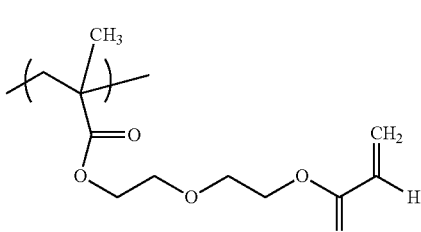

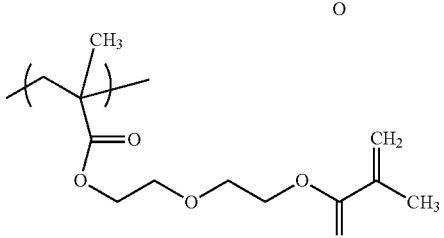

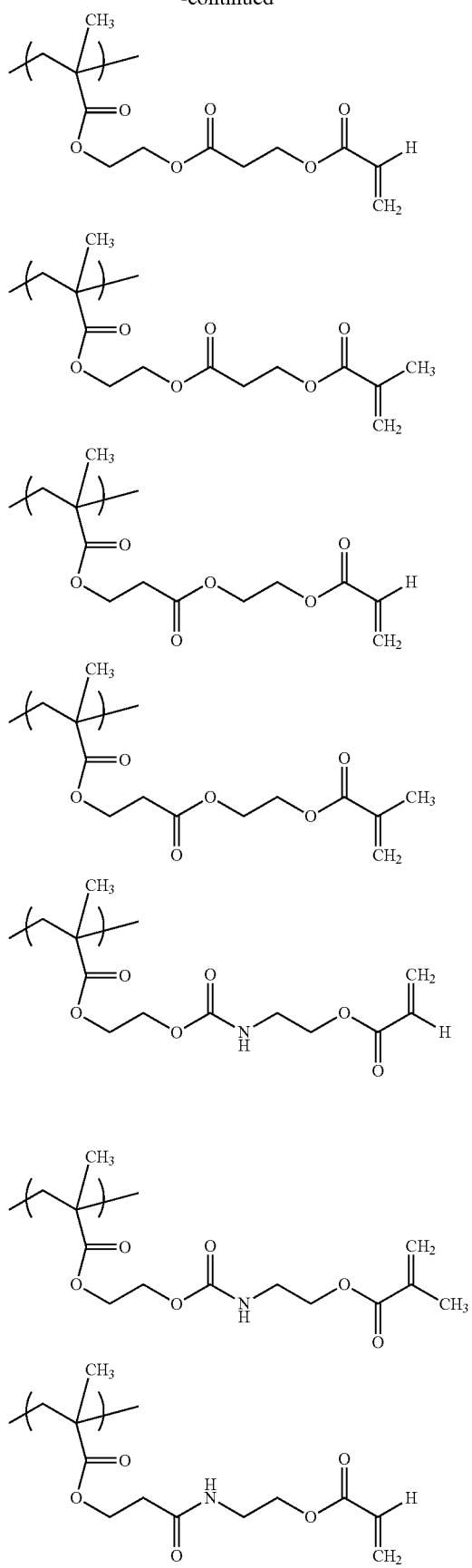
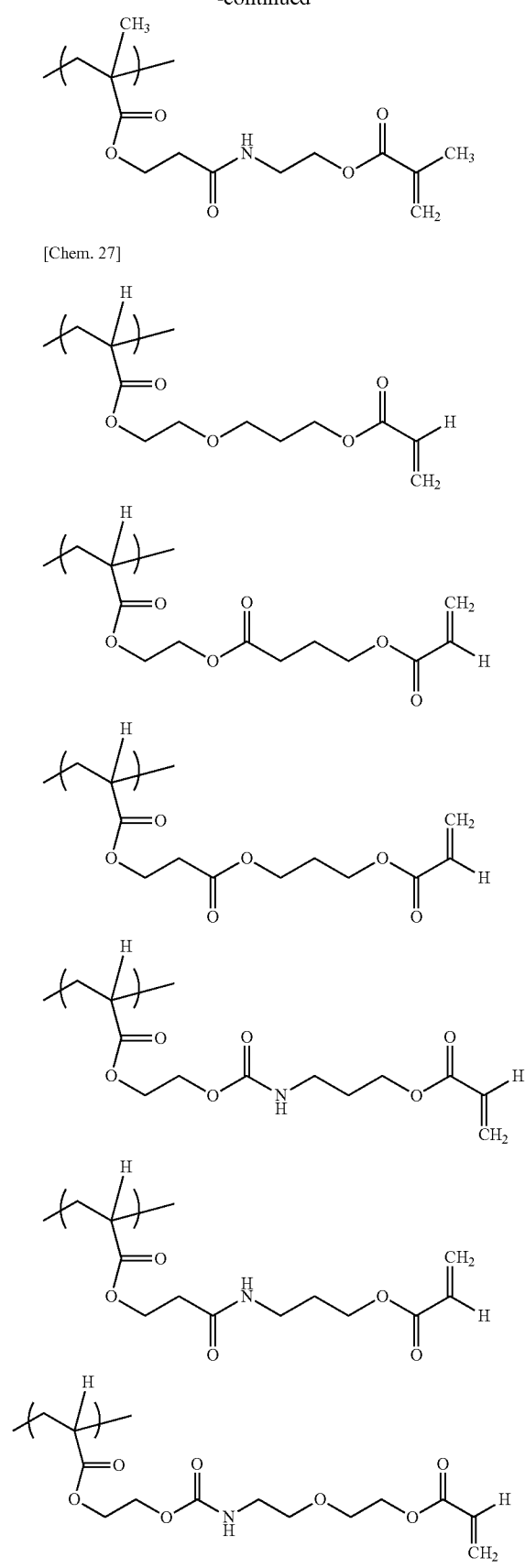

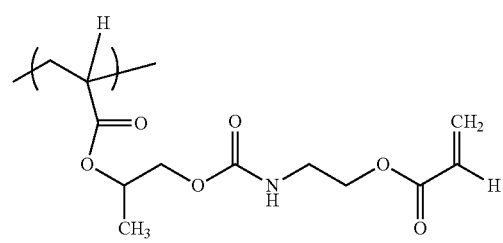
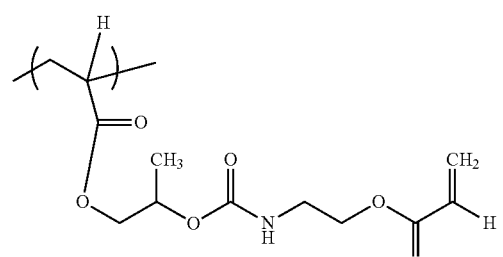
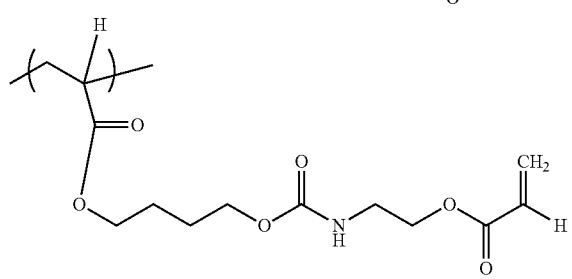
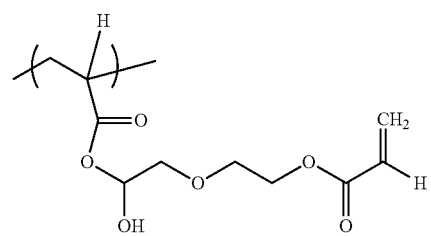
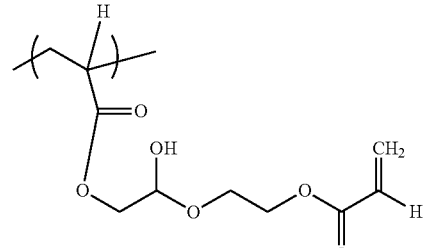
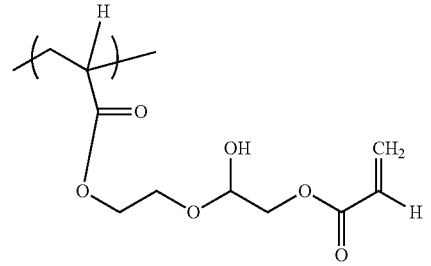
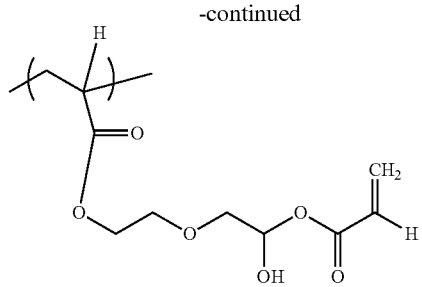
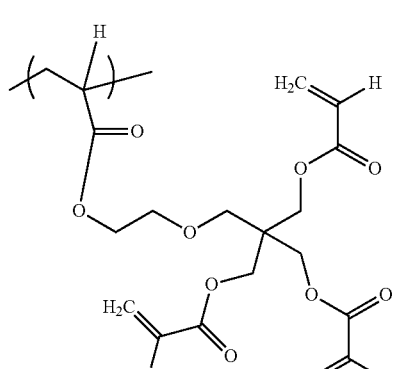
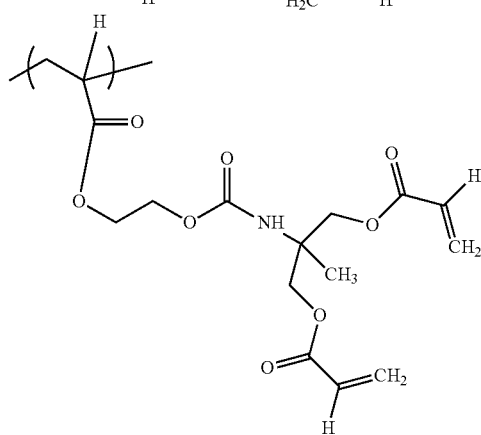
[Chem. 29]
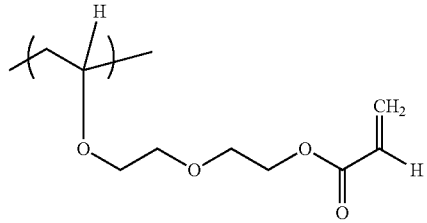
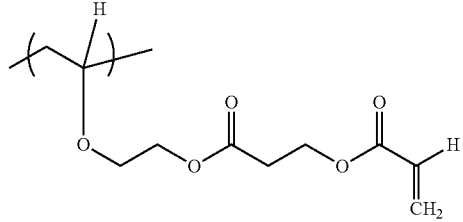

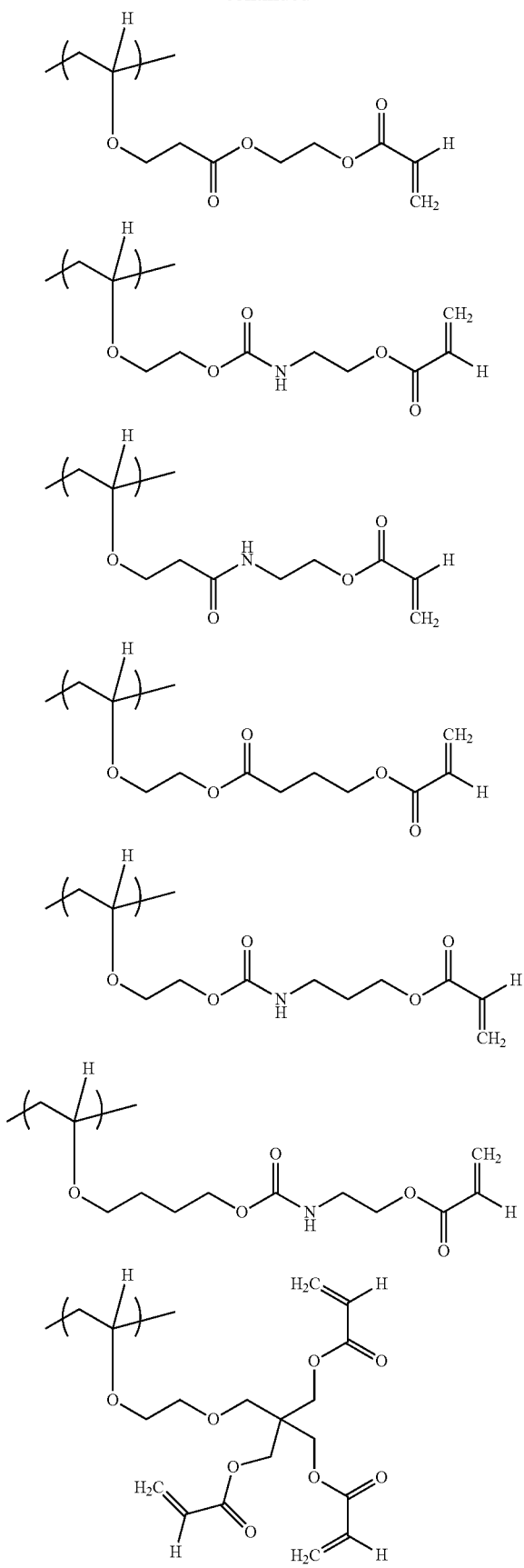

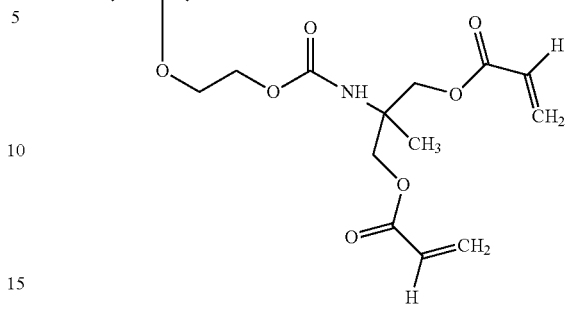

The amount of the repeating unit represented by the formula (1-4) in the fluororesin is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (1-4) is more than 70 mass %, the fluororesin tends to be hardly soluble in solvents. When the amount of the repeating unit represented by the formula (1-4) is less than 5 mass %, a fluororesin film or banks obtainable from the fluororesin tend to have lower adhesion to substrates.

It is assumed, although not confirmed, that the repeating unit represented by the formula (1-4) in the fluororesin has an effect of improving the adhesion of the resulting fluororesin films or banks to substrates. The effects of the present disclosure described herein are not intended to be exhaustive.

The fluororesin according to the first embodiment of the present disclosure may be a mixture (blend) of a copolymer containing a repeating unit represented by the formula (1-2) and a repeating unit represented by the formula (1-4) and another copolymer containing a repeating unit represented by the formula (1-2) and a repeating unit represented by the formula (1-4). Specifically, in one preferred embodiment of the present disclosure, the fluororesin according to the first embodiment of the present disclosure is a mixture of a fluororesin containing a repeating unit represented by the formula (1-4) wherein $W^{1-2}$ is —O—C(=O)—NH— and a fluororesin containing a repeating unit represented by the formula (1-4) wherein $W^{1-2}$ is —C(=O)—NH—.

In the photosensitive resin composition according to the first embodiment of the present disclosure, the fluororesin may include a structure represented by the following formula (1-5).

[Chem. 30]

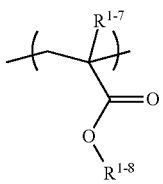

(1-5)

In the formula (1-5), $R^{1-7}$ represents a hydrogen atom or a methyl group.

In the formula (1-5), $R^{1-8}$ represents a C1-C15 linear, C3-C15 branched, or C3-C15 cyclic alkyl group in which one or more hydrogen atoms in the alkyl group are substituted by fluorine atoms; and the repeating unit has a fluorine content of 30 mass % or more.

When $R^{1-8}$ is a linear hydrocarbon group, specific examples thereof include a methyl group, an ethyl group, a propyl group, a butyl group, a pentyl group, a hexyl group, a heptyl group, an octyl group, a nonyl group, and C10-C14 linear alkyl groups in which one or more hydrogen atoms are substituted by fluorine atoms.

When $R^{1-8}$ is a linear hydrocarbon group, preferably, the repeating unit represented by the formula (1-5) is a repeating unit represented by the following formula (1-5-1).

[Chem. 31]

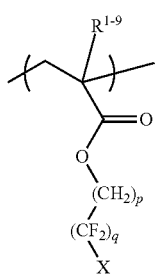

(1-5-1)

In the formula (1-5-1), $R^{1-9}$ is the same as $R^{1-7}$ in the formula (1-5).

In the formula (1-5-1), X is a hydrogen atom or a fluorine atom.

In the formula (1-5-1), p is an integer of 1 to 4, and q is an integer of 1 to 14. Particularly preferably, p is an integer of 1 or 2, q is an integer of 2 to 8, and X is a fluorine atom.

The following are examples of preferred structures of the repeating unit represented by the formula (1-5).

[Chem. 32]

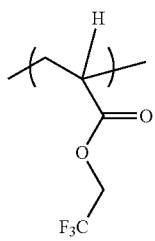 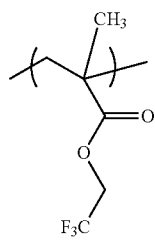 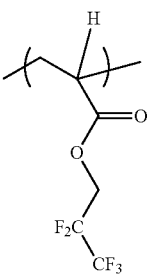

-continued

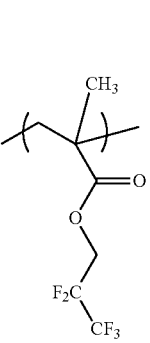 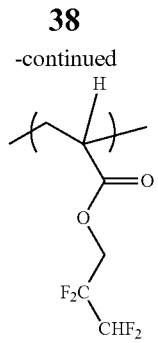 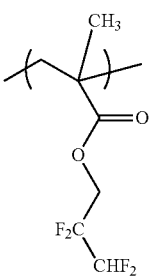

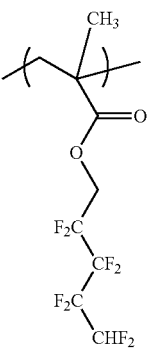 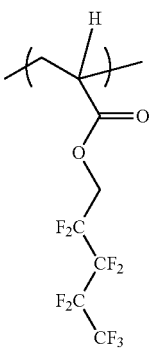

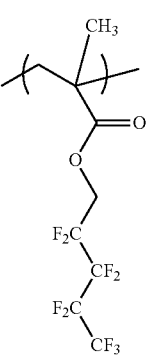 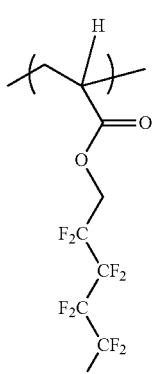 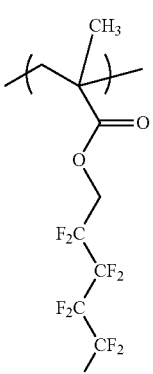

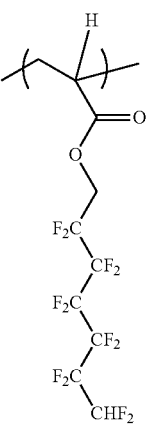 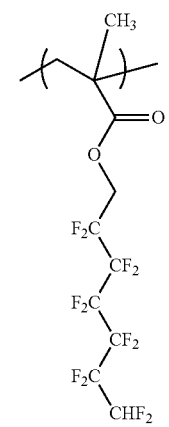

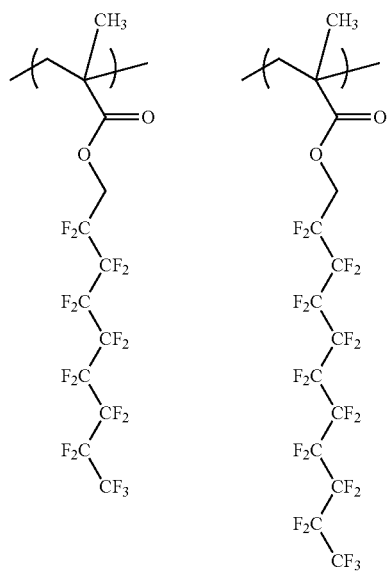
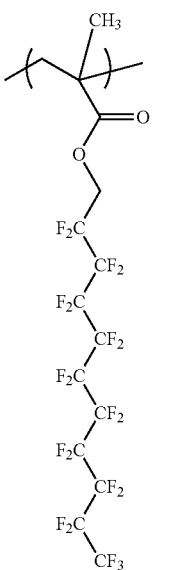
[Chem. 33]
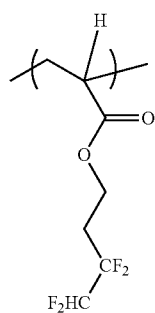
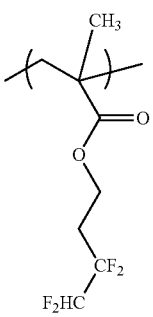
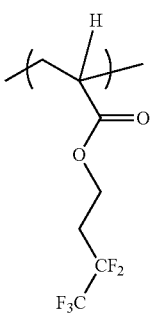
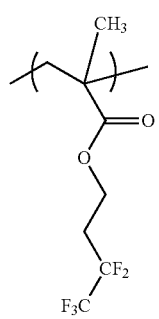
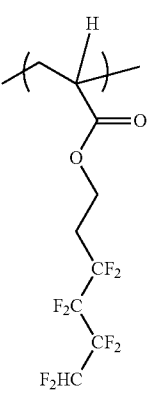
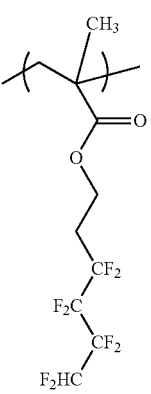
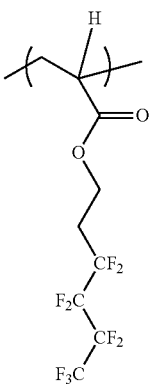
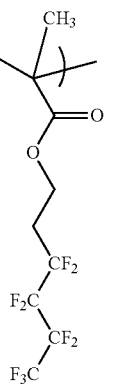
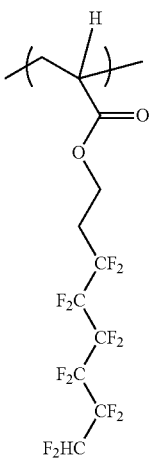
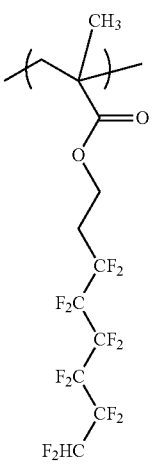
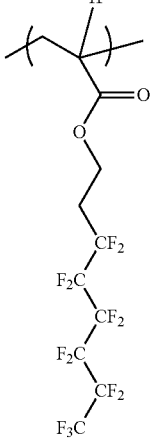
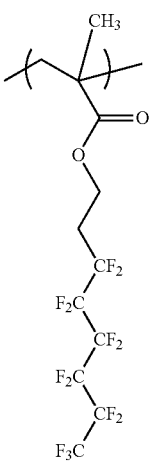
[Chem. 34]
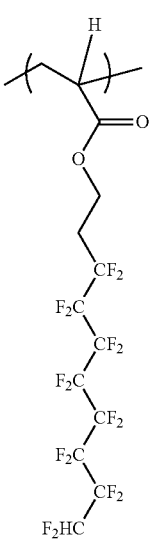
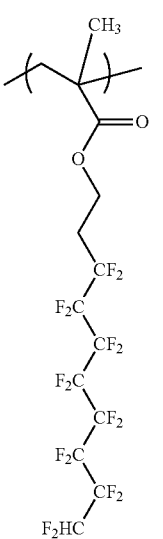
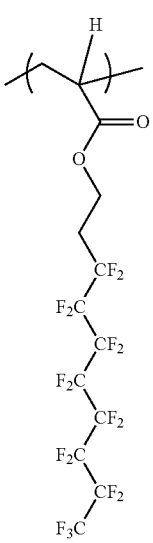

[Chem. 35]

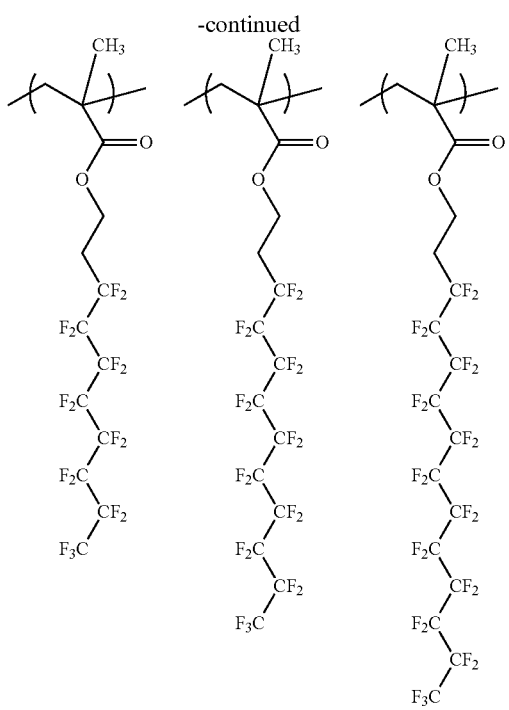
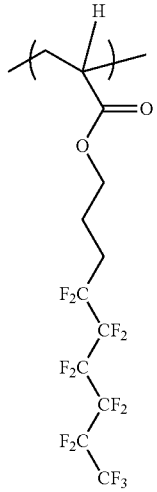
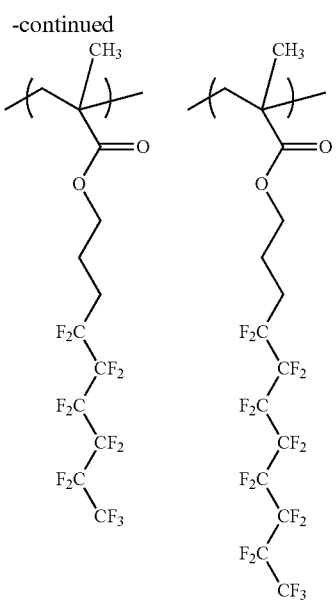
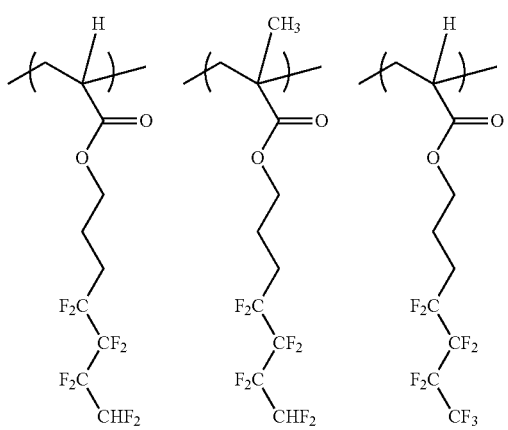
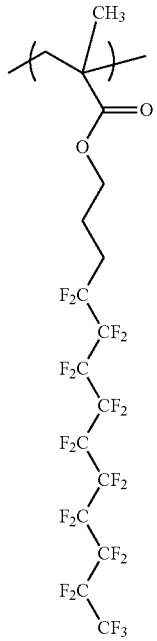
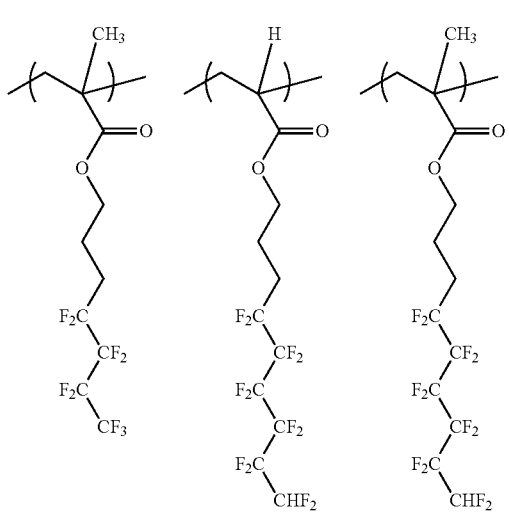

The amount of the repeating unit represented by the formula (1-5) is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (1-5) is more than 70 mass %, the fluororesin tends to be hardly soluble in solvents.

The repeating unit represented by the formula (1-5) is a repeating unit that imparts ink repellency after UV-ozone treatment or oxygen plasma treatment. Thus, when pursuing high ink repellency, preferably, the fluororesin according to the first embodiment of the present disclosure contains the repeating unit represented by the formula (1-5).

In the photosensitive resin composition according to the first embodiment of the present disclosure, the fluororesin may include a structure represented by the following formula (1-6).

[Chem. 36]

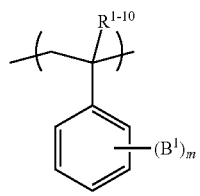

(1-6)

In the formula (1-6), $R^{1-10}$ represents a hydrogen atom or a methyl group.

In the formula (1-6), each $B^1$ independently represents a hydroxy group, a carboxy group, —C(=O)—O—$R^{1-11}$ ($R^{1-11}$ represents a C1-C15 linear, C3-C15 branched, or C3-C15 cyclic alkyl group in which one or more hydrogen atoms in the alkyl group are substituted by fluorine atoms, and $R^{1-11}$ has a fluorine content of 30 mass % or more), or —O—C(=O)—$R^{1-12}$ ($R^{1-12}$ represents a C1-C6 linear, C3-C6 branched, or C3-C6 cyclic alkyl group); and m represents an integer of 0 to 3.

The following are examples of preferred structures of the repeating unit represented by the formula (1-6).

[Chem. 37]

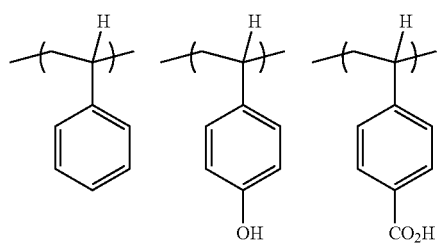

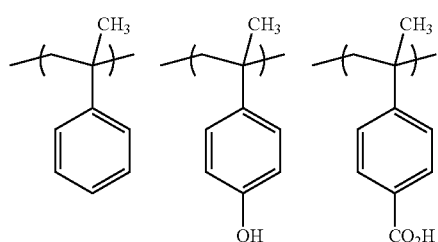

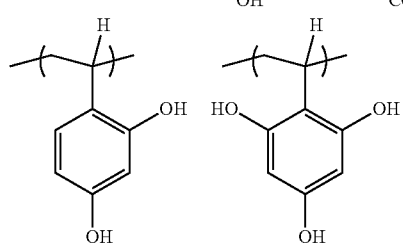

-continued

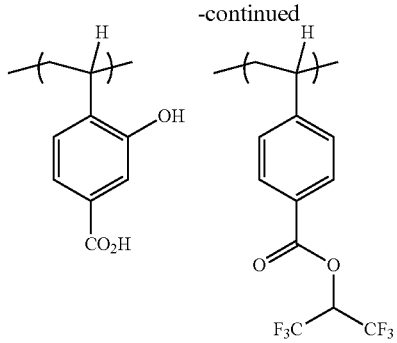

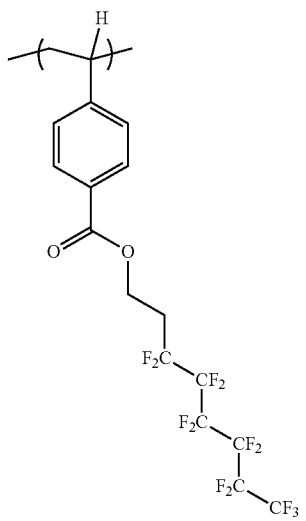

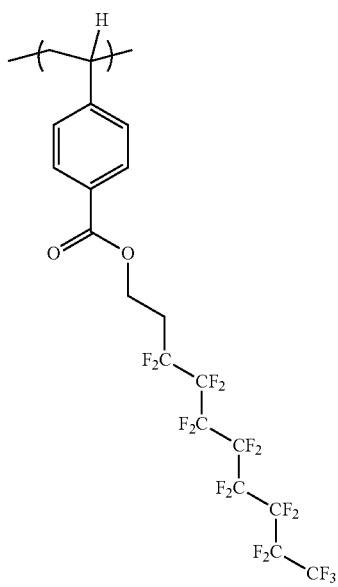

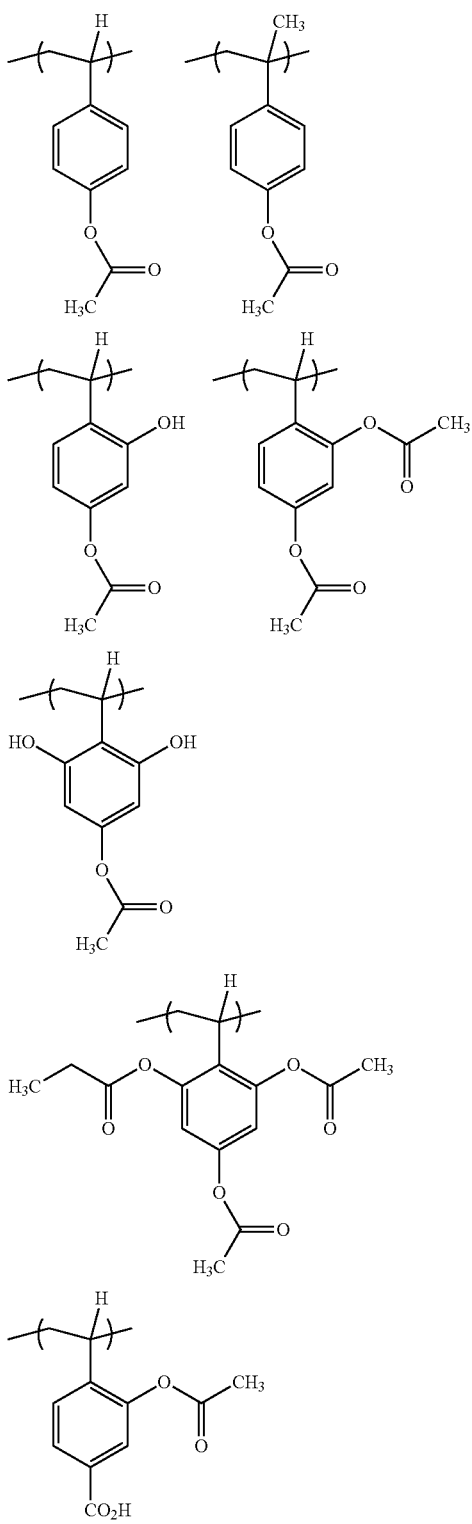

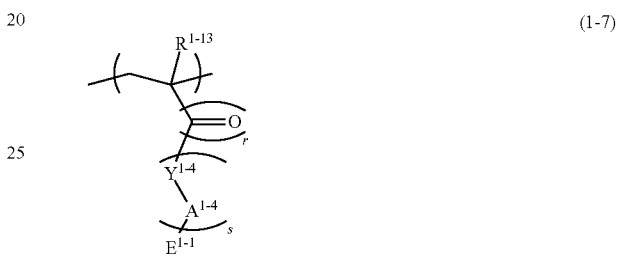

The amount of the repeating unit represented by the formula (1-6) is preferably 5 mass % or more and 70 mass % or less, more preferably 10 mass % or more and 50 mass % or less, particularly preferably 20 mass % or more and 40 mass % or less, relative to 100 mass % of the fluororesin.

When the amount of the repeating unit represented by the formula (1-6) is more than 70 mass %, the fluororesin tends to be hardly soluble in solvents.

A repeating unit represented by the formula (1-6) wherein $B^1$ is a hydroxy group or a carboxy group has solubility in an alkali developer. Thus, when it is desired to impart alkali developability to a film obtainable from the fluororesin, preferably, the fluororesin according to the first embodiment of the present disclosure contains the repeating unit represented by the formula (1-6) wherein $B^{1-1}$ is a hydroxy group or a carboxy group.

In the photosensitive resin composition according to the first embodiment of the present disclosure, the fluororesin may include a structure represented by the following formula (1-7).

[Chem. 39]

(1-7)

In the formula (1-7), $R^{1-13}$ represents a hydrogen atom or a methyl group.

In the formula (1-7), $A^{1-4}$ is a divalent linking group and represents a C1-C10 linear, C3-C10 branched, or C3-C10 cyclic alkylene group in which one or more hydrogen atoms in the alkylene group may be substituted by hydroxy groups or —O—C(=O)—CH$_3$.

When the divalent linking group $A^{1-4}$ is a C1-C10 linear alkylene group, examples thereof include a methylene group, an ethylene group, a propylene group, an n-butylene group, an n-pentylene group, an n-hexalene group, an n-heptalene group, an n-octalene group, an n-nonalene group, and an n-decalene group.

When the divalent linking group $A^{1-4}$ is a C3-C10 branched alkylene group, examples thereof include an isopropylene group, an isobutylene group, a sec-butylene group, a tert-butylene group, an isopentalene group, and an isohexalene group.

When the divalent linking group $A^{1-4}$ is a C3-C10 cyclic alkylene group, examples thereof include two-substituted cyclopropane, two-substituted cyclobutane, two-substituted cyclopentane, two-substituted cyclohexane, two-substituted cycloheptane, two-substituted cyclooctane, two-substituted cyclodecane, and two-substituted 4-tert-butylcyclohexane.

When one or more hydrogen atoms in these alkylene groups are substituted by hydroxy groups, examples of these hydroxy group-substituted alkylene groups include a 1-hydroxyethylene group (—CH(OH)CH$_2$—), a 2-hydroxyethylene group (—CH$_2$CH(OH)—), a 1-hydroxy-n-propylene group, a 2-hydroxy-n-propylene group, a hydroxy-isopropylene group (—CH(CH$_2$OH)CH$_2$—), a 1-hydroxy-n-butylene group, a 2-hydroxy-n-butylene group, a hydroxy-sec-butylene group (—CH(CH$_2$OH)CH$_2$CH$_2$—), a hydroxy-isobutylene group (—CH$_2$CH(CH$_2$OH)CH$_2$—), and a hydroxy-tert-butylene group (—C(CH$_2$OH)(CH$_3$)CH$_2$—).

When one or more hydrogen atoms in these alkylene groups are substituted by —O—C(=O)—CH$_3$, examples of these substituted-alkylene groups include those in which hydroxy groups of the hydroxy group-substituted alkylene groups exemplified above are substituted by —O—C(=O)—CH₃.

The divalent linking group $A^{1-4}$ is preferably a methylene group, an ethylene group, a propylene group, an n-butylene group, an isobutylene group, a sec-butylene group, a cyclohexyl group, a 1-hydroxyethylene group (—CH(OH)CH₂—), a 2-hydroxyethylene group (—CH₂CH(OH)—), a 2-hydroxy-n-propylene group, a hydroxy-isopropylene group (—CH(CH₂OH)CH₂—), a 2-hydroxy-n-butylene group, or a hydroxy-sec-butylene group (—CH(CH₂OH)CH₂CH₂—); more preferably an ethylene group, a propylene group, a 1-hydroxyethylene group (—CH(OH)CH₂—), a 2-hydroxyethylene group (—CH₂CH(OH)—), a 2-hydroxy-n-propylene group, or a hydroxy-isopropylene group (—CH(CH₂OH)CH₂—); particularly preferably an ethylene group, a 1-hydroxyethylene group (—CH(OH)CH₂—), or a 2-hydroxyethylene group (—CH₂CH(OH)—).

In the formula (1-7), $Y^{1-4}$ is a divalent linking group and represents —O— or —NH—, with —O— being more preferred.

In the formula (1-7), r represents 0 or 1. When r is 0, (—C(=O)—) represents a single bond.

In the formula (1-7), $E^{1-1}$ represents a hydroxy group, a carboxy group, or an oxirane group.

When $E^{1-1}$ is an oxirane group, examples thereof include an ethylene oxide group, a 1,2-propylene oxide group, and a 1,3-propylene oxide group. Preferred of these is an ethylene oxide group.

In the formula (1-7), s represents 0 or 1. When s is 0, (—$Y^{1-4}$-$A^{1-4}$-) represents a single bond. When r is 0 and s is 0, the structure has $E^{1-1}$ bonded to the main chain of the repeating unit.

The following are examples of preferred structures of the repeating unit represented by the formula (1-7).

[Chem. 40]

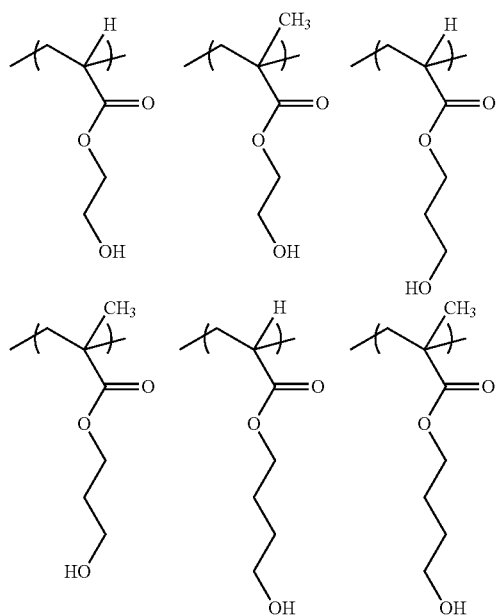

-continued

A repeating unit represented by the formula (1-7) wherein $E^{1-1}$ is a hydroxy group or a carboxy group imparts solubility to the fluororesin in an alkali developer. Thus, when it is desired to impart alkali developability to a film obtainable from the fluororesin, preferably, the fluororesin according to the first embodiment of the present disclosure contains the repeating unit represented by the formula (1-7) wherein $E^{1-1}$ is a hydroxy group or a carboxy group.

In the photosensitive resin composition according to the first embodiment of the present disclosure, the molecular weight of the fluororesin in terms of weight average molecular weight measured by gel permeation chromatography (GPC) using polystyrene as a standard substance is preferably 1000 or more and 1000000 or less, more preferably 2000 or more and 500000 or less, particularly preferably 3000 or more and 100000 or less. When the molecular weight is less than 1000, the resulting fluororesin film or banks for organic EL tend to have a low strength. When the molecular weight is more than 1000000, it may be difficult to form a fluororesin film due to lack of solubility of the fluororesin in solvents.

The dispersity (Mw/Mn) is preferably 1.01 to 5.00, more preferably 1.01 to 4.00, particularly preferably 1.01 to 3.00.

The fluororesin may be a random copolymer, an alternating copolymer, a block copolymer, or a graft copolymer. Preferably, the fluororesin is a random copolymer to suitably (not locally) disperse characteristics of each repeating unit.

The following are preferred embodiments of the fluororesin in the photosensitive resin composition according to the first embodiment of the present disclosure.

Embodiment 1-1

Fluororesin containing a repeating unit represented by the following formula (1-2) and a repeating unit represented by the following formula (1-3)
Formula (1-2): $R^{1-1}$ and $R^{1-2}$ are hydrogen atoms, and each Rf is independently a fluorine atom, a difluoromethyl group, or a trifluoromethyl group.
Formula (1-3): $R^{1-3}$ and $R^{1-4}$ are hydrogen atoms; $W^1$ is a —O—C(=O)—NH—, —C(=O)—O—C(=O)—NH—, or —C(=O)—NH—; $A^{1-1}$ is an ethylene group; $Y^{1-1}$ is —O—; and n is 1.

Embodiment 1-2

Fluororesin containing a repeating unit represented by the following formula (1-2) and a repeating unit represented by the following formula (1-3)
Formula (1-2): same as described in Embodiment 1-1
Formula (1-3): $R^{1-3}$ and $R^{1-4}$ are hydrogen atoms; $W^{1-1}$ is —O—; $A^{1-1}$ is a 2-hydroxy-n-propylene group or a hydroxyisopropylene group (—CH(CH$_2$OH)CH$_2$—); $Y^{1-1}$ is —O—; and n is 1.

Embodiment 1-3

Fluororesin containing repeating units represented by the following formulas (1-2), (1-3), and (1-5-1)
Formula (1-2): same as described in Embodiment 1-1
Formula (1-3): same as described in Embodiment 1-1
Formula (1-5-1): $R^{1-9}$ is a methyl group; p is an integer of 2; q is an integer of 4 to 8; and X is a fluorine atom.

Embodiment 1-4

Fluororesin containing repeating units represented by the following formulas (1-2), (1-3), (1-5-1), and (1-6)
Formula (1-2): same as described in Embodiment 1-1
Formula (1-3): same as described in Embodiment 1-1
Formula (1-5-1): same as described in Embodiment 1-3
Formula (1-6): $R^{1-10}$ is a hydrogen atom; $B^1$ is a hydroxy group or a carboxy group; and m is 1.

Embodiment 1-5

Fluororesin containing a repeating unit represented by the following formula (1-2) and a repeating unit represented by the following formula (1-4)
Formula (1-2): same as described in Embodiment 1-1
Formula (1-4): $R^{1-5}$ and $R^{1-6}$ are each independently a hydrogen atom or a methyl group; $W^{1-2}$ is —O—C(=O)—NH—, —C(=O)—O—C(=O)—NH—, or —C(=O)—NH—; $A^{1-2}$ and $A^{1-3}$ are each independently an ethylene group; $Y^{1-2}$ and $Y^{1-3}$ are —O—; n is 1; and r is 1.

Embodiment 1-6

Fluororesin containing a repeating unit represented by the following formula (1-2) and a repeating unit represented by the following formula (1-4)
Formula (1-2): same as described in Embodiment 1-1
Formula (1-4): $R^{1-5}$ and $R^{1-6}$ are each independently a hydrogen atom or a methyl group; $W^{1-2}$ is —O—C(=O)—NH—, —C(=O)—O—C(=O)—NH—, or —C(=O)—NH—; $A^{1-2}$ and $A^{1-3}$ are each independently an ethylene group, a 1-hydroxy-n-ethylene group (—CH(OH)CH$_2$—), or a 2-hydroxy-n-ethylene group (—CH$_2$CH(OH)—); $Y^{1-2}$ and $Y^{1-3}$ are —O—; n is 1; and r is 1.

Embodiment 1-7

Fluororesin containing a repeating unit represented by the following formula (1-2) and a repeating unit represented by the following formula (1-4)
Formula (1-2): same as described in Embodiment 1-1
Formula (1-4): $R^{1-5}$ and $R^{1-6}$ are each independently a hydrogen atom or a methyl group; $W^{1-2}$ is —O—C(=O)—NH—, —C(=O)—O—C(=O)—NH—, or —C(=O)—NH—; $A^{1-2}$ and $A^{1-3}$ are each independently an ethylene group or a butyl group; $Y^{1-2}$ and $Y^{1-3}$ are —O—; n is 1; and r is 0.

Embodiment 1-8

Fluororesin containing repeating units represented by the following formulas (1-2), (1-4), and (1-5-1)
Formula (1-2): same as described in Embodiment 1-1
Formula (1-4): same as described in Embodiment 1-5
Formula (1-5-1): same as described in Embodiment 1-3

Embodiment 1-9

Fluororesin containing repeating units represented by the following formulas (1-2), (1-4), (1-5-1), and (1-7)
Formula (1-2): same as described in Embodiment 1-1
Formula (1-4): same as described in Embodiment 1-5
Formula (1-5-1): same as described in Embodiment 1-3
Formula (1-7): $R^{1-13}$ is a hydrogen atom; $A^{1-4}$ is an ethylene group; $Y^{1-4}$ is —O—; r is 1; s is 1; and $E^{1-1}$ is a hydroxy group or a carboxy group.

Embodiment 1-10

Fluororesin containing repeating units represented by the following formulas (1-2), (1-4), (1-5-1), (1-6), and (1-7)
Formula (1-2): same as described in Embodiment 1-1
Formula (1-4): same as described in Embodiment 1-5
Formula (1-5-1): same as described in Embodiment 1-3
Formula (1-6): same as described in Embodiment 1-4
Formula (1-7): same as described in Embodiment 1-9

In the photosensitive resin composition according to the first embodiment of the present disclosure, the fluororesin has a fluorine content of preferably 20 to 50 mass %, more preferably 25 to 40 mass %.

The fluororesin having a fluorine content in the above ranges is easily soluble in solvents. A fluororesin film or banks having excellent liquid repellency can be obtained because the fluororesin contains fluorine atoms.

Herein, the fluorine content of the fluororesin can be calculated from properties measured by nuclear magnetic resonance (NMR) spectroscopy such as molar percentages of monomers constituting the fluororesin, molecular weights of monomers constituting the fluororesin, and amount of fluorine in each monomer.

The following describes a fluorine content measurement method, providing that the fluororesin is a resin derived from 1,1-bistrifluoromethylbutadiene, 4-hydroxystyrene, and 2-(perfluorohexyl)ethyl methacrylate.

(i) First, the fluororesin is measured by NMR to calculate the percentage of each monomer (mol percentage).

(ii) The molecular weight (Mw) of the monomer of the fluororesin is multiplied by the mol percentage, and the resulting values are added up to determine the total value. The weight percentage (wt %) of each monomer is calculated from the total value.

The molecular weight of 1,1-bistrifluoromethylbutadiene is 190, the molecular weight of 1,1-bistrifluoromethylbutadiene is 120, and the molecular weight of 2-(perfluorohexyl)ethyl methacrylate is 432.

(iii) Next, the fluorine content of the monomer containing fluorine is calculated.

(iv) For each monomer, "fluorine content in the monomer÷molecular weight (Mw) of the monomer×weight percentage (wt %)" is calculated, and the resulting values are added up.

(v) The value obtained in (iv) above is divided by the total value obtained in (ii) above to calculate the fluorine content of the fluororesin.

<Solvent>

In the photosensitive resin composition according to the first embodiment of the present disclosure, any solvent that can dissolve the fluororesin may be used, and examples thereof include ketones, alcohols, polyhydric alcohols and their derivatives, ethers, esters, aromatic solvents, and fluorine solvents. These may be used alone or in combination of two or more thereof.

Specific examples of the ketones include acetone, methyl ethyl ketone, cyclopentanone, cyclohexanone, methyl isoamyl ketone, 2-heptanone, cyclopentanone, methyl isobutyl ketone, methyl isopentyl ketone, and 2-heptanone.

Specific examples of the alcohols include isopropanol, butanol, isobutanol, n-pentanol, isopentanol, tert-pentanol, 4-methyl-2-pentanol, 3-methyl-3-pentanol, 2,3-dimethyl-2-pentanol, n-hexanol, n-heptanol, 2-heptanol, n-octanol, n-decanol, s-amyl alcohol, t-amyl alcohol, isoamyl alcohol, 2-ethyl-1-butanol, lauryl alcohol, hexyl decanol, and oleyl alcohol.

Specific examples of the polyhydric alcohols and their derivatives include ethylene glycol, ethylene glycol monoacetate, ethylene glycol dimethyl ether, diethylene glycol, diethylene glycol dimethyl ether, diethylene glycol monoacetate, propylene glycol, propylene glycol monoacetate, propylene glycol monomethyl ether (PGME), propylene glycol monoethyl ether, propylene glycol monopropyl ether, propylene glycol monobutyl ether, propylene glycol monomethyl ether acetate (PGMEA), and monomethyl ether, monoethyl ether, monopropyl ether, monobutyl ether, and monophenyl ether of dipropylene glycol or dipropylene glycol monoacetate.

Specific examples of the ethers include diethyl ether, diisopropyl ether, tetrahydrofuran, dioxane, and anisole.

Specific examples of the esters include methyl lactate, ethyl lactate (EL), methyl acetate, ethyl acetate, butyl acetate, methyl pyruvate, ethyl pyruvate, methyl methoxypropionate, ethyl ethoxypropionate, and γ-butyrolactone.

Examples of the aromatic solvents include xylene and toluene.

Examples of the fluorine solvents include chlorofluorocarbons, hydrochlorofluorocarbons, perfluoro compounds, and hexafluoroisopropyl alcohol.

Other solvents such as terpene-based petroleum naphtha solvents and paraffinic solvents, which are high-boiling-point weak solvents, can also be used to improve coating properties.

Of these, preferably, the solvent is at least one selected from the group consisting of methyl ethyl ketone, cyclohexanone, methyl isoamyl ketone, 2-heptanone, ethylene glycol, ethylene glycol dimethyl ether, ethylene glycol monoacetate, diethylene glycol, diethylene glycol monoacetate, diethylene glycol dimethyl ether, propylene glycol, propylene glycol monoacetate, propylene glycol monomethyl ether (PGME), propylene glycol monomethyl ether acetate (PGMEA), dipropylene glycol, dipropylene glycol monoacetate monomethyl ether, dipropylene glycol monoacetate monoethyl ether, dipropylene glycol monoacetate monopropyl ether, dipropylene glycol monoacetate monobutyl ether, dipropylene glycol monoacetate monophenyl ether, 1,4-dioxane, methyl lactate, ethyl lactate, methyl acetate, ethyl acetate, butyl acetate, methyl methoxypropionate, ethyl ethoxypropionate, γ-butyrolactone, and hexafluoroisopropyl alcohol. More preferred are methyl ethyl ketone, propylene glycol monomethyl ether acetate (PGMEA), propylene glycol monomethyl ether (PGME), cyclohexanone, ethyl lactate, butyl acetate, and γ-butyrolactone.

The amount of the solvent in the photosensitive resin composition according to the first embodiment of the present disclosure is preferably 50 parts by mass or more and 2000 parts by mass or less, more preferably 100 parts by mass or more and 1000 parts by mass or less, relative to the concentration (100 parts by mass) of the fluororesin (when the photosensitive resin composition contains the later-described alkali-soluble resin, the concentration is the sum including the alkali-soluble resin). The thickness of the resulting resin film can be adjusted by adjusting the amount of the solvent. When the amount is in the above ranges, the resulting resin film has a thickness particularly suitable to obtain banks for organic EL.

<Photopolymerization Initiator>

In the photosensitive resin composition according to the first embodiment of the present disclosure, any known photopolymerization initiator can be used as long as it polymerizes a monomer having a polymerizable double bond by high energy rays such as electromagnetic waves or electron beams.

The photopolymerization initiator can be a photo-radical initiator or a photoacid initiator. These may be used alone or in combination with a photo-radical initiator and a photoacid initiator. Two or more photo-radical initiators or photoacid initiators may be mixed. Use of the photopolymerization initiator in combination with additives enables living polymerization in some cases. Known additives can be used.

Specifically, the photo-radical initiators can be classified into the following types, for example: the intramolecular cleavage type that cleaves the intermolecular bond by absorption of electromagnetic waves or electron beams to generate radicals; and the hydrogen extraction type that, when used in combination with a hydrogen donor such as a tertiary amine or ether, generates radicals. Either type can be used. A photo-radical initiator of a type different from those described above can also be used.

Specific examples of the photo-radical initiators include benzophenone-based, acetophenone-based, diketone-based, acylphosphine oxide-based, quinone-based, and acyloin-based photo-radical initiators.

Specific examples of the benzophenone-based photo-radical initiators include benzophenone, 4-hydroxybenzophenone, 2-benzoylbenzoic acid, 4-benzoylbenzoic acid, 4,4'-bis(dimethylamino)benzophenone, and 4,4'-bis(diethylamino)benzophenone. Preferred of these are 2-benzoylbenzoic acid, 4-benzoylbenzoic acid, and 4,4'-bis(diethylamino) benzophenone.

Specific examples of the acetophenone-based photo-radical initiators include acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl-[4-(methylthio)phenyl]-2-morphorino-1-propanone, and 2-benzyl-2-dimethylamino-1-(4-morphorinophenyl)-butan-1-one. Preferred of these are p-dimethylaminoacetophenone and p-methoxyacetophenone.

Specific examples of the diketone-based photo-radical initiators include 4,4'-dimethoxybenzyl, methyl benzoylformate, and 9,10-phenanthrenequinone. Preferred of these are 4,4'-dimethoxybenzyl and methyl benzoylformate.

Specific examples of the acylphosphine oxide-based photo-radical initiators include bis(2,4,6-trimethylbenzoyl)-phenylphosphine oxide.

Specific examples of the quinone-based photo-radical initiators include anthraquinone, 2-ethylanthraquinone, camphorquinone, and 1,4-naphthoquinone. Preferred of these are camphorquinone and 1,4-naphthoquinone.

Specific examples of the acyloin-based photo-radical initiators include benzoin, benzoin methyl ether, benzoin ethyl ether, and benzoin isopropyl ether. Preferred of these are benzoin and benzoin methyl ether.

Preferred are benzophenone-based, acetophenone-based, and diketone-based photo-radical initiators. More preferred are benzophenone-based photo-radical initiators.

Examples of preferred commercially available photo-radical initiators include Irgacure 127, Irgacure 184, Irgacure 369, Irgacure 651, Irgacure 819, Irgacure 907, Irgacure 2959, Irgacure OXE-01, Darocur 1173, and Lucirin TPO (trade names) available from BASF. More preferred of these are Irgacure 651 and Irgacure 369.

Specifically, the photoacid initiator is an onium salt of a pair of cation and anion, the cation being at least one selected from the group consisting of aromatic sulfonic acid, aromatic iodonium, aromatic diazonium, aromatic ammonium, thianthrenium, thioxanthonium, and (2,4-cyclopentadien-1-yl) (1-methylethylbenzene)-iron, the anion being at least one selected from the group consisting of tetrafluoroborate, hexafluorophosphate, hexafluoroantimonate, and pentafluorophenyl borate.

Particularly preferred of these are bis[4-(diphenylsulfonio)phenyl]sulfide bishexafluorophosphate, bis[4-(diphenylsulfonio)phenyl]sulfide tetrakis(pentafluorophenyl)borate, and diphenyliodonium hexafluorophosphate.

Examples of commercially available photoacid generators include CPI-100P, CPI-110P, CPI-101A, CPI-200K, and CPI-210S (trade names) available from San-Apro Ltd.; CYRACURE Photoinitiator UVI-6990, CYRACURE Photoinitiator UVI-6992, and CYRACURE Photoinitiator UVI-6976 (trade names) available from Dow Chemical Japan Limited; ADECA OPTOMER SP-150, ADECA OPTOMER SP-152, ADECA OPTOMER SP-170, ADECA OPTOMER SP-172, and ADECA OPTOMER SP-300 (trade names) available from ADEKA; CI-5102 and CI-2855 (trade names) available from Nippon Soda Co., Ltd.; SAN AID SI-60L, SAN AID SI-80L, SAN AID SI-100L, SAN AID SI-110L, SAN AID SI-180L, SAN AID SI-110, and SAN AID SI-180 (trade names) available from Sanshin Chemical Industry Co. Ltd; Esacure 1064 and Esacure 1187 (trade names) available from Lamberti; and Irgacure 250 (trade name) available from Ciba Specialty Chemicals.

The amount of the photopolymerization initiator in the photosensitive resin composition according to the first embodiment of the present disclosure is preferably 0.1 parts by mass or more and 30 parts by mass or less, more preferably 1 part by mass or more and 20 parts by mass or less, relative to 100 parts by mass of the fluororesin (when the photosensitive resin composition contains the later-described alkali-soluble resin, the concentration is the sum including the alkali-soluble resin). When the amount of the photopolymerization initiator is less than 0.1 parts by mass, the crosslinking effect tends to be insufficient. When the amount thereof is more than 30 parts by mass, the resolution and sensitivity tend to be low.

The photosensitive resin composition according to the first embodiment of the present disclosure essentially contains a fluororesin, a solvent, and a photopolymerization initiator, and may further contain a crosslinking agent, an alkali-soluble resin, a naphthoquinonediazide group-containing compound, a basic compound, and other additives.

<Crosslinking Agent>

The crosslinking agent reacts with a repeating unit represented by the formula (1-3) or (1-4), whereby the resin can have a crosslinked structure. This can improve the mechanical strength of the resulting film.

A known crosslinking agent can be used. Specific examples thereof include compounds obtained by reacting an amino group-containing compound such as melamine, acetoguanamine, benzoguanamine, urea, ethylene urea, propylene urea, or glycoluril with formaldehyde or formaldehyde and a lower alcohol, and substituting a hydrogen atom of the amino group by a hydroxymethyl group or a lower alkoxymethyl group; polyfunctional epoxy compounds; polyfunctional oxetane compounds; polyfunctional isocyanate compounds; and polyfunctional acrylate compounds. Here, those that use melamine are referred to as melamine-based crosslinking agents, those that use urea are referred to as urea-based crosslinking agents, those that use alkylene urea such ethylene urea or propylene urea are referred to as alkylene urea-based crosslinking agents, and those that use glycoluril are referred to as glycoluril-based crosslinking agents. These crosslinking agents may be used alone or in combination of two or more thereof.

Preferably, the crosslinking agent is at least one selected from these crosslinking agents. Particularly preferred are glycoluril-based crosslinking agents and polyfunctional acrylate compounds.

Examples of the melamine-based crosslinking agents include hexamethoxymethyl melamine, hexaethoxymethyl melamine, hexapropoxymethyl melamine, and hexabutoxymethyl melamine. Preferred of these is hexamethoxymethyl melamine.

Examples of the urea-based crosslinking agents include bismethoxymethylurea, bisethoxymethylurea, bispropoxymethylurea, and bisbutoxymethylurea. Preferred of these is bismethoxymethylurea.

Examples of the alkylene urea-based crosslinking agents include ethylene urea-based crosslinking agents such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based crosslinking agents such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; 1,3-di(methoxymethyl)-4,5-dihydroxy-2-imidazolidinone; and 1,3-di(methoxymethyl)-4,5-dimethoxy-2-imidazolidinone.

Examples of the glycoluril-based crosslinking agents include mono-, di-, tri-, and/or tetra-hydroxymethylated glycoluril; mono-, di-, tri-, and/or tetra-methoxymethylated glycoluril; mono-, di-, tri-, and/or tetra-ethoxymethylated glycoluril; mono-, di-, tri-, and/or tetra-propoxymethylated glycoluril; and mono-, di-, tri-, and/or tetra-butoxymethylated glycoluril.

Examples of the polyfunctional acrylate compounds include polyfunctional acrylates (e.g., A-TMM-3, A-TMM-3L, A-TMM-3LM-N, A-TMPT, and AD-TMP (trade names) available from Shin-Nakamura Chemical Co., Ltd.); polyethylene glycol diacrylates (e.g., A-200, A-400, and A-600 (trade names) available from Shin-Nakamura Chemical Co., Ltd.); urethane acrylates (e.g., UA-122P, UA-4HA, UA-6HA, UA-6LPA, UA-11003H, UA-53H, UA-4200, UA-200PA, UA-33H, UA-7100, and UA-7200 (trade names) available from Shin-Nakamura Chemical Co., Ltd.); and pentaerythritol tetraacrylate.

The following are examples of preferred polyfunctional acrylate compounds.

[Chem. 41]

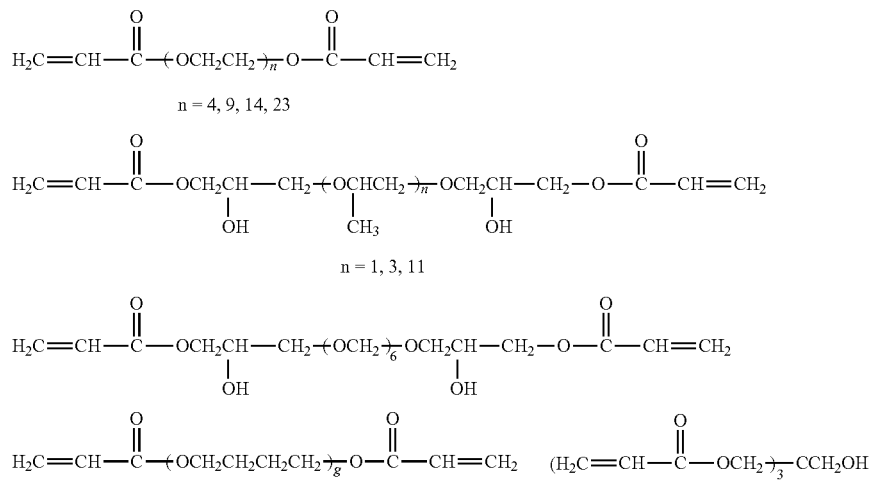

[Chem. 42]

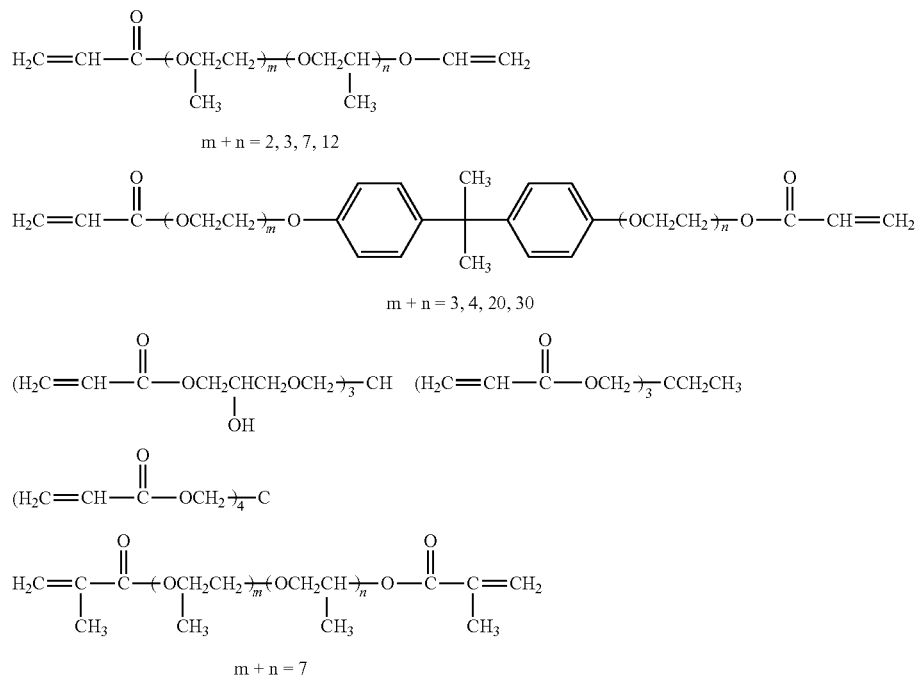

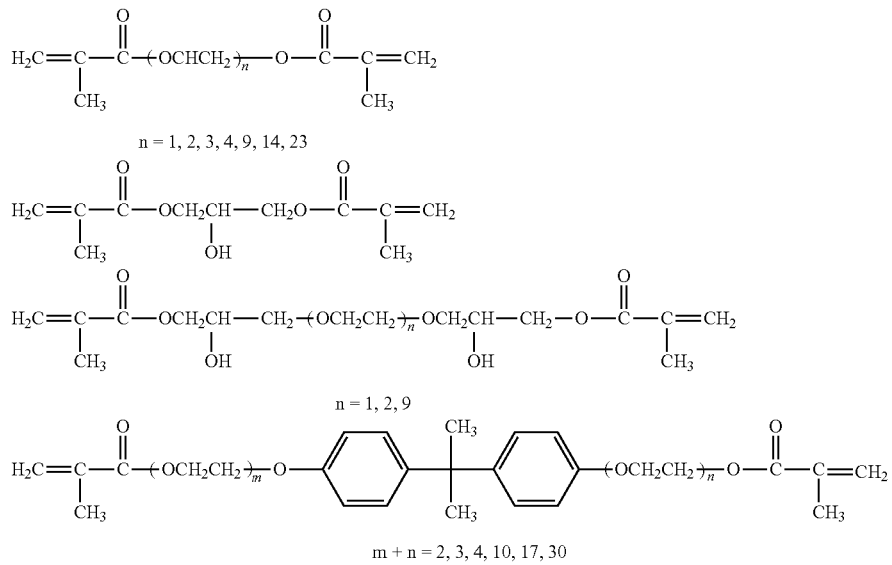

n = 1, 2, 3, 4, 9, 14, 23 n = 1, 2, 9 m + n = 2, 3, 4, 10, 17, 30

The amount of the crosslinking agent in the photosensitive resin composition according to the first embodiment of the present disclosure is preferably 10 parts by mass or more and 300 parts by mass or less, more preferably 50 parts by mass or more and 200 parts by mass or less, relative to 100 parts by mass of the fluororesin (when the photosensitive resin composition contains the later-described alkali-soluble resin, the concentration is the sum including the alkali-soluble resin). When the amount of the crosslinking agent is less than 10 parts by mass, the crosslinking effect tends to be insufficient. When the amount thereof is more than 300 parts by mass, the resolution and sensitivity tend to be low.

<Alkali-Soluble Resin>

When the photosensitive resin composition according to the first embodiment of the present disclosure contains an alkali-soluble resin, it is possible to improve the shape of banks obtainable from the photosensitive resin composition according to the first embodiment of the present disclosure.

Examples of the alkali-soluble resin include alkali-soluble novolac resins.

Alkali-soluble novolac resins can be obtained by condensation of phenol with aldehyde in the presence of an acid catalyst.

Specific examples of the phenol include phenol, o-cresol, m-cresol, p-cresol, 2,3-dimethylphenol, 2,4-dimethylphenol, 2,5-dimethylphenol, 3,4-dimethylphenol, 3,5-dimethylphenol, 2,3,5-trimethylphenol, 3,4,5-trimethylphenol, resorcinol, 2-methylresorcinol, 4-ethylresorcinol, hydroquinone, methylhydroquinone, catechol, 4-methyl-catechol, pyrogallol, phloroglucinol, thymol, and isothymol. These phenols may be used alone or in combination of two or more thereof.

Specific examples of the aldehyde include formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, nitrobenzaldehyde, furfural, glyoxal, glutaraldehyde, terephthalaldehyde, and isophthalaldehyde.

Specific examples of the acid catalyst include hydrochloric acid, nitric acid, sulfuric acid, phosphoric acid, phosphorous acid, formic acid, oxalic acid, acetic acid, methanesulfonic acid, diethyl sulfate, and p-toluenesulfonic acid. These acid catalysts may be used alone or in combination of two or more thereof.

Other examples of the alkali-soluble resin include acid-modified epoxy acrylic resins. Examples of commercially available acid-modified epoxy acrylic resins include CCR-1218H, CCR-1159H, CCR-1222H, CCR-1291H, CCR-1235, PCR-1050, TCR-1335H, UXE-3024, ZAR-1035, ZAR-2001H, ZFR-1185, and ZCR-1569H (trade names) available from Nippon Kayaku Co., Ltd.

The weight average molecular weight of the alkali-soluble resin is preferably 1000 to 50000 in terms of developability and resolution of the photosensitive resin composition.

The amount of the alkali-soluble resin in the photosensitive resin composition according to the first embodiment of the present disclosure is preferably 500 parts by mass or more and 10000 parts by mass or less, more preferably 1000 parts by mass or more and 7000 parts by mass or less, relative to 100 parts by mass of the fluororesin. When the amount of the alkali-soluble resin is more than 10000 parts by mass, the fluororesin according to the first embodiment of the present disclosure tends to have insufficient ink repellency after UV-ozone treatment or oxygen plasma treatment.

<Naphthoquinonediazide Group-Containing Compound>

When the photosensitive resin composition according to the first embodiment of the present disclosure contains a naphthoquinonediazide group-containing compound, it is possible to improve the shape of banks obtainable from the photosensitive resin composition according to the first embodiment of the present disclosure.

Any naphthoquinonediazide group-containing compound can be used, and one commonly used as a photosensitive component of a resist composition for i-rays can be used.

Specific examples of the naphthoquinonediazide group-containing compound include a naphthoquinone-1,2-diazide-4-sulfonate compound, a naphthoquinone-1,2-diazide-5-sulfonate compound, a naphthoquinone-1,2-diazide-6-sulfonate compound, a naphthoquinone-1,2-diazide sulfonate compound, an orthobenzoquinonediazide sulfonate compound, and an orthoanthraquinonediazide sulfonate compound. Preferred of these are a naphthoquinone-1,2-diazide-4-sulfonate compound, a naphthoquinone-1,2-diazide-5-sulfonate compound, and a naphthoquinone-1,2-diazide-6-sulfonate compound, because they have excellent solubility. These compounds may be used alone or in combination of two or more thereof.

The amount of the naphthoquinonediazide group-containing compound in the photosensitive resin composition according to the first embodiment of the present disclosure is preferably 10 parts by mass to 60 parts by mass, more preferably 20 parts by mass to 50 parts by mass, relative to 100 parts by mass of the fluororesin (when the photosensitive resin composition contains the above-described alkali-soluble resin, the concentration is the sum including the alkali-soluble resin). When the amount thereof is more than 60 parts by weight, the photosensitive resin composition tends to lack sensitivity.

<Basic Compound>

The basic compound functions to decrease the diffusion rate of an acid generated by the photoacid generator when the acid is diffused into a film of the photosensitive resin composition according to the first embodiment of the present disclosure.

The presence of the basic compound makes it possible to adjust the acid diffusion distance and improve the shape of banks.

The presence of the basic compound also makes it possible to stably form banks with desired accuracy because the banks are less likely to be deformed even when the banks formed are left to stand for a long time before being exposed.

Examples of the basic compound include aliphatic amines, aromatic amines, heterocyclic amines, and aliphatic polycyclic amines. Preferred of these are aliphatic amines. Specific examples thereof include secondary or tertiary aliphatic amines and alkyl alcohol amines. These basic compounds may be used alone or in combination of two or more thereof.

Examples of the aliphatic amines include alkylamines and alkyl alcohol amines each in which at least one hydrogen atom of ammonia ($NH_3$) is substituted by a C12 or lower alkyl group or a hydroxyalkyl group. Specific examples thereof include trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, tri-n-dodecylamine, dimethylamine, diethylamine, di-n-propylamine, di-n-butylamine, di-n-pentylamine, di-n-hexylamine, di-n-heptylamine, di-n-octylamine, di-n-nonylamine, di-n-decanylamine, di-n-dodecylamine, dicyclohexylamine, methylamine, ethylamine, n-propylamine, n-butylamine, n-pentylamine, n-hexylamine, n-heptylamine, n-octylamine, n-nonylamine, n-decanylamine, n-dodecylamine, diethanolamine, triethanolamine, diisopropanolamine, triisopropanolamine, di-n-octanolamine, and tri-n-octanolamine.

Preferred of these are dialkylamine, trialkylamine, and alkyl alcohol amines. More preferred are alkyl alcohol amines. Particularly preferred of these alkyl alcohol amines are triethanolamine and triisopropanolamine.

Examples of the aromatic amines and heterocyclic amines include aniline and aniline derivatives such as N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine; heterocyclic amines such as 1,5-diazabicyclo[4.3.0]non-5-en, 1,8-diazabicyclo[5.4.0]undec-7-en, 1,4-diazabicyclo[2.2.2]octane, pyridine, bipyridine, 4-dimethylaminopyridine, hexamethylenetetramine, and 4,4-dimethylimidazoline; hindered amines such as bis(1,2,2,6,6-pentamethyl-4-piperidyl)sebacate; alcoholic nitrogen-containing compounds such as 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, and 1-[2-(2-hydroxyethoxy)ethyl]piperazine; and picoline, lutidine, pyrrole, piperidine, piperazine, indole, hexamethylenetetramine, and the like The amount of the basic compound in the photosensitive resin composition according to the first embodiment of the present disclosure is preferably 0.001 parts by mass to 2 parts by mass, more preferably 0.01 parts by mass to 1 part by mass, relative to 100 parts by mass of the fluororesin (when the photosensitive resin composition contains the above-described alkali-soluble resin, the concentration is the sum including the alkali-soluble resin). When the amount of the basic compound is less than 0.001 parts by mass, the effect thereof as an additive tends to be insufficient. When the amount thereof is more than 2 parts by mass, the resolution and sensitivity tend to be low.

<Other Additives>

The photosensitive resin composition according to the first embodiment of the present disclosure may contain other additives if necessary. Examples of the other additives include various additives such as dissolution inhibitors, plasticizers, stabilizers, colorants, surfactants, thickeners, leveling agents, defoamers, compatibility agents, adhesives, and antioxidants.

These other additives may be known ones.

Preferably, the surfactant contains any one or more of fluorine-based surfactants and silicone-based surfactants (fluorine-based surfactants, silicone-based surfactants, and surfactants containing both fluorine atoms and silicon atoms).

Described below is a method of producing a fluororesin cured product using the photosensitive resin composition according to the first embodiment of the present disclosure.

The method of producing a fluororesin cured product according to the first embodiment of the present disclosure includes a baking step of baking the photosensitive resin composition according to the first embodiment of the present disclosure at a temperature of 140° C. or lower for curing.

In this step, preferably, the photosensitive resin composition according to the first embodiment of the present disclosure is baked at 60° C. to 130° C.

The method of producing a fluororesin cured product according to the first embodiment of the present disclosure may include an exposing step of exposing the photosensitive resin composition to high energy rays before the baking step.

Preferably, the high energy rays are at least one type of rays selected from the group consisting of ultraviolet rays, gamma rays, X-rays, and α-rays.

The fluororesin cured product obtained as described above has excellent water repellency and oil repellency owing to its low surface free energy. For example, the fluororesin cured product can be used as a water- and oil-repellent agent for treating fabrics (base materials) for clothes or the like, or a sealing agent for protecting substrates (base materials) for microfabricated semiconductors.

The fluororesin cured product can be used as a material to protect base materials in various applications.

The method of producing a fluororesin cured product according to the first embodiment of the present disclosure may include the following steps: (1-1) a film forming step, (1-2) an exposing step, (1-3) a developing step, and (1-4) a baking step.

Each step is described below.

(1-1) Film Forming Step

First, the photosensitive resin composition according to the first embodiment of the present disclosure is applied to a substrate, and then heated, whereby the photosensitive resin composition is formed into a fluororesin film.

The heating conditions are not limited, but preferably, the heating is performed at 80° C. to 100° C. for 60 to 200 seconds.

This can remove the solvents and the like in the photosensitive resin composition.

The substrate may be a silicon wafer, metal, glass, ITO substrate, or the like.

The substrate may include an organic or inorganic film formed thereon in advance. For example, the substrate may include an underlayer such as an anti-reflective film or a multilayer resist, and the underlayer may have a pattern formed thereon. The substrate may be pre-washed. For example, the substrate may be washed with ultrapure water, acetone, an alcohol (methanol, ethanol, or isopropyl alcohol), or the like.

A known method such as spin coating can be used to apply the photosensitive resin composition according to the first embodiment of the present disclosure to the substrate.

(1-2) Exposing Step

Next, a desired photo mask is set in an exposure device, and the fluororesin film is exposed to high energy rays through the photo mask.

Preferably, the high energy rays are at least one type of rays selected from the group consisting of ultraviolet rays, gamma rays, X-rays, and α-rays.

The exposure of the high energy rays is preferably 1 mJ/cm² or more and 200 mJ/cm² or less, more preferably 10 mJ/cm² or more and 100 mJ/cm² or less.

(1-3) Developing Step

Next, the fluororesin film after the exposing step is developed with an alkaline aqueous solution to obtain a patterned fluororesin film.

Specifically, the exposed or non-exposed portions of the fluororesin film are dissolved in an alkaline aqueous solution to obtain a patterned fluororesin film.

The alkaline aqueous solution may be, for example, a tetramethylammonium hydroxide (TMAH) aqueous solution, a tetrabutylammonium hydroxide (TBAH) aqueous solution, or the like.

When the alkaline aqueous solution is a tetramethylammonium hydroxide (TMAH) aqueous solution, the concentration thereof is preferably 0.1 mass % or more and 5 mass % or less, more preferably 2 mass % or more and 3 mass % or less.

Any known development method, such as dipping, paddling, or spraying, can be used.

The development time (contact time of the developer with the fluororesin film) is preferably 10 seconds or more and 3 minutes or less, more preferably 30 seconds or more and 2 minutes or less.

After development, a step of washing the patterned fluororesin film with deionized water or the like may be included if necessary. Regarding the washing method and washing time, washing for 10 seconds or more and 3 minutes or less is preferred, and washing for 30 seconds or more and 2 minutes or less is more preferred.

(1-4) Baking Step

After the developing step, the patterned fluororesin film is baked at a temperature of 140° C. or lower for curing, whereby a fluororesin cured product is obtained.

The baking can be performed on a hot plate. Preferably, the baking conditions are 60° C. to 130° C. for 10 to 120 minutes.

The fluororesin cured product produced as described above can be used as banks for displays such as organic EL displays, micro-LED displays, and quantum dot displays.

In other words, the method of producing a fluororesin cured product according to the first embodiment of the present disclosure can also produce banks for displays such as organic EL displays, micro-LED displays, and quantum dot displays.

The method of producing a fluororesin cured product according to the first embodiment of the present disclosure can cure a photosensitive resin composition at low temperatures. Thus, the method of producing a fluororesin cured product according to the first embodiment of the present disclosure can produce banks for displays such as organic EL displays, micro-LED displays, and quantum dot displays, without causing significant thermal damage on luminescent layers.

In the method of producing a fluororesin cured product according to the first embodiment of the present disclosure, UV-ozone treatment or oxygen plasma treatment may be performed after the baking step (1-4). Of these, UV-ozone treatment is preferred.

With this treatment, residual organic matter in recesses of the patterned fluororesin film can be removed, and uneven wetting of the ink dropped is reduced. This can prevent defects in display elements.

Examples According to the First Embodiment

The first embodiment of the present disclosure is described in detail below with reference to examples but the present disclosure is not limited to these examples.

1. Synthesis of Monomers

[Synthesis Example 1-1] Synthesis of 1,1-bistrifluoromethylbutadiene (BTFBE)

A 1000-ml glass flask equipped with a stirrer was charged with concentrated sulfuric acid (400 g) and heated to 100° C. Then, 1,1,1-trifluoro-2-trifluoromethyl-4-penten-2-ol (300 g) was gradually dropped thereto over one hour. After dropping, the mixture was stirred at 100° C. for 60 minutes. No residual raw materials were detected by ¹⁹F-NMR analysis of the reaction solution. Then, a fraction at 68° C. to 70° C. was collected by atmospheric distillation from the reaction solution, whereby 1,1-bistrifluoromethylbutadiene (hereinafter described as BTFBE) was obtained (yield: 58%).

Presumably, the following chemical reaction occurred in this reaction.

[Chem. 44]

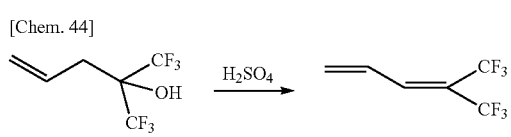

<Results of NMR Analysis>

The following results were obtained by NMR analysis of the BTFBE synthesized.

$^1$H-NMR (solvent: deuterated chloroform; standard substance: TMS); δ (ppm) 5.95 (1H, dd) 6.05 (1H, dd), 6.85 (1H, m), 7.04 (1H, m)

$^{19}$F-NMR (solvent: deuterated chloroform; standard substance: $C_6D_6$); δ (ppm) −65.3 (3F, m), −58.4 (3F, m)

[Synthesis Example 1-2] Synthesis of 4-hydroxystyrene (p-HO-St)

A 1000-ml glass flask equipped with a stirrer was charged at room temperature (about 20° C.) with p-acetoxystyrene (a product of Tokyo Chemical Industry Co., Ltd., hereinafter described as p-AcO-St) (100 g) and methanol (300 g), which were mixed therein, and 1,3,5-trihydroxybenzene (0.50 g; equivalent to 0.5 mass % of p-AcO-St) as a polymerization inhibitor was added to the mixture. Then, after the solution was cooled to 0° C. in an ice bath, a sodium hydroxide aqueous solution having a concentration of 12 mass % (corresponding to 1.0 equivalent of p-AcO-St) was gradually dropped over 40 minutes, followed by stirring at 0° C. for 30 minutes. No residual raw materials were detected by $^1$H-NMR analysis of the reaction solution. Then, a hydrochloric acid aqueous solution having a concentration of 18 mass % (corresponding to 0.8 equivalents of p-AcO-St) was dropped over 30 minutes, followed by stirring for 30 minutes. The pH of the solution was measured to be 6.

The resulting reaction solution was subjected to extraction with methyl-t-butylether (360 g) at room temperature (about 20° C.), followed by washing twice with purified water (330 g). To the resulting organic layer was added 1,3,5-trihydroxybenzene in an amount equivalent to 1 mass % of 4-hydroxystyrene. Subsequently, 4-hydroxystyrene was concentrated to 72 mass %, and added to n-octane (a poor solvent) cooled to 0° C. Then, the solution was placed in an ice bath and stirred for one hour to precipitate crystals of 4-hydroxystyrene. The crystals were filtered and further washed with n-octane. Then, the crystals were vacuum dried at 25° C. Thus, white crystals of 4-hydroxystyrene (hereinafter described as p-HO-St) were obtained (yield: 66%).

Presumably, the following chemical reaction occurred in this reaction.

[Chem. 45]

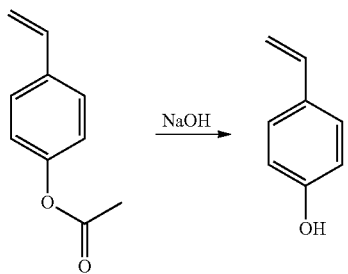

2. Production of Fluororesin (First Step: Polymerization)
[Measurement of Molar Ratio of Repeating Units] NMR The molar ratio of the repeating units of the polymer was determined from the measurements of $^1$H-NMR, $^{19}$F-NMR, or $^{13}$C-NMR.

[Measurement of Polymer Molecular Weight] GPC

The weight average molecular weight Mw and the molecular weight dispersity (Mw/Mn: ratio of the weight average molecular weight Mw to the number average molecular weight Mn) of the polymer were measured by a high-speed gel permeation chromatograph (hereinafter sometimes referred to as GPC; model: HLC-8320 GPC available from Tosoh Corporation) with an ALPHA-M column and an ALPHA-2500 column (both available from Tosoh Corporation) connected in series, using tetrahydrofuran (THF) as a developing solvent and polystyrene as a standard substance. A refractive index difference detector was used.

2-1. Polymerization of Fluororesin Precursors

[Synthesis of Fluororesin Precursor 1-1]

A 300-ml glass flask equipped with a stirrer was charged at room temperature (about 20° C.) with BTFBE obtained in Synthesis Example 1-1 (9.5 g (0.05 mol)), 2-hydroxyethyl methacrylate (a product of Tokyo Chemical Industry Co., Ltd., hereinafter described as HEMA) (13.1 g (0.10 mol)), 2-(perfluorohexyl)ethyl methacrylate (a product of Tokyo Chemical Industry Co., Ltd., hereinafter described as MA-C6F) (43.2 g (0.1 mol)), p-HO-St obtained in Synthesis Example 1-2 (9.0 g (0.075 mol)), and MEK (70 g). Then, 2,2'-azobis(2-methylbutyronitrile) (a product of Tokyo Chemical Industry Co., Ltd., hereinafter described as AIBN) (1.6 g (0.005 mol)) was added thereto, followed by degassing with stirring. Subsequently, the flask was purged with nitrogen gas, and the temperature inside the flask was raised to 75° C. for reaction for six hours. n-Heptane (380 g) was dropped into the reaction system, whereby a transparent viscous substance was precipitated. This viscous substance was isolated by decantation. Vacuum drying was performed at 60° C. Thus, a fluororesin precursor 1-1 as a transparent viscous substance was obtained (67 g; yield: 90%).

<Results of NMR Measurement>

The fluororesin precursor 1-1 was subjected to NMR analysis. The ratio (molar ratio) of "Repeating units of the fluororesin precursor 1-1" below was as follows: BTFBE repeating unit:HEMA repeating unit:MA-C6F repeating unit:p-HO-St repeating unit=20:28:30:22.

[Chem. 46]

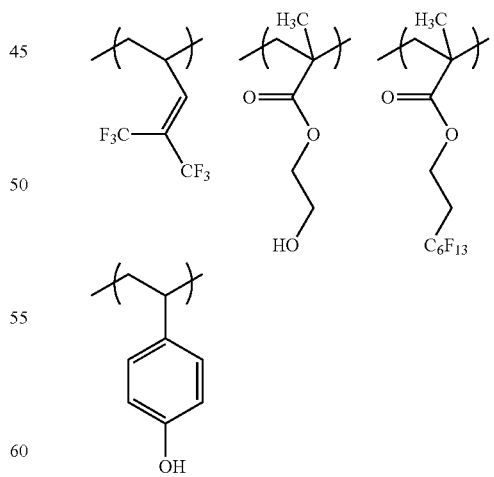

Repeating Units of the Fluororesin Precursor 1-1

<Results of GPC Measurement>

The fluororesin precursor 1-1 was subjected to GPC measurement. As a result, Mw was 6700, and Mw/Mn was 1.3.

[Synthesis of Fluororesin Precursor 1-2]

The same procedure as in the synthesis of the fluororesin precursor 1-1 was performed, except that p-HO-St was replaced by vinyl benzoic acid (a product of Tokyo Chemical Industry Co., Ltd., hereinafter described as VBA) Thus, a fluororesin precursor 1-2 containing the following repeating units was obtained (yield: 91%).

<Results of NMR Measurement>

The fluororesin precursor 1-2 was subjected to NMR analysis. The ratio (molar ratio) of "Repeating units of fluororesin precursor 1-2" below was as follows: BTFBE repeating unit:HEMA repeating unit:MA-C6F repeating unit:VBA repeating unit=19:27:31:23.

[Chem. 47]

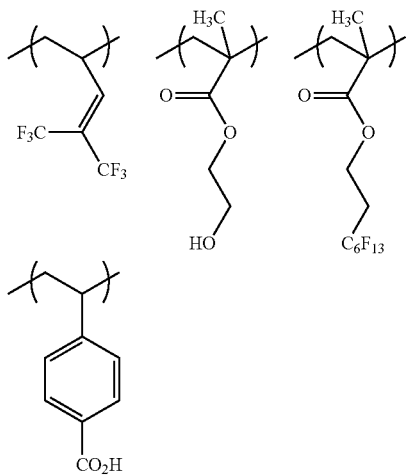
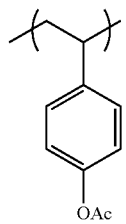

Repeating Units of Fluororesin Precursor 1-2

<Results of GPC Measurement>

The fluororesin precursor 1-2 was subjected to GPC measurement. As a result, Mw was 6900, and Mw/Mn was 1.3.

[Synthesis of Fluororesin Precursor 1-3]

The same procedure as in the synthesis of the fluororesin precursor 1-1 was performed, except that p-HO-St was replaced by p-acetoxystyrene (a product of Tokyo Chemical Industry Co., Ltd., hereinafter described as p-AcO-St). Thus, a fluororesin precursor 1-3 containing the following repeating units was obtained (yield: 88%).

<Results of NMR Measurement>

The fluororesin precursor 1-3 was subjected to NMR analysis. The ratio (molar ratio) of "Repeating units of fluororesin precursor 1-3" below was as follows: BTFBE repeating unit:HEMA repeating unit:MA-C6F repeating unit:p-AcO-St repeating unit=15:33:30:22.

[Chem. 48]

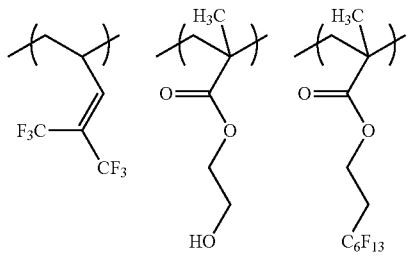

Repeating Units of Fluororesin Precursor 1-3

<Results of GPC Measurement>

The fluororesin precursor 1-3 was subjected to GPC measurement. As a result, Mw was 7100, and Mw/Mn was 1.3.

[Synthesis of Fluororesin Precursor 1-4]

The same procedure as in the synthesis of the fluororesin precursor 1-1 was performed, except that p-HO-St was replaced by styrene (a product of Tokyo Chemical Industry Co., Ltd., hereinafter described as St). Thus, a fluororesin precursor 1-4 containing the following repeating units was obtained (yield: 90%).

<Results of NMR Measurement>

The fluororesin precursor 1-4 was subjected to NMR analysis. The ratio (molar ratio) of "Repeating units of fluororesin precursor 1-4" below was as follows: BTFBE repeating unit:HEMA repeating unit:MA-C6F repeating unit:St repeating unit=16:34:29:21.

[Chem. 49]

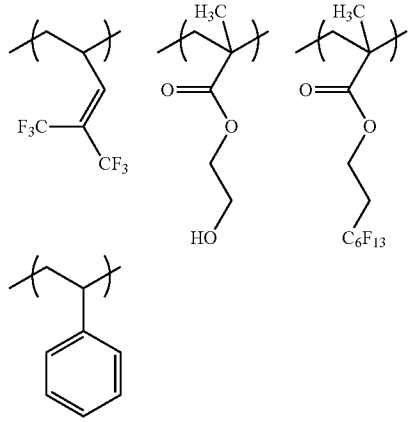

Repeating Units of Fluororesin Precursor 1-4

<Results of GPC Measurement>

The fluororesin precursor 1-4 was subjected to GPC measurement. As a result, Mw was 7400, and Mw/Mn was 1.3.

[Synthesis of Fluororesin Precursor 1-5]

A 300-ml glass flask equipped with a stirrer was charged at room temperature with HEMA (13.01 g (0.1 mol)), MA-C6F (43.2 g (0.1 mol)), hexafluoro-2-propyl methacrylate (HFIP-M) (23.6 g (0.1 mol)), methyl methacrylate (MAA) (8.66 g (0.1 mol)), and MEK (88 g). Then, AIBN (1.6 g (0.010 mol)) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (530 g), whereby a white precipitate was obtained. The precipitate was filtered and vacuum dried at 60° C., whereby a fluororesin precursor 5 as a white solid was obtained (60 g; yield: 66%).
<Results of NMR Measurement>
The fluororesin precursor 1-5 was subjected to NMR analysis. The ratio (molar ratio) of "Repeating units of fluororesin precursor 1-5" below was as follows: HEMA repeating unit:MA-C6F repeating unit:HFIP-M repeating unit:MAA repeating unit=25:25:24:26.

[Chem. 50]

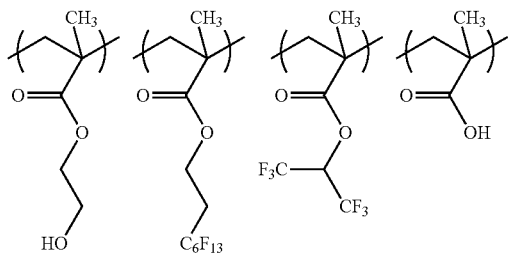

Repeating Units of Fluororesin Precursor 1-5
<Results of GPC Measurement>
The fluororesin precursor 1-5 was subjected to GPC measurement. As a result, Mw was 10300, and Mw/Mn was 1.4.
[Synthesis of Fluororesin Precursor 1-6]
A 300-ml glass flask equipped with a stirrer was charged at room temperature (about 20° C.) with HEMA (13.1 g (0.10 mol)), MA-C6F (43.2 g (0.10 mol)), VBA (11.1 g (0.075 mol)), and MEK (75 g). Then, 2,2'-azobis(2-methylbutyronitrile) (a product of Tokyo Chemical Industry Co., Ltd., hereinafter described as AIBN) (1.6 g (0.005 mol)) was added thereto, followed by degassing with stirring. Subsequently, the flask was purged with nitrogen gas, and the temperature inside the flask was raised to 75° C. for reaction for six hours. n-Heptane (400 g) was dropped into the reaction system, whereby a transparent viscous substance was precipitated. This viscous substance was isolated by decantation. Vacuum drying was performed at 60° C. Thus, a fluororesin precursor 1-6 as a transparent viscous substance was obtained (56 g: yield: 83%).
<Results of NMR Measurement>
The fluororesin precursor 1-6 was subjected to NMR analysis. The ratio (molar ratio) of "Repeating units of fluororesin precursor 1-6" below was as follows: HEMA repeating unit:MA-C6F repeating unit:VBA repeating unit=33:32:35.

[Chem. 51]

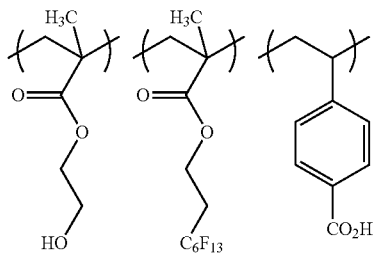

Repeating Units of Fluororesin Precursor 1-6
<Results of GPC Measurement>
The fluororesin precursor 1-6 was subjected to GPC measurement. As a result, Mw was 14300, and Mw/Mn was 1.6.
2-2. Synthesis of Comparative Fluororesin Precursor Comparative Polymerization Example 1-1

A 300-ml glass flask equipped with a stirrer was charged at room temperature (about 20° C.) with HEMA (13.1 g (0.10 mol)), MA-C6F (43.2 g (0.1 mol)), normal-butyl methacrylate (hereinafter abbreviated as MA-nBu) (14.2 g (0.1 mol)), and MEK (71 g). Then, AIBN (0.8 g (0.005 mol)) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (500 g), whereby a white precipitate was obtained. The precipitate was filtered and vacuum dried at 60° C., whereby a comparative fluororesin precursor 1-1 as a white solid was obtained (49.3 g; yield: 70%).
<Results of NMR Measurement>
The comparative fluororesin precursor 1-1 was subjected to NMR analysis. The ratio (molar ratio) of "Repeating units of comparative fluororesin precursor 1-1" below was as follows: HEMA repeating unit:MA-C6F repeating unit:MA-nBu repeating unit=35:32:33.

[Chem. 52]

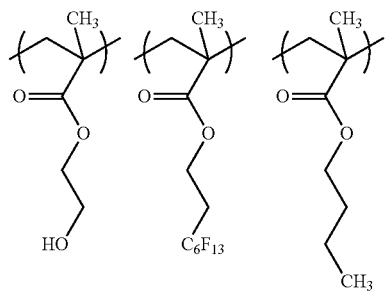

Repeating Units of Comparative Fluororesin Precursor 1-1
<Results of GPC Measurement>
The comparative fluororesin precursor 1-1 was subjected to GPC measurement. As a result, Mw was 10700, and Mw/Mn was 1.7.

Comparative Polymerization Example 1-2

The same procedure as in the synthesis of the comparative fluororesin precursor 1-1 was performed, except that MA-nBu was replaced by p-AcO-St. Thus, a comparative fluororesin precursor 1-2 containing the following repeating units was obtained (yield: 74%).
<Results of NMR Measurement>
The comparative fluororesin precursor 1-2 was subjected to NMR analysis. The ratio (molar ratio) of "Repeating units of comparative fluororesin precursor 1-2" was as follows: HEMA repeating unit:MA-C6F repeating unit:p-AcO-St repeating unit=33:34:33.

[Chem. 53]

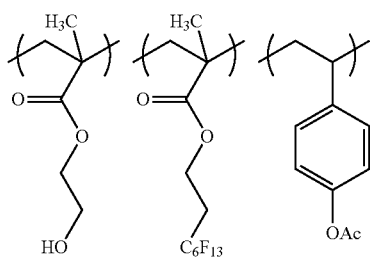

Repeating Units of Comparative Fluororesin Precursor 1-2
<Results of GPC Measurement>

The comparative fluororesin precursor 1-2 was subjected to GPC measurement. As a result, Mw was 15300, and Mw/Mn was 1.7.

Comparative Polymerization Example 1-3

The same procedure as in the synthesis of the comparative fluororesin precursor 1-1 was performed, except that MA-nBu was replaced by p-HO-St. Thus, a comparative fluororesin precursor 1-3 containing the following repeating units was obtained (yield: 75%).
<Results of NMR Measurement>

The comparative fluororesin precursor 1-3 was subjected to NMR analysis. The ratio (molar ratio) of "Repeating units of comparative fluororesin precursor 1-3" was as follows: HEMA repeating unit:MA-C6F repeating unit:p-HO-St repeating unit=34:32:34.

[Chem. 54]

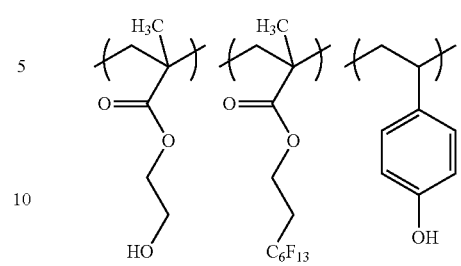

Repeating Units of Comparative Fluororesin Precursor 1-13
<Results of GPC Measurement>

The comparative fluororesin precursor 1-3 was subjected to GPC measurement. As a result, Mw was 12300, and Mw/Mn was 1.6.

Table 1-1 shows the repeating units of the resulting fluororesin precursors and comparative fluororesin precursors, molar ratio of the repeating units, and weight average molecular weight (Mw), molecular weight distribution (Mw/Mn), yield, and fluorine content (%) of each of the fluororesin precursors and comparative fluororesin precursors. The fluorine content was determined by calculating the weight ratio of the repeating units from the molar ratio after polymerization of the monomers and calculating the weight percentage of fluorine atoms constituting the monomers.

TABLE 1-1

| Polymer | Composition (repeating units) (molar ratio) | | | | Molecular weight | | Yield (%) | Fluorine content (%) |
|---|---|---|---|---|---|---|---|---|
| | 1-1 | 1-2 | 1-3 | 1-4 | Mw | Mw/Mn | | |
| Fluororesin precursor 1-1 | BTFBE 20 | HEMA 28 | MA-C6F 30 | p-HO-St 22 | 6,700 | 1.3 | 90 | 42 |
| Fluororesin precursor 1-2 | BTFBE 19 | HEMA 27 | MA-C6F 31 | VBA 23 | 6,900 | 1.3 | 91 | 41 |
| Fluororesin precursor 1-3 | BTFBE 15 | HEMA 33 | MA-C6F 30 | p-AcO-St 22 | 7,100 | 1.3 | 88 | 38.5 |
| Fluororesin precursor 1-4 | BTFBE 16 | HEMA 34 | MA-C6F 29 | St 21 | 7,400 | 1.3 | 90 | 40 |
| Fluororesin precursor 1-5 | — | HEMA 26 | MA-C6F 33 HFIP-M 16 | MAA 54 | 10,300 | 1.4 | 66 | 38 |
| Fluororesin precursor 1-6 | — | HEMA 33 | MA-C6F 32 | VBA 35 | 14,300 | 1.6 | 83 | 34 |
| Comparative fluororesin precursor 1-1 | — | HEMA 35 | MA-C6F 32 | MA-nBu 33 | 10,700 | 1.7 | 70 | 34 |
| Comparative fluororesin precursor 1-2 | — | HEMA 33 | MA-C6F 34 | p-AcO-St 33 | 15,300 | 1.7 | 74 | 34.5 |
| Comparative fluororesin precursor 1-3 | — | HEMA 34 | MA-C6F 32 | p-HO-St 34 | 12,300 | 1.6 | 75 | 36.5 |

3. Production of Fluororesin (Second Step: Addition Reaction)

The fluororesin precursors and comparative fluororesin precursors obtained in "2. Production of fluororesin (first step: polymerization)" were each reacted with an acrylic acid derivative, whereby fluororesins were synthesized. The acrylic acid derivative was 2-isocyanatoethyl acrylate (trade name: KarenzAOI, a product of Showa Denko K.K.) represented by the following formula. This reaction is an addition reaction of hydroxy groups of each fluororesin precursor and the acrylic acid derivative.

Described below are fluororesin synthesis examples. The resulting fluororesins were named as follows.

the fluororesin precursor 1-1 used (i.e., same as before the introduction of the crosslinking group). The newly formed bond ($W^2$ in the formula (4)) was "—O—C(=O)—NH—".
[Synthesis of Fluororesins 1-2-A (100) to 1-6-A (100) and Comparative Fluororesins 1-1-A (100) to 1-3-A (100)]

Fluororesins 1-2-A (100) to 1-6A (100) and comparative fluororesins 1-1-A (100) to 1-3-A (100) were synthesized as in the fluororesin 1-1-A (100). Table 1-2 shows the fluororesin precursors used, ratio of acrylic acid derivative introduced, crosslinking group structure formed ($W^{1-2}$ in the formula (1-4)), amount of crosslinking groups introduced (reaction rate), amount of residual hydroxy groups (non-reaction rate), weight average molecular weight (Mw), and molecular weight distribution (Mw/Mn).

TABLE 1-2

| | | | Ratio of acrylic acid derivative introduced (molar ratio) | | | | |
|---|---|---|---|---|---|---|---|
| Fluororesin No. | Fluororesin precursor No. | Formed bond ($W^{1-2}$ in formula (1-4)) | Amount of acrylic acid derivative introduced (reaction rate %) | Amount of residual hydroxy groups (non-reaction rate %) | Molecular weight Mw | Mw/Mn | Fluorine content (%) |
| 1-1-A (100) | 1-1 | —O—C(=O)—NH— | 99 | 1 | 8,200 | 1.3 | 36 |
| 1-2-A (100) | 1-2 | —O—C(=O)—NH— | 98 | 2 | 8,400 | 1.3 | 35 |
| 1-3-A (100) | 1-3 | —O—C(=O)—NH— | 99 | 1 | 8,600 | 1.3 | 32 |
| 1-4-A (100) | 1-4 | —O—C(=O)—NH— | 98 | 2 | 9,000 | 1.3 | 33 |
| 1-5-A (100) | 1-5 | —O—C(=O)—NH— | 98 | 2 | 12,100 | 1.4 | 34 |
| 1-6-A (100) | 1-6 | —O—C(=O)—NH— | 97 | 3 | 16,200 | 1.7 | 28 |
| Comparative 1-1-A (100) | Comparative 1-1 | —O—C(=O)—NH— | 98 | 2 | 12,600 | 1.8 | 28 |
| Comparative 1-2-A (100) | Comparative 1-2 | —O—C(=O)—NH— | 99 | 1 | 18,200 | 1.7 | 29 |
| Comparative 1-3-A (100) | Comparative 1-3 | —O—C(=O)—NH— | 98 | 2 | 14,300 | 1.7 | 31 |

The first number represents the number of the fluororesin precursor. The subsequent alphabet letter represents the acrylic acid derivative used. KarenzAOI is represented by "A". The last number in the parenthesis indicates the nominal amount of acrylic acid derivative introduced (molar ratio) relative to the resin precursor.

[Chem. 55]

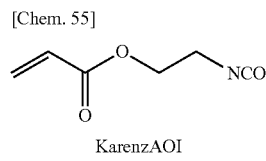

KarenzAOI

[Synthesis of Fluororesin 1-1-A (100)]

A 300-ml glass flask equipped with a stirrer was charged with the fluororesin precursor 1-1 (10 g (hydroxy equivalent: 0.0115 mol)) and PGMEA (30 g). Then, KarenzAOI (1.62 g (0.0114 mol)) was added thereto, and a reaction was carried out at 45° C. for eight hours. After completion of the reaction, the reaction solution was concentrated, and n-heptane (150 g) was then added to obtain a precipitate. The precipitate was filtered and vacuum dried at 35° C., whereby a fluororesin 1-1-A (100) as a white solid was obtained (11.1 g; yield: 95%).
<Results of NMR Measurement>

In the fluororesin 1-1-A (100), the molar ratio of the amount of KarenzAOI-derived acrylic acid derivative introduced (reaction rate) to the amount of residual hydroxy groups (non-reaction rate) was 99:1. The ratio of the repeating units (BTFBE repeating unit, MA-C6F repeating unit, and p-HO-St repeating unit) that do not react with a crosslinking group site was found to be unchanged from that in 4. Evaluation of Low-Temperature Curing of Each Cured Fluororesin Film
[Formation of Photocurable Fluororesin Compositions 1-1 to 1-6 and Comparative Photocurable Fluororesin Compositions 1-1 to 1-3]

The fluororesins and comparative fluororesins produced (10 parts, each) were each mixed with a solvent (75 parts), a photopolymerization initiator (5 parts), and a crosslinking agent (10 parts), and the resulting solutions were filtered through a 0.2-μm membrane filter, whereby curable fluororesin compositions 1-1 to 1-6 and comparative curable fluororesin compositions 1-1 to 1-3 were prepared.

The following solvent, photopolymerization initiator, and crosslinking agent were used.
Solvent: propylene glycol monomethyl ether acetate (PGMEA)
Photopolymerization initiator: Irgacure 369 (available from BASF)
Crosslinking agent: pentaerythritol tetraacrylate (available from Tokyo Chemical Industry Co., Ltd.)
[Formation of Fluororesin Films 1-1 to 1-6 and Comparative Fluororesin Films 1-1 to 1-3]

The curable fluororesin compositions 1-1 to 1-6 and comparative curable fluororesin compositions 1-1 to 1-3 prepared were each applied to a silicon wafer using a spin coater at a rotation speed of 1000 rpm. Subsequently, each curable fluororesin composition was heated on a hot plate at 90° C. for 150 seconds to remove the solvent, whereby fluororesin films 1-1 to 1-6 and comparative fluororesin films 1-1 to 1-3 were each formed on the silicon wafer.
[Evaluation of Cured Fluororesin Film by Low-Temperature Curing Method]

The resulting resin films were each entirely exposed (200 mJ/cm$^2$) to i-rays (wavelength: 365 nm) using a mask aligner (available from SUSS MicroTec Group) without a mask.

The films after exposure were subjected to comparison between a method (i) of forming a cured fluororesin film by curing at high temperatures (a method of heating at 230° C. for one hour) and the following methods (ii) to (iv) of forming a cured fluororesin film by curing at low temperatures.

(ii): Method of heating at 90° C. for one hour (iii): Method of heating at 90° C. for one hour after the resin film is entirely exposed to i-rays (wavelength: 365 nm) for additional exposure (2000 mJ/cm$^2$) using the mask aligner without a mask (iv): Method of heating at 90° C. for one hour after the resin film is entirely exposed to UV-ozone for five minutes using a UV-ozone treatment device (available from Sen Lights Corporation; model number: L17-110)

Each cured fluororesin film was evaluated for degree of curing by the degree of temporal change in contact angle with respect to anisole (a solvent for quantum dot color filters) at 1 second and 10 seconds after dropping of anisole.

After the thickness of the cured fluororesin film was measured in advance, a silicon substrate having the cured film on its surface was immersed in anisole in a petri dish, and heated on a hot plate at 140° C. for 10 minutes. Subsequently, anisole on the surface of the cured film was sufficiently removed by an air gun, and the thickness was measured again. The cured film was evaluated by film thickness change before and after immersion in anisole.

The cured fluororesin film obtained by the method (i) of curing at high temperatures was used as reference. Cured fluororesin films with comparable evaluation results were determined as "good", and the rest were determined as "poor". Specifically, less temporal change in contact angle with respect to anisole is better, and less film thickness change after immersion in anisole is better.

[Contact Angle Measurement]

With a contact angle meter "DMs-601" available from Kyowa Interface Science Co., Ltd., each cured fluororesin film surface and each comparative cured fluororesin film surface were subjected to contact angle measurement with respect to anisole.

[Film Thickness Measurement]

Using a stylus-type surface shape measuring instrument "Dektak-8" available from Bruker Nano, the thickness of each cured fluororesin film and the thickness of each comparative cured fluororesin film were measured before and after immersion in anisole.

Table 1-3 shows the results.

TABLE 1-3

| Cured fluororesin film | (i) (Reference example) | | | | (ii) | | | | (iii) | | | | (iv) | | | |
|---|---|---|---|---|---|---|---|---|---|---|---|---|---|---|---|---|
| | Contact angle (°) | | Film thickness (nm) | | Contact angle (°) | | Film thickness (nm) | | Contact angle (°) | | Film thickness (nm) | | Contact angle (°) | | Film thickness (nm) | |
| | 1 s | 10 s | Before | After | 1 s | 10 s | Before | After | 1 s | 10 s | Before | After | 1 s | 10 s | Before | After |
| 1-1 | 61.0 | 60.8 | 1210 | 1210 | 61.0 | 48.5 | 1230 | 870 | 60.5 | 47.8 | 1200 | 810 | 61.2 | 61.2 | 1250 | 1250 |
| 1-2 | 70.0 | 69.8 | 1190 | 1190 | 65.0 | 64.5 | 1210 | 1200 | 66.0 | 65.6 | 1190 | 1190 | 70.1 | 69.8 | 1230 | 1220 |
| 1-3 | 66.1 | 65.8 | 1200 | 1200 | 57.0 | 38.0 | 1230 | 840 | 57.0 | 38.0 | 1250 | 830 | 66.0 | 65.9 | 1180 | 1170 |
| 1-4 | 66.2 | 66.0 | 1230 | 1220 | 63.1 | 42.7 | 1250 | 650 | 64.5 | 41.7 | 1230 | 650 | 67.2 | 67.0 | 1200 | 1190 |
| 1-5 | 60.1 | 59.9 | 1180 | 1170 | 65.0 | 63.5 | 1270 | 1250 | 64.2 | 63.6 | 1230 | 1230 | 60.0 | 59.8 | 1230 | 1230 |
| 1-6 | 67.1 | 67.0 | 1160 | 1160 | 63.1 | 62.3 | 1250 | 1240 | 63.5 | 62.8 | 1200 | 1190 | 66.3 | 66.3 | 1180 | 1170 |
| Comparative 1-1 | 61.3 | 61.0 | 1180 | 1170 | 65.0 | 34.3 | 1160 | 320 | 63.2 | 33.1 | 1230 | 300 | 35.2 | 20.2 | 1050 | 320 |
| Comparative 1-2 | 64.5 | 63.8 | 1190 | 1180 | 67.2 | 43.1 | 1150 | 410 | 65.2 | 41.8 | 1210 | 420 | 32.1 | 18.6 | 1080 | 380 |
| Comparative 1-3 | 62.5 | 62.1 | 1160 | 1160 | 68.1 | 45.3 | 1190 | 330 | 67.2 | 45.4 | 1190 | 350 | 28.3 | 13.9 | 1120 | 280 |

According to the results, the cured fluororesin films 1-1 to 1-6 formed by the method (iv) were comparable to those of the cured fluororesin films obtained by the method (i) (reference). This confirmed sufficient curing even at low temperatures.

Regarding the cured fluororesin films formed by the methods (ii) and (iii), the cured fluororesin films 1-2, 1-5, and 1-6 showed good results.

In contrast, the comparative cured fluororesin films 1-1 to 1-3 were poor with a significant temporal decrease in contact angle with respect to anisole and a significant decrease in film thickness after immersion in anisole, as compared to the cured fluororesin films formed by the method (i) (reference). Anisole after being used for immersion was concentrated by an evaporator and the resulting oily matter was analyzed, with the result that each fluororesin was detected. This confirmed that these fluororesins were dissolved in anisole due to insufficient curing.

5. Preparation of Photosensitive Resin Compositions

[Preparation of Photosensitive Resin Compositions 1-1 to 1-10 and Comparative Photosensitive Resin Compositions 1-1 to 1-6]

The fluororesins or comparative fluororesins produced above, solvents, photopolymerization initiators, crosslinking agents, and alkali-soluble resins were blended according to Table 1-4. The resulting solutions were filtered through a 0.2-μm membrane filter, whereby photosensitive resin compositions 1 to 10 and comparative photosensitive resin compositions 1 to 6 were prepared.

The following solvents, photopolymerization initiators, crosslinking agents, and alkali-soluble resins were used.

Solvents:
S-1: propylene glycol monomethyl ether acetate (PGMEA); S-2: γ-butyrolactone; S-3: propylene glycol monomethyl ether (PGME); S-4: methyl ethyl ketone; S-5: ethyl lactate Photopolymerization Initiators:
Ini-1: 4-benzoylbenzoic acid; Ini-2: Irgacure 651 (available from BASF); Ini-3: Irgacure 369 (available from BASF)

Crosslinking Agents:
CL-1: pentaerythritol tetraacrylate (available from Tokyo Chemical Industry Co., Ltd.); CL-2: A-TMM-3 (available from Shin-Nakamura Chemical Co., Ltd.)

Alkali-Soluble Resins:
ASP-1: CCR-1235 (available from Nippon Kayaku Co., Ltd.)
ASP-2: ZCR-1569H (available from Nippon Kayaku Co., Ltd.)

TABLE 1-4

| Photosensitive resin composition No. | Fuororesin | | Solvent | | Photopolymerization initiator | | Crosslinking agent | | Alkali-soluble resin | |
|---|---|---|---|---|---|---|---|---|---|---|
| | Type | Parts by mass | Type | Parts by mass | Type | Parts by mass | Type | Parts by mass | Type | Parts by mass |
| 1-1 | 1-1-A (100) | 1.0 | S-1 | 70 | Ini-2 | 1.5 | CL-1 | 10 | ASP-1 | 10 |
| | | | S-3 | 30 | | | | | | |
| 1-2 | 1-1-A (100) | 1.0 | S-1 | 70 | Ini-2 | 1.5 | CL-2 | 10 | ASP-2 | 10 |
| | | | S-2 | 30 | | | | | | |
| 1-3 | 1-2-A (100) | 1.0 | S-1 | 65 | Ini-1 | 1.5 | CL-1 | 10 | ASP-1 | 10 |
| | | | S-3 | 35 | | | | | | |
| 1-4 | 1-2-A (100) | 1.0 | S-1 | 65 | Ini-2 | 1.5 | CL-2 | 10 | ASP-2 | 10 |
| | | | S-4 | 35 | | | | | | |
| 1-5 | 1-3-A (100) | 1.0 | S-1 | 70 | Ini-2 | 1.5 | CL-1 | 10 | ASP-1 | 10 |
| | | | S-3 | 30 | | | | | | |
| 1-6 | 1-3-A (100) | 1.0 | S-1 | 65 | Ini-3 | 1.5 | CL-2 | 10 | ASP-2 | 10 |
| | | | S-5 | 35 | | | | | | |
| 1-7 | 1-4-A (100) | 1.0 | S-1 | 65 | Ini-2 | 1.5 | CL-1 | 10 | ASP-1 | 10 |
| | | | S-3 | 35 | | | | | | |
| 1-8 | 1-4-A (100) | 1.0 | S-3 | 70 | Ini-3 | 1.5 | CL-2 | 10 | ASP-2 | 10 |
| | | | S-5 | 30 | | | | | | |
| 1-9 | 1-5-A (100) | 1.0 | S-1 | 65 | Ini-2 | 1.5 | CL-1 | 10 | ASP-2 | 10 |
| | | | S-3 | 35 | | | | | | |
| 1-10 | 1-6-A (100) | 1.0 | S-1 | 70 | Ini-2 | 1.5 | CL-2 | 10 | ASP-2 | 10 |
| | | | S-3 | 30 | | | | | | |
| Comparative 1-1 | Comparative 1-1-A (100) | 1.0 | S-1 | 70 | Ini-2 | 1.5 | CL-1 | 10 | ASP-1 | 10 |
| | | | S-3 | 30 | | | | | | |
| Comparative 1-2 | Comparative 1-1-A (100) | 1.0 | S-1 | 55 | Ini-3 | 1.5 | CL-2 | 10 | ASP-2 | 10 |
| | | | S-3 | 45 | | | | | | |
| Comparative 1-3 | Comparative 1-2-A (100) | 1.0 | S-1 | 70 | Ini-3 | 1.5 | CL-1 | 10 | ASP-1 | 10 |
| | | | S-3 | 30 | | | | | | |
| Comparative 1-4 | Comparative 1-2-A (100) | 1.0 | S-1 | 60 | Ini-1 | 1.5 | CL-1 | 10 | ASP-2 | 10 |
| | | | S-3 | 40 | | | | | | |
| Comparative 1-5 | Comparative 1-3-A (100) | 1.0 | S-1 | 65 | Ini-2 | 1.5 | CL-1 | 10 | ASP-1 | 10 |
| | | | S-3 | 35 | | | | | | |
| Comparative 1-6 | Comparative 1-3-A (100) | 1.0 | S-1 | 60 | Ini-2 | 1.5 | CL-1 | 10 | ASP-1 | 10 |
| | | | S-3 | 40 | | | | | | |

6. Evaluation of Low-Temperature Curing of Each Photosensitive Resin Composition The photosensitive resin compositions 1-1 to 1-10 and the comparative photosensitive resin compositions 1-1 to 1-6 prepared in "5. Preparation of photosensitive resin compositions" were each applied to a silicon wafer using a spin coater at a rotation speed of 1000 rpm as in "4. Evaluation of low-temperature curing of each fluororesin film". Subsequently, these resin compositions were heated on a hot plate at 90° C. for 150 seconds, whereby photosensitive resin films 1-1 to 1-10 and comparative photosensitive resin films 1-1 to 1-6 (the numbers correspond to the respective numbers of the photosensitive resin compositions) were each formed on the silicon wafer.

[Evaluation of Cured Fluororesin Film by Low-Temperature Curing Method]

The resulting resin films were each entirely exposed (200 mJ/cm$^2$) to i-rays (wavelength: 365 nm) using the mask aligner without a mask.

The films after exposure were subjected to comparison between cured fluororesin films formed by the method (i) and cured fluororesin films formed by the methods (ii) to (iv) as in "4. Evaluation of low-temperature curing of each fluororesin film".

Each cured fluororesin film was evaluated for degree of curing as in "4. Evaluation of low-temperature curing of each fluororesin film".

Table 1-5 shows the results.

sitions" were used to form banks 1-1 to 1-10 and comparative banks 1-1 to 1-6, respectively, by the following method, and the bank properties were evaluated and compared.

[Formation of Banks]

A 10-cm square ITO substrate was washed with ultrapure water and then acetone. Subsequently, the substrate was subjected to UV-ozone treatment for five minutes using the UV-ozone treatment described above. Then, the photosensitive resin compositions 1-1 to 1-10 and the comparative photosensitive resin compositions 1-1 to 1-6 obtained in "5. Preparation of photosensitive resin compositions" were each applied to the UV-ozone-treated substrate using a spin coater at a rotation speed of 1000 rpm, followed by heating on a hot plate at 90° C. for 150 seconds. Thus, fluororesin films and comparative fluororesin films each having a thickness of 5 μm were formed. Each resulting resin film was exposed to i-rays (wavelength: 365 nm) using a mask aligner (available from SUSS MicroTec Group) with a mask having a 5-μm line-and-space pattern. The resulting film was immersed in an alkali developer for 80 seconds, and then washed with ultrapure water for 60 seconds. Subsequently, the resulting patterned film was heated at 90° C. for one hour (baking step) and subjected to UV-ozone treatment for five minutes, followed by heating at 90° C. for one hour.

The resulting resin film was subjected to evaluation of solubility in the developer during the step, evaluation of bank properties (sensitivity and resolution), and contact angle measurement.

TABLE 1-5

| | Curing method | | | | | | | | | | | | | | | | |
|---|---|---|---|---|---|---|---|---|---|---|---|---|---|---|---|---|---|
| | (i) (Reference example) | | | | (ii) | | | | (iii) | | | | (iv) | | | | |
| Photosensitive resin | Contact angle (°) | | Film thickness (nm) | | Contact angle (°) | | Film thickness (nm) | | Contact angle (°) | | Film thickness (nm) | | Contact angle (°) | | Film thickness (nm) | |
| composition | 1 s | 10 s | Before | After | 1 s | 10 s | Before | After | 1 s | 10 s | Before | After | 1 s | 10 s | Before | After |
| 1-1 | 55 | 55 | 5300 | 5300 | 54 | 46 | 5200 | 4200 | 55 | 45 | 5300 | 4150 | 56 | 56 | 5200 | 5200 |
| 1-2 | 58 | 58 | 5200 | 5200 | 55 | 45 | 5250 | 4300 | 57 | 46 | 5200 | 4250 | 57 | 57 | 5250 | 5250 |
| 1-3 | 59 | 59 | 5250 | 5250 | 56 | 55 | 5100 | 5050 | 56 | 56 | 5250 | 5200 | 60 | 60 | 5100 | 5100 |
| 1-4 | 57 | 57 | 5100 | 5100 | 55 | 54 | 5150 | 5050 | 56 | 55 | 5100 | 5050 | 58 | 58 | 5150 | 5150 |
| 1-5 | 56 | 56 | 5150 | 5150 | 56 | 42 | 5300 | 3900 | 55 | 41 | 5150 | 4000 | 55 | 55 | 5300 | 5300 |
| 1-6 | 58 | 58 | 5100 | 5100 | 55 | 43 | 5200 | 4100 | 54 | 42 | 5100 | 4050 | 59 | 59 | 5200 | 5200 |
| 1-7 | 56 | 56 | 5200 | 5200 | 53 | 39 | 5100 | 3950 | 54 | 40 | 5200 | 4100 | 57 | 57 | 5100 | 5100 |
| 1-8 | 60 | 60 | 5250 | 5250 | 55 | 41 | 5250 | 4050 | 53 | 40 | 5250 | 3950 | 58 | 58 | 5250 | 5200 |
| 1-9 | 54 | 54 | 5100 | 5100 | 53 | 52 | 5000 | 4950 | 53 | 53 | 5100 | 5000 | 47 | 32 | 5000 | 4700 |
| 1-10 | 56 | 56 | 5200 | 5200 | 54 | 53 | 5050 | 4900 | 55 | 54 | 5200 | 5150 | 49 | 36 | 5050 | 4550 |
| Comparative 1-1 | 55 | 55 | 5150 | 5150 | 54 | 32 | 5100 | 3900 | 54 | 29 | 5150 | 3800 | 35 | 21 | 5100 | 3500 |
| Comparative 1-2 | 54 | 54 | 5150 | 5150 | 53 | 33 | 5200 | 3800 | 54 | 30 | 5150 | 3750 | 31 | 19 | 5200 | 3300 |
| Comparative 1-3 | 55 | 55 | 5200 | 5200 | 55 | 43 | 5100 | 4100 | 53 | 40 | 5200 | 4050 | 30 | 15 | 5100 | 3600 |
| Comparative 1-4 | 55 | 55 | 5050 | 5050 | 54 | 42 | 5000 | 4050 | 55 | 41 | 5050 | 4100 | 27 | 20 | 5000 | 3500 |
| Comparative 1-5 | 56 | 56 | 5300 | 5300 | 56 | 39 | 5200 | 3500 | 54 | 38 | 5300 | 3600 | 33 | 18 | 5200 | 3250 |
| Comparative 1-6 | 53 | 53 | 5200 | 5200 | 54 | 39 | 5100 | 3600 | 54 | 37 | 5200 | 3650 | 28 | 14 | 5100 | 3600 |

Curing the photosensitive resins 1-1 to 1-8 by the method (iv) yielded results equivalent to those of the reference examples obtained by curing by the method (i), resulting in good cured films.

In contrast, curing the comparative photocurable fluororesins 1-1 to 1-3 by the method (iv) yielded poor results as compared to curing by the method (i). Curing the photosensitive resins 1-1 to 1-8 by the method (ii) or (iii) yielded good results among the photosensitive resins 1-3, 1-4, 1-9, and 1-10.

7. Evaluation of Banks

The photosensitive resin compositions 1-1 to 1-10 and the comparative photosensitive resin compositions 1-1 to 1-6 obtained in "5. Preparation of photosensitive resin compo-

[Solubility in Developer]

The resin film on the ITO substrate after exposure was immersed in an alkali developer at room temperature for 80 seconds to evaluate the solubility in the alkali developer. The alkali developer was a 2.38 mass % tetramethylammonium hydroxide aqueous solution (hereinafter sometimes referred to as TMAH). The solubility of the banks was evaluated by measuring the thickness of the banks after immersion using a contact film thickness meter. The banks were evaluated as "soluble" when completely dissolved, and "insoluble" when the resist film remained undissolved.

Table 1-6 shows the results.

[Resist Properties (Sensitivity and Resolution)]

The optimal exposure Eop (mJ/cm$^2$) for forming banks arranged in the line-and-space pattern was determined and used as an index for sensitivity.

The resulting pattern of banks was observed under a microscope to evaluate the resolution. A pattern without visible line-edge roughness was evaluated as "excellent"; a pattern with slightly visible line-edge roughness was evaluated as "good"; and a pattern with significant line-edge roughness was evaluated as "poor".

Table 1-6 shows the results.

[Contact Angle]

For the entire substrate surface having the banks obtained in the above step, the contact angle between the bank or comparative bank surface and anisole was measured. For the rest of the film, the exposed portions with little temporal change in contact angle were considered as good, and the non-exposed portions with a low contact angle were considered as good.

Table 1-6 shows the results.

TABLE 1-6

| Banks | | 1-1 | 1-2 | 1-3 | 1-4 | 1-5 | 1-6 | 1-7 | 1-8 | 1-9 |
|---|---|---|---|---|---|---|---|---|---|---|
| Photosensitive resin composition | | 1-1 | 1-2 | 1-3 | 1-4 | 1-5 | 1-6 | 1-7 | 1-8 | 1-9 |
| Solubility in developer | Non-exposed portions | Soluble | Soluble | Soluble | Soluble | Soluble | Soluble | Soluble | Soluble | Soluble |
|  | Exposed portions | Insoluble | Insoluble | Insoluble | Insoluble | Insoluble | Insoluble | Insoluble | Insoluble | Insoluble |
| Resist properties | Sensitivity (mJ/cm$^2$) | 200 | 205 | 202 | 206 | 205 | 200 | 199 | 210 | 200 |
|  | Resolution | Excellent | Excellent | Excellent | Excellent | Excellent | Excellent | Excellent | Excellent | Excellent |
| Contact angle (°) Non-exposed portions | 1 s | 10 | 10 | 10 | 10 | 10 | 10 | 10 | 10 | 10 |
|  | 10 s | 10 | 10 | 10 | 10 | 10 | 10 | 10 | 10 | 10 |
| Contact angle (°) Exposed portions | 1 s | 50 | 57 | 60 | 56 | 55 | 50 | 57 | 58 | 47 |
|  | 10 s | 50 | 57 | 60 | 56 | 55 | 50 | 57 | 58 | 32 |

| Banks | | 1-10 | Comparative 1-1 | Comparative 1-2 | Comparative 1-3 | Comparative 1-4 | Comparative 1-5 | Comparative 1-6 |
|---|---|---|---|---|---|---|---|---|
| Photosensitive resin composition | | 1-10 | Comparative 1-1 | Comparative 1-2 | Comparative 1-3 | Comparative 1-4 | Comparative 1-5 | Comparative 1-6 |
| Solubility in developer | Non-exposed portions | Soluble | Soluble | Soluble | Soluble | Soluble | Soluble | Soluble |
|  | Exposed portions | Insoluble | Insoluble | Insoluble | Insoluble | Insoluble | Insoluble | Insoluble |
| Resist properties | Sensitivity (mJ/cm$^2$) | 210 | 205 | 210 | 200 | 204 | 205 | 205 |
|  | Resolution | Excellent | Excellent | Excellent | Excellent | Excellent | Excellent | Excellent |
| Contact angle (°) Non-exposed portions | 1 s | 10 | 10 | 10 | 10 | 10 | 10 | 10 |
|  | 10 s | 10 | 10 | 10 | 10 | 10 | 10 | 10 |
| Contact angle (°) Exposed portions | 1 s | 49 | 35 | 31 | 30 | 27 | 33 | 28 |
|  | 10 s | 36 | 21 | 19 | 15 | 20 | 18 | 14 |

The evaluation of solubility in the developer shows that the banks or comparative banks were made of a negative resist in which only the non-exposed portions are soluble. The evaluation of the bank properties shows that the banks and comparative banks had comparable sensitivity and "excellent" resolution in which the 5-µm line-and-space pattern of the mask was transferred with good resolution without visible line-edge roughness. Specifically, these evaluations show that the fluororesins of the present disclosure and the comparative fluororesins only slightly influenced the banks.

In contrast, regarding the banks, the films heated at 90° C. after the UV-ozone treatment showed no temporal change in contact angle with respect to anisole, with sufficient curing even at low temperatures, resulting in good banks with high liquid repellency.

Second Embodiment

A fluororesin according to the second embodiment of the present disclosure contains a repeating unit represented by a formula (2-1) and a repeating unit represented by the formula (2-2).

[Chem. 56]

(2-1)

-continued

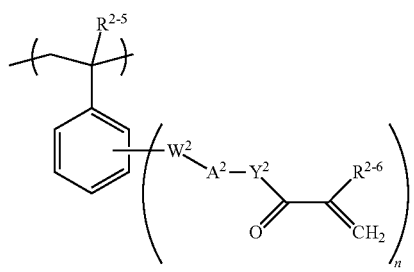

(2-2)

In the formula (2-1), $R^{2-1}$ represents a hydrogen atom, a fluorine atom, or a methyl group; $R^{2-2}$ represents a hydrogen atom or a C1-C6 linear, C3-C6 branched, or C3-C6 cyclic alkyl group; $R^{2-3}$ and $R^{2-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{2-1}$, $R^{2-3}$, and $R^{2-4}$ are fluorine atoms or the fluoroalkyl groups.

In the formula (2-2), $R^{2-5}$ and $R^{2-6}$ each independently represent a hydrogen atom or a methyl group; $W^2$ is a divalent linking group and represents —O—, —O—C(=O)—, —C(=O)—O—, —O—C(=O)—NH—, —C(=O)—O—C(=O)—NH—, or —C(=O)—NH—; $A^2$ is a divalent linking group and represents a C1-C10 linear, C3-C10 branched, or C3-C10 cyclic alkylene group in which one or more hydrogen atoms in the alkylene group may be substituted by hydroxy groups or —O—C(=O)—CH$_3$; $Y^2$ is a divalent linking group and represents —O— or —NH—; and n represents an integer of 1 to 3.

The molecular weight of the fluororesin in terms of weight average molecular weight measured by gel permeation chromatography (GPC) using polystyrene as a standard substance is preferably 1000 or more and 1000000 or less, more preferably 2000 or more and 500000 or less, particularly preferably 3000 or more and 100000 or less. When the molecular weight is less than 1000, the resulting fluororesin film or banks for organic EL tend to have a low strength. When the molecular weight is more than 1000000, it may be difficult to form a fluororesin film due to lack of solubility of the fluororesin in solvents.

The dispersity (Mw/Mn) is preferably 1.01 to 5.00, more preferably 1.01 to 4.00, particularly preferably 1.01 to 3.00.

The fluororesin may be a random copolymer, an alternating copolymer, a block copolymer, or a graft copolymer. Preferably, the fluororesin is a random copolymer to suitably (not locally) disperse characteristics of each repeating unit.

The fluororesin may be a polymer containing a combination of one or more types of units each corresponding to a repeating unit represented by the formula (2-1) and one or more types of units each corresponding to a repeating unit represented by the formula (2-2).

The fluororesin may be a mixture (blend) of such polymers.

Preferably, the fluororesin has a fluorine content of 20 mass % or more and 80 mass % or less relative to 100 mass % of the fluororesin. The fluororesin having a fluorine content in the above ranges is easily soluble in solvents. A fluororesin film or banks having excellent liquid repellency can be obtained because the fluororesin contains fluorine atoms.

The following describes the repeating unit represented by the formula (2-1).

In the formula (2-1), $R^{2-1}$ represents a hydrogen atom, a fluorine atom, or a methyl group. A hydrogen atom and a methyl group are preferred.

In the formula (2-1), $R^{2-2}$ represents a hydrogen atom or a C1-C6 linear, C3-C6 branched, or C3-C6 cyclic alkyl group.

Examples of $R^{2-2}$ include a hydrogen atom, a methyl group, an ethyl group, an n-propyl group, an isopropyl group, an n-butyl group, a 1-methylpropyl group, a 2-methylpropyl group, a tert-butyl group, an n-pentyl group, an isopentyl group, a 1,1-dimethylpropyl group, a 1-methylbutyl group, a 1,1-dimethylbutyl group, an n-hexyl group, a cyclopentyl group, and a cyclohexyl group. A hydrogen atom, a methyl group, an ethyl group, an n-propyl group, and an isopropyl group are preferred. A hydrogen atom and a methyl group are more preferred.

In the formula (2-1), $R^{2-3}$ and $R^{2-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{2-1}$, $R^{2-3}$, and $R^{2-4}$ are fluorine atoms or the fluoroalkyl groups.

When $R^{2-3}$ and $R^{2-4}$ each independently represent a C1-C10 linear, C3-C10 branched, or C3-C10 cyclic alkyl group, examples thereof include a methyl group, an ethyl group, an n-propyl group, an isopropyl group, an n-butyl group, a 1-methylpropyl group, a 2-methylpropyl group, a tert-butyl group, an n-pentyl group, an isopentyl group, a 1,1-dimethylpropyl group, a 1-methylbutyl group, a 1,1-dimethylbutyl group, an n-hexyl group, a cyclopentyl group, and a cyclohexyl group. A methyl group, an ethyl group, an n-propyl group, and an isopropyl group are preferred.

$R^{2-3}$ and $R^{2-4}$ each independently preferably represent a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, a hexafluoroisopropyl group, a heptafluoroisopropyl group, an n-nonafluorobutyl group, an isononafluorobutyl group, or a tert-nonafluorobutyl group; more preferably a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, or a hexafluoroisopropyl group; particularly preferably a fluorine atom, a difluoromethyl group, or a trifluoromethyl group.

The following are examples of preferred structures of the repeating unit represented by the formula (2-1).

[Chem. 57]

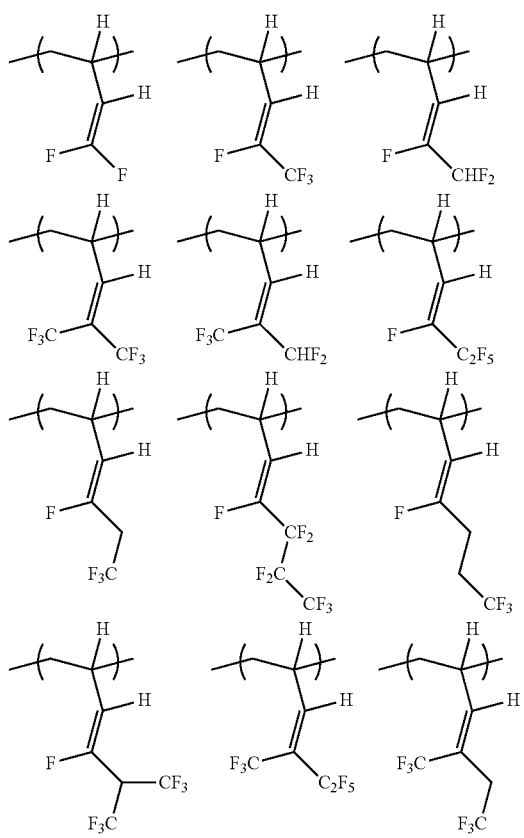

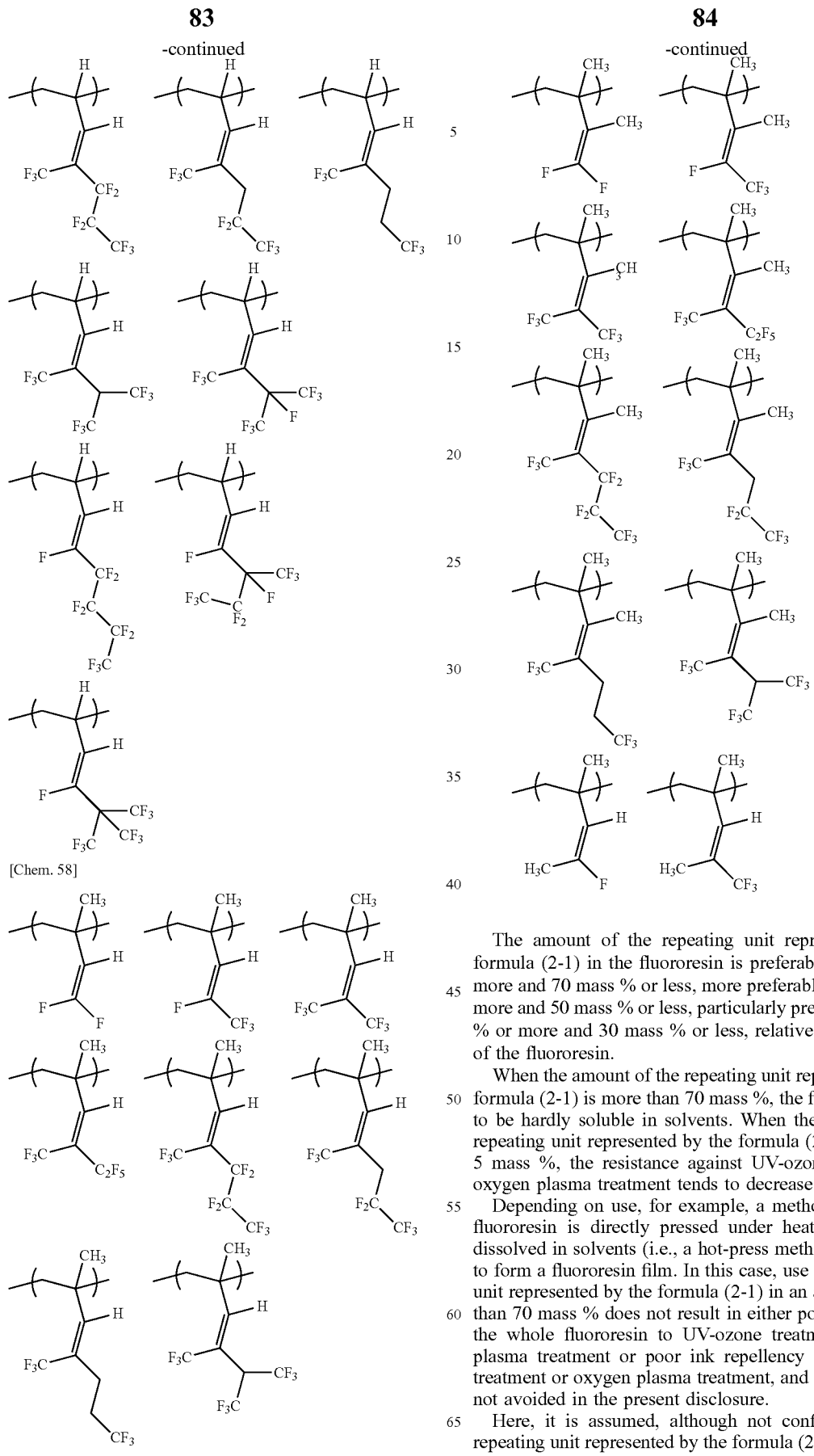

The amount of the repeating unit represented by the formula (2-1) in the fluororesin is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (2-1) is more than 70 mass %, the fluororesin tends to be hardly soluble in solvents. When the amount of the repeating unit represented by the formula (2-1) is less than 5 mass %, the resistance against UV-ozone treatment or oxygen plasma treatment tends to decrease.

Depending on use, for example, a method in which the fluororesin is directly pressed under heat without being dissolved in solvents (i.e., a hot-press method) can be used to form a fluororesin film. In this case, use of the repeating unit represented by the formula (2-1) in an amount of more than 70 mass % does not result in either poor resistance of the whole fluororesin to UV-ozone treatment or oxygen plasma treatment or poor ink repellency after UV-ozone treatment or oxygen plasma treatment, and such use is thus not avoided in the present disclosure.

Here, it is assumed, although not confirmed, that the repeating unit represented by the formula (2-1) according to the second embodiment of the present disclosure has the following effects. The effects of the fluororesin according to the second embodiment of the present disclosure described herein are not intended to be exhaustive.

The repeating unit represented by the formula (2-1) has an effect of imparting ink repellency after UV-ozone treatment or oxygen plasma treatment. Preferably, $R^{2-3}$ and $R^{2-4}$ are each a fluorine atom or a C1-C10 linear, C3-C10 branched, or C3-C10 cyclic fluoroalkyl group, because the above effect is particularly high in such a case.

Further, the repeating unit represented by the formula (2-1) has an effect of increasing the resistance to UV-ozone treatment or oxygen plasma treatment. The possible reasons are as follows.

Generally, the ester bond is considered to be reactive with and not very resistant to UV-ozone treatment or oxygen plasma treatment (also see comparative fluororesin films 2-1 to 2-10 and Table 2-9 described later). Thus, in a fluoropolymer consisting of acrylic sites having an ester bond adjacent to the main chain, the ester bond becomes a reactive site. Presumably, this results in low resistance of the fluoropolymer to the UV-ozone treatment or oxygen plasma treatment (e.g., fluoropolymers disclosed in Patent Literatures 3 and 4).

In contrast, the repeating unit represented by the formula (2-1) according to the second embodiment of the present disclosure has a structure consisting of hydrocarbons without substituents mainly containing oxygen such as an ester bond that is reactive with UV-ozone treatment or oxygen plasma treatment. Thus, the presence of the repeating unit represented by the formula (2-1) in the resin is presumed to increase the resistance of the fluororesin according to the second embodiment of the present disclosure to the UV-ozone treatment or oxygen treatment.

The following describes the repeating unit represented by the formula (2-2).

In the formula (2-2), $R^{2-5}$ and $R^{2-6}$ each independently represent a hydrogen atom or a methyl group.

In the formula (2-2), $W^2$ is a divalent linking group and represents —O—, —O—C(=O)—, —C(=O)—O—, —O—C(=O)—NH—, —C(=O)—O—C(=O)—NH—, or —C(=O)—NH—. Preferred of these are —O—C(=O)—NH—, —C(=O)—O—C(=O)—NH—, and —C(=O)—NH—.

The fluororesin according to the second embodiment of the present disclosure in which $W^2$ is —O—C(=O)—NH— has better ink repellency after UV-ozone treatment or oxygen plasma treatment, and is thus one particularly preferred embodiment.

In the formula (2-2), $A^2$ is a divalent linking group and represents a C1-C10 linear, C3-C10 branched, or C3-C10 cyclic alkylene group in which one or more hydrogen atoms in the alkylene group may be substituted by hydroxy groups or —O—C(=O)—CH$_3$.

When the divalent linking group $A^2$ is a C1-C10 linear alkylene group, examples thereof include a methylene group, an ethylene group, a propylene group, an n-butylene group, an n-pentylene group, an n-hexalene group, an n-heptalene group, an n-octalene group, an n-nonalene group, and an n-decalene group.

When the divalent linking group $A^2$ is a C3-C10 branched alkylene group, examples thereof include an isopropylene group, an isobutylene group, a sec-butylene group, a tert-butylene group, an isopentalene group, and an isohexalene group.

When the divalent linking group $A^2$ is a C3-C10 cyclic alkylene group, examples thereof include a cyclopropyl group, a cyclobutyl group, a cyclopentyl group, a cyclohexyl group, a cycloheptyl group, a cyclooctyl group, a cyclodecanyl group, and a 4-tert-butylcyclohexyl group.

When one or more hydrogen atoms in these alkylene groups are substituted by hydroxy groups, examples of these hydroxy group-substituted alkylene groups include a hydroxyethylene group, a 1-hydroxy-n-propylene group, a 2-hydroxy-n-propylene group, a hydroxy-isopropylene group (—CH(CH$_2$OH)CH$_2$—), a 1-hydroxy-n-butylene group, a 2-hydroxy-n-butylene group, a hydroxy-sec-butylene group (—CH(CH$_2$OH)CH$_2$CH$_2$—), a hydroxy-isobutylene group (—CH$_2$CH(CH$_2$OH)CH$_2$—), and a hydroxy-tert-butylene group (—C(CH$_2$OH)(CH$_3$)CH$_2$—).

When one or more hydrogen atoms in these alkylene groups are substituted by —O—C(=O)—CH$_3$, examples of these substituted-alkylene groups include those in which hydroxy groups of the hydroxy group-substituted alkylene groups exemplified above are substituted by —O—C(=O)—CH$_3$.

Preferably, the divalent linking group $A^2$ is a methylene group, an ethylene group, a propylene group, an n-butylene group, an isobutylene group, a sec-butylene group, a cyclohexyl group, a 2-hydroxy-n-propylene group, a hydroxy-isopropylene group (—CH(CH$_2$OH)CH$_2$—), a 2-hydroxy-n-butylene group, or a hydroxy-sec-butylene group (—CH(CH$_2$OH)CH$_2$CH$_2$—); more preferably an ethylene group, a propylene group, a 2-hydroxy-n-propylene group, or a hydroxy-isopropylene group (—CH(CH$_2$OH)CH$_2$—); particularly preferably an ethylene group or a 2-hydroxy-n-propylene group.

In the formula (2-2), $Y^2$ is a divalent linking group and represents —O— or —NH—, with —O— being more preferred.

In the formula (2-2), n represents an integer of 1 to 3, with n of 1 being particularly preferred.

The substituents are each independently in the ortho, meta, or para position of the aromatic ring, with the para position being preferred.

The following are examples of preferred structures of the repeating unit represented by the formula (2-2). In the examples, the substituent position in the aromatic ring is the para position. Yet, the substituents may be each independently in the ortho or meta position.

[Chem. 59]

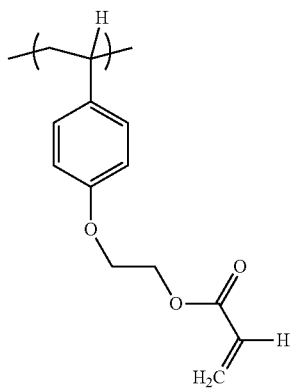

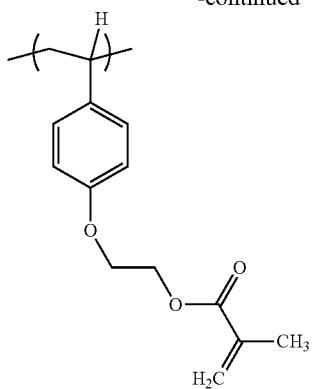
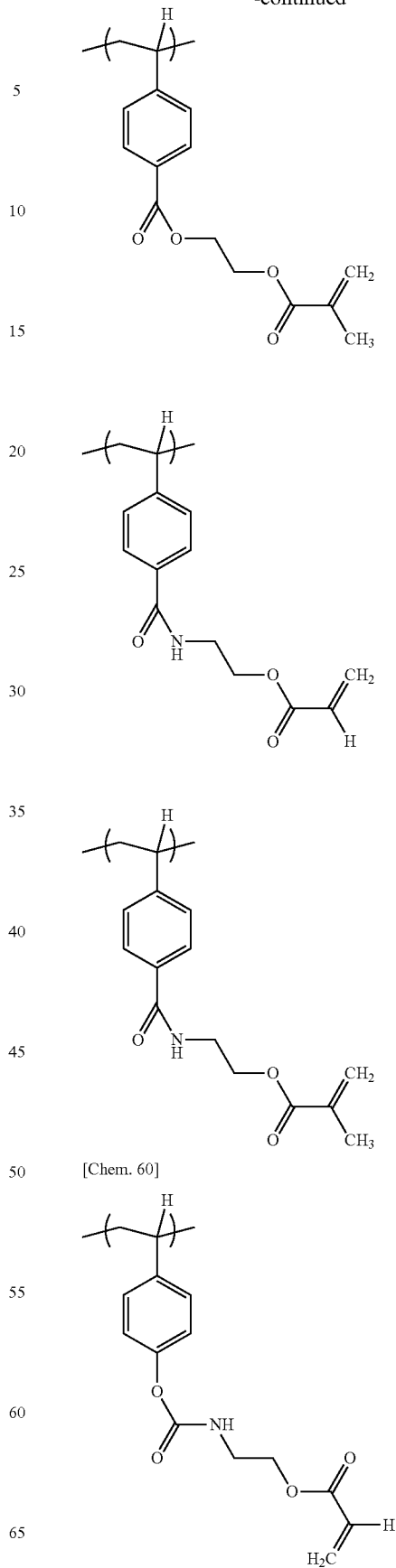

89
-continued
90
-continued
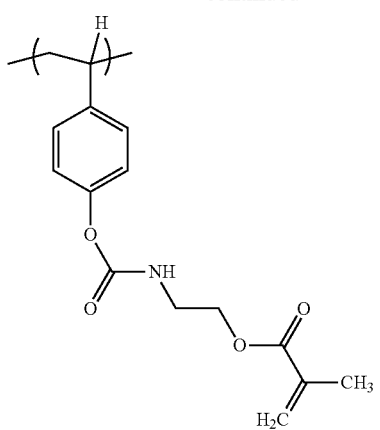
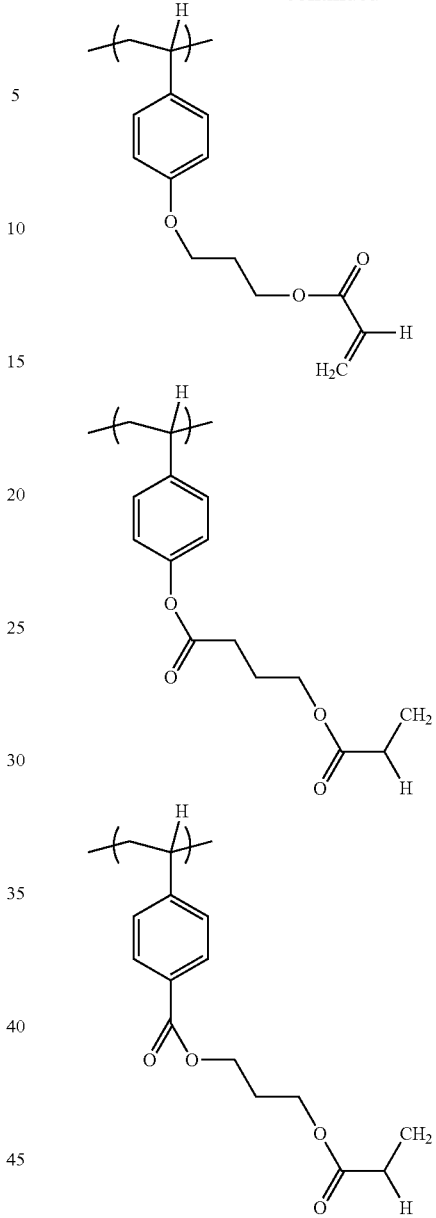
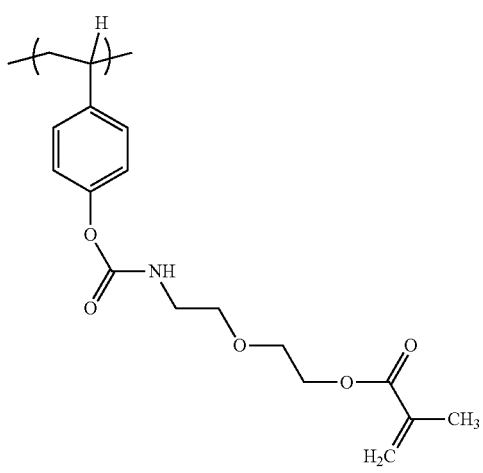

91
-continued
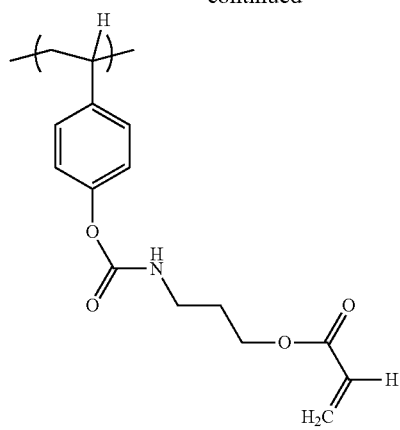
[Chem. 61]
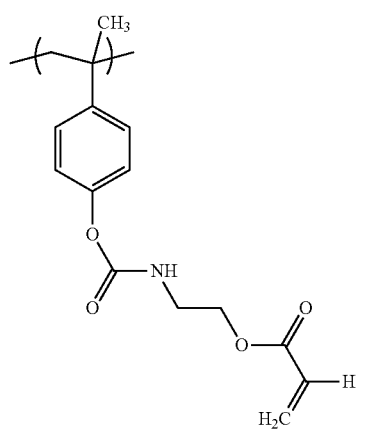
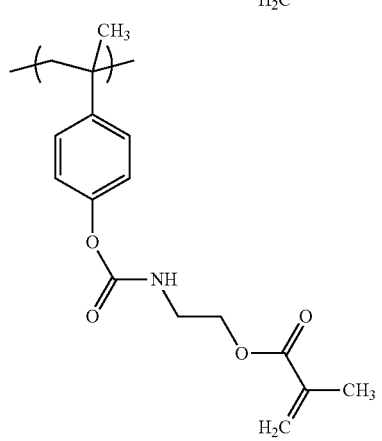
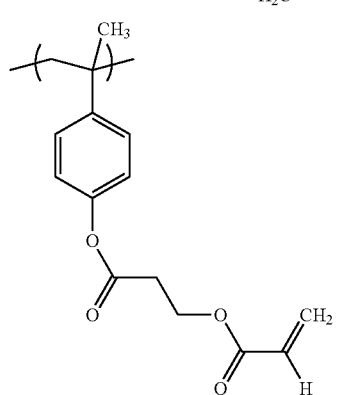
92
-continued
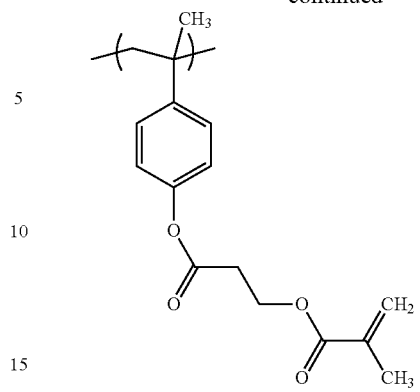
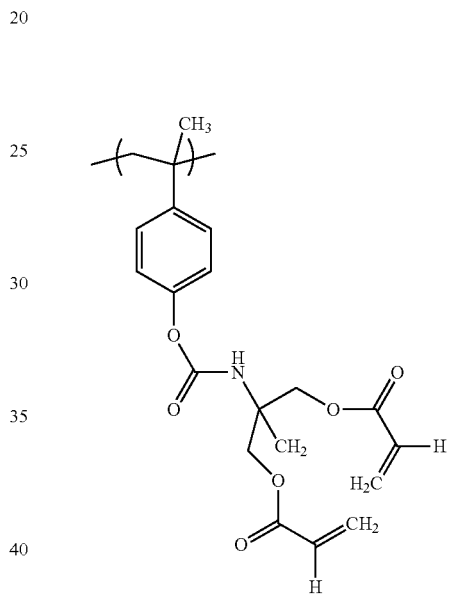
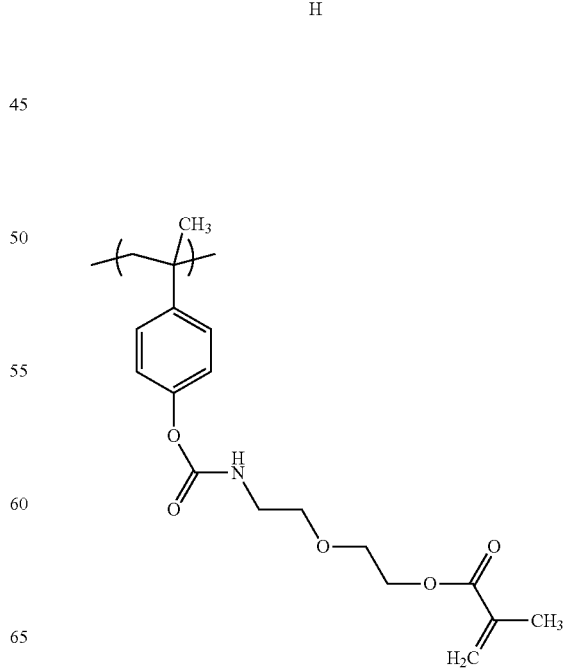

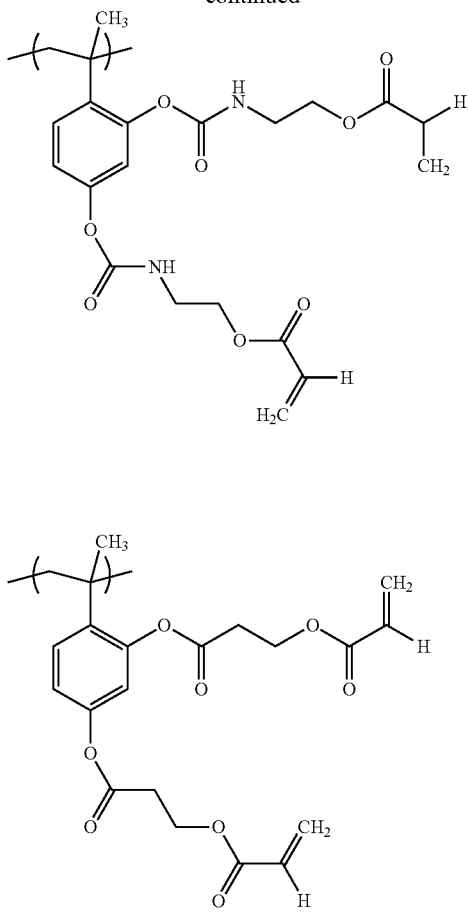

[Chem. 62]

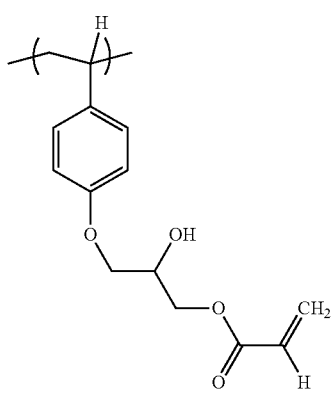

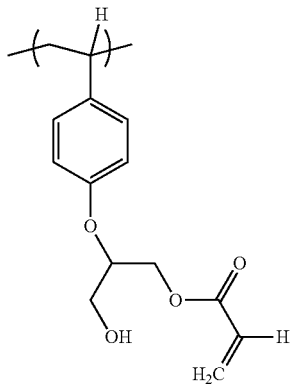

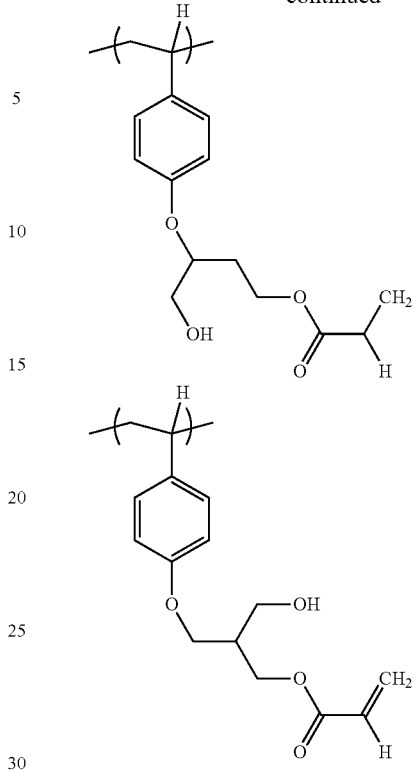

The amount of the repeating unit represented by the formula (2-2) in the fluororesin is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (2-2) is more than 70 mass %, the fluororesin tends to be hardly soluble in solvents. When the amount of the repeating unit represented by the formula (2-1) is less than 5 mass %, the resistance against UV-ozone treatment or oxygen plasma treatment tends to decrease.

Here, it is assumed, although not confirmed, that the repeating unit represented by the formula (2-2) according to the second embodiment of the present disclosure has an effect of exhibiting resistance to UV-ozone treatment oxygen plasma. The effects of the fluororesin according to the second embodiment of the present disclosure described herein are not intended to be exhaustive.

The fluororesin according to the second embodiment of the present disclosure may be, as described above, a mixture (blend) of a copolymer containing a repeating unit represented by the formula (2-1) and a repeating unit represented by the formula (2-2) and another copolymer containing a repeating unit represented by the formula (2-1) and a repeating unit represented by the formula (2-2). Specifically, in one preferred second embodiment of the present disclosure, the fluororesin according to the second embodiment of the present disclosure is a mixture of a fluororesin containing a repeating unit represented by the formula (2-2) wherein $W^2$ is —O—C(=O)—NH— and a fluororesin containing a repeating unit represented by the formula (2-2) wherein $W^2$ is —C(=O)—NH—.

Preferably, the fluororesin according to the second embodiment of the present disclosure further contains a repeating unit represented by the following formula (2-3).

[Chem. 63]

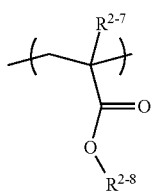

(2-3)

In the formula (2-3), $R^{2-7}$ represents a hydrogen atom or a methyl group;

In the formula (2-3), $R^{2-8}$ represents a C1-C15 linear, C3-C15 branched, or C3-C15 cyclic alkyl group in which one or more hydrogen atoms in the alkyl group are substituted by fluorine atoms; and the repeating unit has a fluorine content of 30 mass % or more.

When $R^{2-8}$ is a linear hydrocarbon group, specific examples include a methyl group, an ethyl group, a propyl group, a butyl group, a pentyl group, a hexyl group, a heptyl group, an octyl group, a nonyl group, and C10-C14 linear alkyl groups in which one or more hydrogen atoms are substituted by fluorine atoms.

The fluororesin according to the second embodiment of the present disclosure may be a polymer containing a combination of a repeating unit represented by the formula (2-3), a repeating unit represented by the formula (2-1), and a repeating unit represented by the formula (2-2).

The fluororesin may also be a mixture (blend) of a polymer containing a repeating unit represented by the formula (2-3) and a polymer containing a repeating unit represented by the formula (2-1) and a repeating unit represented by the formula (2-2). When the fluororesin is a mixture, the fluororesin may be a mixture of a polymer containing a repeating unit represented by the formula (2-3) and a polymer containing a repeating unit represented by the formula (2-1) and a repeating unit represented by the formula (2-2), or a mixture of a polymer containing a repeating unit represented by the formula (2-3) and a repeating unit represented by the formula (2-2) and a polymer containing a repeating unit represented by the formula (2-1).

When $R^{2-8}$ is a linear hydrocarbon group, preferably, the repeating unit represented by the formula (2-3) is a repeating unit represented by the following formula (2-3-1).

[Chem. 64]

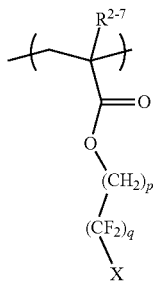

(2-3-1)

wherein $R^{2-7}$ is the same as $R^{2-7}$ in the formula (2-3); X is a hydrogen atom or a fluorine atom; p is an integer of 1 to 4; and q is an integer of 1 to 14.

In the repeating unit represented by the formula (2-3-1), particularly preferably, p is an integer of 1 or 2, q is an integer of 2 to 8, and X is a fluorine atom.

The following are examples of preferred structures of the repeating unit represented by the formula (2-3).

[Chem. 65]

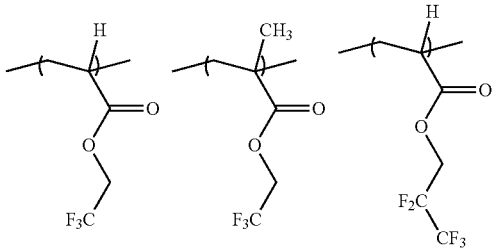

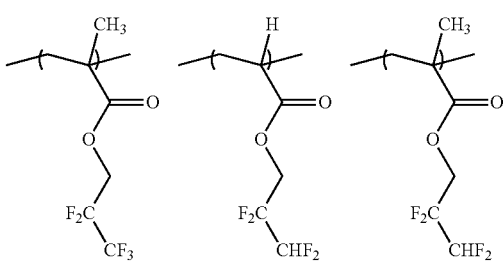

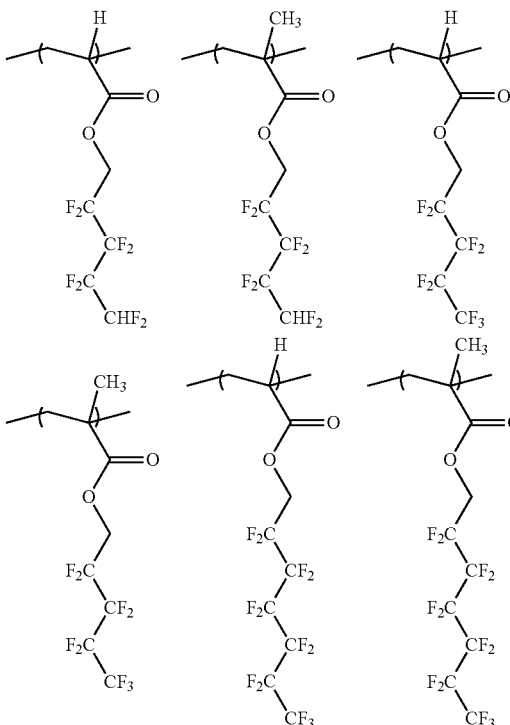

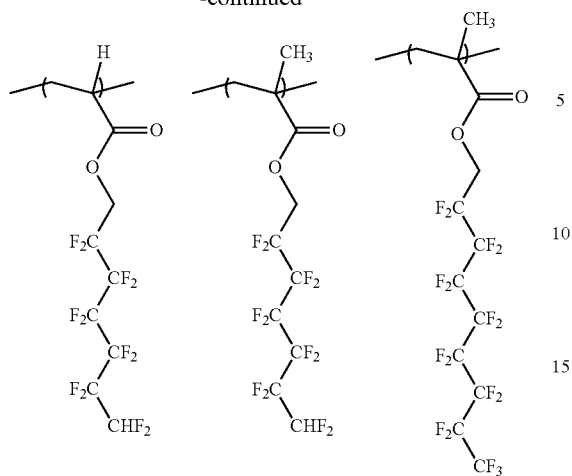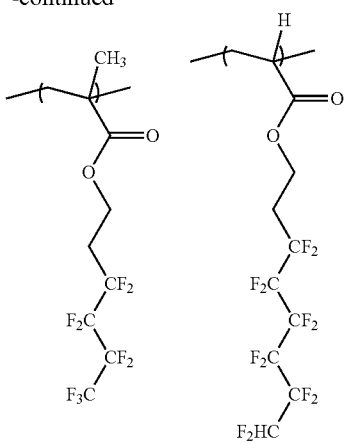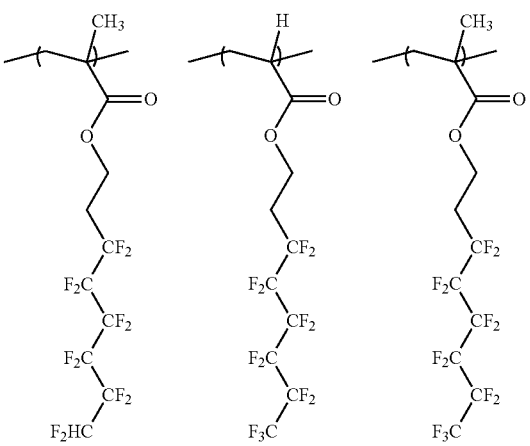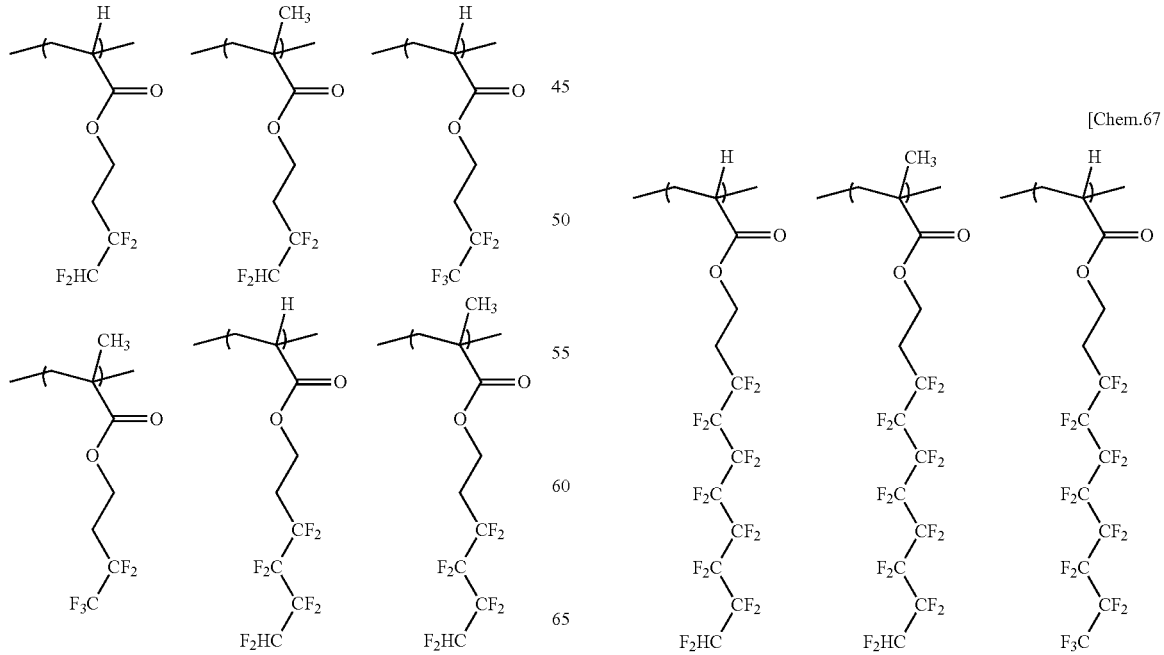
[Chem. 66]
[Chem. 67]

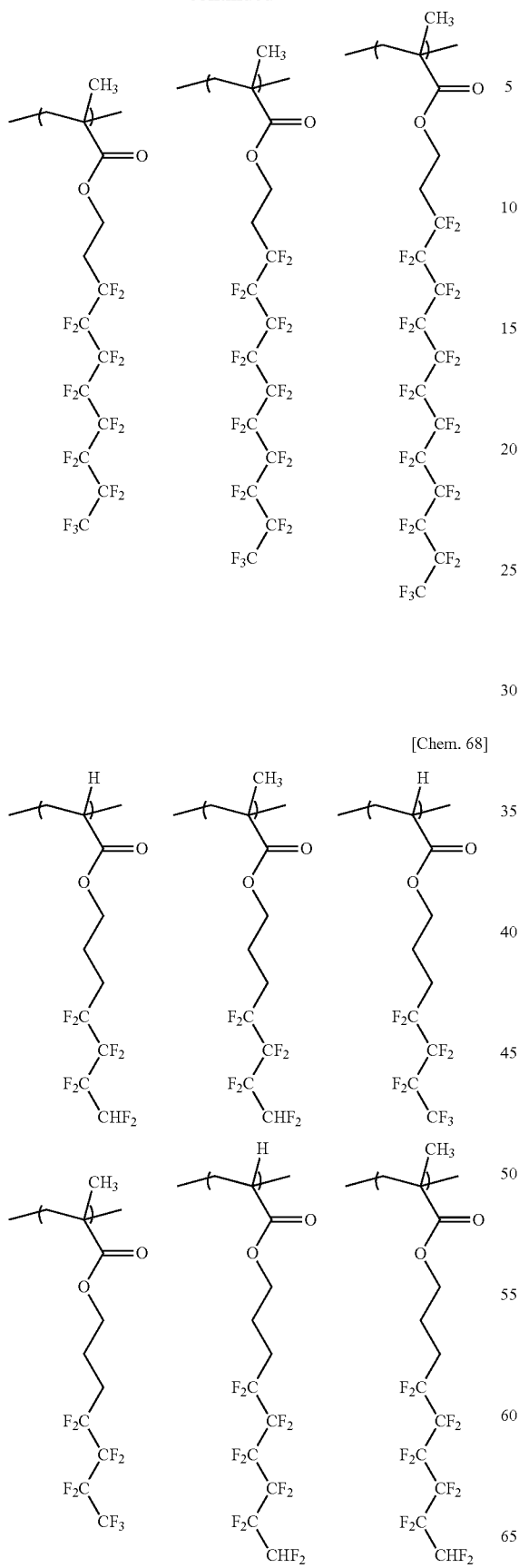
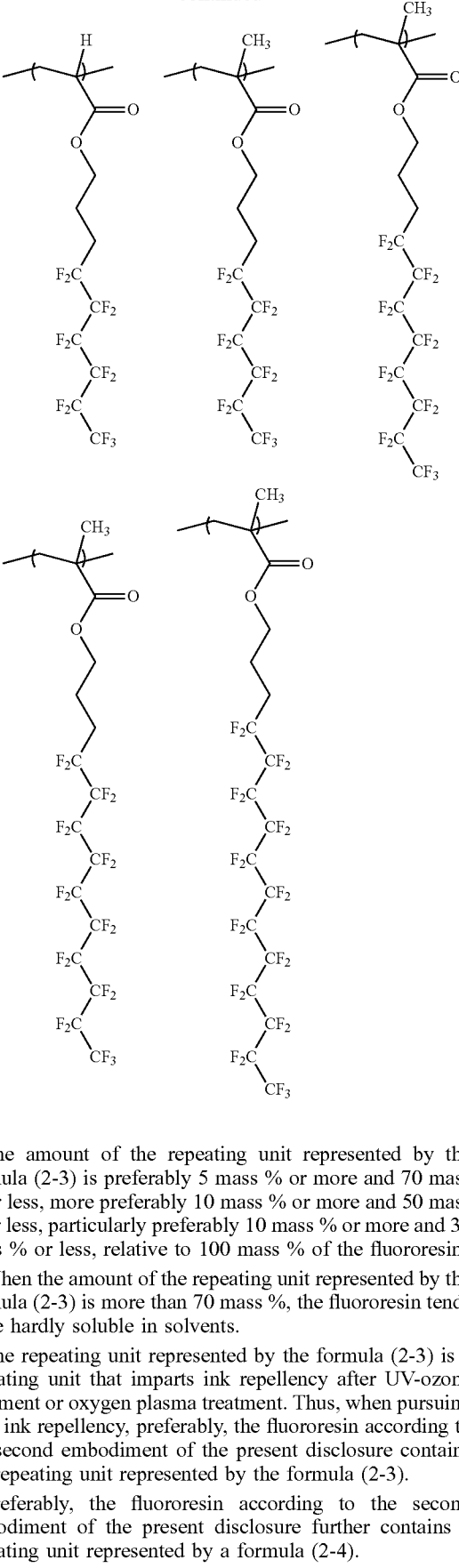

The amount of the repeating unit represented by the formula (2-3) is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (2-3) is more than 70 mass %, the fluororesin tends to be hardly soluble in solvents.

The repeating unit represented by the formula (2-3) is a repeating unit that imparts ink repellency after UV-ozone treatment or oxygen plasma treatment. Thus, when pursuing high ink repellency, preferably, the fluororesin according to the second embodiment of the present disclosure contains the repeating unit represented by the formula (2-3).

Preferably, the fluororesin according to the second embodiment of the present disclosure further contains a repeating unit represented by a formula (2-4).

The fluororesin according to the second embodiment of the present disclosure may be a polymer containing a combination of a repeating unit represented by the formula (2-4), a repeating unit represented by the formula (2-1), and a repeating unit represented by the formula (2-2). Alternatively, the fluororesin may be a polymer containing a combination of a repeating unit represented by the formula (2-4), a repeating unit represented by the formula (2-1), a repeating unit represented by the formula (2-2), and a repeating unit represented by the formula (2-3).

The fluororesin may also be a mixture (blend) of a polymer containing a repeating unit represented by the formula (2-4) and a polymer containing a repeating unit represented by the formula (2-1) and a repeating unit represented by the formula (2-2). When the fluororesin is a mixture, the fluororesin may be a mixture of a polymer containing a repeating unit represented by the formula (2-4) and a repeating unit represented by the formula (2-1) and a polymer containing a repeating unit represented by the formula (2-2), or a mixture of a polymer containing a repeating unit represented by the formula (2-4) and a repeating unit represented by the formula (2-2) and a polymer containing a repeating unit represented by the formula (2-1). Further, when the fluororesin is a mixture containing a repeating unit represented by the formula (2-3), the fluororesin may be a mixture of a repeating unit represented by the formula (2-3) and any of the above possible combinations of the repeating units represented by the formulas (2-1), (2-2), and (2-4).

[Chem. 69]

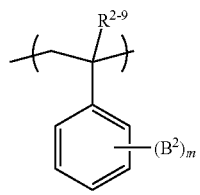

(2-4)

In the formula (2-4), $R^{2-9}$ represents a hydrogen atom or a methyl group.

In the formula (2-4), each $B^2$ independently represents a hydroxy group, a carboxy group, —C(=O)—O—$R^{2-10}$ ($R^{2-10}$ represents a C1-C15 linear, C3-C15 branched, or C3-C15 cyclic alkyl group in which one or more hydrogen atoms in the alkyl group are substituted by fluorine atoms, and $R^{2-10}$ has a fluorine content of 30 mass % or more), or —O—C(=O)—$R^{2-11}$ ($R^{2-11}$ represents a C1-C6 linear, C3-C6 branched, or C3-C6 cyclic alkyl group).

When $B^2$ is —C(=O)—O—$R^{2-10}$, specific examples of $R^{2-10}$ may include those of $R^{2-8}$ in the formula (2-3).

When $B^2$ is —O—C(=O)—$R^{2-11}$, examples of $R^{2-11}$ include a methyl group, an ethyl group, an n-propyl group, an isopropyl group, an n-butyl group, a 1-methylpropyl group, a 2-methylpropyl group, a tert-butyl group, an n-pentyl group, an isopentyl group, a 1,1-dimethylpropyl group, a 1-methylbutyl group, a 1,1-dimethylbutyl group, an n-hexyl group, a cyclopentyl group, and a cyclohexyl group. A hydrogen atom, a methyl group, an ethyl group, an n-propyl group, and an isopropyl group are preferred. A methyl group is more preferred.

In the formula (2-4), m represents an integer of 0 to 3.

The following are examples of preferred structures of the repeating unit represented by the formula (2-4).

[Chem. 70]

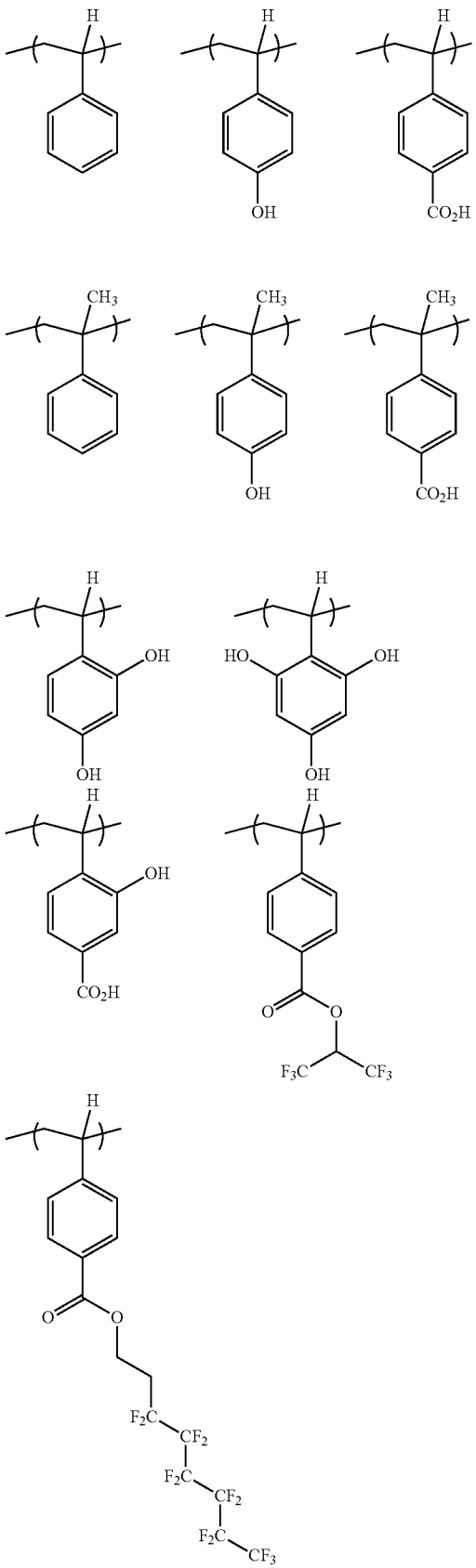

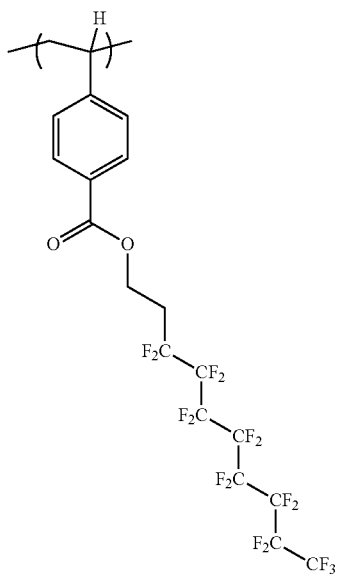

[Chem. 71]

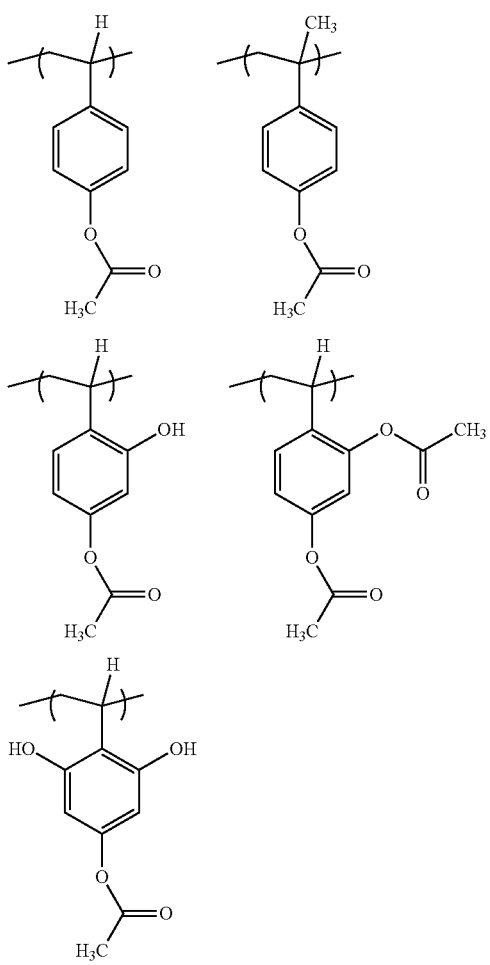

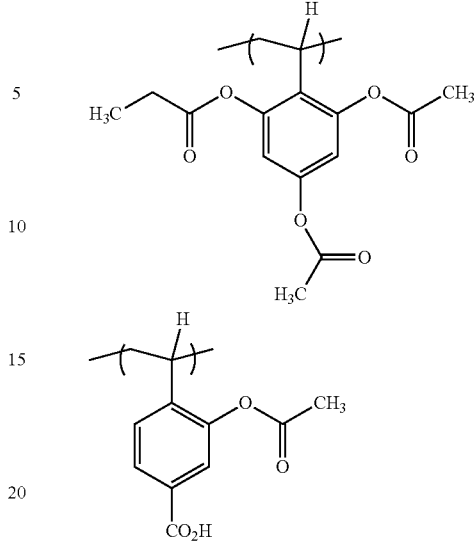

The amount of the repeating unit represented by the formula (2-4) is preferably 5 mass % or more and 70 mass % or less, more preferably 10 mass % or more and 50 mass % or less, particularly preferably 20 mass % or more and 40 mass % or less, relative to 100 mass % of the fluororesin.

When the amount of the repeating unit represented by the formula (2-4) is more than 70 mass %, the fluororesin tends to be hardly soluble in solvents.

A repeating unit represented by the formula (2-4) wherein $B^2$ is a hydroxy group or a carboxy group has solubility in an alkali developer. Thus, when it is desired to impart alkali developability to a film obtainable from the fluororesin, preferably, the fluororesin according to the second embodiment of the present disclosure contains the repeating unit represented by the formula (2-4) wherein $B^2$ is a hydroxy group or a carboxy group. Specifically, when it is desired to form banks containing a repeating unit represented by the formula (2-1) and a repeating unit represented by the formula (2-2A) in the second embodiment of the present disclosure, further adding the repeating unit represented by the formula (2-4) wherein $B^2$ is a hydroxy group or a carboxy group tends to improve the shape of the resulting patterned film, thus providing one preferred embodiment.

A monomer corresponding to the repeating unit represented by the formula (2-4) wherein $B^2$ is a hydroxy group or a carboxy group can also be used as a monomer (formula (2-2a)) of a repeating unit represented by the formula (2-2) (described later).

Particularly preferred embodiments of the fluororesin according to the second embodiment of the present disclosure may include the following four embodiments.

Embodiment 2-1

Fluororesin containing a repeating unit represented by the following formula (2-1) and a repeating unit represented by the following formula (2-2)

Formula (2-1): $R^{2-1}$ and $R^{2-2}$ are hydrogen atoms; and $R^{2-3}$ and $R^{2-4}$ are each independently a fluorine atom, a difluoromethyl group, or a trifluoromethyl group.

Formula (2-2): $R^{2-5}$ and $R^{2-6}$ are hydrogen atoms; $W^2$ is —O—C(=O)—NH—, —C(=O)—O—C(=O)—NH—, or —C(=O)—NH—; $A^2$ is an ethylene group; $Y^2$ is —O—; and n is 1.

Embodiment 2-2

Fluororesin containing a repeating unit represented by the following formula (2-1) and a repeating unit represented by the following formula (2-2)
Formula (2-1): same as described in Embodiment 2-1
Formula (2-2): $R^{2-5}$ and $R^{2-6}$ are hydrogen atoms; $W^2$ is —O—;
$A^2$ is a 2-hydroxy-n-propylene group or a hydroxy-isopropylene group (—CH(CH$_2$OH)CH$_2$—); $Y^2$ is —O—; and n is 1.

Embodiment 2-3

Fluororesin containing repeating units represented by the following formulas (2-1), (2-2), and (2-3-1)
Formula (2-1): same as described in Embodiment 2-1
Formula (2-2): same as described in Embodiment 2-1
Formula (2-3-1): $R^{2-7}$ is a methyl group; p is an integer of 2; q is an integer of 4 to 8; and X is a fluorine atom.

Embodiment 2-4

Fluororesin containing repeating units represented by the following formulas (2-1), (2-2), (2-3-1), and (2-4)
Formula (2-1): same as described in Embodiment 2-1
Formula (2-2): same as described in Embodiment 2-1
Formula (2-3-1): same as described in Embodiment 2-1
formula (2-4): $R^{2-9}$ is a hydrogen atom; $B^2$ is a hydroxy group or a carboxy group; and m is 1.

The fluororesin according to the second embodiment of the present disclosure can be easily produced by the following two steps: first, monomers represented by formulas (2-1a) and (2-2a) are polymerized to obtain a fluororesin precursor containing a repeating unit represented by the formula (2-1) and a repeating unit represented a formula (2-2b); and then the repeating unit represented by the formula (2-2b) between the repeating unit represented by the formula (2-1) and the repeating unit represented by the formula (2-2b) is subjected to addition reaction or condensation reaction with an acrylic acid derivative represented by a formula (2-2c).

[Chem. 72]

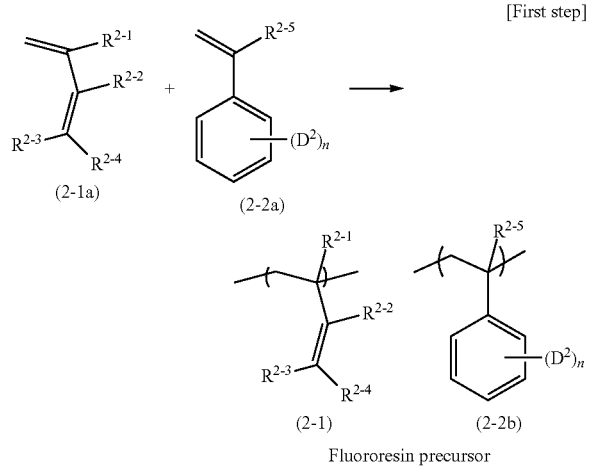

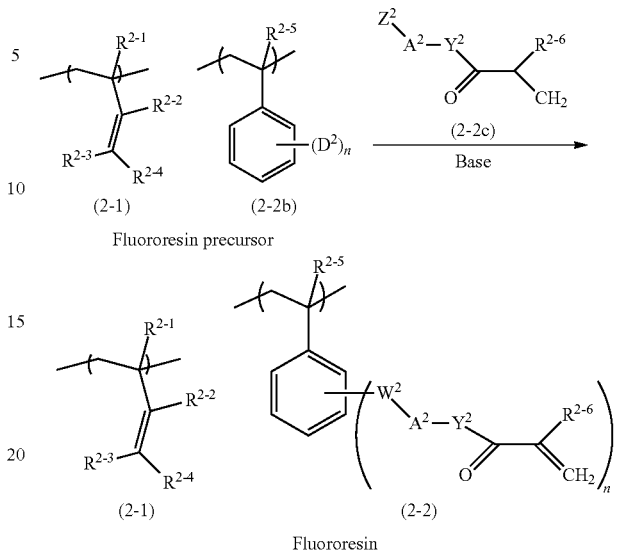

Fluororesin

In the formula (2-1), $R^{2-1}$ represents a hydrogen atom, a fluorine atom, or a methyl group; $R^{2-2}$ represents a hydrogen atom or a C1-C6 linear, C3-C6 branched, or C3-C6 cyclic alkyl group; $R^{2-3}$ and $R^{2-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{2-1}$, $R^{2-3}$, and $R^{2-4}$ are fluorine atoms or the fluoroalkyl groups.

In the formula (2-1a), $R^{2-1}$, $R^{2-2}$, $R^{2-3}$, and $R^{2-4}$ are the same as $R^{2-1}$, $R^{2-2}$, $R^{2-3}$, and $R^{2-4}$ in the formula (2-1), respectively.

In the formula (2-2), $R^{2-5}$ and $R^{2-6}$ each independently represent a hydrogen atom or a methyl group; $W^2$ is a divalent linking group and represents —O—, —O—C(=O)—, —C(=O)—O—, —O—C(=O)—NH—, —C(=O)—O—C(=O)—NH—, or —C(=O)—NH—; $A^2$ is a divalent linking group and represents a C1-C10 linear, C3-C10 branched, or C3-C10 cyclic alkylene group in which one or more hydrogen atoms in the alkylene group may be substituted by hydroxy groups or —O—C(=O)—CH$_3$; $Y^2$ is a divalent linking group and represents —O— or —NH—; and n represents an integer of 1 to 3.

In the formula (2-2a), $R^{2-5}$ and n are the same as $R^{2-5}$ and n in the formula (2-2), respectively; and $D^2$ represents a hydroxy group or a carboxy group.

In the formula (2-2b), $R^{2-5}$, n, and $D^2$ are the same as $R^{2-5}$ and n in the formula (2-2) and $D^2$ in the formula (2-2a), respectively.

In the formula (2-2c), $R^{2-6}$, $A^2$, and $Y^2$ are the same as $R^{2-6}$, $A^2$, and $Y^2$ in the formula (2-2), respectively; and $Z^2$ represents an isocyanate group (—N=C=O), an acid halide (—C(=O)—X, X is a halogen atom or an imidazolyl group), an acid anhydride, a halogen atom, a hydroxy group, an amino group (—NH$_2$), or an oxirane group.

In the formulas (2-2), (2-2a), (2-2b), and (2-2c), the substituents are each independently in the ortho, meta, or para position of the aromatic ring.

Each step is described below.

[First Step]

In the first step, monomers represented by the formulas (2-1a) and (2-2a) are polymerized to produce a fluororesin precursor containing a repeating unit represented by the formula (2-1) and a repeating unit represented by the formula (2-2b).

[Chem. 73]
[First step]

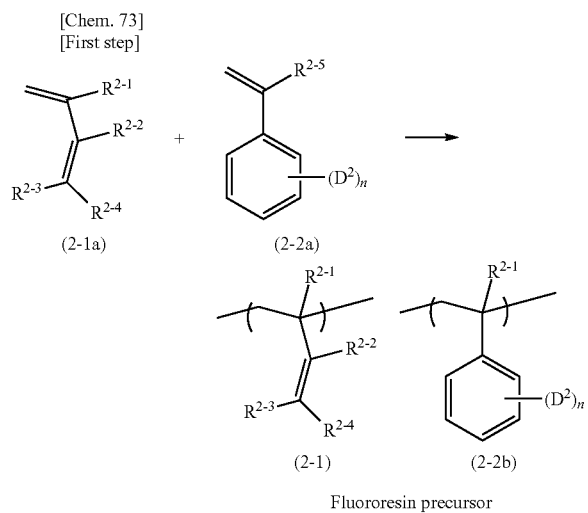

Fluororesin precursor

The monomer represented by the formula (2-1a) may be a commercially available product or can be prepared by a known method or a method based thereon. For example, preferably, the monomer is prepared by a method described in Journal of Organic Chemistry, 1970, Vol. 35, No. 6, pp. 2096-2099, or a method based thereon.

The repeating unit represented by the formula (2-1) is formed by cleavage of the polymerizable double bond of the monomer represented by the formula (2-1a). No structural changes occur and the original structure is maintained, except for the changes in the polymerizable double bond during polymerization. Thus, in the monomer represented by the formula (2-1a), $R^{2-1}$, $R^{2-2}$, $R^{2-3}$ and $R^{2-4}$ are the same as $R^{2-1}$, $R^{2-2}$, $R^{2-3}$, and $R^{2-4}$ in the repeating unit represented by the formula (2-1), respectively. Examples of specific substituents may include those described in the description of the repeating unit represented by the formula (2-1). Examples of preferred structures of the monomer represented by the formula (2-1a) may include those of the respective monomers before cleavage of the polymerizable double bond in the repeating units exemplified in the description of the repeating unit represented by the formula (2-1).

The monomer represented by the formula (2-2a) may be a commercially available product or can be prepared by a known method or a method based thereon. Use of a commercially available product is preferred in terms of easy availability.

The repeating unit represented by the formula (2-2b) is formed by cleavage of the polymerizable double bond of the monomer represented by the formula (2-2a). No structural changes occur and the original structure is maintained, except for the changes in in the polymerizable double bond during polymerization.

In the monomer represented by the formula (2-2a), preferably, $R^{2-5}$ is a hydrogen atom and n is 1. Specifically, a particularly preferred structure is one in which $R^{2-5}$ is a hydrogen atom, $D^2$ is a hydroxy group, and n is 1; or one in which $R^{2-5}$ is a hydrogen atom, $D^2$ is a carboxy group, and n is 1.

The method of polymerizing the monomers represented by the formulas (2-1a) and (2-2a) is now described.

Any common polymerization method can be used, but radical polymerization and ionic polymerization are preferred. In some cases, polymerization methods such as coordination anionic polymerization, living anionic polymerization, cationic polymerization, ring-opening metathesis polymerization, vinylene polymerization, and vinyl addition can also be used. Of these, radical polymerization is particularly preferred. These polymerization methods may be known methods. The radical polymerization method is described below, but polymerization can be easily performed also by other methods according to known documents or the like.

The radical polymerization may be performed in a batch type, semi-continuous type, or continuous-type operation by a known polymerization method such as bulk polymerization, solution polymerization, suspension polymerization, or emulsion polymerization in the presence of a radical polymerization initiator or radical initiation source.

Any radical polymerization initiator may be used. Examples thereof include azo compounds, peroxide compounds, persulfate compounds, and redox compounds. Particularly preferred are 2,2'-azobis(2-methylbutyronitrile), dimethyl 2,2'-azobis(2-methylpropionate), tert-butyl peroxypivalate, di-tert-butyl peroxide, isobutyryl peroxide, lauroyl peroxide, succinic acid peroxide, dicinnamyl peroxide, di-n-propyl peroxydicarbonate, tert-butylperoxyallyl monocarbonate, benzoyl peroxide, hydrogen peroxide, and ammonium persulfate.

Any reaction vessel may be used for polymerization. Preferably, polymerization is performed using a polymerization solvent in addition to the monomers and initiators. A polymerization solvent that does not interfere with radical polymerization is preferred. Typical examples thereof include ester solvents such as ethyl acetate and n-butyl acetate; ketone solvents such as acetone, methyl ethyl ketone, and methyl isobutyl ketone; hydrocarbon solvents such as toluene and cyclohexane; and alcohol solvents such as methanol, isopropyl alcohol, and ethylene glycol monomethyl ether. Solvents such as water, chain ether solvents, cyclic ether solvents, chlorofluorocarbon solvents, and aromatic solvents can also be used. These polymerization solvents can be used alone or in combination of two or more thereof. A molecular weight modifier such as mercaptan may also be used in combination. The reaction temperature for polymerization is suitably changed according to a radical polymerization initiator or radical polymerization initiating source. Usually, the reaction temperature is preferably 20° C. to 200° C., more preferably 30° C. to 140° C., particularly preferably 50° C. to 120° C.

The polymerization time is usually 0.1 to 48 hours, preferably 1 to 24 hours. Preferably, a point at which the monomer is consumed is determined, by an analytical instrument such as a high-performance liquid chromatograph (HPLC) or nuclear magnetic resonance (NMR) device, as the endpoint of the polymerization. After completion of the polymerization, the reaction can be terminated by cooling the polymerization solution to room temperature or below.

The monomer concentration relative to 100 mass % of the polymerization system at the beginning of polymerization is preferably 1 mass % or more and 95 mass % or less, more preferably 10 mass % or more and 80 mass % or less. When the monomer concentration is lower than the above ranges, the reaction rate during polymerization tends to decrease.

When the monomer concentration is higher than the above ranges, the polymerization solution tends to be highly viscous.

The organic solvent or water can be removed from the resulting fluororesin precursor solution or dispersion by a method such as reprecipitation, filtration, or vacuum thermal distillation. Further, the resulting fluororesin precursor may be purified by, for example, a method such as washing with a solvent that does not dissolve the fluororesin during filtration.

[Second Step]

In the second step, the formula (2-2b) between the repeating unit represented by the formula (2-1) and the repeating unit represented by the formula (2-2b) is subjected to addition reaction or condensation reaction with an acrylic acid derivative represented by the formula (2-2c) to produce a fluororesin containing repeating units represented by the formulas (2-1) and (2-2).

[Chem. 74]

(Second Step)

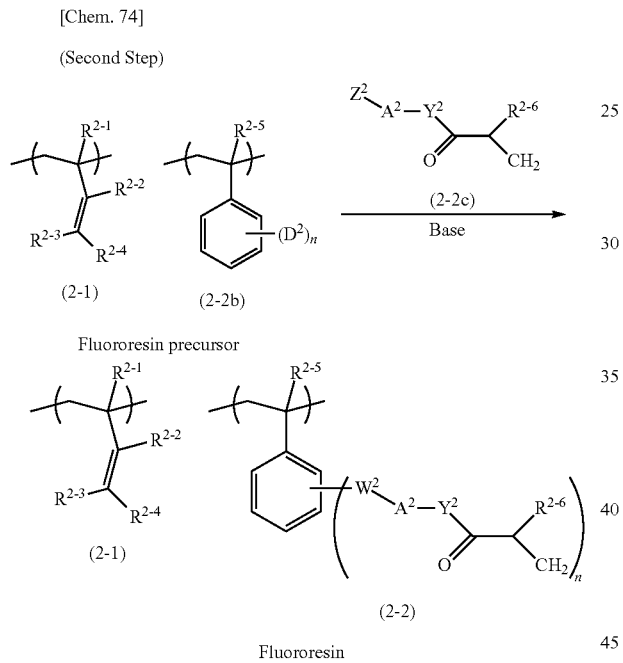

Fluororesin

The acrylic acid derivative represented by the formula (2-2c) may be a commercially available product or can be prepared by a known method or a method based thereon. Use of a commercially available product is preferred in terms of easy availability.

In the formula (2-2c), $R^{2-6}$, $A^2$, and $Y^2$ are the same as $R^{2-6}$, $A^2$, and $Y^2$ in the formula (2-2), respectively. Examples of specific substituents may include those of $R^{2-6}$, $A^2$, and $Y^2$ described in the description of the repeating unit represented by the formula (2-2)

$Z^2$ represents an isocyanate group (—N═C═), an acid halide (—C(═O)—X, wherein X is a halogen atom or an imidazolyl group), an acid anhydride, a halogen atom, a hydroxy group, a hydroxy group protected by a protective group, an amino group (—NH$_2$), or an oxirane group.

Examples of the acid halide (—C(═O)—X, wherein X is a halogen atom or an imidazolyl group) in $Z^2$ include acid fluorides such as —C(═O)—F, —C(═O)—Cl, —C(═O)—Br, and —C(═O)—I, and groups in which —C(═O)— is linked to a 2-imidazolyl group.

Examples of the acid anhydride in $Z^2$ include —C(═O)—O—C(═O)—CH$_3$, —C(═O)—O—C(═O)-(tert-butyl), and —C(═O)—O—C(═O)—CF$_3$.

Examples of the hydroxy group protected by a protective group in $Z^2$ include a hydroxy group protected by a protective group such as a methanesulfonyl group, a trifluoromethanesulfonyl group, or a p-toluenesulfonyl group.

Examples of the oxirane group in $Z^2$ include an ethylene oxide group, a 1,2-propylene oxide group, and a 1,3-propylene oxide group. Of these, $Z^2$ is particularly preferably an isocyanate group, —C(═O)—Cl, or an ethylene oxide group.

Examples of preferred acrylic acid derivatives represented by the formula (2-2c) include the following structures.

[Chem. 75]

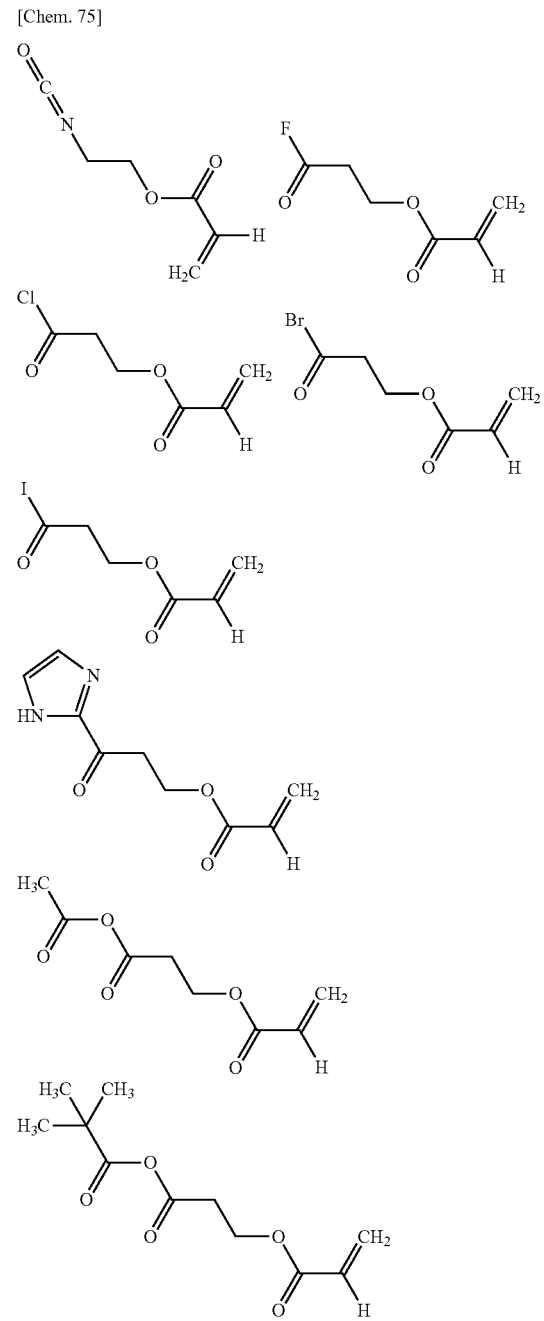

-continued
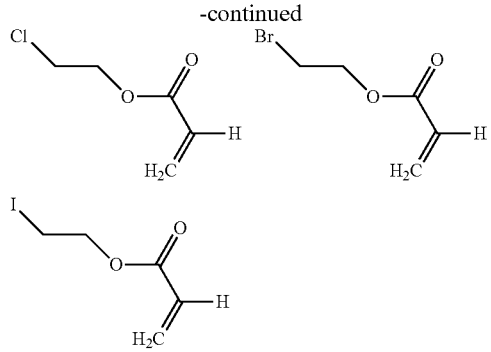
[Chem. 76]
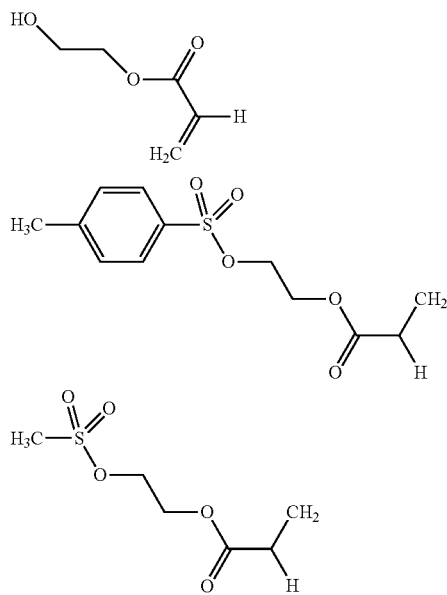
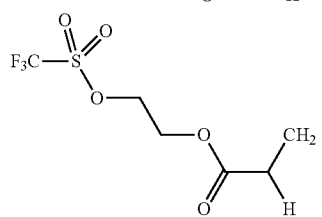
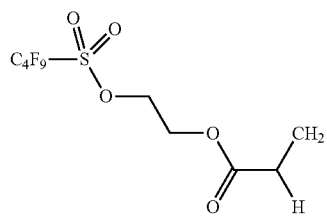
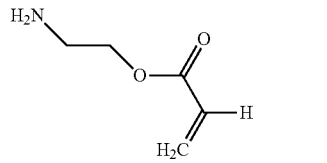
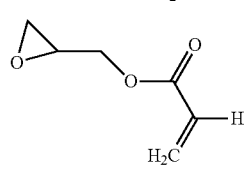
-continued
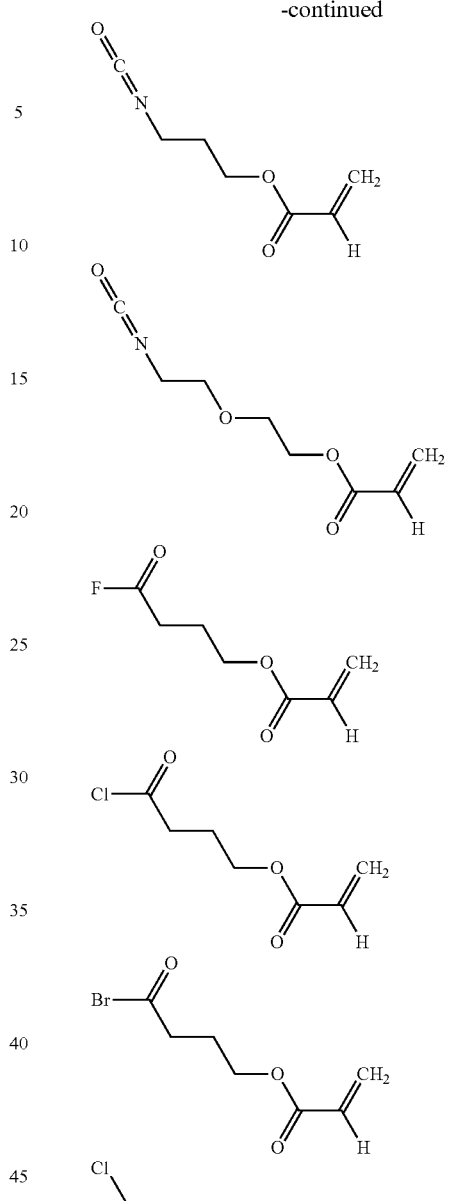
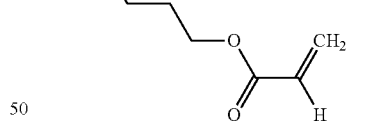
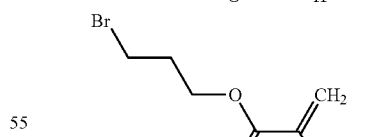
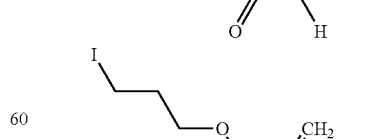
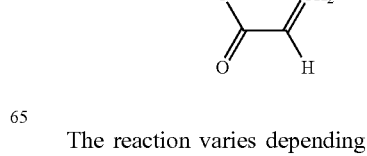
The reaction varies depending on the type of $D^2$ in the formula (2-2b) and the type of $Z^2$ in the formula (2-2c), but in any reaction, a common addition reaction method or condensation reaction method can be used. Here, three forms are exemplified.

Reaction (2-1): When $D^2$ in the formula (2-2b) is a hydroxy group and $Z^2$ in the formula (2-2c) is an isocyanate group, $W^2$ in the resulting formula (2-2) can form a bond "—O—C(=O)—NH—".

Reaction (2-2): When $D^2$ in the formula (2-2b) is a carboxy group and $Z^2$ in the formula (2-2c) is an isocyanate group, $W^2$ in the resulting formula (2-2) can form a bond "—C(=O)—NH—" by decarboxylation in the system or can form a bond "—C(=O)—O—C(=O)—NH—" that does not involve decarboxylation in the system.

Reaction (2-3): When C in the formula (2-2b) is a hydroxy group and $Z^2$ in the formula (2-2c) is an ethylene oxide group, $W^2$ in the resulting formula (2-2) can form a bond "—O—".

The method of the second step is described below. In any of the above reactions, usually, the following method can be used.

The amount of the acrylic acid derivative represented by the formula (2-2c) to act on the fluororesin precursor containing the repeating units represented by the formulas (2-1) and (2-2b) is not limited, but is usually 0.01 to 5 mol, preferably 0.05 to 3 mol, more preferably 0.05 to 1 mol, per mole of the fluororesin precursor containing the repeating units represented by the formulas (2-1) and (2-2b). The amount of the acrylic acid derivative is particularly preferably 0.2 to 1 mol.

Usually, the reaction is performed using an aprotic solvent such as dichloroethane, toluene, ethylbenzene, monochlorobenzene, tetrahydrofuran, acetonitrile, propylene glycol monomethyl monoacetate (PGMEA), or N,N-dimethylformamide. These solvents may be used alone or in combination of two or more thereof.

The reaction temperature is not limited, and is usually in the range of −20° C. to +100° C., preferably 0° C. to +80° C., more preferably +10° C. to +40° C. Preferably, the reaction is performed with stirring.

The reaction time depends on the reaction temperature, but is usually several minutes to 100 hours, preferably 30 minutes to 50 hours, more preferably 1 to 20 hours. Preferably, a point at which the acrylic acid derivative represented by the formula (2-2c) is consumed is determined, by an analytical instrument such as a nuclear magnetic resonance (NMR) device, as the endpoint of the reaction.

In this reaction, a base may be used as a catalyst. Examples of preferred bases include organic bases such as trimethylamine, triethylamine, tripropylamine, tributylamine, and diisopropylethylamine; and inorganic bases such as sodium hydroxide, potassium hydroxide, and lithium hydroxide. The amount of the base catalyst used is not limited, but is 0.01 to 5 mol, preferably 0.02 to 3 mol, more preferably 0.05 to 1 mol, per mole of the fluororesin precursor containing the repeating units represented by the formulas (2-1) and (2-2b).

After completion of the reaction, usual techniques such as reprecipitation, filtration, extraction, crystallization, and recrystallization are performed, whereby a fluororesin containing a repeating unit represented by the formula (2-1) and a repeating unit represented by the formula (2-2) can be obtained. Further, the resulting fluororesin may be purified by, for example, a method such as washing with a solvent that does not dissolve the fluororesin during filtration.

The photosensitive resin composition according to the second embodiment of the present disclosure at least contains the fluororesin, a solvent, and a photopolymerization initiator.

The photosensitive resin composition according to the second embodiment of the present disclosure is particularly suitable as a negative resin composition for obtaining a fluororesin film or banks for organic EL (described later).

In the photosensitive resin composition according to the second embodiment of the present disclosure, any solvent that can dissolve the fluororesin may be used, and examples thereof include ketones, alcohols, polyhydric alcohols and their derivatives, ethers, esters, aromatic solvents, and fluorine solvents. These may be used alone or in combination of two or more thereof.

Specific examples of the ketones include acetone, methyl ethyl ketone, cyclopentanone, cyclohexanone, methyl isoamyl ketone, 2-heptanone cyclopentanone, methyl isobutyl ketone, methyl isopentyl ketone, and 2-heptanone.

Specific examples of the alcohols include isopropanol, butanol, isobutanol, n-pentanol, isopentanol, tert-pentanol, 4-methyl-2-pentanol, 3-methyl-3-pentanol, 2,3-dimethyl-2-pentanol, n-hexanol, n-heptanol, 2-heptanol, n-octanol, n-decanol, s-amyl alcohol, t-amyl alcohol, isoamyl alcohol, 2-ethyl-1-butanol, lauryl alcohol, hexyl decanol, and oleyl alcohol.

Specific examples of the polyhydric alcohols and their derivatives include ethylene glycol, ethylene glycol monoacetate, ethylene glycol dimethyl ether, diethylene glycol, diethylene glycol dimethyl ether, diethylene glycol monoacetate, propylene glycol, propylene glycol monoacetate, propylene glycol monomethyl ether (PGME), propylene glycol monoethyl ether, propylene glycol monopropyl ether, propylene glycol monobutyl ether, propylene glycol monomethyl ether acetate (PGMEA), and monomethyl ether, monoethyl ether, monopropyl ether, monobutyl ether, and monophenyl ether of dipropylene glycol or dipropylene glycol monoacetate.

Specific examples of the ethers include diethyl ether, diisopropyl ether, tetrahydrofuran, dioxane, and anisole.

Specific examples of the esters include methyl lactate, ethyl lactate (EL), methyl acetate, ethyl acetate, butyl acetate, methyl pyruvate, ethyl pyruvate, methyl methoxypropionate, ethyl ethoxypropionate, and γ-butyrolactone.

Examples of the aromatic solvents include xylene and toluene.

Examples of the fluorine solvents include chlorofluorocarbons, hydrochlorofluorocarbons, perfluoro compounds, and hexafluoroisopropyl alcohol.

Other solvents such as terpene-based petroleum naphtha solvents and paraffinic solvents, which are high-boiling-point weak solvents, can also be used to improve coating properties.

Of these, preferably, the solvent is at least one selected from the group consisting of methyl ethyl ketone, cyclohexanone, methyl isoamyl ketone, 2-heptanone, ethylene glycol, ethylene glycol dimethyl ether, ethylene glycol monoacetate, diethylene glycol, diethylene glycol monoacetate, diethylene glycol dimethyl ether, propylene glycol, propylene glycol monoacetate, propylene glycol monomethyl ether (PGME), propylene glycol monomethyl ether acetate (PGMEA), dipropylene glycol, dipropylene glycol monoacetate monomethyl ether, dipropylene glycol monoacetate monoethyl ether, dipropylene glycol monoacetate monopropyl ether, dipropylene glycol monoacetate monobutyl ether, dipropylene glycol monoacetate monophenyl ether, 1,4-dioxane, methyl lactate, ethyl lactate, methyl acetate, ethyl acetate, butyl acetate, methyl methoxypropionate, ethyl ethoxypropionate, γ-butyrolactone, and hexafluoroisopropyl alcohol. More preferred are methyl ethyl ketone, propylene glycol monomethyl ether acetate (PGMEA), propylene glycol monomethyl ether (PGME), cyclohexanone, ethyl lactate, butyl acetate, and γ-butyrolactone.

The amount of the solvent in the photosensitive resin composition according to the second embodiment of the present disclosure is usually 50 mass % or more and 2000 mass % or less, preferably 100 mass % or more and 1000 mass % or less, relative to the concentration (100 mass %) of the fluororesin (when the photosensitive resin composition contains the later-described alkali-soluble resin, the concentration is the sum including the alkali-soluble resin). The thickness of the resulting resin film can be adjusted by adjusting the amount of the solvent. When the amount is in the above ranges, the resulting resin film has a thickness particularly suitable to obtain banks for organic EL.

In the photosensitive resin composition according to the second embodiment of the present disclosure, any photopolymerization initiator can be used as long as it polymerizes the monomers having a polymerizable double bond exemplified in the description of the method of producing a fluororesin by electromagnetic waves or electron beams, and any known photopolymerization initiator can be used.

The photopolymerization initiator can be a photo-radical initiator or a photoacid initiator. These may be used alone or may be used in combination with a photo-radical initiator and a photoacid initiator. Two or more photo-radical initiators or photoacid initiators may be mixed. Use of the photopolymerization initiator in combination with additives enables living polymerization in some cases. Known additives can be used.

Specifically, the photo-radical initiators can be classified into the following types, for example: the intramolecular cleavage type that cleaves the intermolecular bond by absorption of electromagnetic waves or electron beams to generate radicals; and the hydrogen extraction type that, when used in combination with a hydrogen donor such as a tertiary amine or ether, generates radicals. Either type can be used. A photo-radical initiator of a type different from those described above can also be used.

Specific examples of the photo-radical initiators include benzophenone-based, acetophenone-based, diketone-based, acylphosphine oxide-based, quinone-based, and acyloin-based photo-radical initiators.

Specific examples of the benzophenone-based photo-radical initiators include benzophenone, 4-hydroxybenzophenone, 2-benzoylbenzoic acid, 4-benzoylbenzoic acid, 4,4'-bis(dimethylamino)benzophenone, and 4,4'-bis(diethylamino)benzophenone. Preferred of these are 2-benzoylbenzoic acid, 4-benzoylbenzoic acid, and 4,4'-bis(diethylamino)benzophenone.

Specific examples of the acetophenone-based photo-radical initiators include acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl-[4-(methylthio)phenyl]-2-morphorino-1-propanone, and 2-benzyl-2-dimethylamino-1-(4-morphorinophenyl)-butan-1-one. Preferred of these are p-dimethylaminoacetophenone and p-methoxyacetophenone.

Specific examples of the diketone-based photo-radical initiators include 4,4'-dimethoxybenzyl, methyl benzoylformate, and 9,10-phenanthrenequinone. Preferred of these are 4,4'-dimethoxybenzyl and methyl benzoylformate.

Specific examples of the acylphosphine oxide-based photo-radical initiators include bis(2,4,6-trimethylbenzoyl)-phenylphosphine oxide.

Specific examples of the quinone-based photo-radical initiators include anthraquinone, 2-ethylanthraquinone, camphorquinone, and 1,4-naphthoquinone. Preferred of these are camphorquinone and 1,4-naphthoquinone.

Specific examples of the acyloin-based photo-radical initiators include benzoin, benzoin methyl ether, benzoin ethyl ether, and benzoin isopropyl ether. Preferred of these are benzoin and benzoin methyl ether.

Preferred are benzophenone-based, acetophenone-based, and diketone-based photo-radical initiators. More preferred are benzophenone-based photo-radical initiators.

Examples of preferred commercially available photo-radical initiators include Irgacure 127, Irgacure 184, Irgacure 369, Irgacure 651, Irgacure 819, Irgacure 907, Irgacure 2959, Irgacure OXE-01, Darocur 1173, and Lucirin TPO (trade names) available from BASF. More preferred of these are Irgacure 651 and Irgacure 369.

Specifically, the photoacid initiator is an onium salt of a pair of cation and anion, the cation being at least one selected from the group consisting of aromatic sulfonic acid, aromatic iodonium, aromatic diazonium, aromatic ammonium, thianthrenium, thioxanthonium, and (2,4-cyclopentadien-1-yl) (1-methylethylbenzene)-iron, the anion being at least one selected from the group consisting of tetrafluoroborate, hexafluorophosphate, hexafluoroantimonate, and pentafluorophenyl borate.

Particularly preferred of these are bis[4-(diphenylsulfonio)phenyl]sulfide bishexafluorophosphate, bis[4-(diphenylsulfonio)phenyl]sulfide tetrakis(pentafluorophenyl)borate, and diphenyliodonium hexafluorophosphate.

Examples of commercially available photoacid generators include CPI-100P, CPI-110P, CPI-101A, CPI-200K, and CPI-210S (trade names) available from San-Apro Ltd.; CYRACURE Photoinitiator UVI-6990, CYRACURE Photoinitiator UVI-6992, and CYRACURE Photoinitiator UVI-6976 (trade names) available from Dow Chemical Japan Limited; ADECA OPTOMER SP-150, ADECA OPTOMER SP-152, ADECA OPTOMER SP-170, ADECA OPTOMER SP-172, and ADECA OPTOMER SP-300 (trade names) available from ADEKA; CI-5102 and CI-2855 (trade names) available from Nippon Soda Co., Ltd.; SAN AID SI-60L, SAN AID SI-80L, SAN AID SI-100L, SAN AID SI-110L, SAN AID SI-180L, SAN AID SI-110, and SAN AID SI-180 (trade names) available from Sanshin Chemical Industry Co. Ltd; Esacure 1064 and Esacure 1187 (trade names) available from Lamberti; and Irgacure 250 (trade name) available from Ciba Specialty Chemicals.

The amount of the photopolymerization initiator in the photosensitive resin composition according to the second embodiment of the present disclosure is 0.1 mass % or more and 30 mass % or less, preferably 1 mass % or more and 20 mass % or less, relative to 100 mass % of the fluororesin (when the photosensitive resin composition contains the later-described alkali-soluble resin, the concentration is the sum including the alkali-soluble resin). When the amount of the photopolymerization initiator is less than 0.1 mass %, the crosslinking effect tends to be insufficient. When the amount thereof is more than 30 mass %, the resolution and sensitivity tend to be low.

Preferably, the photosensitive resin composition according to the second embodiment of the present disclosure essentially contains the fluororesin according to the second embodiment of the present disclosure, a solvent, and a photopolymerization initiator, and further contains a crosslinking agent (a) and an alkali-soluble resin (b).

The photosensitive resin composition may further contain, for example, a naphthoquinonediazide group-containing compound (c), a basic compound (d), and other additives (e), if necessary.

(a) Crosslinking Agent

The crosslinking agent reacts with a repeating unit represented by the formula (2-2), whereby the resin can have a crosslinked structure. This can improve the mechanical strength of the resulting film.

A known crosslinking agent can be used. Specific examples thereof include compounds obtained by reacting an amino group-containing compound such as melamine, acetoguanamine, benzoguanamine, urea, ethylene urea, propylene urea, or glycoluril with formaldehyde or formaldehyde and a lower alcohol, and substituting a hydrogen atom of the amino group by a hydroxymethyl group or a lower alkoxymethyl group; polyfunctional epoxy compounds; polyfunctional oxetane compounds; polyfunctional isocyanate compounds; and polyfunctional acrylate compounds. Here, those that use melamine are referred to as melamine-based crosslinking agents, those that use urea are referred to as urea-based crosslinking agents, those that use alkylene urea such ethylene urea or propylene urea are referred to as alkylene urea-based crosslinking agents, and those that use glycoluril are referred to as glycoluril-based crosslinking agents. These crosslinking agents may be used alone or in combination of two or more thereof.

Preferably, the crosslinking agent is at least one selected from these crosslinking agents. Particularly preferred are glycoluril-based crosslinking agents and polyfunctional acrylate compounds.

Examples of the melamine-based crosslinking agents include hexamethoxymethyl melamine, hexaethoxymethyl melamine, hexapropoxymethyl melamine, and hexabutoxybutyl melamine. Preferred of these is hexamethoxymethyl melamine.

Examples of the urea-based crosslinking agents include bismethoxymethylurea, bisethoxymethylurea, bispropoxymethylurea, and bisbutoxymethylurea. Preferred of these is bismethoxymethylurea.

Examples of the alkylene urea-based crosslinking agents include ethylene urea-based crosslinking agents such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based crosslinking agents such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; 1,3-di(methoxymethyl)-4,5-dihydroxy-2-imidazolidinone; and 1,3-di(methoxymethyl)-4,5-dimethoxy-2-imidazolidinone.

Examples of the glycoluril-based crosslinking agents include mono-, di-, tri-, and/or tetra-hydroxymethylated glycoluril; mono-, di-, tri-, and/or tetra-methoxymethylated glycoluril; mono-, di-, tri-, and/or tetra-ethoxymethylated glycoluril; mono-, di-, tri-, and/or tetra-propoxymethylated glycoluril; and mono-, di-, tri-, and/or tetra-butoxymethylated glycoluril.

Examples of the polyfunctional acrylate compounds include polyfunctional acrylates (e.g., A-TMM-3, A-TMM-3L, A-TMM-3LM-N, A-TMPT, and AD-TMP (trade names) available from Shin-Nakamura Chemical Co., Ltd.); polyethylene glycol diacrylates (e.g., A-200, A-400, and A-600 (trade names) available from Shin-Nakamura Chemical Co., Ltd.); urethane acrylates (e.g., UA-122P, UA-4HA, UA-6HA, UA-6LPA, UA-11003H, UA-53H, UA-4200, UA-200PA, UA-33H, UA-7100, and UA-7200 (trade names) available from Shin-Nakamura Chemical Co., Ltd.); and pentaerythritol tetraacrylate.

The following are examples of preferred polyfunctional acrylate compounds.

[Chem. 77]

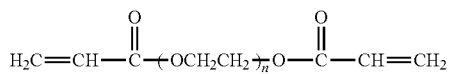

n = 4, 9, 14, 23

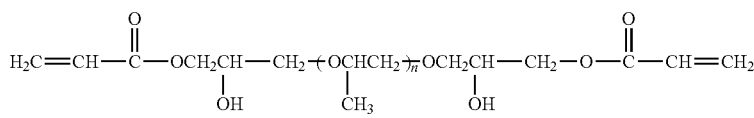

n = 1, 3, 11

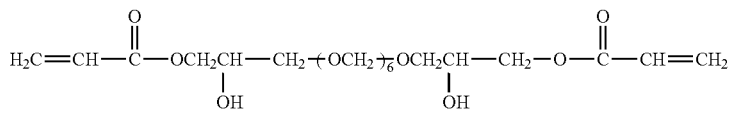

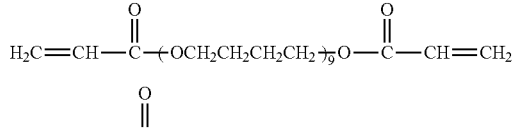

[Chem. 78]

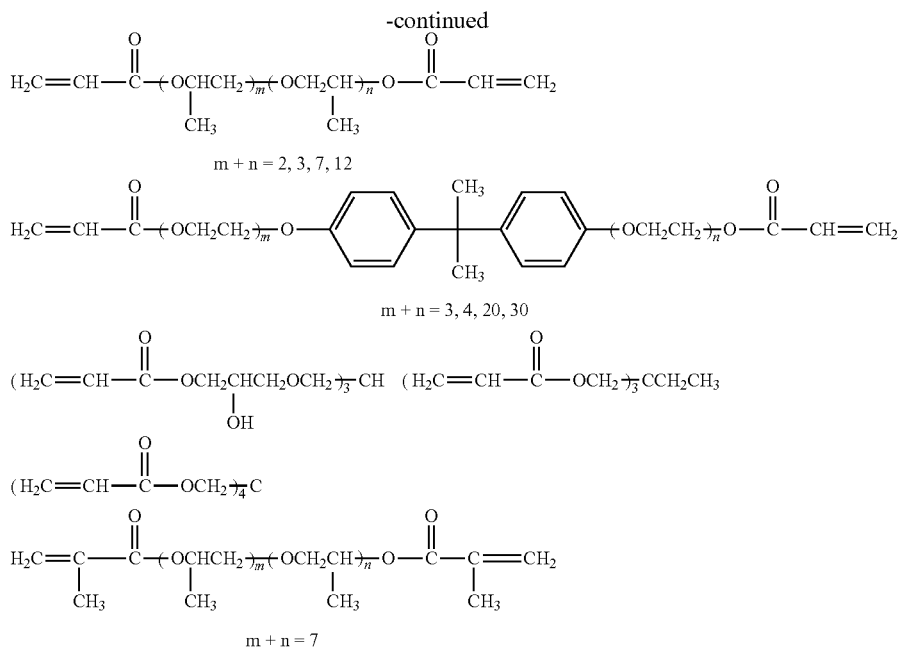

[Chem. 79]

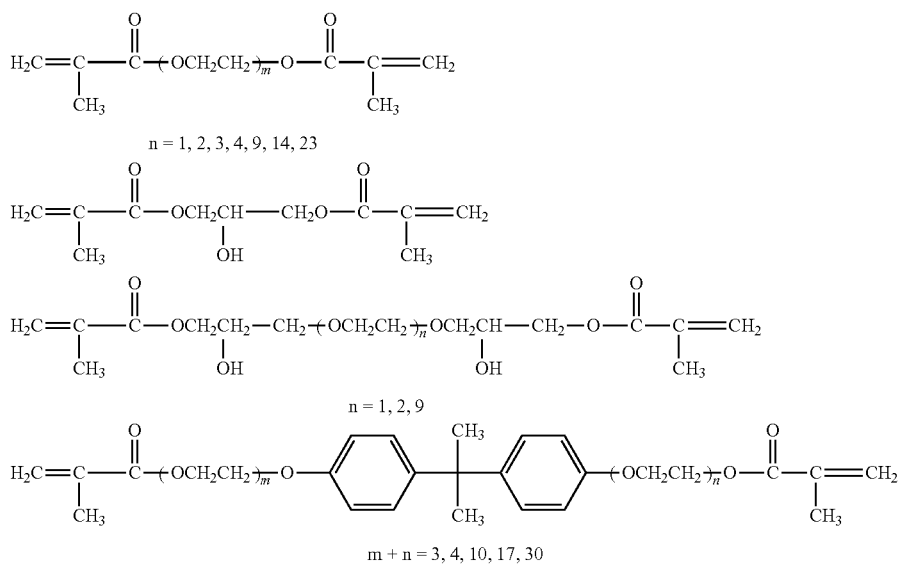

The amount of the crosslinking agent in the photosensitive resin composition according to the second embodiment of the present disclosure is 10 mass % or more and 300 mass % or less, preferably 50 mass % or more and 200 mass % or less, relative to 100 mass % of the fluororesin (when the photosensitive resin composition contains the later-described alkali-soluble resin, the concentration is the sum including the alkali-soluble resin). When the amount of the crosslinking agent is less than 10 mass %, the crosslinking effect tends to be insufficient. When the amount thereof is more than 300 mass %, the resolution and sensitivity tend to be low.

(b) Alkali-Soluble Resin

The alkali-soluble resin has an effect of improving the shape of banks obtainable from the photosensitive resin composition according to the second embodiment of the present disclosure, thus providing one preferred embodiment.

Examples of the alkali-soluble resin include alkali-soluble novolac resins. Alkali-soluble novolac resins can be obtained by condensation of phenol with aldehyde in the presence of an acid catalyst.

Specific examples of the phenol include phenol, o-cresol, m-cresol, p-cresol, 2,3-dimethylphenol, 2,4-dimethylphenol, 2,5-dimethylphenol, 3,4-dimethylphenol, 3,5-dimethylphenol, 2,3,5-trimethylphenol, 3,4,5-trimethylphenol, resorcinol, 2-methylresorcinol, 4-ethylresorcinol, hydroquinone, methylhydroquinone, catechol, 4-methyl-catechol, pyrogallol, phloroglucinol, thymol, and isothymol. These phenols may be used alone or in combination of two or more thereof.

Specific examples of the aldehyde include formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, nitrobenzaldehyde, furfural, glyoxal, glutaraldehyde, terephthalaldehyde, and isophthalaldehyde.

Specific examples of the acid catalyst include hydrochloric acid, nitric acid, sulfuric acid, phosphoric acid, phosphorous acid, formic acid, oxalic acid, acetic acid, methanesulfonic acid, diethyl sulfate, and p-toluenesulfonic acid. These acid catalysts may be used alone or in combination of two or more thereof.

Other examples of the alkali-soluble resin include acid-modified epoxy acrylic resins. Examples of commercially available acid-modified epoxy acrylic resins include CCR-1218H, CCR-1159H, CCR-1222H, CCR-1291H, CCR-1235, PCR-1050, TCR-1335H, UXE-3024, ZAR-1035, ZAR-2001H, ZFR-1185, and ZCR-1569H (trade names) available from Nippon Kayaku Co., Ltd.

The weight average molecular weight of the alkali-soluble resin is preferably 1000 to 50000 in terms of developability and resolution of the photosensitive resin composition.

The amount of the alkali-soluble resin in the photosensitive resin composition according to the second embodiment of the present disclosure is 500 mass % or more and 10000 mass % or less, preferably 1000 mass % or more and 7000 mass % or less, relative to 100 mass % of the fluororesin. When the amount of the alkali-soluble resin is more than 10000 mass %, the fluororesin according to the second embodiment of the present disclosure tends to have insufficient ink repellency after UV-ozone treatment or oxygen plasma treatment.

(c) Naphthoquinonediazide Group-Containing Compound

Any naphthoquinonediazide group-containing compound can be used, and one commonly used as a photosensitive component of a resist composition for i-rays can be used. The naphthoquinonediazide group-containing compound has an effect of improving the shape of banks obtainable from the photosensitive resin composition according to the second embodiment of the present disclosure, thus providing one preferred embodiment.

Specific examples of the naphthoquinonediazide group-containing compounds include a naphthoquinone-1,2-diazide-4-sulfonate compound, a naphthoquinone-1,2-diazide-5-sulfonate compound, a naphthoquinone-1,2-diazide-6-sulfonate compound, a naphthoquinone-1,2-diazide sulfonate compound, an orthobenzoquinonediazide sulfonate compound, and an orthoanthraquinonediazide sulfonate compound. Preferred of these are a naphthoquinone-1,2-diazide-4-sulfonate compound, a naphthoquinone-1,2-diazide-5-sulfonate compound, and a naphthoquinone-1,2-diazide-6-sulfonate compound, because they have excellent solubility. These compounds may be used alone or in combination of two or more thereof.

The amount of the naphthoquinonediazide group-containing compound in the photosensitive resin composition according to the second embodiment of the present disclosure is usually 10 mass % to 60 mass %, preferably 20 mass % to 50 mass %, relative to 100 mass % of the fluororesin (when the photosensitive resin composition contains the above-described alkali-soluble resin, the concentration is the sum including the alkali-soluble resin). When the amount thereof is more than 60 wt %, the photosensitive resin composition tends to lack sensitivity.

(d) Basic Compound

The basic compound functions to decrease the diffusion rate of an acid generated by the photoacid generator when the acid is diffused into a film. The presence of the basic compound is likely to improve the shape of banks by adjusting the acid diffusion distance and increase the stability to obtain a bank shape with desired accuracy even when the banks formed are left to stand for a long time before being exposed.

Examples of the basic compound include aliphatic amines, aromatic amines, heterocyclic amines, and aliphatic polycyclic amines. Preferred of these are aliphatic amines. Specific examples thereof include secondary or tertiary aliphatic amines and alkyl alcohol amines. These basic compounds may be used alone or in combination of two or more thereof.

Examples of the aliphatic amines include alkylamines and alkyl alcohol amines each in which at least one hydrogen atom of ammonia ($NH_3$) is substituted by a C12 or lower alkyl group or a hydroxyalkyl group. Specific examples thereof include trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, tri-n-dodecylamine, dimethylamine, diethylamine, di-n-propylamine, di-n-butylamine, di-n-pentylamine, di-n-hexylamine, di-n-heptylamine, di-n-octylamine, di-n-nonylamine, di-n-decanylamine, di-n-dodecylamine, dicyclohexylamine, methylamine, ethylamine, n-propylamine, n-butylamine, n-pentylamine, n-hexylamine, n-heptylamine, n-octylamine, n-nonylamine, n-decanylamine, n-dodecylamine, diethanolamine, triethanolamine, diisopropanolamine, triisopropanolamine, di-n-octanolamine, and tri-n-octanolamine. Preferred of these are dialkylamine, trialkylamine, and alkyl alcohol amines. More preferred are alkyl alcohol amines. Particularly preferred of these alkyl alcohol amines are triethanolamine and triisopropanolamine.

Examples of the aromatic amines and heterocyclic amines include aniline and aniline derivatives such as N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine; heterocyclic amines such as 1,5-diazabicyclo[4.3.0]non-5-en, 1,8-diazabicyclo[5.4.0]undec-7-en, 1,4-diazabicyclo[2.2.2]octane, pyridine, bipyridine, 4-dimethylaminopyridine, hexamethylenetetramine, and 4,4-dimethylimidazoline; hindered amines such as bis(1,2,2,6,6-pentamethyl-4-piperidyl)sebacate; alcoholic nitrogen-containing compounds such as 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, and 1-[2-(2-hydroxyethoxy)ethyl]piperazine; and amines such as picoline, lutidine, pyrrole, piperidine, piperazine, indole, and hexamethylenetetramine.

The amount of the basic compound in the photosensitive resin composition according to the second embodiment of the present disclosure is usually 0.001 mass % to 2 mass %, preferably 0.01 mass % to 1 mass %, relative to 100 mass % of the fluororesin (when the photosensitive resin composition contains the above-described alkali-soluble resin, the concentration is the sum including the alkali-soluble resin). When the amount of the basic compound is less than 0.001 mass %, the effect thereof as an additive tends to be insufficient. When the amount thereof is more than 2 mass %, the resolution and sensitivity tend to be low.

(e) Other Additives

The photosensitive resin composition according to the second embodiment of the present disclosure may contain other additives if necessary. Known additives may be suitably used as the other additives, and examples thereof include various additives such as dissolution inhibitors, plasticizers, stabilizers, colorants, surfactants, thickeners, leveling agents, defoamers, compatibility agents, adhesives, and antioxidants.

Preferably, the surfactant contains any one or more of fluorine-based surfactants and silicone-based surfactants (fluorine-based surfactants, silicone-based surfactants, and surfactants containing both fluorine atoms and silicon atoms).

The fluororesin film according to the second embodiment of the present disclosure contains a repeating unit represented by the formula (2-1) and a repeating unit represented by the formula (2-2A). Specifically, the fluororesin film according to the second embodiment of the present disclosure is obtained by curing the photosensitive resin composition described above.

[Chem. 80]

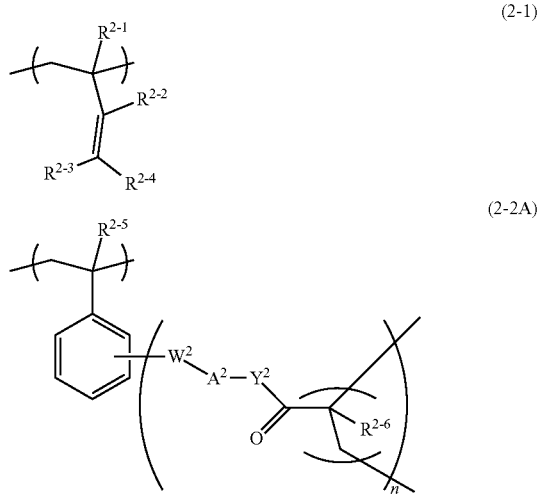

(2-1)

(2-2A)

In the formula (2-1), $R^{2-1}$ represents a hydrogen atom, a fluorine atom, or a methyl group; $R^{2-2}$ represents a hydrogen atom or a C1-C6 linear, C3-C6 branched, or C3-C6 cyclic alkyl group; $R^{2-3}$ and $R^{2-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{2-1}$, $R^{2-3}$, and $R^{2-4}$ are fluorine atoms or the fluoroalkyl groups.

In the formula (2-2A), $R^{2-5}$ and $R^{2-6}$ each independently represent a hydrogen atom or a methyl group; $W^2$ is a divalent linking group and represents —O—, —O—C(=O)—, —C(=O)—O—, —O—C(=O)—NH—, —C(=O)—O—C(=O)—NH—, or —C(=O)—NH—; $A^2$ is a divalent linking group and represents a C1-C10 linear, C3-C10 branched, or C3-C10 cyclic alkylene group in which one or more hydrogen atoms in the alkylene group may be substituted by hydroxy groups or —O—C(=O)—CH$_3$; $Y^2$ is a divalent linking group and represents —O— or —NH—; and n represents an integer of 1 to 3.

Examples of preferred structures of the repeating unit represented by the formula (2-1) may include those described in the description of the repeating unit represented by the above formula (2-1).

The repeating unit represented by the formula (2-2A) is formed by cleavage of the polymerizable double bond of the repeating unit represented by the formula (2-2). No structural changes occur and the original structure is maintained, except for the changes in the polymerizable double bond during polymerization. Thus, in the repeating unit represented by the formula (2-2A), $R^{2-5}$, $R^{2-6}$, $W^2$, $A^2$, $Y^2$, and n are the same as $R^{2-5}$, $R^{2-6}$, $W^2$, $A^2$, $Y^2$, and n in the repeating unit represented by the formula (2-2), respectively. Examples of specific substituents may include those described for the repeating unit represented by the above formula (2-2). Examples of preferred structures of the repeating unit represented by the formula (2-2A) may include the preferred structures described in the description of the repeating unit represented by the formula (2-2), except that they are formed by cleavage of the polymerizable double bond.

The fluororesin film according to the second embodiment of the present disclosure can be suitably used as a simple film not having a pattern. It can also be suitably used as a film having a pattern, i.e., banks (described later). Herein, the term "fluororesin film" refers to a film not having a pattern.

The fluororesin film according to the second embodiment of the present disclosure has excellent water repellency and oil repellency owing to its low surface free energy. For example, the fluororesin film can be used as a water- and oil-repellent agent for treating fabrics (base materials) for clothes or the like, or a sealing agent for protecting substrates (base materials) for microfabricated semiconductors. The fluororesin film can be used as a film to protect base materials in various applications.

When forming a fluororesin film, it is particularly preferred that the photosensitive resin composition essentially contains a fluororesin, a solvent, and a photopolymerization initiator and further contains a crosslinking agent. The photosensitive resin composition may contain other additives if necessary. Examples of the solvent, the photopolymerization initiator, the crosslinking agent, and the other additives may include those described above in the description of the photosensitive resin composition.

When pursuing properties other than the ink repellency of the fluororesin according to the second embodiment of the present disclosure after UV-ozone treatment or oxygen plasma treatment, the fluororesin is mixed (blended) with other resins, whereby characteristics of other resins can be incorporated.

The types of monomers of such "other resins" are not limited. Examples thereof include styrene compounds, acrylic acid esters, and methacrylic acid esters. These may be homopolymers of one type or copolymers of two or more types. Fluorine-free monomers are particularly preferred.

When forming a fluororesin film by mixing the fluororesin with the "other resins" as described above, the mass % of the fluororesin according to the second embodiment of the present disclosure relative to 100 mass % of the fluororesin film is usually 50 mass % to 99 mass %, more preferably 60 mass % to 99 mass %, particularly preferably 70 mass % to 99 mass %. The rest are the "other resins" or "various additives" described above. When the amount of the fluororesin according to the second embodiment of the present disclosure is less than 50 mass %, the ink repellency tends to decrease after UV-ozone treatment or oxygen plasma treatment.

When forming a fluororesin film, the concentration of the fluororesin relative to 100 mass % of the photosensitive resin composition is preferably 1 mass % or more and 30 mass % or less, more preferably 2 mass % or more and 20 mass % or less, to facilitate coating and film formation.

A technique similar to conventionally known coating methods can be appropriately used as the method of forming a film using the photosensitive resin composition according to the second embodiment of the present disclosure. A suitable method can be selected according to a coating target. For example, the fluororesin according to the second embodiment of the present disclosure can be suitably applied with an appropriate coating device such as a slit coater, die coater, gravure coater, dip coater, or spin coater. A method such as immersion coating, spray coating, or roller coating can also be used.

After a fluororesin film is applied to a substrate, preferably, the solvent contained in the photosensitive resin composition is dried and removed from the fluororesin film.

The solvent can be removed by heating the substrate coated with the fluororesin film at 80° C. or higher and 300° C. or lower. Preferably, the heating is performed until a decrease in weight of the fluororesin film is no longer observed. The heating may be performed under atmospheric pressure, increased pressure, or reduced pressure. Further, the heating may be performed in air or inert atmospheres, or may be performed under flow of a predetermined gas.

When the heating temperature is lower than 80° C., the solvent tends to remain. When the heating temperature is higher than 300° C., the fluororesin tends to decompose. More preferably, the heating temperature is 100° C. or higher and 250° C. or lower, so that the solvent can be removed without causing decomposition of the fluororesin.

The coating target may be a substrate for a microfabricated semiconductor or a fabric for clothes or the like.

Here, the fluororesin film to be formed on a base material may be formed on the entire or partial surface of the base material.

Preferably, the thickness of the resulting fluororesin film is 1 μm or more and 500 μm or less. A fluororesin film thinner than 1 μm may have low mechanical strength. A fluororesin film thicker than 500 μm tends not to be flat due to large recesses and protrusions on its surface.

The banks according to the second embodiment of the present disclosure contain a repeating unit represented by the formula (2-1) and a repeating unit represented by the formula (2-2A). Specifically, the banks according to the second embodiment of the present disclosure are obtained by curing the photosensitive resin composition described above.

When forming the banks according to the second embodiment of the present disclosure, it is particularly preferred that the photosensitive resin composition essentially contains a fluororesin, a solvent, and a photopolymerization initiator, and further contains a crosslinking agent and an alkali-soluble resin. The photosensitive resin composition may further contain, for example, a naphthoquinonediazide group-containing compound (c), a basic compound (d), and other additives (e), if necessary.

Examples of the compounds may include those described above in the description of the photosensitive resin composition.

A resist pattern formation method of a conventional photoresist technique can be used as a method of forming the banks according to the second embodiment of the present disclosure. The method of forming the banks is described below.

The banks can be formed by a film forming step (2-4-1), an exposing step (2-4-2), a developing step (2-4-3), and a UV-ozone treatment or oxygen plasma treatment step (2-4-4). In the film forming step (2-4-1), the photosensitive resin composition is applied to a substrate to form a film. In the exposing step (2-4-2), the substrate is irradiated with electromagnetic waves or electron beams through a photo mask to transfer a photo mask pattern to the film. In the developing step (2-4-3), the film is developed using a developer to form banks. In the UV-ozone treatment or oxygen plasma treatment step (2-4-4), the residual organic matter or the like in recesses between the banks is removed. Subsequently, a heating step (2-4-5) may be included if necessary.

Each step is described below with examples.

2-4-1. Film Forming Step

The film forming step is a step of forming a film on a substrate such as a silicon wafer by applying the photosensitive resin composition thereto by spin coating or the like and subsequently heating the silicon wafer on a hot plate to remove a solvent. The solvent is removed by heating usually at a temperature of 60° C. or higher and 200° C. or lower for 10 seconds or more and 10 minutes or less, preferably at a temperature of 80° C. or higher and 150° C. or lower for 30 seconds or more and 2 minutes or less.

The substrate may be a silicon wafer, metal, glass, ITO substrate, or the like. The substrate may include an organic or inorganic film formed thereon in advance. For example, the substrate may include an anti-reflective film and/or a multilayer resist underlayer, and such a film and/or underlayer may have a pattern formed thereon. The substrate may be pre-washed. For example, the substrate may be washed with ultrapure water, acetone, an alcohol (methanol, ethanol, or isopropyl alcohol), or the like.

2-4-2. Exposing Step

The exposing step is a step of setting a desired photo mask in an exposure device, irradiating the film with electromagnetic waves or electron beams through the photo mask, and then heating the film on a hot plate.

The wavelength of electromagnetic waves or electron beams used for exposure is preferably 100 to 600 nm, more preferably 300 to 500 nm, and those containing i-rays (365 nm), h-rays (405 nm), and g-rays (436 nm) are particularly preferred. Light with a wavelength of 330 nm or less may be cut off if necessary.

Examples of light sources include KrF excimer laser light (wavelength: 248 nm), ArF excimer laser light (wavelength: 193 nm), and F2 excimer laser light (wavelength: 157 nm).

The amount of electromagnetic wave or electron beam exposure is 1 mJ/cm$^2$ or more and 200 mJ/cm$^2$ or less, preferably 10 mJ/cm$^2$ or more and 100 mJ/cm$^2$ or less.

The heating after exposure is performed on a hot plate usually at a temperature of 60° C. or higher and 150° C. or lower for 10 seconds or more and 5 minutes or less, preferably at a temperature of 80° C. or higher and 130° C. or lower for 30 seconds or more and 3 minutes or less.

2-4-3. Developing Step

The developing step is a step of forming banks by dissolving, in a developer, the exposed or non-exposed portions of the film obtained in the exposing step described above.

The developer may be, for example, an alkaline aqueous solution such as a tetramethylammonium hydroxide (TMAH) aqueous solution or a tetrabutylammonium hydroxide (TBAH) aqueous solution, or an organic solvent such as propylene glycol monomethyl ether acetate (PGMEA) or butyl acetate.

The concentration of the tetramethylammonium hydroxide (TMAH) aqueous solution is usually 0.1 mass % or more and 5 mass % or less, preferably 2 mass % or more and 3 mass % or less.

Any known development method, such as dipping, paddling, or spraying, can be used.

The development time (contact time of the developer with the film) is usually 10 seconds or more and 3 minutes or less, preferably 30 seconds or more and 2 minutes or less.

After development, a step of washing the formed banks film with deionized water or the like may be included if necessary. The washing method and washing time are as described above for the development method using a developer and development time.

The film after development is subjected to a heating step for crosslinking and removing low-boiling components. The heating is performed on a hot plate usually at a temperature of 60° C. or higher and 300° C. or lower for 10 seconds or more and 120 minutes or less, preferably at a temperature of 140° C. or higher and 250° C. or lower for 10 minutes or more and 90 minutes or less.

2-4-4. UV-Ozone Treatment or Oxygen Plasma Treatment Step

The UV-ozone treatment or oxygen plasma treatment step is a step of irradiating the entire surface of the substrate having the banks formed thereon with UV-ozone or oxygen plasma to remove residual organic matter or the like in the recesses between the banks.

The UV-ozone treatment time is usually 10 seconds or more and 30 minutes or less, preferably 1 minute or more and 15 minutes or less.

The oxygen plasma treatment time is usually 10 seconds or more and 30 minutes or less, preferably 1 minute or more and 15 minutes or less.

When the UV-ozone treatment or oxygen plasma treatment time is less than 10 seconds, removal of residual organic matter tends to be incomplete. When the UV-ozone treatment or oxygen plasma treatment time is more than 30 minutes, the thickness of the patterned film tends to decrease.

2-4-5. Heating Step

After the UV-ozone treatment or oxygen plasma treatment step, a heating step of heating the resulting banks may be performed if necessary. This step can improve the liquid repellency of the upper surfaces of the banks according to the second embodiment of the present disclosure.

The heating is performed on a hot plate usually at a temperature of 60° C. or higher and 300° C. or lower for 10 seconds or more and 30120 minutes or less, preferably at a temperature of 140° C. or higher and 250° C. or lower for 10 minutes or more and 1590 minutes or less.

Preferably, the heat treatment step is performed when the banks according to the second embodiment of the present disclosure contain the repeating unit represented by the formula (2-4) wherein B is a carboxy group. Such banks are one embodiment especially capable of improving the ink repellency by the heat treatment step.

The display element according to the second embodiment of the present disclosure includes the banks.

Examples of the display element according to the second embodiment of the present disclosure include organic electroluminescence displays (hereinafter organic EL displays), micro-LED displays, and quantum dot displays.

Examples According to the Second Embodiment

The second embodiment of the present disclosure is described in detail below with reference to examples but the present disclosure is not limited to these examples.

1. Synthesis of Monomers

[Synthesis Example 2-1] Synthesis of 1,1-bistrifluoromethylbutadiene (BTFBE)

A 1000-ml glass flask equipped with a stirrer was charged with concentrated sulfuric acid (400 g) and heated to 100° C. Then, 1,1,1-trifluoro-2-trifluoromethyl-4-penten-2-ol (a product of Central Glass Co., Ltd.) (300 g) was gradually dropped thereto over one hour. After dropping, the mixture was stirred at 100° C. for 60 minutes. No residual raw materials were detected by $^{19}$F-NMR analysis of the reaction solution. Then, a fraction at 68° C. to 70° C. was collected by atmospheric distillation from the reaction solution, whereby 1,1-bistrifluoromethylbutadiene (hereinafter described as BTFBE) was obtained (yield: 58%).

[Chem. 81]

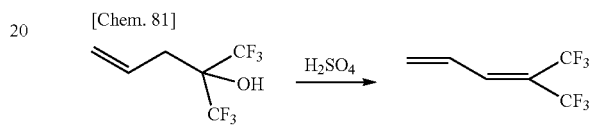

<Results of NMR Analysis>

$^{1}$H-NMR (solvent: deuterated chloroform; standard substance: TMS); δ (ppm) 5.95 (1H, dd) 6.05 (1H, dd), 6.85 (1H, m), 7.04 (1H, m)

$^{19}$F-NMR (solvent: deuterated chloroform; standard substance: $C_6D_6$); δ (ppm) −65.3 (3F, m), −58.4 (3F, m)

[Synthesis Example 2-2] Synthesis of 4-hydroxystyrene (p-HO-St)

(The synthesis was performed with reference to Examples in JP 2016-98181 A.)

A 1000-ml glass flask equipped with a stirrer was charged at room temperature (about 20° C.) with 4-acetoxystyrene (a product of Tokyo Chemical Industry Co., Ltd., hereinafter described as p-AcO-St) (100 g) and methanol (300 g), which were mixed therein, and 1,3,5-trihydroxybenzene (0.50 g; equivalent to 0.5 mass % of p-AcO-St) as a polymerization inhibitor was added to the mixture. Then, after the solution was cooled to 0° C. in an ice bath, a sodium hydroxide aqueous solution having a concentration of 12 mass % (corresponding to 1.0 equivalent of p-AcO-St) was gradually dropped over 40 minutes, followed by stirring at 0° C. for 30 minutes. No residual raw materials were detected by $^{1}$H-NMR analysis of the reaction solution. Then, a hydrochloric acid aqueous solution having a concentration of 18 mass % (corresponding to 0.8 equivalents of p-AcO-St) was dropped over 30 minutes, followed by stirring for 30 minutes. The pH of the solution was measured to be 6.

The resulting reaction solution was subjected to extraction with methyl-t-butylether (360 g) at room temperature (about 20° C.), followed by washing twice with purified water (330 g). To the resulting organic layer was added 1,3,5-trihydroxybenzene in an amount equivalent to 1 mass % of 4-hydroxystyrene. Subsequently, 4-hydroxystyrene was concentrated to 72 mass %, and added to n-octane (a poor solvent) cooled to 0° C. Then, the solution was placed in an ice bath and stirred for one hour to precipitate crystals of 4-hydroxystyrene. The crystals were filtered and further washed with n-octane. Then, the crystals were vacuum dried at 25° C. Thus, white crystals of 4-hydroxystyrene (hereinafter described as p-HO-St) were obtained (yield: 66%).

[Chem. 82]

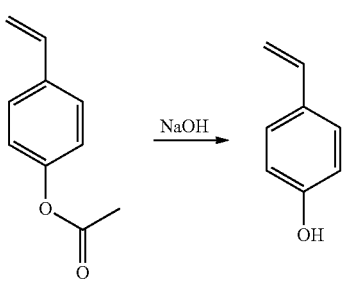

2. Production of Fluororesin (First Step: Polymerization)
[Measurement of Molar Ratio of Repeating Units] NMR The molar ratio of the repeating units of the polymer was determined from the measurements of $^1$H-NMR, $^{19}$F-NMR, or $^{13}$C-NMR.
[Measurement of Polymer Molecular Weight] GPC The weight average molecular weight Mw and the molecular weight distribution (Mw/Mn: ratio of the weight average molecular weight Mw to the number average molecular weight Mn) of the polymer were measured by a high-speed gel permeation chromatograph (hereinafter sometimes referred to as GPC; model: HLC-8320 GPC available from Tosoh Corporation) with an ALPHA-M column and an ALPHA-2500 column (products both available from Tosoh Corporation) connected in series, using tetrahydrofuran (THF) as a developing solvent. A refractive index difference detector was used.
2-1. Polymerization of Fluororesin Precursors
[Polymerization of Fluororesin Precursor 2-1]

A 300-ml glass flask equipped with a stirrer was charged at room temperature (about 20° C.) with BTFBE obtained in Synthesis Example 2-1 (9.5 g (0.05 mol)), p-HO-St obtained in Synthesis Example 2-2 (12.2 g (0.1 mol)), 2-(perfluorohexyl)ethyl methacrylate (a product of Tokyo Chemical Industry Co., Ltd., hereinafter described as MA-C6F) (43.2 g (0.1 mol)), and MEK (65 g). Then, 2,2'-azobis(2-methylbutyronitrile) (a product of Tokyo Chemical Industry Co., Ltd., hereinafter described as AIBN) (1.6 g (0.005 mol)) was added thereto, followed by degassing with stirring. Subsequently, the flask was purged with nitrogen gas, and the temperature inside the flask was raised to 75° C. for reaction for six hours. n-Heptane (350 g) was dropped into the reaction system, whereby a transparent viscous substance was precipitated. This viscous substance was isolated by decantation. Vacuum drying was performed at 60° C. Thus, a fluororesin precursor 2-1 as a transparent viscous substance was obtained (58 g; yield: 90%).
<Results of NMR Measurement>

The ratio (in mol %) of the repeating units of the fluororesin precursor 2-1 was as follows: BTFBE repeating unit:p-HO-St repeating unit:MA-C6F repeating unit=21:51:28.

[Chem. 83]

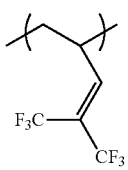

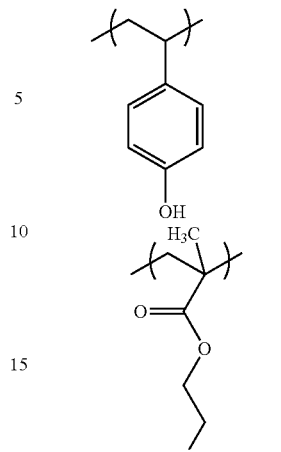

Fluororesin precursor 2-1

<Results of GPC Measurement>
Mw=12000, Mw/Mn=1.4
[Polymerization of Fluororesin Precursor 2-2]

The same procedure as in the synthesis of the fluororesin precursor 2-1 was performed, except that p-HO-St was replaced by vinyl benzoic acid (a product of Tokyo Chemical Industry Co., Ltd., hereinafter described as VBA) Thus, a fluororesin precursor 2-2 containing the following repeating units was obtained (yield: 87%).
<Results of NMR Measurement>

The ratio (in mol %) of the repeating units of the fluororesin precursor 2-2 was as follows: BTFBE repeating unit:VBA repeating unit:MA-C6F repeating unit=16:57:27.

[Chem. 84]

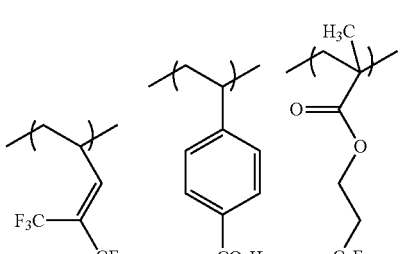

Fluroresin precursor 2-2

<Results of GPC Measurement>
Mw=9000, Mw/Mn=1.4
[Polymerization of Fluororesin Precursor 2-3]

A 300-ml glass flask equipped with a stirrer was charged at room temperature (about 20° C.) with BTFBE (9.5 g (0.05 mol)), p-HO-St (6.1 g (0.05 mol)), VBA (7.4 g (0.05 mol)), MA-C6F (43.2 g (0.1 mol)), and MEK (65 g). Then, AIBN (1.6 g (0.010 mol)) was added thereto, followed by degassing with stirring. Subsequently, the flask was purged with nitrogen gas, and the temperature inside the flask was raised to 75° C. for reaction for six hours. n-Heptane (350 g) was dropped into the reaction system, whereby a white solid was precipitated. The solid was isolated by filtration and vacuum dried at 60° C., whereby a fluororesin precursor 2-3 as a white solid was obtained (59 g; yield: 89%).

<Results of NMR Measurement>

The ratio (in mol %) of the repeating units of the fluororesin precursor 2-3 was as follows: BTFBE repeating unit:p-HO-St repeating unit:VBA repeating unit:MA-C6F repeating unit=15:25:25:35.

[Chem. 85]

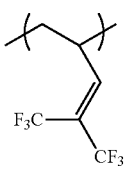

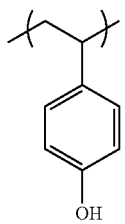

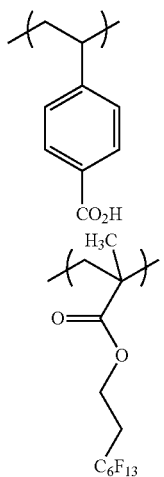

Fluororesin precursor 2-3

<Results of GPC Measurement>
Mw=7500, Mw/Mn=1.3

[Polymerization of Fluororesin Precursor 2-4]

The same procedure as in the synthesis of the fluororesin precursor 2-3 was performed, except that p-HO-St was replaced by styrene (a product of Tokyo Chemical Industry Co., Ltd., hereinafter described as St). Thus, a fluororesin precursor 2-4 containing the following repeating units was obtained (yield: 86%).

<Results of NMR Measurement>

The ratio (in mol %) of the repeating units of the fluororesin precursor 2-4 was as follows: BTFBE repeating unit:VBA repeating unit:MA-C6F repeating unit:St repeating unit=16:26:34:24.

[Chem. 86]

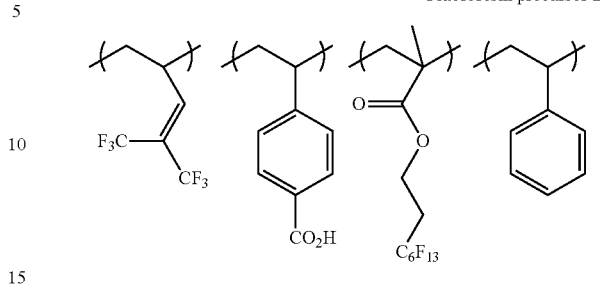

Fluororesin precursor 2-4

<Results of GPC Measurement>
Mw=7300, Mw/Mn=1.3

[Polymerization of Fluororesin Precursor 2-5]

The same procedure as in the synthesis of the fluororesin precursor 2-3 was performed, except that VBA was replaced by St. Thus, a fluororesin precursor 2-5 containing the following repeating units was obtained (yield: 84%).

<Results of NMR Measurement>

The ratio (in mol %) of the repeating units of the fluororesin precursor 2-5 was as follows: BTFBE repeating unit:p-HO-St repeating unit:MA-C6F repeating unit:St repeating unit=16:25:35:25.

[Chem. 87]

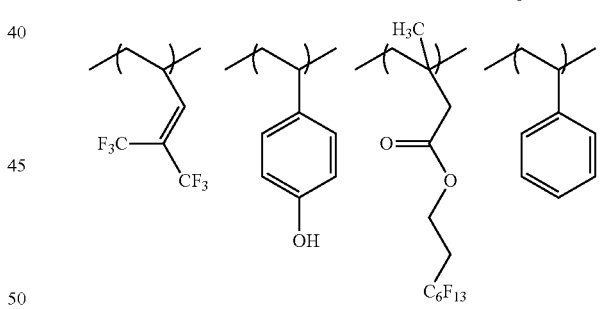

Fluororesin precursor 2-5

<Results of GPC Measurement>
Mw=6900, Mw/Mn=1.3

[Polymerization of Fluororesin Precursor 2-6]

The same procedure as in the synthesis of the fluororesin precursor 2-3 was performed, except that VBA was replaced by p-AcO-St. Thus, a fluororesin precursor 2-6 containing the following repeating units was obtained (yield: 88%).

<Results of NMR Measurement>

The ratio (in mol %) of the repeating units of the fluororesin precursor 2-6 was as follows: BTFBE repeating unit:p-HO-St repeating unit:MA-C6F repeating unit:p-AcO-St repeating unit=17:23:33:27.

[Chem. 88]

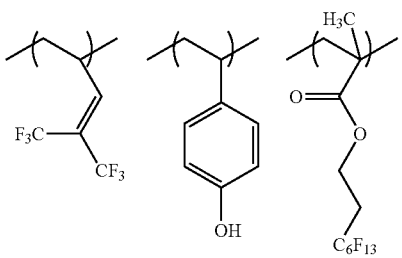

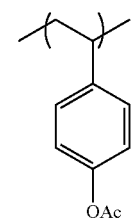

Fluororesin precursor 2-6

<Results of GPC Measurement>
Mw=7900, Mw/Mn=1.4

2-2. Polymerization of Comparative Fluororesins

[Polymerization of Comparative Fluororesin Precursor 2-1]

A 300-ml glass flask equipped with a stirrer was charged at room temperature (about 20° C.) with methacrylic acid (a product of Tokyo Chemical Industry Co., Ltd., hereinafter described as MAA) (17.32 g (0.2 mol)), MA-C6F (43.2 g (0.1 mol)), hexafluoroisopropyl methacrylate (a product of Central Glass Co., Ltd., hereinafter described as HFIP-M) (23.6 g (0.1 mol)), and MEK (84 g). Then, AIBN (1.6 g (0.010 mol)) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (500 g), whereby a white precipitate was obtained. The precipitate was filtered and vacuum dried at 60° C., whereby a comparative fluororesin precursor 2-1 as a white solid was obtained (55 g; yield: 64%).

<Results of NMR Measurement>

The molar ratio of the repeating units of the comparative fluororesin precursor 2-1 was as follows: MA-C6F repeating unit:HFIP-M repeating unit:MAA repeating unit=20:26:54.

[Chem. 89]

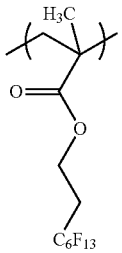

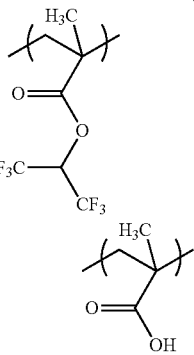

Comparative fluororesin precursor 2-1

<Results of GPC Measurement>
Mw=9700, Mw/Mn=1.5

[Polymerization of Comparative Fluororesin Precursor 2-2]

A 300-ml glass flask equipped with a stirrer was charged at room temperature with MA-C6F (43.2 g (0.1 mol)), HFIP-M (23.6 g (0.1 mol)), MAA (8.66 g (0.1 mol)), 2-hydroxyethyl methacrylate (a product of Tokyo Chemical Industry Co., Ltd., hereinafter described as HEMA) (13.01 g (0.1 mol)), and MEK (88 g). Then, AIBN (1.6 g (0.010 mol) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (500 g), whereby a white precipitate was obtained. The precipitate was filtered and vacuum dried at 60° C., whereby a comparative fluororesin precursor 2-2 as a white solid was obtained (60 g; yield: 68%).

<Results of NMR Measurement>

The molar ratio of the repeating units of the comparative fluororesin precursor 2-2 was as follows: MA-C6F repeating unit:HFIP-M repeating unit:MAA repeating unit:HEMA repeating unit=24:26:26:24.

[Chem. 90]

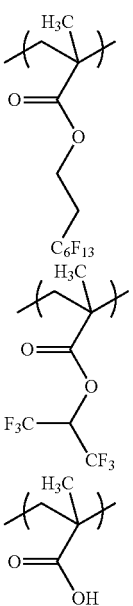

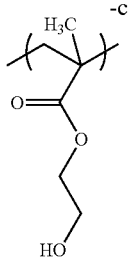

Comparative fluororesin precursor 2-2

<Results of GPC Measurement>
Mw=10700, Mw/Mn=1.5

[Polymerization of Comparative Fluororesin Precursor 2-3]

A 300-ml glass flask equipped with a stirrer was charged at room temperature with p-HO-St (12.2 g (0.10 mol)), MA-C6F (43.2 g (0.1 mol)), and MEK (55 g). Then, AIBN 1.6 g (0.010 mol) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (500 g), whereby a white precipitate was obtained. The precipitate was filtered and vacuum dried at 60° C., whereby a comparative fluororesin precursor 2-3 as a white solid was obtained (45 g; yield: 81%).

<Results of NMR Measurement>

The molar ratio of the repeating units of the comparative fluororesin precursor 2-3 was as follows: p-HO-St repeating unit:MA-C6F repeating unit=55:45.

[Chem. 91]

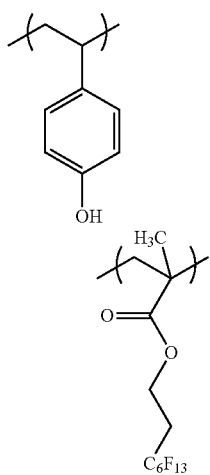

Comparative fluororesin precursor 2-3

<Results of GPC Measurement>
Mw=15700, Mw/Mn=1.7

[Polymerization of Comparative Fluororesin Precursor 2-4]

The same procedure as in the synthesis of the comparative fluororesin precursor 2-3 was performed, except that p-HO-St was replaced by VBA. Thus, a comparative fluororesin precursor 2-4 containing the following repeating units was obtained (yield: 88%).

<Results of NMR Measurement>

The molar ratio of the repeating units of the comparative fluororesin precursor 2-4 was as follows: VBA repeating unit:MA-C6F repeating unit=57:43.

[Chem. 92]

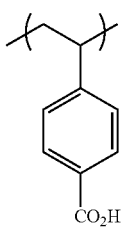

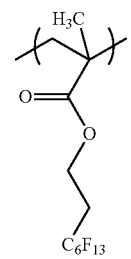

Comparative fluororesin precursor 2-4

<Results of GPC Measurement>
Mw=16300, Mw/Mn=1.7

Table 2-1 shows the repeating units of the resulting fluororesin precursors 2-1 to 2-6 and comparative fluororesin precursors 2-1 to 2-4, molar ratio of the repeating units, and weight average molecular weight (Mw), molecular weight distribution (Mw/Mn), and yield of each of the fluororesin precursors and comparative fluororesin precursors.

TABLE 2-1

| Polymer | Composition (repeating units) (mol %) | | | | | Molecular weight | | |
|---|---|---|---|---|---|---|---|---|
| | Formula (2-1) | Formula (2-2b) | Formula (2-3) | Formula (2-4) | Other | Mw | Mw/Mn | Yield (%) |
| Fluororesin precursor 2-1 | BTFBE 21 | p-HO-St 51 | MA-C6F 28 | — | — | 12,000 | 1.4 | 90 |
| Fluororesin precursor 2-2 | BTFBE 16 | VBA 57 | MA-C6F 27 | — | — | 9,000 | 1.4 | 87 |

TABLE 2-1-continued

| Polymer | Composition (repeating units) (mol %) | | | | | Molecular weight | | Yield (%) |
| --- | --- | --- | --- | --- | --- | --- | --- | --- |
| | Formula (2-1) | Formula (2-2b) | Formula (2-3) | Formula (2-4) | Other | Mw | Mw/Mn | |
| Fluororesin precursor 2-3 | BTFBE 15 | p-HO-St 25 VBA 25 | MA-C6F 35 | — | — | 7,500 | 1.3 | 89 |
| Fluororesin precursor 2-4 | BTFBE 16 | VBA 26 | MA-C6F 34 | St 24 | — | 7,300 | 1.3 | 86 |
| Fluororesin precursor 2-5 | BTFBE 16 | p-HO-St 25 | MA-C6F 35 | St 25 | — | 6,900 | 1.3 | 84 |
| Fluororesin precursor 2-6 | BTFBE 17 | p-HO-St 23 | MA-C6F 33 | p-AcO-St 27 | — | 7,900 | 1.4 | 88 |
| Comparative fluororesin precursor 2-1 | — | — | MA-C6F 26 HFIP-M 20 | — | MAA 54 | 9,700 | 1.5 | 64 |
| Comparative fluororesin precursor 2-2 | — | — | MA-C6F 24 HFIP-M 26 | — | MAA 26 HEMA 24 | 10,700 | 1.5 | 68 |
| Comparative fluororesin precursor 2-3 | — | p-HO-St 55 | MA-C6F 45 | — | — | 15,700 | 1.7 | 81 |
| Comparative fluororesin precursor 2-4 | — | VBA 57 | MA-C6F 43 | — | — | 16,300 | 1.7 | 88 |

3. Production of Fluororesin (Second Step: Addition Reaction or Condensation Reaction)

The fluororesin precursors 2-1 to 2-6 and comparative fluororesin precursors 2-1 to 2-4 obtained in "2. Production of fluororesin (first step: polymerization)" were each reacted with an acrylic acid derivative, whereby fluororesins were synthesized. The acrylic acid derivative was KarenzAOI, KarenzBEI (products of Showa Denko K.K.), or glycidyl acrylate (a product of Tokyo Chemical Industry Co., Ltd.). This reaction is an addition reaction or a condensation reaction of hydroxy groups or carboxylic acid sites of each fluororesin precursor and the acrylic acid derivative.

Described below are fluororesin synthesis examples. The resulting fluororesins were named as follows. The first number represents the number of the fluororesin precursor. The subsequent alphabet letter represents the acrylic acid derivative used. KarenzAOI is represented by "A", KarenzBEI is represented by "B", and glycidyl acrylate is represented by "G". The last number in the parenthesis indicates the nominal amount of acrylic acid derivative introduced (molar ratio) relative to the resin precursor.

[Chem. 93]

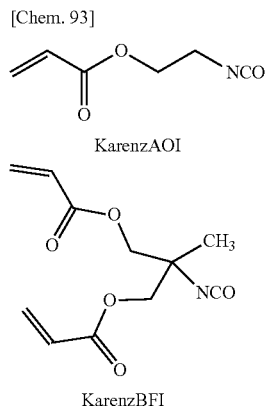

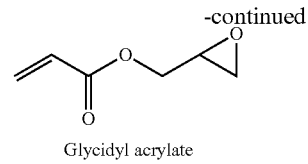

Glycidyl acrylate

[Synthesis of Fluororesin 2-1-A (50)]

A 300-ml glass flask equipped with a stirrer was charged with the fluororesin precursor 2-1 (130 g) (hydroxy equivalent: 0.270 mol) and PGMEA (260 g). Then, KarenzAOI (19 g (0.135 mol)) and triethylamine (5.32 g (0.0528 mol)) were added thereto, and a reaction was carried out at room temperature for four hours. After completion of the reaction, the reaction solution was concentrated, and n-heptane (1500 g) was then added to obtain a precipitate. The precipitate was filtered and vacuum dried at 40° C., whereby a fluororesin 2-1-A (50) as a white solid was obtained (140 g; yield: 94%).

<Results of NMR Measurement>

In the fluororesin 2-1-A (50), the molar ratio of the amount of KarenzAOI-derived acrylic acid derivative introduced (reaction rate) to the amount of residual hydroxy groups (non-reaction rate) was 57:43. The ratio of the repeating units (BTFBE repeating unit and MA-C6F repeating unit) that do not react with a crosslinking group site was found to be unchanged from that in the fluororesin precursor 2-1 used (i.e., same as before the introduction of the crosslinking group). The newly formed bond ($W^2$ in the formula (2-2)) was "—O—C(=O)—NH—".

[Synthesis of Fluororesin 2-1-A (100)]

The same procedure as in the synthesis of the fluororesin 2-1-A (50) was performed, except that KarenzAOI was used in an amount of 38 g (0.270 mol). Thus, a fluororesin 2-1-A (100) containing the following repeating units was obtained (yield: 96%).

<Results of NMR Measurement>

In the fluororesin 2-1-A (100), the molar ratio of the amount of KarenzAOI-derived acrylic acid derivative introduced (reaction rate) to the amount of residual hydroxy groups (non-reaction rate) was 95:5. The ratio of the repeating units (BTFBE repeating unit and MA-C6F repeating unit) that do not react with a crosslinking group site was found to be unchanged from that in the fluororesin precursor 2-1 used (i.e., same as before the introduction of the crosslinking group). The newly formed bond ($W^2$ in the formula (2-2)) was "—O—C(=O)—NH—".

[Synthesis of Fluororesin 2-1-B (50)]

The same procedure as in the synthesis of the fluororesin 2-1-A (50) was performed, except that KarenzAOI was replaced by KarenzBEI (32 g (0.134 mol)). Thus, a fluororesin 2-1-B (50) containing the following repeating units was obtained (yield: 93%).

<Results of NMR Measurement>

In the fluororesin 2-1-B (50), the molar ratio of the amount of KarenzBEI-derived acrylic acid derivative introduced (reaction rate) to the amount of residual hydroxy groups (non-reaction rate) was 53:47. The ratio of the repeating units (BTFBE repeating unit and MA-C6F repeating unit) that do not react with a crosslinking group site was found to be unchanged from that in the fluororesin precursor 2-1 used (i.e., same as before the introduction of the crosslinking group). The newly formed bond ($W^2$ in the formula (2-2)) was "—O—C(=O)—NH—".

[Synthesis of Fluororesin 2-1-G (50)]

A 300-ml glass flask equipped with a stirrer was charged with the fluororesin precursor 2-1 (130 g) (hydroxy equivalent: 0.270 mol) and PGMEA (260 g). Then, glycidyl acrylate (17 g (0.132 mol)) was added thereto, and a reaction was carried out at 80° C. for 18 hours. The content after the reaction was concentrated, and heptane (1500 g) was then added to obtain a precipitate. The precipitate was filtered and vacuum dried at 40° C., whereby a fluororesin 2-1-G (50) as a white solid was obtained (135 g; yield: 92%).

<Results of NMR Measurement>

In the fluororesin 2-1-G, the molar ratio of the amount of glycidyl acrylate-derived acrylic acid derivative introduced (reaction rate) to the amount of residual hydroxy groups (non-reaction rate) was 55:45.

The ratio of the repeating units (BTFBE repeating unit and MA-C6F repeating unit) that do not react with a crosslinking group site was found to be unchanged from that in the fluororesin precursor 2-1 used (i.e., same as before the introduction of the crosslinking group). The newly formed bond ($W^2$ in the formula (2-2)) was "—O—".

[Synthesis of Fluororesin 2-2-A (10)]

A 300-ml glass flask equipped with a stirrer was charged with the fluororesin precursor 2-2 (130 g (hydroxy equivalent: 0.355 mol)) and PGMEA (300 g). Then, KarenzAOI (10 g (0.071 mol)) was added thereto, and a reaction was carried out at 60° C. for 18 hours. After completion of the reaction, the reaction solution was concentrated, and n-heptane (1500 g) was then added to obtain a precipitate. The precipitate was filtered and vacuum dried at 40° C., whereby a fluororesin 2-2-A (10) as a white solid was obtained (132 g; yield: 94%).

<Results of NMR Measurement>

In the fluororesin 2-2-A (10), the molar ratio of the amount of KarenzAOI-derived acrylic acid derivative introduced (reaction rate) to the amount of residual hydroxy groups (non-reaction rate) was 10:90. The ratio of the repeating units (BTFBE repeating unit and MA-C6F repeating unit) that do not react with a crosslinking group site was found to be unchanged from that in the fluororesin precursor 2-1 used (i.e., same as before the introduction of the crosslinking group). The newly formed bond ($W^2$ in the formula (2-2)) was "—C(=O)—NH—".

[Synthesis of Fluororesins 2-2-B (5) to 2-6-G (50)]

Fluororesins 2-2-B (5) to 2-6-G (50) were produced as in the fluororesin 2-1-A (50), 2-1-A (100), 2-1-G (50), or 2-2-A (10). Table 2-2 shows the fluororesin precursors used, acrylic acid derivative, crosslinking group structure formed ($W^2$ in the formula (2-2)), amount of crosslinking groups introduced (reaction rate), and amount of residual hydroxy groups (non-reaction rate).

[Synthesis of Comparative Fluororesins 2-1-A (50) to 2-4-G (50)]

Comparative fluororesins 2-1-A (50) to 2-4-G (50) were produced as in the fluororesins 2-1-A (50), 2-1-A (100), 2-1-G (50), or 2-2-A (10). Table 2-3 shows the comparative fluororesin precursors used, type of the crosslinking group site introduced, amount of crosslinking groups introduced (reaction rate), and amount of residual hydroxy groups (non-reaction rate).

TABLE 2-2

| Fluororesin No. | Fluororesin precursor No. | Acrylic acid derivative Formula (2-2c) | Formed bond ($W^2$ in formula (2-2)) | Ratio of acrylic acid derivative introduced (mol %) | | Molecular weight | |
|---|---|---|---|---|---|---|---|
| | | | | Amount of acrylic acid derivative introduced | Amount of residual hydroxy groups | Mw | Mw/Mn |
| 2-1-A (50) | 2-1 | A | —O—C(=O)—NH— | 57 | 43 | 13,500 | 1.4 |
| 2-1-A (100) | 2-1 | A | —O—C(=O)—NH— | 95 | 5 | 15,000 | 1.4 |
| 2-1-B (50) | 2-1 | B | —O—C(=O)—NH— | 55 | 45 | 14,000 | 1.4 |
| 2-1-G (50) | 2-1 | G | —O— | 47 | 53 | 13,500 | 1.4 |
| 2-2-A (10) | 2-2 | A | —C(=O)—NH— | 10 | 90 | 9,300 | 1.3 |
| 2-2-B (5) | 2-2 | B | —C(=O)—NH— | 5 | 95 | 9,200 | 1.3 |
| 2-2-G (50) | 2-2 | G | —C(=O)—O— | 47 | 53 | 10,500 | 1.3 |
| 2-3-A (50) | 2-3 | A | —O—C(=O)—NH—<br>—C(=O)—NH— | 52 | 48 | 9,000 | 1.3 |
| 2-3-B (40) | 2-3 | B | —O—C(=O)—NH—<br>—C(=O)—NH— | 42 | 58 | 9,300 | 1.3 |
| 2-3-G (50) | 2-3 | G | —O—<br>—C(=O)—O— | 46 | 54 | 9,000 | 1.3 |
| 2-4-A (10) | 2-4 | A | —C(=O)—NH— | 9 | 91 | 7,600 | 1.3 |
| 2-4-B (5) | 2-4 | B | —C(=O)—NH— | 4 | 96 | 7,500 | 1.3 |
| 2-4-G (50) | 2-4 | G | —C(=O)—O— | 48 | 52 | 8,800 | 1.3 |
| 2-5-A (50) | 2-5 | A | —O—C(=O)—NH— | 54 | 46 | 8,400 | 1.3 |
| 2-5-B (45) | 2-5 | B | —O—C(=O)—NH— | 43 | 57 | 8,900 | 1.3 |
| 2-5-G (50) | 2-5 | G | —O— | 47 | 53 | 8,400 | 1.3 |

TABLE 2-2-continued

| Fluororesin No. | Fluororesin precursor No. | Acrylic acid derivative Formula (2-2c) | Formed bond ($W^2$ in formula (2-2)) | Ratio of acrylic acid derivative introduced (mol %) | | Molecular weight | |
|---|---|---|---|---|---|---|---|
| | | | | Amount of acrylic acid derivative introduced | Amount of residual hydroxy groups | Mw | Mw/Mn |
| 2-6-A (50) | 2-6 | A | —O—C(=O)—NH— | 53 | 47 | 9,400 | 1.4 |
| 2-6-B (40) | 2-6 | B | —O—C(=O)—NH— | 38 | 52 | 9,600 | 1.4 |
| 2-6-G (50) | 2-6 | G | —O— | 46 | 54 | 9,400 | 1.4 |

TABLE 2-3

| Comparative fluororesin No. | Comparative fluororesin precursor No. | Acrylic acid derivative Formula (2-2c) | Formed bond ($W^2$ in formula (2-2)) | Ratio of acrylic acid derivative introduced (mol %) | | Molecular weight | |
|---|---|---|---|---|---|---|---|
| | | | | Amount of acrylic acid derivative introduced | Amount of residual hydroxy groups | Mw | Mw/Mn |
| Comparative 2-1-A (50) | Comparative 2-1 | A | —C(=O)—NH— | 51 | 49 | 10,200 | 1.5 |
| Comparative 2-1-B (50) | Comparative 2-1 | B | —C(=O)—NH— | 54 | 46 | 10,700 | 1.5 |
| Comparative 2-1-G (50) | Comparative 2-1 | G | —C(=O)—O— | 53 | 47 | 10,200 | 1.5 |
| Comparative 2-2-A (50) | Comparative 2-2 | A | —O—C(=O)—NH— —C(=O)—NH— | 48 | 52 | 12,200 | 1.5 |
| Comparative 2-2-B (45) | Comparative 2-2 | B | —O—C(=O)—NH— —C(=O)—NH— | 43 | 57 | 12,700 | 1.5 |
| Comparative 2-2-G (50) | Comparative 2-2 | G | —O— —C(=O)—O— | 51 | 49 | 12,200 | 1.5 |
| Comparative 2-3-A (50) | Comparative 2-3 | A | —C(=O)—NH— | 52 | 48 | 17,200 | 1.7 |
| Comparative 2-3-B (40) | Comparative 2-3 | B | —C(=O)—NH— | 42 | 58 | 17,700 | 1.7 |
| Comparative 2-3-G (50) | Comparative 2-3 | G | —O— | 46 | 54 | 17,200 | 1.7 |
| Comparative 2-4-A (10) | Comparative 2-4 | A | —C(=O)—NH— | 8 | 92 | 16,600 | 1.7 |
| Comparative 2-4-B (5) | Comparative 2-4 | B | —C(=O)—NH— | 5 | 95 | 16,500 | 1.7 |
| Comparative 2-4-G (50) | Comparative 2-4 | G | —C(=O)—O— | 51 | 49 | 18,500 | 1.7 |

4. Preparation of Photosensitive Resin Compositions

[Preparation of Photosensitive Resin Compositions 2-1 to 2-38, Comparative Photosensitive Resin Compositions 2-1 to 2-12]

The fluororesins or comparative fluororesins produced above, solvents, photopolymerization initiators, crosslinking agents, alkali-soluble resins, naphthoquinonediazide group-containing compounds, and basic compounds were blended according to Tables 2-4 to 2-6. The resulting solutions were filtered through a 0.2-μm membrane filter, whereby photosensitive resin compositions 2-1 to 2-38 and comparative photosensitive resin compositions 2-1 to 2-12 were prepared. In the tables, the symbol "-" means no addition of the component.

The following solvents, photopolymerization initiators, crosslinking agents, alkali-soluble resin, naphthoquinonediazide group-containing compound, and basic compound were used.

Solvents:
S-1: propylene glycol monomethyl ether acetate (PGMEA); S-2: γ-butyrolactone; S-3: propylene glycol monomethyl ether (PGME); S-4: methyl ethyl ketone; S-5: cyclohexanone; S-6: ethyl lactate; S-7: butyl acetate Photopolymerization Initiators:
Ini-1: 4-benzoylbenzoic acid; Ini-2: Irgacure 651 (a product of BASF); Ini-3: Irgacure 369 (a product of BASF)

Crosslinking Agents:
CL-1: pentaerythritol tetraacrylate (a product of Tokyo Chemical Industry Co., Ltd.); CL-2: A-TMM-3 (a product of Shin-Nakamura Chemical Co., Ltd.)

Alkali-Soluble Resin:
ASP-1: CCR-1235 (a product of Nippon Kayaku Co., Ltd.)

Naphthoquinonediazide Group-Containing Compound:
N-1: naphthoquinone-1,2-diazide-5-sulfonate compound (PC-5, a product of Toyo Gosei Co., Ltd.)

Basic Compound:
B-1: triethanolamine (a product of Tokyo Chemical Industry Co., Ltd.)

TABLE 2-4

| Photosensitive resin composition No. | Fluororesin Type | Fluororesin Parts by mass | Solvent Type | Solvent Parts by mass | Photopolymerization initiator Type | Photopolymerization initiator Parts by mass | Crosslinking agent Type | Crosslinking agent Parts by mass | Alkali-soluble resin Type | Alkali-soluble resin Parts by mass | Naphthoquinonediazide group-containing compound Type | Naphthoquinonediazide group-containing compound Parts by mass | Basic compound Type | Basic compound Parts by mass |
|---|---|---|---|---|---|---|---|---|---|---|---|---|---|---|
| 2-1 | 2-1-A (50) | 1.0 | S-1 | 100 | Ini-2 | 7.5 | — | — | — | — | — | — | — | — |
| 2-2 | 2-1-A (50) | 1.0 | S-1 / S-3 | 70 / 30 | Ini-3 | 7.5 | CL-1 | 50 | ASP-1 | 50 | — | — | — | — |
| 2-3 | 2-1-A (100) | 1.0 | S-2 | 100 | Ini-2 | 7.5 | — | — | — | — | — | — | — | — |
| 2-4 | 2-1-A (100) | 1.0 | S-1 / S-3 | 65 / 35 | Ini-3 | 5.0 | CL-1 | 30 | ASP-1 | 50 | — | — | — | — |
| 2-5 | 2-1-B (50) | 1.0 | S-3 | 100 | Ini-1 | 7.5 | — | — | — | — | — | — | — | — |
| 2-6 | 2-1-B (50) | 0.5 | S-1 / S-3 | 60 / 40 | Ini-3 | 7.5 | CL-1 | 50 | ASP-1 | 50 | — | — | — | — |
| 2-7 | 2-1-G (50) | 1.0 | S-4 | 100 | Ini-1 | 7.5 | — | — | — | — | — | — | — | — |
| 2-8 | 2-1-G (50) | 1.0 | S-1 / S-3 | 68 / 32 | Ini-3 | 7.5 | CL-1 | 50 | ASP-1 | 50 | — | — | — | — |
| 2-9 | 2-2-A (10) | 1.0 | S-4 | 100 | Ini-2 | 7.5 | — | — | — | — | — | — | — | — |
| 2-10 | 2-2-A (10) | 1.0 | S-1 / S-3 | 50 / 50 | Ini-3 | 7.5 | CL-1 | 50 | ASP-1 | 50 | — | — | — | — |
| 2-11 | 2-2-B (5) | 1.0 | S-4 | 100 | Ini-2 | 7.5 | — | — | — | — | — | — | — | — |
| 2-12 | 2-2-B (5) | 0.8 | S-1 / S-3 | 55 / 45 | Ini-3 | 7.5 | CL-1 | 50 | ASP-1 | 50 | — | — | — | — |
| 2-13 | 2-2-G (50) | 1.0 | S-4 | 100 | Ini-3 | 7.5 | — | — | — | — | — | — | — | — |
| 2-14 | 2-2-G (50) | 1.0 | S-1 / S-3 | 60 / 40 | Ini-3 | 7.5 | CL-1 | 50 | ASP-1 | 50 | — | — | — | — |
| 2-15 | 2-3-A (50) | 1.0 | S-4 | 100 | Ini-2 | 7.5 | — | — | — | — | — | — | — | — |
| 2-16 | 2-3-A (50) | 1.0 | S-1 / S-3 | 70 / 30 | Ini-3 | 7.5 | CL-1 | 50 | ASP-1 | 50 | — | — | — | — |
| 2-17 | 2-3-B (40) | 1.0 | S-5 | 100 | Ini-2 | 7.5 | — | — | — | — | — | — | — | — |
| 2-18 | 2-3-B (40) | 1.5 | S-1 / S-3 | 70 / 30 | Ini-3 | 7.5 | CL-1 | 50 | ASP-1 | 45 | N-1 | 10 | B-1 | 0.5 |
| 2-19 | 2-3-G (50) | 1.0 | S-4 | 100 | Ini-3 | 7.5 | — | — | — | — | — | — | — | — |
| 2-20 | 2-3-G (50) | 0.7 | S-1 / S-3 | 70 / 30 | Ini-3 | 7.5 | CL-1 | 65 | ASP-1 | 50 | — | — | — | — |

TABLE 2-5

| Photosensitive resin composition No. | Fluororesin Type | Fluororesin Parts by mass | Solvent Type | Solvent Parts by mass | Photopolymerization initiator Type | Photopolymerization initiator Parts by mass | Crosslinking agent Type | Crosslinking agent Parts by mass | Alkali-soluble resin Type | Alkali-soluble resin Parts by mass | Naphthoquinonediazide group-containing compound Type | Naphthoquinonediazide group-containing compound Parts by mass | Basic compound Type | Basic compound Parts by mass |
|---|---|---|---|---|---|---|---|---|---|---|---|---|---|---|
| 2-21 | 2-4-A (10) | 1.0 | S-6 | 100 | Ini-2 | 7.5 | — | — | — | — | — | — | — | — |
| 2-22 | 2-4-A (10) | 1.0 | S-1 / S-3 | 70 / 30 | Ini-3 | 7.5 | CL-1 | 50 | ASP-1 | 50 | — | — | — | — |
| 2-23 | 2-4-B (5) | 1.0 | S-1 | 100 | Ini-2 | 7.5 | — | — | — | — | — | — | — | — |
| 2-24 | 2-4-B (5) | 1.2 | S-1 / S-3 | 60 / 40 | Ini-2 | 7.5 | CL-2 | 70 | ASP-1 | 40 | N-1 | 10 | B-1 | 0.5 |
| 2-25 | 2-4-G (50) | 1.0 | S-7 | 100 | Ini-3 | 7.5 | — | — | — | — | — | — | — | — |
| 2-26 | 2-4-G (50) | 1.0 | S-1 / S-3 | 65 / 35 | Ini-3 | 7.5 | CL-1 | 50 | ASP-1 | 50 | — | — | — | — |
| 2-27 | 2-5-A (50) | 1.0 | S-2 | 100 | Ini-2 | 7.5 | — | — | — | — | — | — | — | — |
| 2-28 | 2-5-A (50) | 1.0 | S-1 / S-3 | 70 / 30 | Ini-3 | 7.5 | CL-1 | 50 | ASP-1 | 50 | — | — | — | — |
| 2-29 | 2-5-B (45) | 1.0 | S-8 | 100 | Ini-2 | 7.5 | — | — | — | — | — | — | — | — |
| 2-30 | 2-5-B (45) | 1.0 | S-1 / S-3 | 70 / 30 | Ini-1 | 7.5 | CL-2 | 30 | ASP-1 | 50 | — | — | — | — |
| 2-31 | 2-5-G (50) | 1.0 | S-2 | 100 | Ini-3 | 7.5 | — | — | — | — | — | — | — | — |
| 2-32 | 2-5-G (50) | 1.0 | S-1 / S-3 | 70 / 30 | Ini-3 | 7.5 | CL-1 | 50 | ASP-1 | 60 | — | — | — | — |
| 2-33 | 2-6-A (50) | 1.0 | S-1 | 100 | Ini-2 | 7.5 | — | — | — | — | — | — | — | — |
| 2-34 | 2-6-A (50) | 1.0 | S-1 / S-3 | 70 / 30 | Ini-3 | 7.5 | CL-1 | 75 | ASP-1 | 50 | — | — | — | — |
| 2-35 | 2-6-B (40) | 1.0 | S-1 | 100 | Ini-1 | 7.5 | — | — | — | — | — | — | — | — |
| 2-36 | 2-6-B (40) | 1.5 | S-7 | 100 | Ini-3 | 7.5 | CL-1 | 50 | ASP-1 | 70 | N-1 | 10 | — | — |
| 2-37 | 2-6-G (50) | 1.0 | S-8 | 100 | Ini-3 | 7.5 | — | — | — | — | — | — | — | — |
| 2-38 | 2-6-G (50) | 1.3 | S-5 | 100 | Ini-2 | 7.5 | CL-2 | 75 | ASP-1 | 50 | — | — | — | — |

TABLE 2-6

| Comparative photosensitive resin composition No. | Comparative fluororesin Type | Parts by mass | Solvent Type | Parts by mass | Photopolymerization initiator Type | Parts by mass | Crosslinking agent Type | Parts by mass | Alkali-soluble resin Type | Parts by mass | Naphthoquinonediazide group-containing compound Type | Parts by mass | Basic compound Type | Parts by mass |
|---|---|---|---|---|---|---|---|---|---|---|---|---|---|---|
| 2-1 | Comparative 2-1-A (50) | 1.0 | S-1 S-3 | 70 30 | Ini-3 | 7.5 | CL-1 | 50 | ASP-1 | 50 | — | — | — | — |
| 2-2 | Comparative 2-1-B (50) | 1.0 | S-3 | 100 | Ini-1 | 7.5 | CL-1 | 50 | ASP-1 | 50 | — | — | — | — |
| 2-3 | Comparative 2-1-G (50) | 1.0 | S-4 | 100 | Ini-1 | 7.5 | CL-1 | 50 | ASP-1 | 50 | — | — | — | — |
| 2-4 | Comparative 2-2-A (50) | 1.0 | S-1 S-3 | 50 50 | Ini-3 | 7.5 | CL-1 | 50 | ASP-1 | 50 | — | — | — | — |
| 2-5 | Comparative 2-2-B (45) | 1.0 | S-1 S-3 | 55 45 | Ini-3 | 7.5 | CL-1 | 50 | ASP-1 | 50 | N-1 | 10 | B-1 | 0.5 |
| 2-6 | Comparative 2-2-G (50) | 1.0 | S-7 | 100 | Ini-3 | 7.5 | CL-1 | 50 | ASP-1 | 50 | — | — | — | — |
| 2-7 | Comparative 2-3-A (50) | 1.0 | S-1 S-3 | 70 30 | Ini-3 | 7.5 | CL-1 | 50 | ASP-1 | 50 | — | — | — | — |
| 2-8 | Comparative 2-3-B (40) | 1.0 | S-1 S-3 | 70 30 | Ini-3 | 7.5 | CL-1 | 50 | ASP-1 | 50 | — | — | B-1 | 0.5 |
| 2-9 | Comparative 2-3-G (50) | 1.0 | S-1 | 100 | Ini-3 | 7.5 | CL-1 | 50 | ASP-1 | 50 | — | — | — | — |
| 2-10 | Comparative 2-4-A (10) | 1.0 | S-1 | 100 | Ini-3 | 7.5 | CL-1 | 50 | ASP-1 | 50 | — | — | — | — |
| 2-11 | Comparative 2-4-B (5) | 1.0 | S-1 S-3 | 60 40 | Ini-2 | 7.5 | CL-2 | 50 | ASP-1 | 50 | — | — | B-1 | 0.5 |
| 2-12 | Comparative 2-4-G (50) | 1.0 | S-1 S-3 | 60 40 | Ini-3 | 7.5 | CL-1 | 50 | ASP-1 | 50 | — | — | — | — |

5. Evaluation of Resistance of Fluororesin Film to UV-Ozone Treatment and Liquid Repellency

[Formation of Fluororesin Films 2-1 to 2-38 and Comparative Fluororesin Films 2-1 to 2-12]

The photosensitive resin compositions 2-1 to 2-38 and comparative photosensitive resin compositions 2-1 to 2-12 prepared were each applied to a silicon wafer using a spin coater at a rotation speed of 1000 rpm. Subsequently, these resin compositions were heated on a hot plate at 100° C. for 150 seconds, whereby fluororesin films 2-1 to 2-38 and comparative fluororesin films 2-1 to 2-12 (the numbers correspond to the respective numbers of the photosensitive resin compositions) were each formed on the silicon wafer.

The fluororesin films 2-2, 2-10, 2-16, 2-22, 2-28, and 2-34 and the comparative fluororesin films 2-1, 2-4, 2-7, and 2-10 obtained above were subjected to contact angle measurement with respect to water, anisole, and methyl benzoate before and after UV-ozone treatment and after heating. Water, anisole, and methyl benzoate were used as ink solvents.

[UV-Ozone Treatment Step and Heating Step]

The fluororesin films and comparative fluororesin films on the silicon wafer were each subjected to UV-ozone treatment for 10 minutes using a UV-ozone treatment device (available from Sen Lights Corporation; model number: PL17-110). Subsequently, heating was performed at 230° C. for 60 seconds.

[Contact Angle Measurement]

With a contact angle meter "DMs-601" available from Kyowa Interface Science Co., Ltd., each fluororesin film surface and each comparative fluororesin film surface were subjected to contact angle measurement with respect to water, anisole, and methyl benzoate before and after the UV-ozone treatment and after the subsequent heating step.

[Film Thickness Measurement]

Using a stylus-type surface shape measuring instrument "Dektak-8" available from Bruker Nano, the thickness of each of the fluororesin films and comparative fluororesin films was measured before and after the UV-ozone treatment and after the subsequent heating step.

[Measurement of Molecular Weight Changes]

The fluororesin films and the comparative fluororesin films were each scraped off with a spatula, and each resulting solid was dissolved in THF to determine the molecular weight by GPC before and after the UV-ozone treatment and after the subsequent heating step. The tables show each molecular weight in the cases where multiple peaks were detected. In addition, "1000, multiple" in the table indicates the cases where multiple peaks were detected and the molecular weight was 1000 or less.

Table 2-7 shows the results of the contact angle measurement in each step. Table 2-8 shows the results of the film thickness measurement and molecular weight in each step.

TABLE 2-7

| | | Contact angle (°) | | | | | | | |
|---|---|---|---|---|---|---|---|---|---|
| | | Anisole | | | Methyl benzoate | | | Water | | |
| | Photosensitive | UV-ozone treatment | | After heating | UV-ozone treatment | | After heating | UV-ozone treatment | | After heating |
| Fluororesin film No. | resin composition No. | Before | After | step | Before | After | step | Before | After | step |
| 2-2 | 2-2 | 70 | 55 | 68 | 68 | 52 | 64 | 105 | 98 | 104 |
| 2-10 | 2-10 | 72 | 40 | 69 | 71 | 38 | 68 | 106 | 97 | 105 |
| 2-16 | 2-16 | 70 | 48 | 68 | 71 | 43 | 69 | 104 | 96 | 103 |
| 2-22 | 2-22 | 71 | 45 | 67 | 72 | 34 | 68 | 105 | 97 | 104 |
| 2-28 | 2-28 | 69 | 50 | 67 | 68 | 44 | 68 | 105 | 97 | 104 |
| 2-34 | 2-34 | 67 | 54 | 66 | 68 | 51 | 66 | 104 | 96 | 104 |
| Comparative 2-1 | Comparative 2-1 | 77 | 47 | 46 | 74 | 32 | 28 | 106 | 33 | 21 |
| Comparative 2-4 | Comparative 2-4 | 75 | 43 | 45 | 75 | 31 | 27 | 107 | 37 | 25 |
| Comparative 2-7 | Comparative 2-7 | 72 | 42 | 46 | 70 | 40 | 31 | 109 | 50 | 63 |
| Comparative 2-10 | Comparative 2-10 | 73 | 37 | 48 | 71 | 28 | 27 | 110 | 31 | 58 |

TABLE 2-8

| | Photosensitive | Film thickness (nm) | | | Molecular weight | | |
|---|---|---|---|---|---|---|---|
| | resin | UV-ozone treatment | | After heating | UV-ozone treatment | | After heating |
| Fluororesin film No. | composition No. | Before | After | step | Before | After | step |
| 2-2 | 2-2 | 1800 | 1710 | 1660 | 12,000 | 11,300 | 10,900 |
| 2-10 | 2-10 | 1810 | 1720 | 1680 | 9,000 | 8,600 | 8,500 |
| 2-16 | 2-16 | 1900 | 1790 | 1720 | 7,500 | 7,200 | 7,100 |
| 2-22 | 2-22 | 1850 | 1760 | 1690 | 7,300 | 7,100 | 7,000 |
| 2-28 | 2-28 | 1950 | 1830 | 1790 | 6,900 | 6,700 | 6,600 |
| 2-34 | 2-34 | 1920 | 1810 | 1740 | 7,900 | 7,700 | 7,500 |
| Comparative 2-1 | Comparative 2-1 | 1820 | 420 | <100 | 9,700 | <1000 multiple | <1000 multiple |
| Comparative 2-4 | Comparative 2-4 | 1900 | 510 | 230 | 10,700 | <1000 multiple | <1000 multiple |
| Comparative 2-7 | Comparative 2-7 | 1810 | 850 | 610 | 15,700 | 4000, <1000 multiple | 4100, <1000 multiple |
| Comparative 2-10 | Comparative 2-10 | 1730 | 720 | 490 | 16,300 | 5200, <1000 multiple | 4800, <1000 multiple |

According to the results in Table 2-7, in the fluororesin films 2-2, 2-10, 2-16, 2-22, 2-28, and 2-34 according to the second embodiment of the present disclosure, although a decrease in contact angle was observed after the UV-ozone treatment, the contact angle increased to a degree comparable to that before the UV-ozone treatment due to the subsequent heat treatment step, indicating good liquid repellency of the fluororesin films after the UV-ozone treatment. In contrast, in the comparative fluororesin films 2-1, 2-4, 2-7, and 2-10, although a high contact angle was observed before the UV-ozone treatment, the contact angle decreased after the UV-ozone treatment and remained small even after the subsequent heating step, indicating insufficient liquid repellency after the UV-ozone treatment.

According to the results in Table 2-8, in the fluororesin films 2-2, 2-10, 2-16, 2-22, 2-28, and 2-34 according to the second embodiment of the present disclosure, although a slight decrease in film thickness was observed after the UV-ozone treatment, the molecular weight of the remaining film was comparable, indicating excellent resistance to the UV-ozone treatment. In contrast, in the comparative fluororesin films 2-1, 2-4, 2-7, and 2-10, a significant decrease in film thickness was confirmed after the UV-ozone treatment, and the molecular weight of the remaining film significantly decreased as compared to that before the UV-ozone treatment, indicating insufficient resistance to the UV-ozone treatment.

6. Evaluation of Liquid Repellency on Upper Surfaces of Banks after UV-Ozone Treatment or Oxygen Plasma Treatment The photosensitive resin compositions 2-2, 2-6, 2-8, 2-10, 2-14, 2-16, and 2-26 and the comparative photosensitive resin compositions 2-1, 2-4, 2-7, and 2-12 obtained in "4. Preparation of photosensitive resin compositions" were used to form banks 2-2, 2-6, 2-8, 2-10, 2-14, 2-16, and 2-26 and comparative banks 2-1, 2-4, 2-7, and 2-12, respectively, and the bank properties were evaluated and compared. Table 2-9 shows the results. The components used for the above photosensitive resin compositions except for the fluororesin or comparative fluororesin were standardized to compare the properties.

[Formation of Banks]

A 10-cm square ITO substrate was washed with ultrapure water and then acetone. Subsequently, the substrate was subjected to UV-ozone treatment for five minutes using the UV-ozone treatment described above. Then, the photosensitive resin compositions 2-2, 2-6, 2-8, 2-10, 2-14, 2-16, and 2-26 and the comparative photosensitive resin compositions 2-1, 2-4, 2-7, and 2-12 obtained in "4. Preparation of photosensitive resin compositions" were each applied to the UV-ozone-treated substrate using a spin coater at a rotation speed of 1000 rpm, followed by heating on a hot plate at 100° C. for 150 seconds. Thus, fluororesin films and comparative fluororesin films each having a thickness of 2 μm were formed.

Each resulting resin film was exposed to i-rays (wavelength: 365 nm) using a mask aligner (a product of SUSS MicroTec Group) with a mask having a 5-μm line-and-space pattern.

The resulting resin film after exposure was subjected to evaluation of solubility in a developer, evaluation of bank properties (sensitivity and resolution), and contact angle measurement.

[Solubility in Developer]

The resin film on the ITO substrate after exposure was immersed in an alkali developer at room temperature for 80 seconds to evaluate the solubility in the alkali developer. The alkali developer was a 2.38 mass % tetramethylammonium hydroxide aqueous solution (hereinafter sometimes referred to as TMAH). The solubility of the banks was evaluated by measuring the thickness of the banks after immersion using a contact film thickness meter. The banks were were evaluated as "soluble" when completely dissolved, and "insoluble" when the resist film remained undissolved.

[Bank Properties (Sensitivity and Resolution)]

The optimal exposure Eop (mJ/cm$^2$) for forming banks arranged in the line-and-space pattern was determined and used as an index for sensitivity.

The resulting pattern of banks was observed under a scanning electron microscope to evaluate the resolution. A pattern without visible line-edge roughness was evaluated as "excellent"; a pattern with slightly visible line-edge roughness was evaluated as "good"; and a pattern with significant line-edge roughness was evaluated as "poor".

[Contact Angle]

Each substrate having the banks obtained in the above step was heated at 230° C. for 60 minutes. Then, the entire substrate surface was subjected to UV-ozone treatment or oxygen plasma treatment for 10 minutes. Subsequently, heating was performed at 230° C. for 60 seconds. The contact angle between the bank or comparative surface and anisole was measured before and after the UV-ozone treatment and after the subsequent heating step.

The UV-ozone treatment device and the contact angle meter described above were used. An oxygen plasma treatment device was Plasma Dry Cleaner PDC-210 available from Yamato Scientific Co., Ltd. The oxygen plasma treatment was performed at an oxygen gas flow rate of 30 cc/min and an output of 300 W.

TABLE 2-9

| Banks | | 2-2 | 2-6 | 2-8 | 2-10 | 2-14 | 2-16 |
|---|---|---|---|---|---|---|---|
| Comparative photosensitive resin composition | | 2-2 | 2-6 | 2-8 | 2-10 | 2-14 | 2-16 |
| Solubility in developer | Non-exposed portion | Soluble | Soluble | Soluble | Soluble | Soluble | Soluble |
| | Exposed portion | Insoluble | Insoluble | Insoluble | Insoluble | Insoluble | Insoluble |
| Resist properties | Sensitivity (mJ/cm$^2$) | 105 | 100 | 102 | 100 | 100 | 102 |
| | Resolution | Excellent | Excellent | Excellent | Excellent | Excellent | Excellent |
| Contact angle (°) Non-exposed portion | Before UV-ozone treatment | 35 | 37 | 32 | 28 | 36 | 38 |
| | After UV-ozone treatment | 10 | 10 | 10 | 10 | 10 | 10 |
| | After heating step | 10 | 10 | 10 | 10 | 10 | 10 |
| Contact angle (°) Exposed portion | Before UV-ozone treatment | 70 | 71 | 70 | 72 | 71 | 70 |
| | After UV-ozone treatment | 54 | 56 | 53 | 38 | 36 | 47 |
| | After heating step | 68 | 66 | 67 | 71 | 70 | 68 |
| Contact angle (°) Non-exposed portion | Before oxygen plasma treatment | 33 | 34 | 29 | 25 | 33 | 35 |
| | After oxygen plasma treatment | 10 | 10 | 10 | 10 | 10 | 10 |
| | After heating step | 10 | 10 | 10 | 10 | 10 | 10 |
| Contact angle (°) Exposed portion | Before oxygen plasma treatment | 70 | 71 | 70 | 72 | 71 | 70 |
| | After oxygen plasma treatment | 41 | 46 | 43 | 31 | 28 | 40 |
| | After heating step | 67 | 65 | 68 | 70 | 71 | 68 |

| Banks | | 2-26 | Comparative 2-1 | Comparative 2-4 | Comparative 2-7 | Comparative 2-12 |
|---|---|---|---|---|---|---|
| Comparative photosensitive resin composition | | 2-26 | Comparative 2-1 | Comparative 2-4 | Comparative 2-7 | Comparative 2-12 |
| Solubility in developer | Non-exposed portion | Soluble | Soluble | Soluble | Soluble | Soluble |
| | Exposed portion | Insoluble | Insoluble | Insoluble | Insoluble | Insoluble |
| Resist properties | Sensitivity (mJ/cm$^2$) | 105 | 105 | 102 | 100 | 102 |
| | Resolution | Excellent | Excellent | Excellent | Excellent | Excellent |
| Contact angle (°) Non-exposed portion | Before UV-ozone treatment | 40 | 40 | 38 | 38 | 36 |
| | After UV-ozone treatment | 10 | 10 | 10 | 10 | 10 |
| | After heating step | 10 | 10 | 10 | 10 | 10 |
| Contact angle (°) Exposed portion | Before UV-ozone treatment | 69 | 75 | 74 | 72 | 73 |
| | After UV-ozone treatment | 45 | 47 | 43 | 40 | 35 |
| | After heating step | 67 | 35 | 33 | 29 | 36 |
| Contact angle (°) Non-exposed portion | Before oxygen plasma treatment | 37 | 38 | 35 | 35 | 33 |
| | After oxygen plasma treatment | 10 | 10 | 10 | 10 | 10 |
| | After heating step | 10 | 10 | 10 | 10 | 10 |
| Contact angle (°) Exposed portion | Before oxygen plasma treatment | 69 | 75 | 74 | 72 | 73 |
| | After oxygen plasma treatment | 36 | 35 | 33 | 36 | 28 |
| | After heating step | 68 | 25 | 27 | 25 | 26 |

As shown in Table 2-9, the evaluation of solubility in the developer shows that the banks according to the second embodiment of the present disclosure and the comparative banks were made of a negative resist in which only the non-exposed portions are soluble. The evaluation of the bank properties shows that all the banks had comparable sensitivity and "excellent" resolution in which the 5-μm line-and-space pattern of the mask was transferred with good resolution without visible line-edge roughness. Specifically, these evaluations show that the fluororesin according to the second embodiment of the present disclosure and the comparative fluororesins only slightly influenced the banks.

In contrast, in the banks according to the second embodiment of the present disclosure, although the contact angle between the exposed portions (corresponding to the upper surfaces of the banks) and anisole decreased due to the UV-ozone treatment or oxygen plasma treatment, the contact angle increased due to the subsequent heating step, indicating good liquid repellency. In the comparative banks, the contact angle decreased due to the UV-ozone treatment or oxygen plasma treatment and remained small even after the subsequent heating step, indicating insufficient liquid repellency.

Third Embodiment

A third embodiment of the present disclosure is described below in the following order.
3-1. Fluororesin
3-1-1. Repeating unit represented by formula (3-1)
3-1-2. Repeating unit represented by formula (3-2)
3-1-3. Repeating unit represented by formula (3-3)
3-1-4. Repeating unit represented by formula (3-4)
3-1-5. Repeating unit represented by formula (3-5)
3-1-6. Preferred embodiments of fluororesin
3-1-7. Production method of fluororesin
3-2. Photosensitive resin composition
3-3. Fluororesin film
3-4. Banks
3-5. Display device
3-1. Fluororesin The fluororesin according to the third embodiment of the present disclosure contains a repeating unit represented by a formula (3-1) and a repeating unit represented by a formula (3-2).

[Chem. 94]

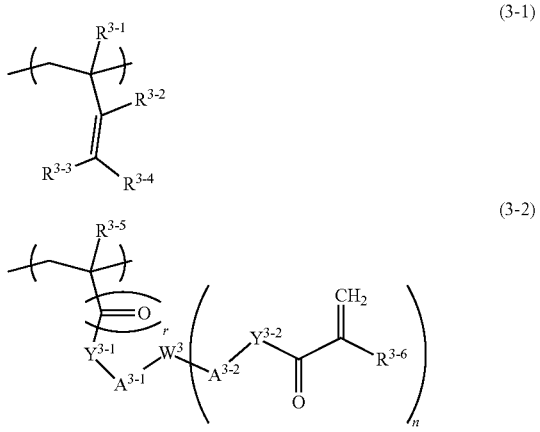

In the formula (3-1), $R^{3-1}$ represents a hydrogen atom, a fluorine atom, or a methyl group; $R^{3-2}$ represents a hydrogen atom or a C1-C6 linear, C3-C6 branched, or C3-C6 cyclic alkyl group; $R^{3-3}$ and $R^{3-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{3-1}$, $R^{3-3}$, and $R^{3-4}$ are fluorine atoms or the fluoroalkyl groups.

In the formula (3-2), $R^{3-5}$ and $R^{3-6}$ each independently represent a hydrogen atom or a methyl group; $W^3$ is a divalent linking group and represents —O—, —O—C(=O)—, —C(=O)—O—, —O—C(=O)—NH—, —C(=O)—O—C(=O)—NH—, or —C(=O)—NH—; $A^{3-1}$ and $A^{3-2}$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—CH$_3$; $Y^{3-1}$ and $Y^{3-2}$ are divalent linking groups and each independently represent —O— or —NH—; n represents an integer of 1 to 3; and r represents 0 or 1.

The molecular weight of the fluororesin in terms of weight average molecular weight measured by gel permeation chromatography (GPC) using polystyrene as a standard substance is preferably 1000 or more and 1000000 or less, more preferably 2000 or more and 500000 or less, particularly preferably 3000 or more and 100000 or less. When the molecular weight is less than 1000, the resulting fluororesin film or banks for organic EL tend to have a low strength. When the molecular weight is more than 1000000, it may be difficult to form a fluororesin film due to lack of solubility of the fluororesin in solvents.

The dispersity (Mw/Mn) is preferably 1.01 to 5.00, more preferably 1.01 to 4.00, particularly preferably 1.01 to 3.00.

The fluororesin may be a random copolymer, an alternating copolymer, a block copolymer, or a graft copolymer. Preferably, the fluororesin is a random copolymer to suitably (not locally) disperse characteristics of each repeating unit.

The fluororesin may be a polymer containing a combination of one or more types of units each corresponding to a repeating unit represented by the formula (3-1) and one or more types of units each corresponding to a repeating unit represented by the formula (3-2) (described later).

The fluororesin may be a mixture (blend) of such polymers.

Preferably, the fluororesin has a fluorine content of 20 mass % or more and 80 mass % or less relative to 100 mass % of the fluororesin. The fluororesin having a fluorine content in the above ranges is easily soluble in solvents. A fluororesin film or banks having excellent liquid repellency can be obtained because the fluororesin contains fluorine atoms.

3-1-1. Repeating Unit Represented by Formula (3-1)

The following describes the repeating unit represented by the formula (3-1).

In the formula (3-1), $R^{3-1}$ represents a hydrogen atom, a fluorine atom, or a methyl group. A hydrogen atom and a methyl group are preferred.

In the formula (3-1), $R^{3-2}$ represents a hydrogen atom or a C1-C6 linear, C3-C6 branched, or C3-C6 cyclic alkyl group.

Examples of $R^{3-2}$ include a hydrogen atom, a methyl group, an ethyl group, an n-propyl group, an isopropyl group, an n-butyl group, a 1-methylpropyl group, a 2-methylpropyl group, a tert-butyl group, an n-pentyl group, an isopentyl group, a 1,1-dimethylpropyl group, a 1-methylbutyl group, a 1,1-dimethylbutyl group, an n-hexyl group, a cyclopentyl group, and a cyclohexyl group. A hydrogen atom, a methyl group, an ethyl group, an n-propyl group, and an isopropyl group are preferred. A hydrogen atom and a methyl group are more preferred.

In the formula (3-1), $R^{3-3}$ and $R^{3-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group.

Further, one or more of $R^{3-1}$, $R^{3-3}$, and $R^{3-4}$ are fluorine atoms or the fluoroalkyl groups.

When $R^{3-3}$ and $R^{3-4}$ each independently represent a C1-C10 linear, C3-C10 branched, or C3-C10 cyclic alkyl group, examples thereof include a methyl group, an ethyl group, an n-propyl group, an isopropyl group, an n-butyl group, a 1-methylpropyl group, a 2-methylpropyl group, a tert-butyl group, an n-pentyl group, an isopentyl group, a 1,1-dimethylpropyl group, a 1-methylbutyl group, a 1,1-dimethylbutyl group, an n-hexyl group, a cyclopentyl group, and a cyclohexyl group. A methyl group, an ethyl group, an n-propyl group, and an isopropyl group are preferred.

$R^{3-3}$ and $R^{3-4}$ each independently preferably represent a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, a hexafluoroisopropyl group, a heptafluoroisopropyl group, an n-nonafluorobutyl group, an isononafluorobutyl group, or a tert-nonafluorobutyl group; more preferably a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, or a hexafluoroisopropyl group; particularly preferably a fluorine atom, a difluoromethyl group, or a trifluoromethyl group.

The following are examples of preferred structures of the repeating unit represented by the formula (3-1).

[Chem. 95]

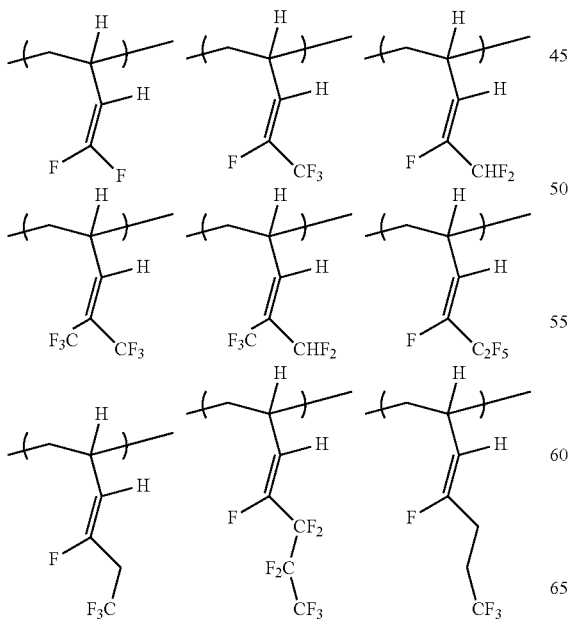

-continued

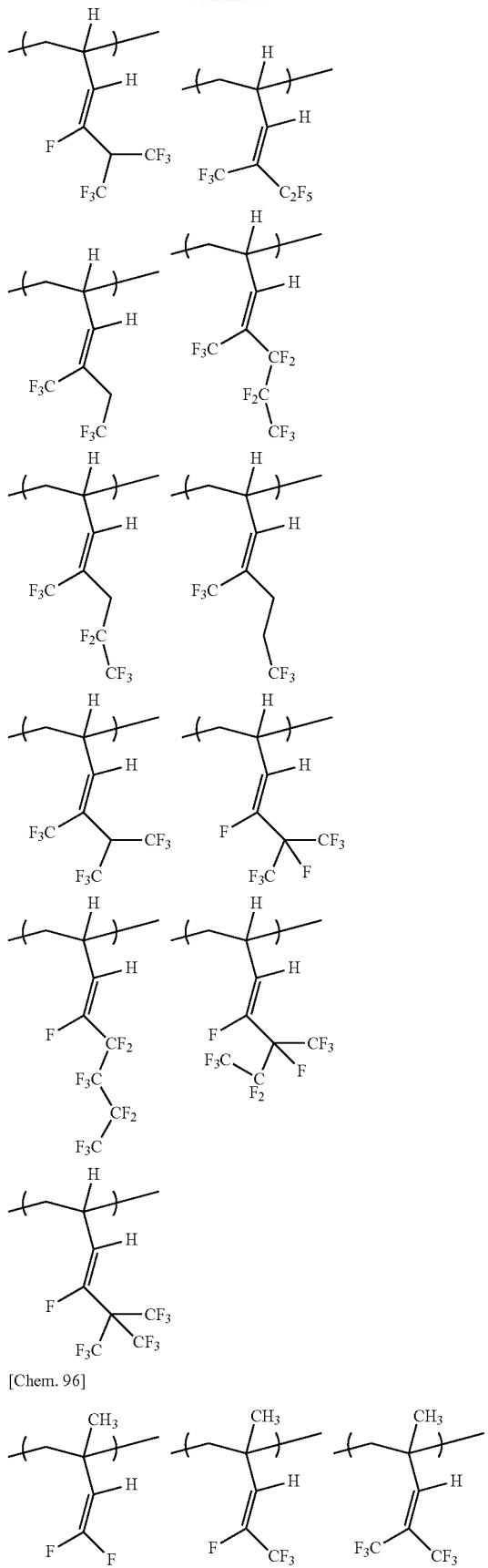

[Chem. 96]

-continued

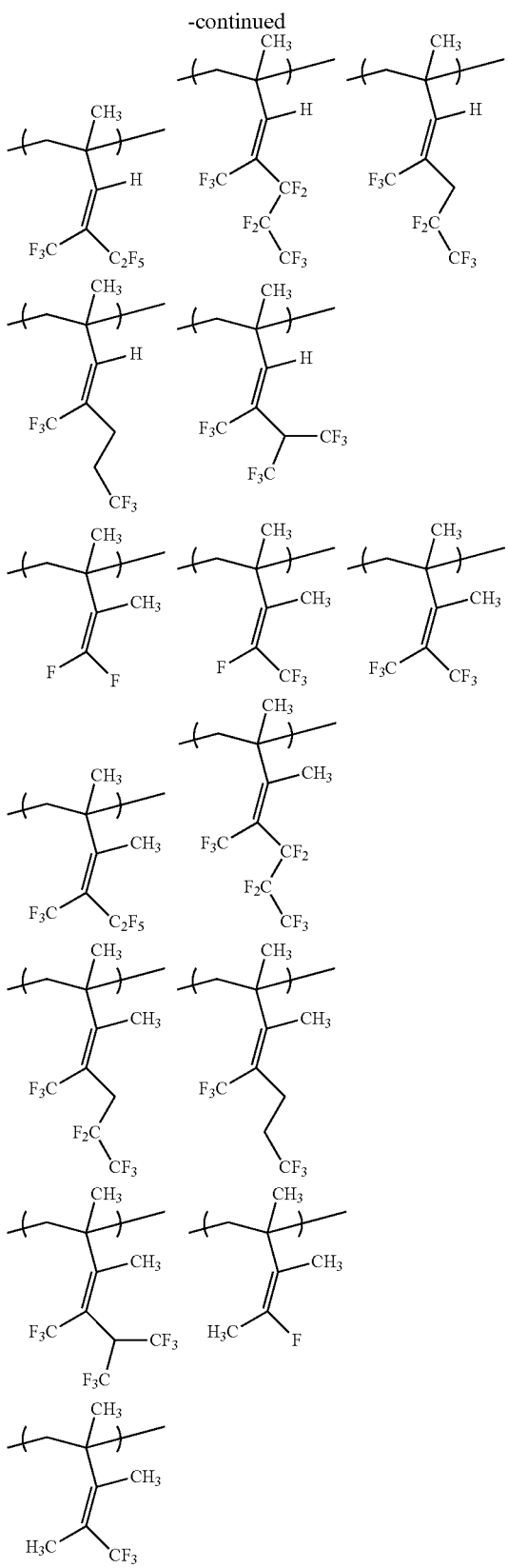

The amount of the repeating unit represented by the formula (3-1) in the fluororesin is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (3-1) is more than 70 mass %, the fluororesin tends to be hardly soluble in solvents. When the amount of the repeating unit represented by the formula (3-1) is less than 5 mass %, the resistance against UV-ozone treatment or oxygen plasma treatment tends to decrease.

Depending on use, for example, a method in which the fluororesin is directly pressed under heat without being dissolved in solvents (i.e., a hot-press method) can be used to form a fluororesin film. In this case, use of the repeating unit represented by the formula (3-1) in an amount of more than 70 mass % does not result in either poor resistance of the whole fluororesin to UV-ozone treatment or oxygen plasma treatment or poor ink repellency after UV-ozone treatment or oxygen plasma treatment, and such use is thus not avoided in the third embodiment of the present disclosure.

Here, it is assumed, although not confirmed, that the repeating unit represented by the formula (3-1) according to the third embodiment of the present disclosure has the following effects. The effects of the third embodiment of the present disclosure described herein are not intended to be exhaustive.

The repeating unit represented by the formula (3-1) has an effect of imparting ink repellency to the fluororesin after UV-ozone treatment or oxygen plasma treatment. Preferably, $R^{3-3}$ and $R^{3-4}$ are each a fluorine atom or a C1-C10 linear, C3-C10 branched, or C3-C10 cyclic fluoroalkyl group, because the above effect is particularly high in such a case.

Further, the repeating unit represented by the formula (3-1) has an effect of increasing the resistance of the fluororesin to UV-ozone treatment or oxygen plasma treatment. The possible reasons are as follows.

Generally, the ester bond is considered to be reactive with and not very resistant to UV-ozone treatment or oxygen plasma treatment (also see comparative fluororesin films 3-1 to 3-10 and Tables 3-12 to 3-15 described later). Thus, in a fluoropolymer consisting of acrylic sites having an ester bond adjacent to the main chain, the ester bond becomes a reactive site. Presumably, this results in low resistance of the fluoropolymer to the UV-ozone treatment or oxygen plasma treatment (e.g., fluoropolymers disclosed in Patent Literatures 3 and 4).

In contrast, the repeating unit represented by the formula (3-1) according to the third embodiment of the present disclosure has a structure consisting of hydrocarbons without substituents mainly containing oxygen such as an ester bond that is reactive with UV-ozone treatment or oxygen plasma treatment. Thus, the presence of the repeating unit represented by the formula (3-1) in the resin is presumed to increase the resistance of the fluororesin according to the third embodiment of the present disclosure to the UV-ozone treatment or oxygen treatment.

3-1-2. Repeating Unit Represented by Formula (3-2)

The following describes the repeating unit represented by the formula (3-2).

In the formula (3-2), $R^{3-5}$ and $R^{3-6}$ each independently represent a hydrogen atom or a methyl group.

In the formula (3-2), $W^3$ is a divalent linking group and represents —O—, —O—C(=O)—, —C(=O)—O—, —O—C(=O)—NH—, —C(=O)—O—C(=O)—NH—, or —C(=O)—NH—. Preferred of these are —O—C (=O)—NH—, —C(=O)—O—C(=O)—NH—, and —C(=O)—NH—.

The fluororesin according to the third embodiment of the present disclosure in which $W^3$ is —O—C(=O)—NH— has better ink repellency after UV-ozone treatment or oxygen plasma treatment, and is thus one particularly preferred embodiment.

In the formula (3-2), $A^{3-1}$ and $A^{3-2}$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—$CH_3$.

When the divalent linking groups $A^{3-1}$ and $A^{3-2}$ each independently represent a C1-C10 linear alkylene group, examples thereof include a methylene group, an ethylene group, a propylene group, an n-butylene group, an n-pentylene group, an n-hexalene group, an n-heptalene group, an n-octalene group, an n-nonalene group, and an n-decalene group.

When the divalent linking groups $A^{3-1}$ and $A^{3-2}$ each independently represent a C3-C10 branched alkylene group, examples thereof include an isopropylene group, an isobutylene group, a sec-butylene group, a tert-butylene group, an isopentalene group, and an isohexalene group.

When the divalent linking groups $A^{3-1}$ and $A^{3-2}$ each independently represent a C3-C10 cyclic alkylene group, examples thereof include a cyclopropyl group, a cyclobutyl group, a cyclopentyl group, a cyclohexyl group, a cycloheptyl group, a cyclooctyl group, a cyclodecanyl group, and a 4-tert-butylcyclohexyl group.

When one or more hydrogen atoms in these alkylene groups are substituted by hydroxy groups, examples of these hydroxy group-substituted alkylene groups include a 1-hydroxyethylene group (—CH(OH)$CH_2$—), a 2-hydroxyethylene group (—$CH_2$CH(OH)—), a 1-hydroxy-n-propylene group, a 2-hydroxy-n-propylene group, a hydroxy-isopropylene group (—CH($CH_2$OH)$CH_2$—), a 1-hydroxy-n-butylene group, a 2-hydroxy-n-butylene group, a hydroxy-sec-butylene group (—CH($CH_2$OH)$CH_2$$CH_2$—), a hydroxy-isobutylene group (—$CH_2$CH($CH_2$OH)$CH_2$—), and a hydroxy-tert-butylene group (—C($CH_2$OH)($CH_3$)$CH_2$—).

When one or more hydrogen atoms in these alkylene groups are substituted by —O—C(=O)—$CH_3$, examples of these substituted-alkylene groups include those in which hydroxy groups of the hydroxy group-substituted alkylene groups exemplified above are substituted by —O—C (=O)—$CH_3$.

Preferably, the divalent linking groups $A^{3-1}$ and $A^{3-2}$ each independently represent a methylene group, an ethylene group, a propylene group, an n-butylene group, an isobutylene group, a sec-butylene group, a cyclohexyl group, a 1-hydroxyethylene group (—CH(OH)$CH_2$—), a 2-hydroxyethylene group (—$CH_2$CH(OH)—), a 2-hydroxy-n-propylene group, a hydroxy-isopropylene group (—CH($CH_2$OH)$CH_2$—), a 2-hydroxy-n-butylene group, or a hydroxy-sec-butylene group (—CH($CH_2$OH)$CH_2$$CH_2$—); more preferably, an ethylene group, a propylene group, a 1-hydroxyethylene group (—CH(OH)$CH_2$—), a 2-hydroxyethylene group (—$CH_2$CH(OH)—), a 2-hydroxy-n-propylene group, or a hydroxy-isopropylene group (—CH($CH_2$OH) $CH_2$—); particularly preferably an ethylene group, a 1-hydroxyethylene group (—CH(OH)$CH_2$—), or a 2-hydroxyethylene group (—$CH_2$CH(OH)—).

In the formula (3-2), $Y^{3-1}$ and $Y^{3-2}$ are divalent linking groups and each independently represent —O— or —NH—, with —O— being more preferred.

In the formula (3-2), n represents an integer of 1 to 3, with n of 1 being particularly preferred.

In the formula (3-2), r represents 0 or 1. When r is 0, (—C(=O)—) represents a single bond.

The following are examples of preferred of structures of the repeating unit represented by the formula (3-2).

[Chem. 97]

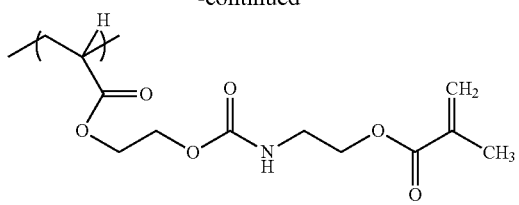
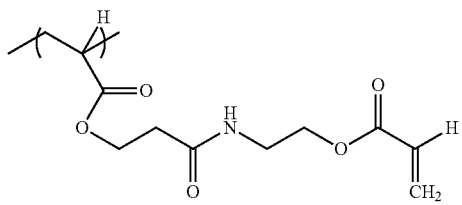
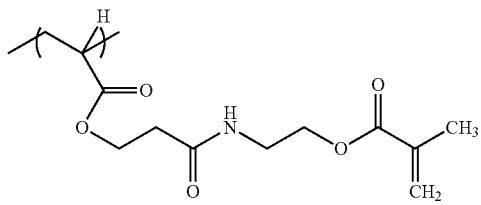
[Chem. 98]
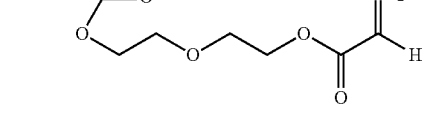
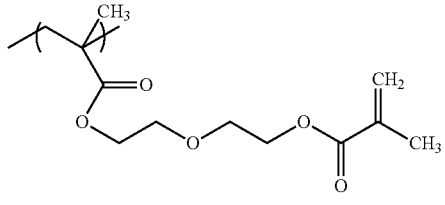
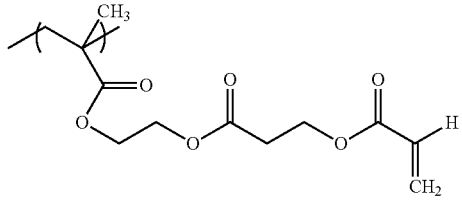
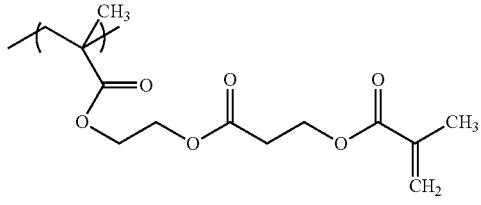
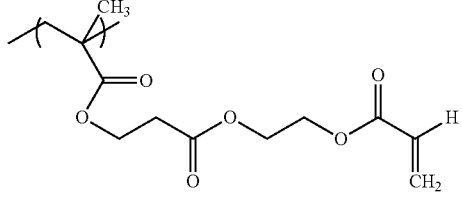
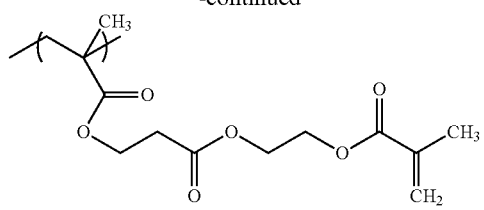
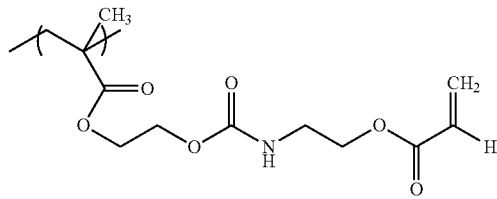
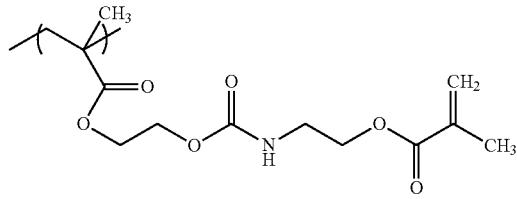
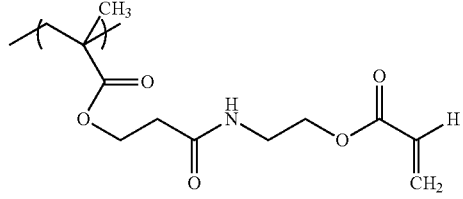
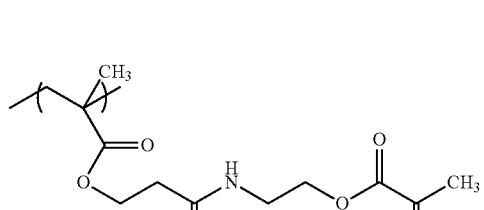
[Chem. 99]
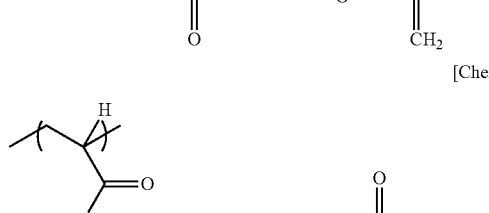
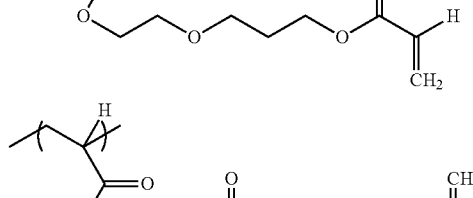
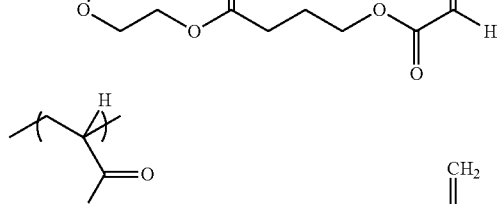

161
-continued
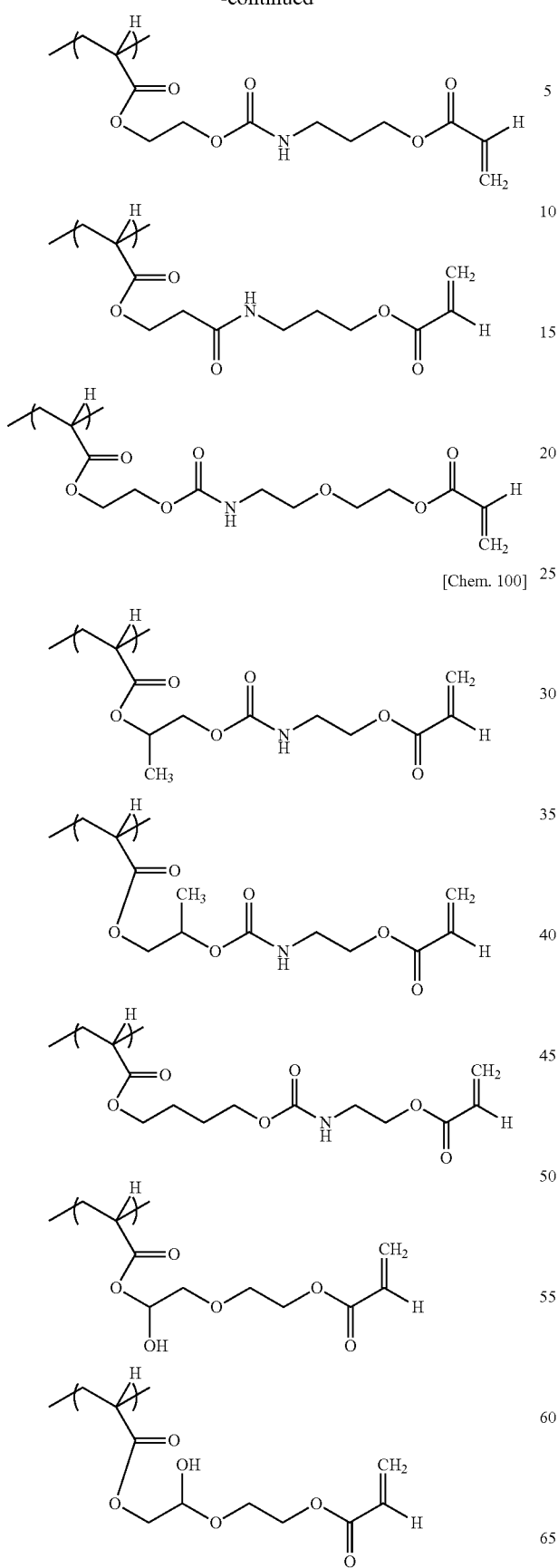
[Chem. 100]
162
-continued
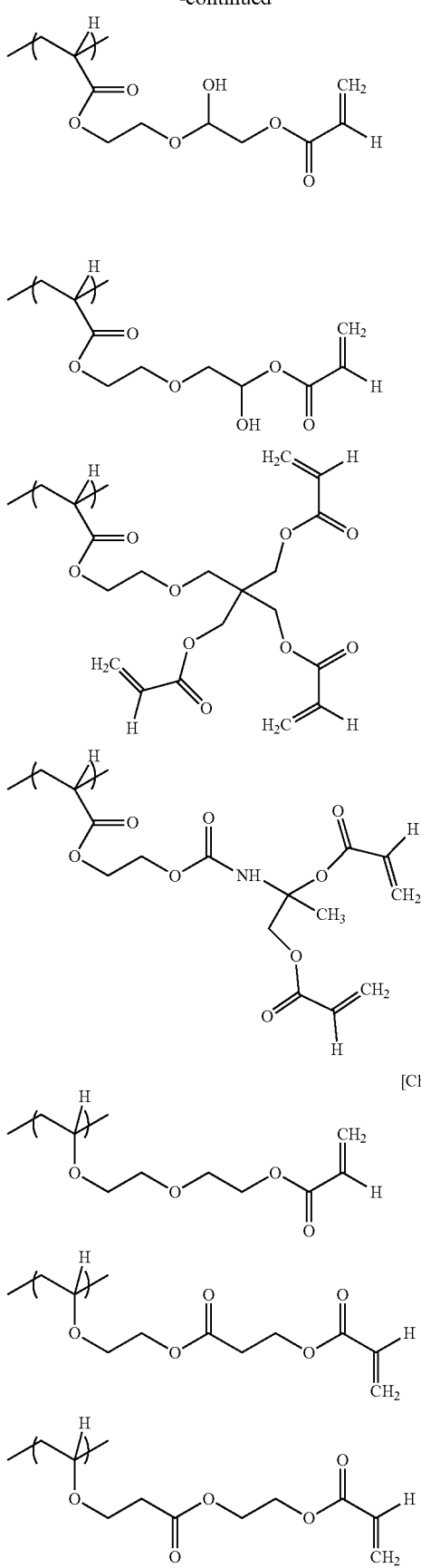
[Chem. 101]

-continued

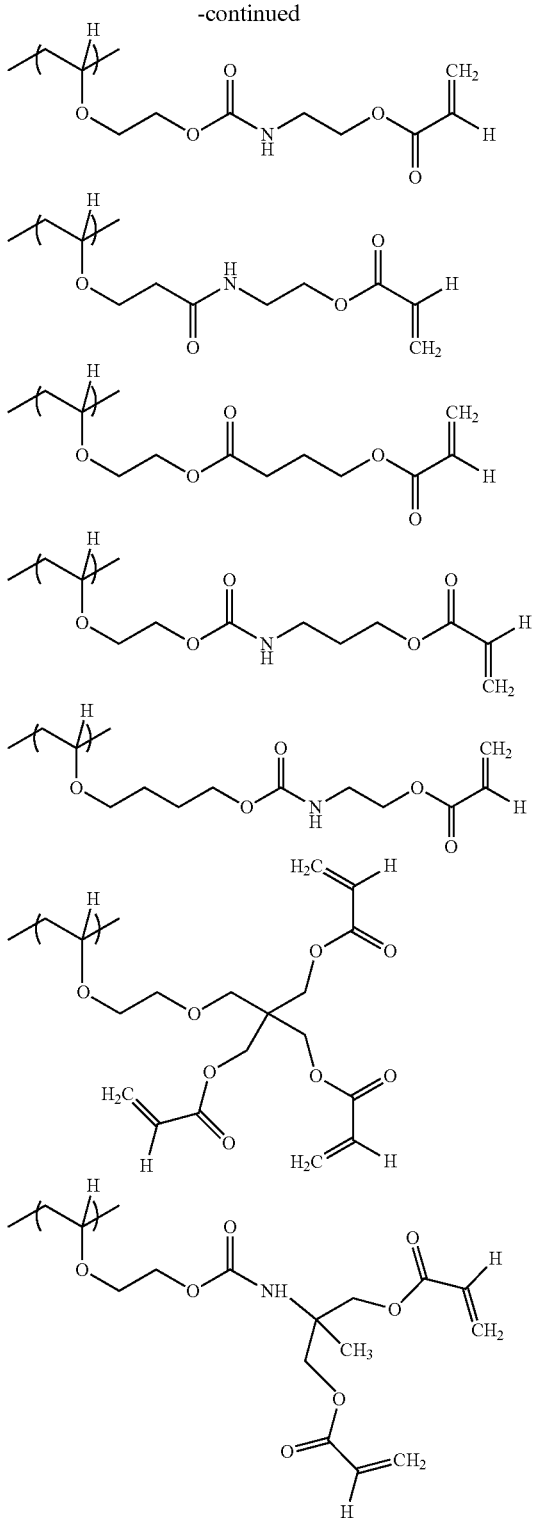

The amount of the repeating unit represented by the formula (3-2) in the fluororesin is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (3-2) is more than 70 mass %, the fluororesin tends to be hardly soluble in solvents. When the amount of the repeating unit represented by the formula (3-1) is less than 5 mass %, a fluororesin film or banks obtainable from the fluororesin tend to have lower adhesion to substrates.

Here, it is assumed, although not confirmed, that the repeating unit represented by the formula (3-2) according to the third embodiment of the present disclosure in the fluororesin has an effect of improving the adhesion of the resulting fluororesin film or banks to substrates. The effects of the third embodiment of the present disclosure described herein are not intended to be exhaustive.

The fluororesin according to the third embodiment of the present disclosure may be, as described above, a mixture (blend) of a copolymer containing a repeating unit represented by the formula (3-1) and a repeating unit represented by the formula (3-2) and another copolymer containing a repeating unit represented by the formula (3-1) and a repeating unit represented by the formula (3-2). Specifically, in one preferred third embodiment of the present disclosure, the fluororesin according to the third embodiment of the present disclosure is a mixture of a fluororesin containing a repeating unit represented by the formula (3-2) wherein $W^3$ is —O—C(=O)—NH— and a fluororesin containing a repeating unit represented by the formula (3-2) wherein $W^3$ is —C(=O)—NH—.

3-1-3. Repeating Unit Represented by Formula (3-3)

Preferably, the fluororesin according to the third embodiment of the present disclosure further contains a repeating unit represented by a formula (3-3).

The fluororesin may be a polymer containing a combination of a repeating unit represented by the formula (3-3), a repeating unit represented by the formula (3-1), and a repeating unit represented by the formula (3-2).

The fluororesin may also be a mixture (blend) of a polymer containing a repeating unit represented by the formula (3-3) and a polymer containing a repeating unit represented by the formula (3-1) and a repeating unit represented by the formula (3-2). When the fluororesin is a mixture, the fluororesin may be a mixture of a polymer containing a repeating unit represented by the formula (3-3) and a repeating unit represented by the formula (3-1) and a polymer containing a repeating unit represented by the formula (3-2), or a mixture of a polymer containing a repeating unit represented by the formula (3-3) and a repeating unit represented by the formula (3-2) and a polymer containing a repeating unit represented by the formula (3-1).

[Chem. 102]

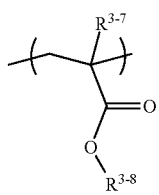

(3-3)

In the formula (3-3), $R^{3-7}$ represents a hydrogen atom or a methyl group;

In the formula (3-3), $R^{3-8}$ represents a C1-C15 linear, C3-C15 branched, or C3-C15 cyclic alkyl group in which one or more hydrogen atoms in the alkyl group are substituted by fluorine atoms; and the repeating unit has a fluorine content of 30 mass % or more.

When $R^{3-8}$ is a linear hydrocarbon group, specific examples thereof include a methyl group, an ethyl group, a propyl group, a butyl group, a pentyl group, a hexyl group, a heptyl group, an octyl group, a nonyl group, and C10-C14 linear alkyl groups in which one or more hydrogen atoms are substituted by fluorine atoms.

When $R^{3-8}$ is a linear hydrocarbon group, preferably, the repeating unit represented by the formula (3-3) is a repeating unit represented by the following formula (3-3-1).

[Chem. 103]

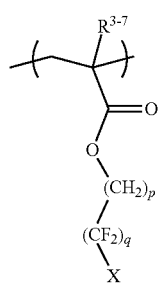

(3-3-1)

wherein $R^{3-7}$ is the same as $R^{3-7}$ in the formula (3-3); X is a hydrogen atom or a fluorine atom; p is an integer of 1 to 4; and q is an integer of 1 to 14.

In the repeating unit represented by the formula (3-3-1), particularly preferably, p is an integer of 1 or 2, q is an integer of 2 to 8, and X is a fluorine atom.

The following are examples of preferred structures of the repeating unit represented by the formula (3-3).

[Chem. 104]

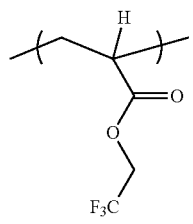

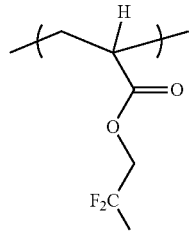

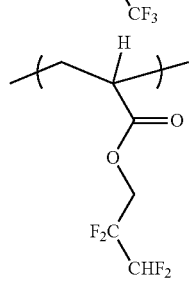

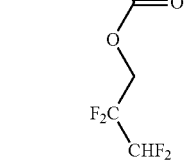

-continued

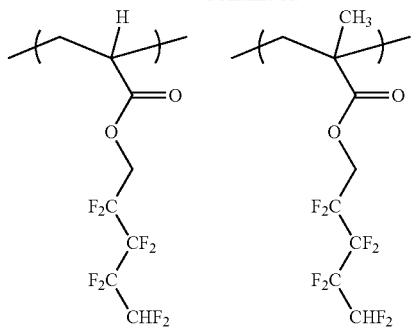

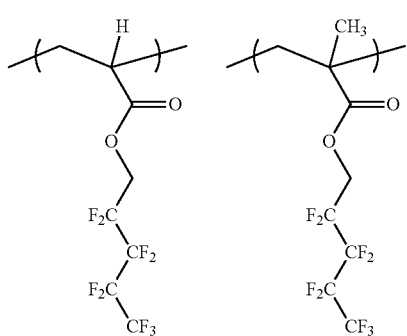

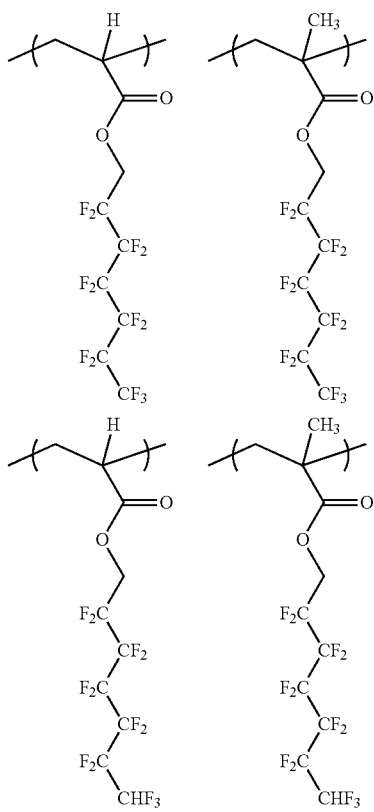

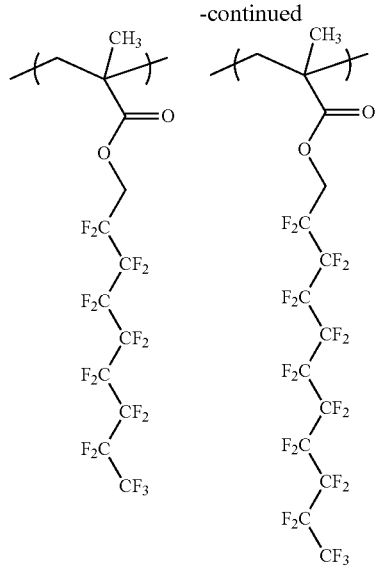
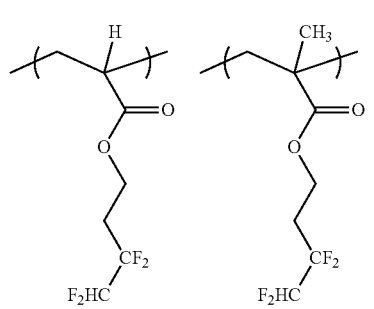
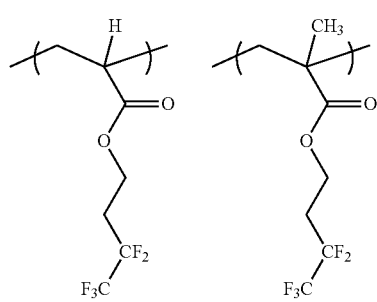
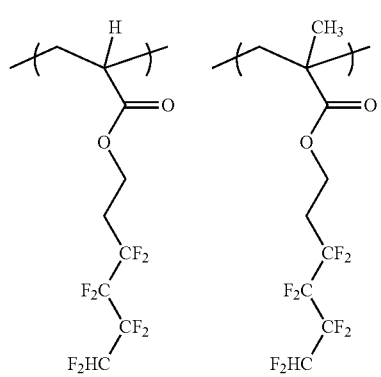
[0710]
[Chem. 105]
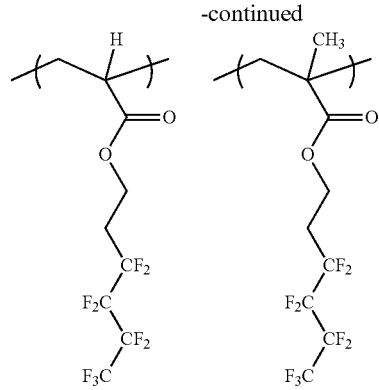
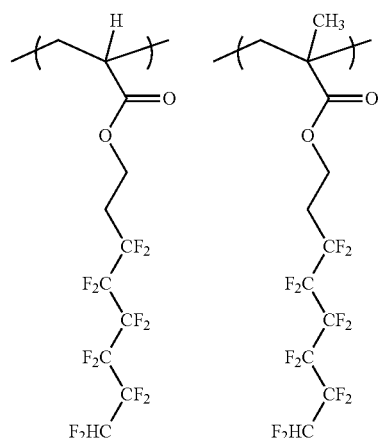
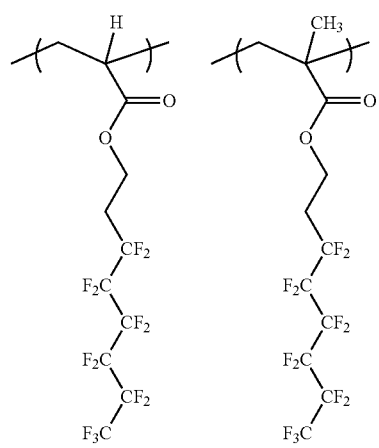

[0711]
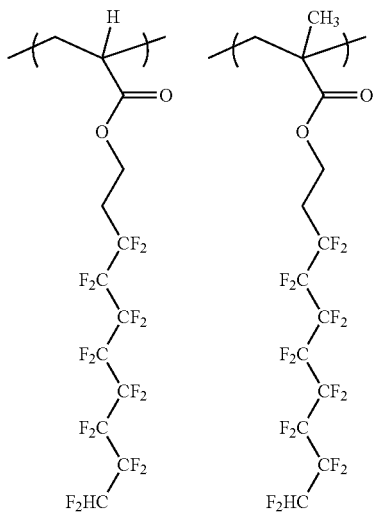
[Chem. 106]
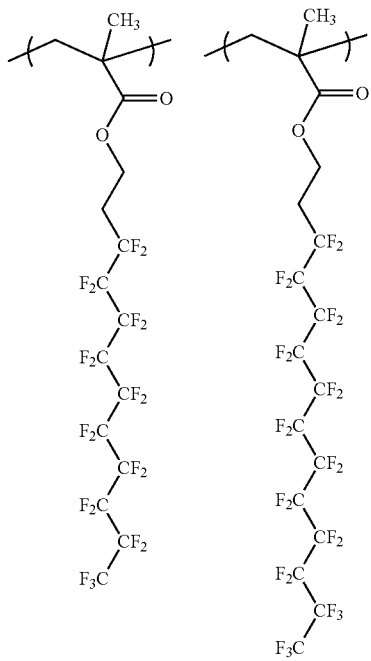
[0712]
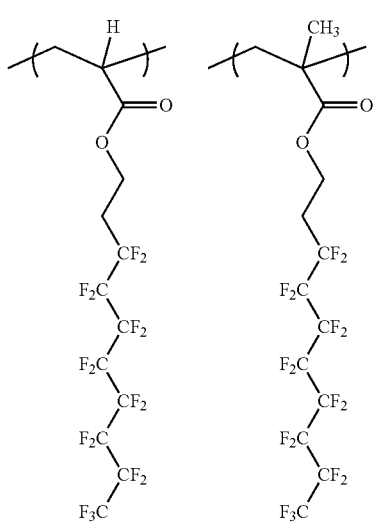
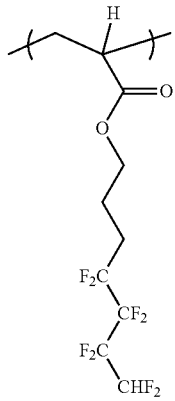
[Chem. 107]
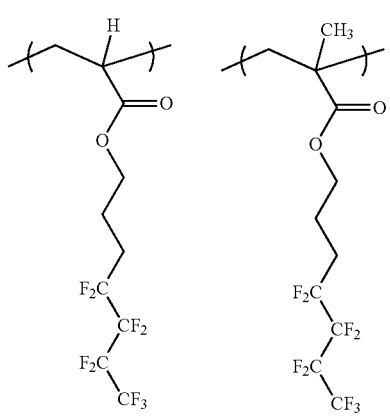

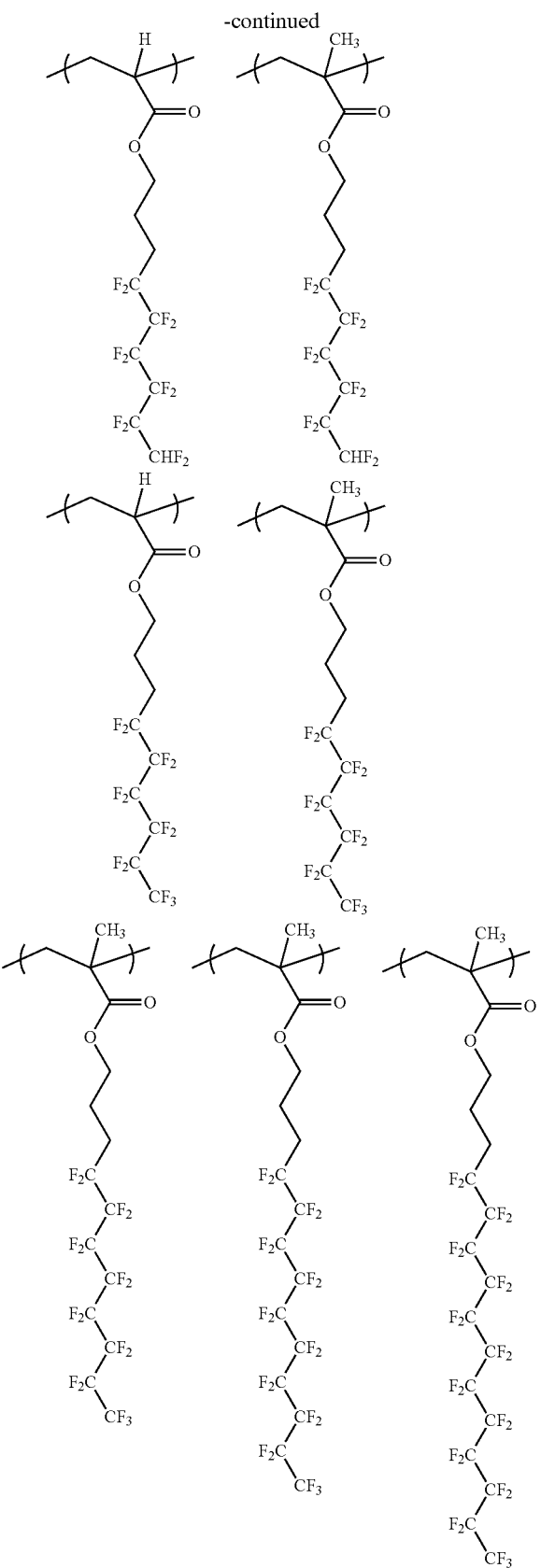

The amount of the repeating unit represented by the formula (3-3) is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (3-3) is more than 70 mass %, the fluororesin tends to be hardly soluble in solvents.

The repeating unit represented by the formula (3-3) is a repeating unit that imparts ink repellency to the fluororesin after UV-ozone treatment or oxygen plasma treatment. Thus, when pursuing high ink repellency, preferably, the fluororesin according to the third embodiment of the present disclosure contains the repeating unit represented by the formula (3-3).

3-1-4. Repeating Unit Represented by Formula (3-4)

Preferably, the fluororesin according to the third embodiment of the present disclosure further contains a repeating unit represented by a formula (3-4).

The fluororesin may be a polymer containing a combination of a repeating unit represented by the formula (3-4), a repeating unit represented by the formula (3-1), and a repeating unit represented by the formula (3-2). Alternatively, the fluororesin may be a polymer containing a combination of a repeating unit represented by the formula (3-4), a repeating unit represented by the formula (3-1), a repeating unit represented by the formula (3-2), and a repeating unit represented by the formula (3-3).

The fluororesin may also be a mixture (blend) of a polymer containing a repeating unit represented by the formula (3-4) and a polymer containing a repeating unit represented by the formula (3-1) and a repeating unit represented by the formula (3-2). When the fluororesin is a mixture, the fluororesin may be a mixture of a polymer containing a repeating unit represented by the formula (3-4) and a repeating unit represented by the formula (3-1) and a polymer containing a repeating unit represented by the formula (3-2), or a mixture of a polymer containing a repeating unit represented by the formula (3-4) and a repeating unit represented by the formula (3-2) and a polymer containing a repeating unit represented by the formula (3-1). Further, when the fluororesin is a mixture containing a repeating unit represented by the formula (3-3), the fluororesin may be a mixture of a repeating unit represented by the formula (3-3) and any of the above possible combinations of the repeating units represented by the formulas (3-1), (3-2), and (3-4).

[Chem. 108]

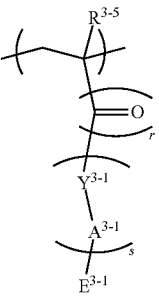

(3-4)

In the formula (3-4), $R^{3-5}$, $Y^{3-1}$, $A^{3-1}$, and r are the same as $R^{3-5}$, $Y^{3-1}$, $A^{3-1}$, and r in the formula (3-2), respectively. Specific or preferred examples may also include those described in "3-1-2. Repeating unit represented by formula (3-2)".

In the formula (3-4), $E^{3-1}$ represents a hydroxy group, a carboxy group, or an oxirane group.

When $E^{3-1}$ is an oxirane group, examples thereof include an ethylene oxide group, a 1,2-propylene oxide group, and a 1,3-propylene oxide group. Preferred of these is an ethylene oxide group.

In the formula (3-4), s represents 0 or 1. When s is 0, ($-Y^{3-1}-A^{3-1}-$) represents a single bond. When r is 0 and s is 0, the structure has $E^{3-1}$ bonded to the main chain of the repeating unit.

The formula (3-4) may be a repeating unit represented by the following formula (3-6).

[Chem. 109]

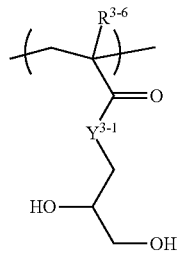

(3-6)

In the formula (3-6), $R^{3-6}$ and $Y^{3-1}$ are the same as $R^{3-6}$ and $Y^{3-1}$ in the formula (3-2), respectively.

The following are examples of preferred structures of the repeating unit represented by the formula (3-4).

[Chem. 110]

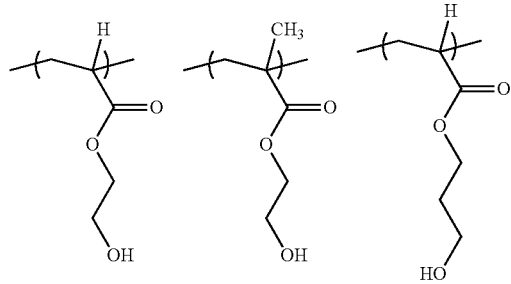

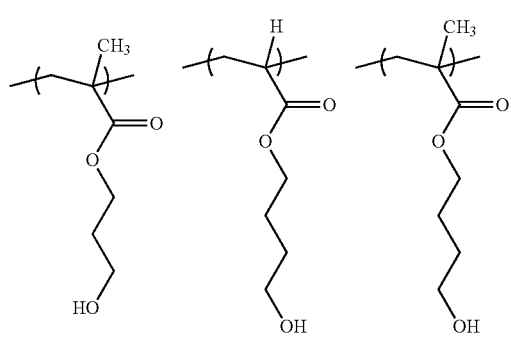

-continued

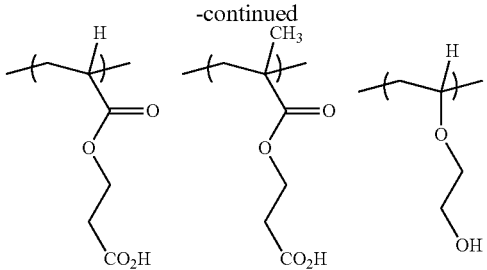

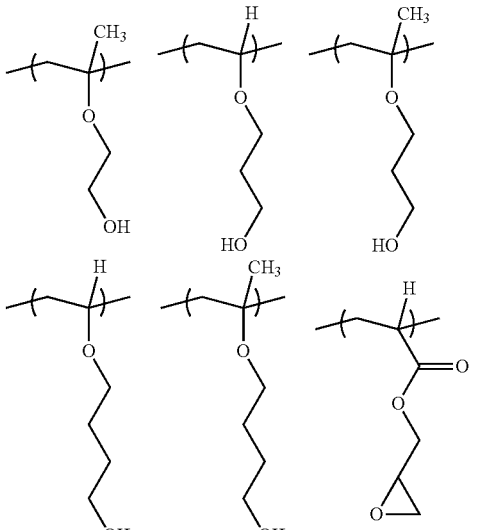

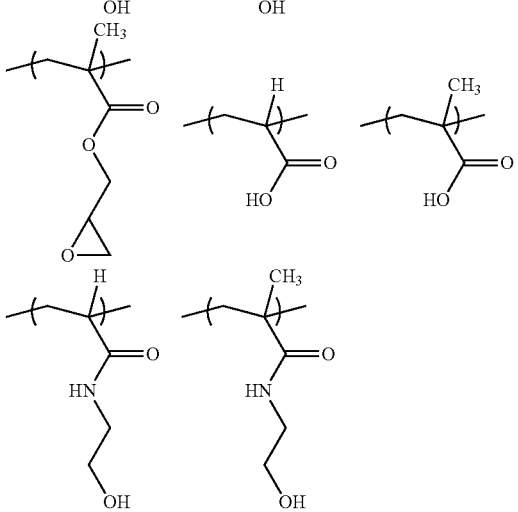

A repeating unit represented by the formula (3-4) wherein $E^{3-1}$ is a hydroxy group or a carboxy group imparts solubility to the fluororesin in an alkali developer. Thus, when it is desired to impart alkali developability to a film obtainable from the fluororesin, preferably, the fluororesin according to the third embodiment of the present disclosure contains the repeating unit represented by the formula (3-4) wherein $E^{3-1}$ is a hydroxy group or a carboxy group. Specifically, when it is desired to form banks containing a repeating unit represented by the formula (3-1) and a repeating unit represented by the formula (3-2A) in the third embodiment of the present disclosure, further adding the repeating unit represented by the formula (3-4) wherein $E^{3-1}$ is a hydroxy group or a carboxy group tends to improve the shape of the resulting patterned film, thus providing one preferred embodiment.

3-1-5. Repeating Unit Represented by Formula (3-5)

Preferably, the fluororesin according to the third embodiment of the present disclosure further contains a repeating unit represented by a formula (3-5).

The fluororesin may be a polymer containing a combination of a repeating unit represented by the formula (3-5), a repeating unit represented by the formula (3-1), and a repeating unit represented by the formula (3-2). Alternatively, the fluororesin may be a polymer containing a combination of a repeating unit represented by the formula (3-5), a repeating unit represented by the formula (3-1), a repeating unit represented by the formula (3-2), and a repeating unit represented by the formula (3-3).

The fluororesin may also be a mixture (blend) of a polymer containing a repeating unit represented by the formula (3-5) and a polymer containing a repeating unit represented by the formula (3-1) and a repeating unit represented by the formula (3-2). When the fluororesin is a mixture, the fluororesin may be a mixture of a polymer containing a repeating unit represented by the formula (3-5) and a repeating unit represented by the formula (3-1) and a polymer containing a repeating unit represented by the formula (3-2), or a mixture of a polymer containing a repeating unit represented by the formula (3-5) and a repeating unit represented by the formula (3-2) and a polymer containing a repeating unit represented by the formula (3-1). Further, when the fluororesin is a mixture containing a repeating unit represented by the formula (3-3), the fluororesin may be a mixture of a repeating unit represented by the formula (3-3) and any of the above possible combinations of the repeating units represented by the formulas (3-1), (3-2), and (3-5).

[Chem. 111]

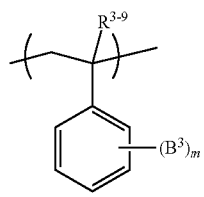

(3-5)

In the formula (3-5), $R^{3-9}$ represents a hydrogen atom or a methyl group.

In the formula (3-5), each $B^3$ independently represents a hydroxy group, a carboxy group, —C(=O)—O—$R^{3-10}$ ($R^{3-10}$ represents a C1-C15 linear, C3-C15 branched, or C3-C15 cyclic alkyl group in which one or more hydrogen atoms in the alkyl group are substituted by fluorine atoms, and $R^{3-10}$ has a fluorine content of 30 mass % or more), or —O—C(=O)—$R^{3-11}$ ($R^{3-11}$ represents a C1-C6 linear, C3-C6 branched, or C3-C6 cyclic alkyl group).

When $B^3$ is —C(=O)—O—$R^{3-10}$, specific examples of $R^{3-10}$ may include those of $R^{3-8}$ in the formula (3-3).

When $B^3$ is —O—C(=O)—$R^{3-11}$, examples of $R^{3-11}$ include a methyl group, an ethyl group, an n-propyl group, an isopropyl group, an n-butyl group, a 1-methylpropyl group, a 2-methylpropyl group, a tert-butyl group, an n-pentyl group, an isopentyl group, a 1,1-dimethylpropyl group, a 1-methylbutyl group, a 1,1-dimethylbutyl group, an n-hexyl group, a cyclopentyl group, and a cyclohexyl group. A hydrogen atom, a methyl group, an ethyl group, an n-propyl group, and an isopropyl group are preferred. A methyl group is more preferred.

In the formula (3-5), m represents an integer of 0 to 3.

The following are examples of preferred structures of the repeating unit represented by the formula (3-5).

[Chem. 112]

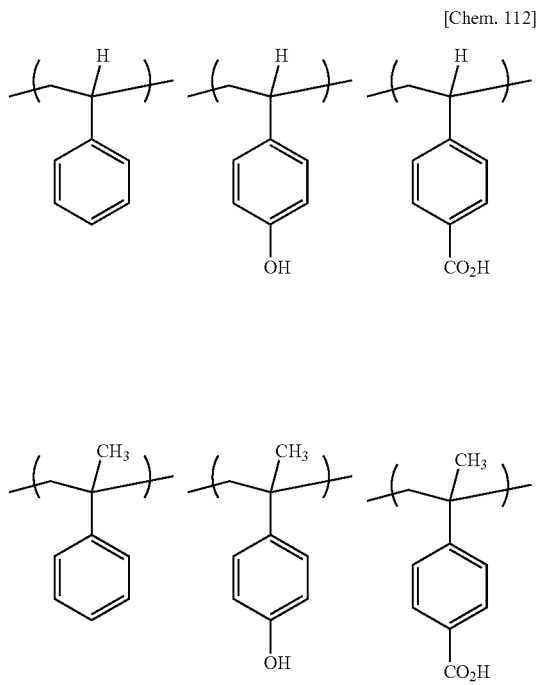

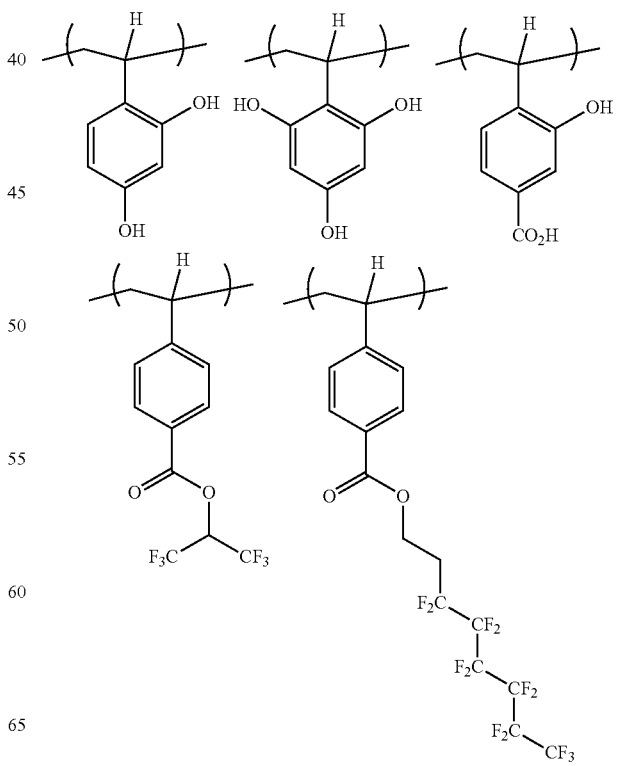

-continued

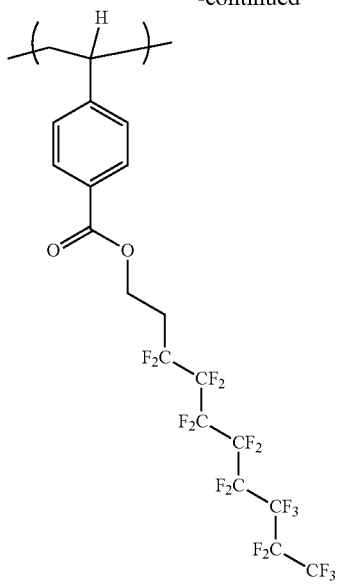

[Chem. 113]

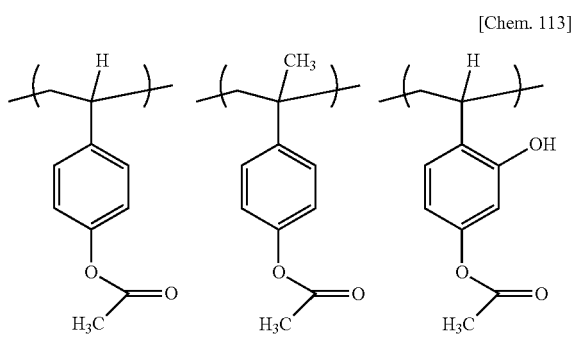

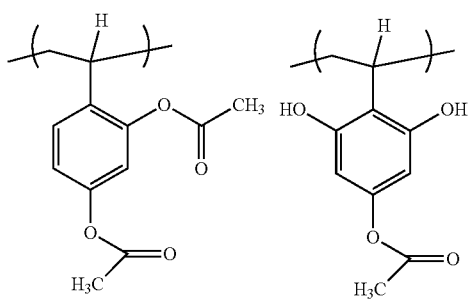

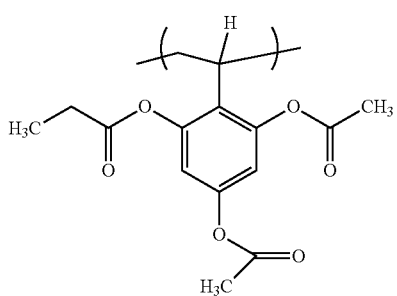

-continued

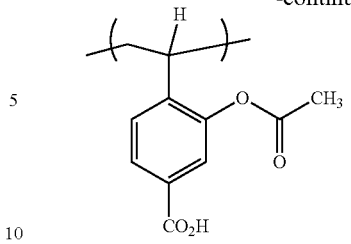

The amount of the repeating unit represented by the formula (3-5) is preferably 5 mass % or more and 70 mass % or less, more preferably 10 mass % or more and 50 mass % or less, particularly preferably 20 mass % or more and 40 mass % or less, relative to 100 mass % of the fluororesin.

When the amount of the repeating unit represented by the formula (3-5) is more than 70 mass %, the fluororesin tends to be hardly soluble in solvents.

A repeating unit represented by the formula (3-5) wherein $B^3$ is a hydroxy group or a carboxy group imparts solubility to the fluororesin in an alkali developer. Thus, when it is desired to impart alkali developability to a film obtainable from the fluororesin, preferably, the fluororesin according to the third embodiment of the present disclosure contains the repeating unit represented by the formula (3-5) wherein $B^3$ is a hydroxy group or a carboxy group. Specifically, when it is desired to form banks containing a repeating unit represented by the formula (3-1) and a repeating unit represented by the formula (3-2A) in the third embodiment of the present disclosure, further adding the repeating unit represented by the formula (3-5) wherein $B^3$ is a hydroxy group or a carboxy group tends to improve the shape of the resulting patterned film, thus providing one preferred embodiment.

3-1-6. Preferred Embodiments of Fluororesin

Particularly preferred embodiments of the fluororesin according to the third embodiment of the present disclosure may include the following six embodiments.

Embodiment 3-1

Fluororesin containing a repeating unit represented by the following formula (3-1) and a repeating unit represented by the following formula (3-2)

Formula (3-1): $R^{3-1}$ and $R^{3-2}$ are hydrogen atoms; and $R^{3-3}$ and $R^{3-4}$ are each independently a fluorine atom, a difluoromethyl group, or a trifluoromethyl group.

Formula (3-2): $R^{3-5}$ and $R^{3-6}$ are each independently a hydrogen atom or a methyl group; $W^3$ is —O—C(=O)—NH—, —C(=O)—O—C(=O)—NH—, or —C(=O)—NH—; $A^{3-1}$ and $A^{3-2}$ are each independently an ethylene group; $Y^{3-1}$ and $Y^{3-2}$ are —O—; n is 1; and r is 1.

Embodiment 3-2

Fluororesin containing a repeating unit represented by the following formula (3-1) and a repeating unit represented by the following formula (3-2)

Formula (3-1): same as described in Embodiment 3-1

Formula (3-2): $R^{3-5}$ and $R^{3-6}$ are each independently a hydrogen atom or a methyl group; $W^3$ represents —O—C(=O)—NH—, —C(=O)—O—C(=O)—NH—, or —C(=O)—NH—; $A^{3-1}$ and $A^{3-2}$ are each independently an ethylene group, a 1-hydroxy-n-ethylene group (—CH(OH)CH$_2$—), or a 2-hydroxy-n-ethylene group (—CH$_2$CH(OH)—); $Y^{3-1}$ and $Y^{3-2}$ are —O—; n is 1; and r is 1.

Embodiment 3-3

Fluororesin containing a repeating unit represented by the following formula (3-1) and a repeating unit represented by the following formula (3-2)

Formula (3-1): same as described in Embodiment 3-1

Formula (3-2): $R^{3-5}$ and $R^{3-6}$ are each independently a hydrogen atom or a methyl group; $W^3$ represents —O—C(=O)—NH—, —C(=O)—O—C(=O)—NH—, or —C(=O)—NH—; $A^{3-1}$ and $A^{3-2}$ are each independently an ethylene group or a butyl group; $Y^{3-1}$ and $Y^{3-2}$ are —O—; n is 1; and r is 0.

Embodiment 3-4

Fluororesin containing repeating units represented by the following formulas (3-1), (3-2), and (3-3-1)

Formula (3-1): same as described in Embodiment 3-1

Formula (3-2): same as described in Embodiment 3-1

Formula (3-3-1): $R^{3-7}$ is a methyl group; p is 2; q is an integer of 4 to 8; X is a fluorine atom.

Embodiment 3-5

Fluororesin containing repeating units represented by the following formulas (3-1), (3-2), (3-3-1), and (3-4)

Formula (3-1): same as described in Embodiment 3-1

Formula (3-2): same as described in Embodiment 3-1

Formula (3-3-1): same as described in Embodiment 3-4

Formula (3-4): $R^{3-5}$, $Y^{3-1}$, $A^{3-1}$, and r are as the same as described in Embodiment 1; s is 1; and $E^{3-1}$ is a hydroxy group or a carboxy group.

Embodiment 3-6

Fluororesin containing repeating units represented by the following formulas (3-1), (3-2), (3-3-1), (3-4), and (3-5)

Formula (3-1): same as described in Embodiment 3-1

Formula (3-2): same as described in Embodiment 3-1

Formula (3-3-1): same as described in Embodiment 3-4

Formula (3-4): same as described in Embodiment 3-5

Formula (3-5): $R^{3-9}$ is a hydrogen atom; $B^3$ is a hydroxy group, a carboxy group, or —O—C(=O)—CH₃; and m is 1.

3-1-7. Method of Producing Fluororesin

The fluororesin according to the third embodiment of the present disclosure can be easily produced by the following two steps: first, monomers represented by formulas (3-1a) and (3-2a) are polymerized to obtain a fluororesin precursor containing a repeating unit represented by the formula (3-1) and a repeating unit represented by a formula (3-2b); and then the formula (3-2b) between the repeating unit represented by the formula (3-1) and the repeating unit represented by the formula (3-2b) is subjected to addition reaction with an acrylic acid derivative represented by a formula (3-2c).

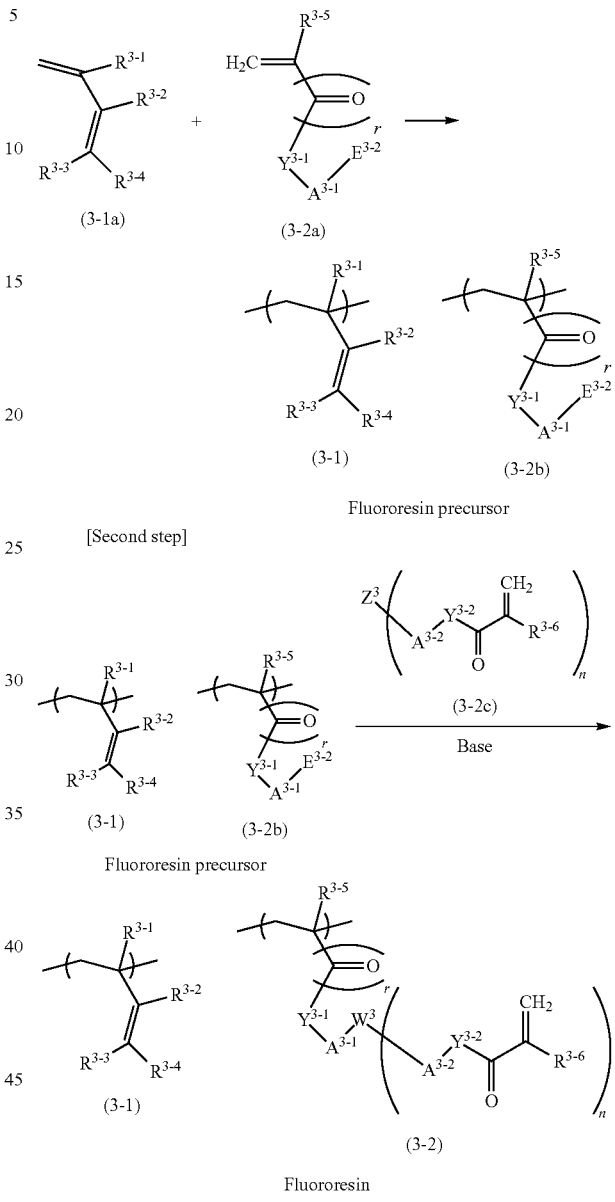

[Chem. 114]

[First step]

(3-1a)   (3-2a)

(3-1)   (3-2b)

Fluororesin precursor

[Second step]

(3-1)   (3-2b)

Fluororesin precursor (3-2c)

Base (3-1)   (3-2)

Fluororesin

In the formula (3-1), $R^{3-1}$ represents a hydrogen atom, a fluorine atom, or a methyl group; $R^{3-2}$ represents a hydrogen atom or a C1-C6 linear, C3-C6 branched, or C3-C6 cyclic alkyl group; $R^{3-3}$ and $R^{3-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{3-1}$, $R^{3-3}$, and $R^{3-4}$ are fluorine atoms or the fluoroalkyl groups.

In the formula (3-1a), $R^{3-1}$, $R^{3-2}$, $R^{3-3}$, and $R^{3-4}$ are the same as $R^{3-1}$, $R^{3-2}$, $R^{3-3}$, and $R^{3-4}$ in the formula (3-1), respectively.

In the formula (3-2), $R^{3-5}$ and $R^{3-6}$ each independently represent a hydrogen atom or a methyl group; W is a divalent linking group and represents —O—, —O—C(=O)—, —C(=O)—O—, —O—C(=O)—NH—, —C(=O)—O—

C(=O)—NH—, or —C(=O)—NH—; $A^{3-1}$ and $A^{3-2}$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—CH$_3$; $Y^{3-1}$ and $Y^{3-2}$ are divalent linking groups and each independently represent —O— or —NH—; n represents an integer of 1 to 3; and r represents 0 or 1.

In the formula (3-2a), $R^{3-5}$, $Y^{3-1}$, $A^{3-1}$, and r are the same as $R^{3-5}$, $Y^{3-1}$, $A^{3-1}$, and r in the formula (3-2), respectively; and $E^{3-2}$ represents a hydroxy group or an ethylene oxide group.

In the formula (3-2b), $R^{3-5}$, $Y^{3-1}$, $A^{3-1}$, r and $E^{3-2}$ are the same as $R^{3-5}$, $Y^{3-1}$, $A^{3-1}$, and r in the formula (3-2) and $E^{3-2}$ in the formula (3-2a), respectively.

In the formula (3-2c), $R^{3-6}$, $Y^{3-2}$, $A^{3-2}$, and n are the same as $R^{3-6}$, $Y^{3-2}$, $A^{3-2}$, and n in the formula (3-2), respectively; and $Z^3$ represents an isocyanate group (—N=C=O) or an acid halide (—C(=O)—X, X represents a halogen atom or an imidazolyl group), an acid anhydride, a halogen atom, a hydroxy group, an amino group (—NH$_2$), or an oxirane group.

Each step is described below.

[First Step]

In the first step, monomers represented by the formulas (3-1a) and (3-2a) are polymerized to produce a fluororesin precursor containing a repeating unit represented by the formula (3-1) and a repeating unit represented by the formula (3-2b).

[Chem. 115]
[First step]

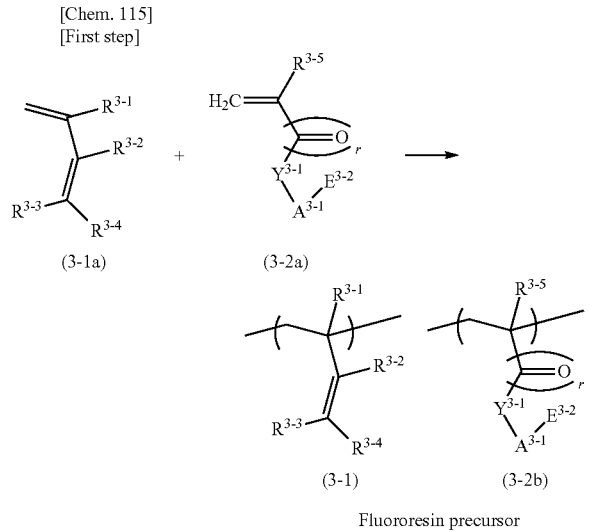

Fluororesin precursor

The monomer represented by the formula (3-1a) may be a commercially available product or can be prepared by a known method or a method based thereon. For example, preferably, the monomer is prepared by a method described in Journal of Organic Chemistry, 1970, Vol. 35, No. 6, pp. 2096-2099, or a method based thereon.

The repeating unit represented by the formula (3-1) is formed by cleavage of the polymerizable double bond of the monomer represented by the formula (3-1a). No structural changes occur and the original structure is maintained, except for the changes in the polymerizable double bond during polymerization. Thus, in the monomer represented by the formula (3-1a), $R^{3-1}$, $R^{3-2}$, $R^{3-3}$, and $R^{3-4}$ are the same as $R^{3-1}$, $R^{3-2}$, $R^{3-3}$, and $R^{3-4}$ in the repeating unit represented by the formula (3-1), respectively. Examples of specific substituents include those described in "3-1-1. Repeating unit represented by formula (3-1)". Examples of preferred structures of the monomer represented by the formula (3-1a) may include those of the respective monomers before cleavage of the polymerizable double bond in the repeating units exemplified in "3-1-1. Repeating unit represented by formula (3-1)".

The monomer represented by the formula (3-2a) may be a commercially available product or can be prepared by a known method or a method based thereon. Use of a commercially available product is preferred in terms of easy availability.

The repeating unit represented by the formula (3-2b) is formed by cleavage of the polymerizable double bond of the monomer represented by the formula (3-2a). No structural changes occur and the original structure is maintained, except for the changes in the polymerizable double bond during polymerization.

In the monomer represented by the formula (3-2a), $E^{3-2}$ represents a hydroxy group or an ethylene oxide group. In the monomer represented by the formula (3-2a), preferably, $R^{3-5}$ is a hydrogen atom or a methyl group; $A^{3-1}$ is an ethylene group; $Y^{3-1}$ is —O—; $E^{3-2}$ is a hydroxy group; and r is 0 or 1.

The method of polymerizing the monomers represented by the formulas (3-1a) and (3-2a) is now described.

Any common polymerization method can be used, but radical polymerization and ionic polymerization are preferred. In some cases, polymerization methods such as coordination anionic polymerization, living anionic polymerization, cationic polymerization, ring-opening metathesis polymerization, vinylene polymerization, and vinyl addition can also be used. Of these, radical polymerization is particularly preferred. These polymerization methods may be known methods. The radical polymerization method is described below, but polymerization can be easily performed also by other methods according to known documents or the like.

The radical polymerization may be performed in a batch type, semi-continuous type, or continuous-type operation by a known polymerization method such as bulk polymerization, solution polymerization, suspension polymerization, or emulsion polymerization in the presence of a radical polymerization initiator or radical initiation source.

Any radical polymerization initiator may be used. Examples thereof include azo compounds, peroxide compounds, persulfate compounds, and redox compounds. Particularly preferred are 2,2'-azobis(2-methylbutyronitrile), dimethyl 2,2'-azobis(2-methylpropionate), tert-butyl peroxypivalate, di-tert-butyl peroxide, isobutyryl peroxide, lauroyl peroxide, succinic acid peroxide, dicinnamyl peroxide, di-n-propyl peroxydicarbonate, tert-butylperoxyallyl monocarbonate, benzoyl peroxide, hydrogen peroxide, and ammonium persulfate.

Any reaction vessel may be used for polymerization. Preferably, polymerization is performed using a polymerization solvent in addition to the monomers and initiators. A polymerization solvent that does not interfere with radical polymerization is preferred. Typical examples thereof include ester solvents such as ethyl acetate and n-butyl acetate; ketone solvents such as acetone, methyl ethyl ketone, and methyl isobutyl ketone; hydrocarbon solvents such as toluene and cyclohexane; and alcohol solvents such as methanol, isopropyl alcohol, and ethylene glycol monomethyl ether. Solvents such as water, chain ether solvents, cyclic ether solvents, chlorofluorocarbon solvents, and aromatic solvents can also be used. These polymerization solvents can be used alone or in combination of two or more thereof. A molecular weight modifier such as mercaptan may also be used in combination. The reaction temperature for polymerization is suitably changed according to a radical polymerization initiator or radical polymerization initiating source. Usually, the reaction temperature is preferably 20° C. to 200° C., more preferably 30° C. to 140° C., particularly preferably 50° C. to 120° C.

The polymerization time is usually 0.1 to 48 hours, preferably 1 to 24 hours. Preferably, a point at which the monomer is consumed is determined, by an analytical instrument such as a high-performance liquid chromatograph (HPLC) or nuclear magnetic resonance (NMR) device, as the endpoint of the polymerization. After completion of the polymerization, the reaction can be terminated by cooling the polymerization solution to room temperature or below.

The monomer concentration relative to 100 mass % of the polymerization system at the beginning of polymerization is preferably 1 mass % or more and 95 mass % or less, more preferably 10 mass % or more and 80 mass % or less. When the monomer concentration is lower than the above ranges, the reaction rate during polymerization tends to decrease. When the monomer concentration is higher than the above ranges, the polymerization solution tends to be highly viscous.

The organic solvent or water can be removed from the resulting fluororesin precursor solution or dispersion by a method such as reprecipitation, filtration, or vacuum thermal distillation. Further, the resulting fluororesin precursor may be purified by, for example, a method such as washing with a solvent that does not dissolve the fluororesin during filtration.

[Second Step]

In the second step, the formula (3-2b) between the repeating unit represented by the formula (3-1) and the repeating unit represented by the formula (3-2b) is subjected to addition reaction with an acrylic acid derivative represented by the formula (3-2c) to produce a fluororesin containing repeating units represented by the formulas (3-1) and (3-2).

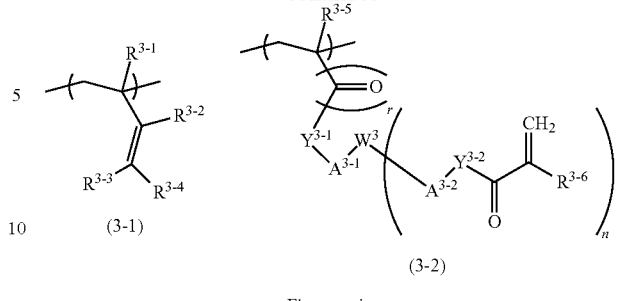

Fluororesin

The acrylic acid derivative represented by the formula (3-2c) may be a commercially available product or can be prepared by a known method or a method based thereon. Use of a commercially available product is preferred in terms of easy availability.

In the formula (3-2c), $R^{3-6}$, $Y^{3-2}$, $A^{3-2}$, and n are the same as $R^{3-6}$, $Y^{3-2}$, $A^{3-2}$, and n in the formula (3-2), respectively. Examples of specific substituents may include those of $R^{3-6}$, $Y^{3-2}$, and $A^{3-2}$ described in "3-1-2. Repeating unit represented by formula (3-2)".

$Z^3$ represents an isocyanate group (—N=C=O), an acid halide (—C(=O)—X, wherein X is a halogen atom or an imidazolyl group), an acid anhydride, a halogen atom, a hydroxy group, a hydroxy group protected by a protective group, an amino group (—NH$_2$), or an oxirane group.

Examples of the acid halide (—C(=O)—X, wherein X is a halogen atom or an imidazolyl group) in $Z^3$ include acid fluorides such as —C(=O)—F, —C(=O)—Cl, —C(=O)—Br, and —C(=O)—I, and groups in which —C(=O)— is linked to a 2-imidazolyl group.

Examples of the acid anhydride in $Z^3$ include —C(=O)—O—C(=O)—CH$_3$, —C(=O)—O—C(=O)—C(CH$_3$)$_3$, and —C(=O)—O—C(=O)—CF$_3$.

Examples of the hydroxy group protected by a protective group in $Z^3$ include a hydroxy group protected by a protective group such as a methanesulfonyl group, a trifluoromethanesulfonyl group, or a p-toluenesulfonyl group.

Examples of the oxirane group in $Z^3$ include an ethylene oxide group, a 1,2-propylene oxide group, and a 1,3-propylene oxide group.

Of these, $Z^3$ is particularly preferably an isocyanate group, —C(=O)—Cl, or an ethylene oxide group.

Examples of preferred acrylic acid derivatives represented by the formula (3-2c) include the following structures.

[Chem. 116]

[Second step]

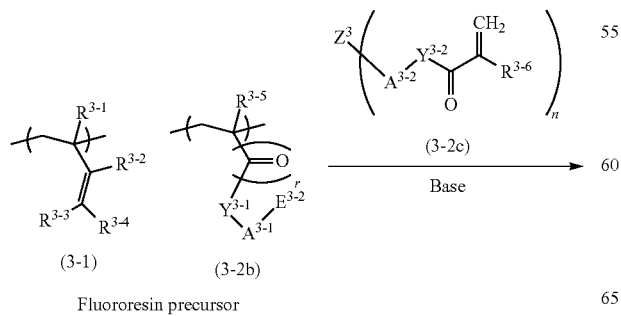

Fluororesin precursor

[Chem. 117]

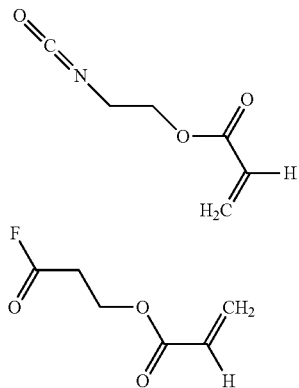

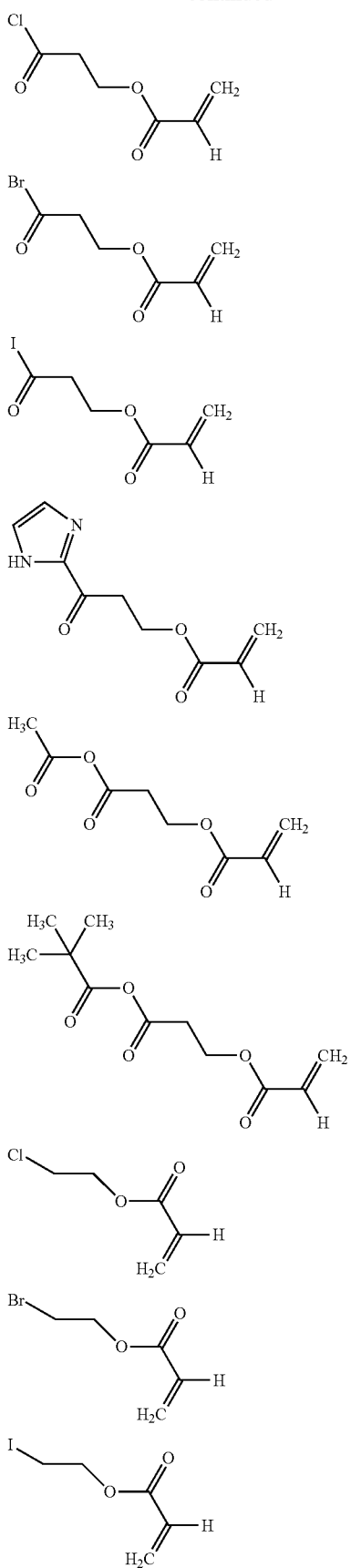
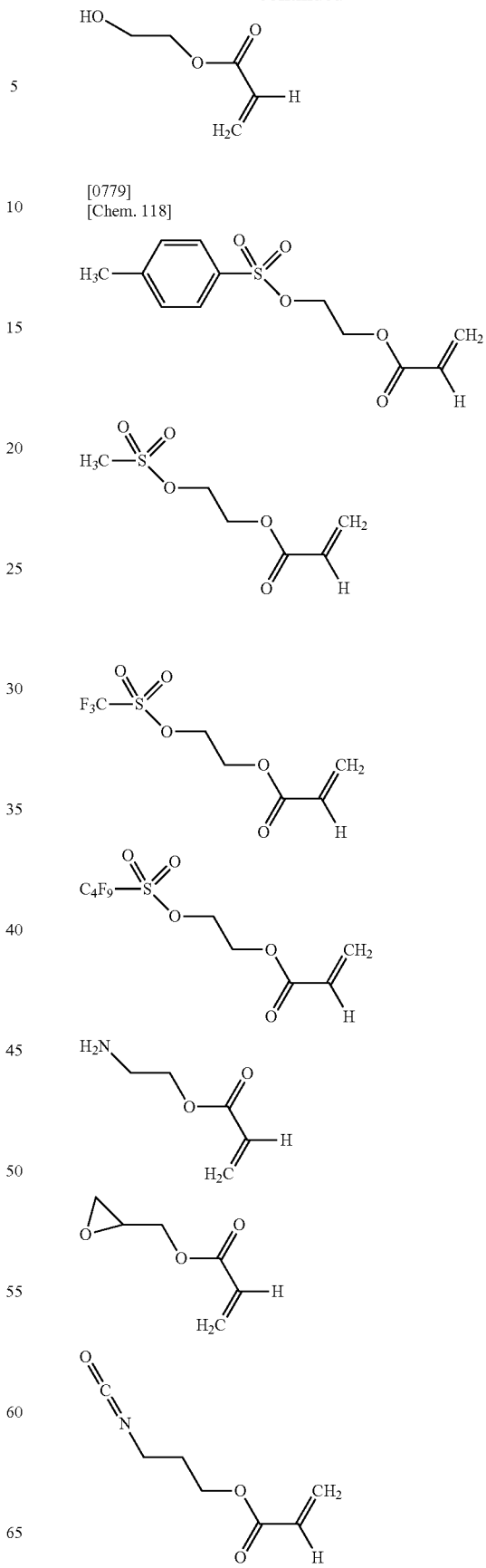
[0779]
[Chem. 118]

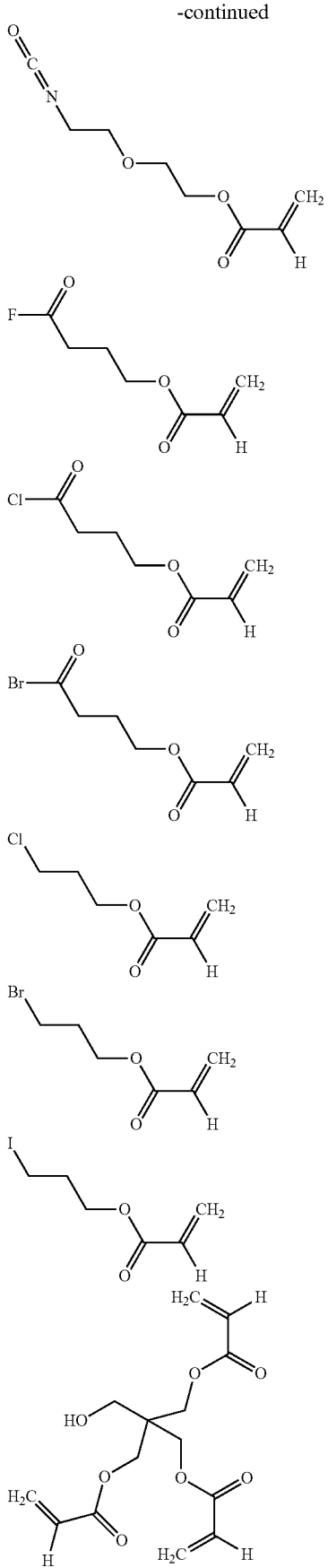
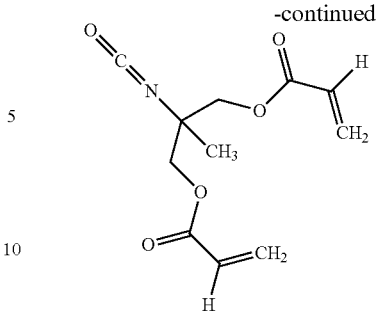

The form of the addition reaction varies depending on the type of $Z^3$ in the formula (3-2c), but in any form, a common addition reaction method can be used. Here, two forms are exemplified.

Form (3-1): When $E^{3-2}$ in the formula (3-2b) is a hydroxy group and $Z^3$ in the formula (3-2c) is an isocyanate group, W in the resulting formula (3-2) can form a bond "—O—C(=O)—NH—".

Form (3-2): When $E^{3-2}$ in the formula (3-2b) is a hydroxy group and $Z^3$ in the formula (3-2c) is an ethylene oxide group, $W^3$ in the resulting formula (3-2) can form a bond "—O—".

Even when the fluororesin precursor containing the repeating units represented by the formulas (3-1) and (3-2b) further contains a repeating unit having a nucleophilic substituent such as a carboxy group (e.g., a repeating unit in which $E^{3-1}$ in the formula (3-3) is a carboxy group, or a repeating unit in which $B^3$ in the formula (3-4) is a hydroxy group or a carboxy group), $E^{3-2}$ in the formula (3-2b) selectively reacts with the acrylic acid derivative represented by the formula (3-2c). This is because $Z^3$ in the formula (3-2c) is reactive with $E^{3-2}$ in the formula (3-2b). The reactivity varies depending on the type of $A^{3-1}$ and $E^{3-2}$ in the formula (3-2b), but when $E^{3-2}$ in the formula (3-2b) is a primary alcohol, the reactivity between the formula (3-2b) and the formula (3-2c) is significant.

The method of the second step is described below. In any of the above forms, usually, the following method can be used.

The amount of the acrylic acid derivative represented by the formula (3-2c) to act on the fluororesin precursor containing the repeating units represented by the formulas (3-1) and (3-2b) is not limited, but is usually 0.01 to 5 mol, preferably 0.05 to 3 mol, more preferably 0.05 to 1 mol, per mole of the fluororesin precursor containing the repeating units represented by the formulas (3-1) and (3-2b). The amount of the acrylic acid derivative is particularly preferably 0.2 to 1 mol.

Usually, the reaction is performed using an aprotic solvent such as dichloroethane, toluene, ethylbenzene, monochlorobenzene, tetrahydrofuran, acetonitrile, propylene glycol monomethyl monoacetate (PGMEA), or N,N-dimethylformamide. These solvents may be used alone or in combination of two or more thereof.

The reaction temperature is not limited, and is usually in the range of −20° C. to +100° C., preferably 0° C. to +80° C., more preferably +10° C. to +40° C. Preferably, the reaction is performed with stirring.

The reaction time depends on the reaction temperature, but is usually several minutes to 100 hours, preferably 30 minutes to 50 hours, more preferably 1 to 20 hours. Preferably, a point at which the acrylic acid derivative represented by the formula (3-2c) is consumed is determined, by an analytical instrument such as a nuclear magnetic resonance (NMR) device, as the endpoint of the reaction.

In this reaction, a base may be used as a catalyst. Examples of preferred bases include organic bases such as trimethylamine, triethylamine, tripropylamine, tributylamine, and diisopropylethylamine; and inorganic bases such as sodium hydroxide, potassium hydroxide, and lithium hydroxide. The amount of the base catalyst used is not limited, but is 0.01 to 5 mol, preferably 0.02 to 3 mol, more preferably 0.05 to 1 mol, per mole of the fluororesin precursor containing the repeating units represented by the formulas (3-1) and (3-2b).

After completion of the reaction, usual techniques such as reprecipitation, filtration, extraction, crystallization, and recrystallization are performed, whereby a fluororesin containing a repeating unit represented by the formula (3-1) and a repeating unit represented by the formula (3-2) can be obtained. Further, the resulting fluororesin may be purified by, for example, a method such as washing with a solvent that does not dissolve the fluororesin during filtration.

3-2. Photosensitive Resin Composition

The photosensitive resin composition according to the third embodiment of the present disclosure at least contains the fluororesin, a solvent, and a photopolymerization initiator.

The photosensitive resin composition according to the third embodiment of the present disclosure is particularly suitable as a negative resin composition for obtaining a fluororesin film or banks for organic EL (described later).

In the photosensitive resin composition according to the third embodiment of the present disclosure, any solvent that can dissolve the fluororesin may be used, and examples thereof include ketones, alcohols, polyhydric alcohols and their derivatives, ethers, esters, aromatic solvents, and fluorine solvents. These may be used alone or in combination of two or more thereof.

Specific examples of the ketones include acetone, methyl ethyl ketone, cyclopentanone, cyclohexanone, methyl isoamyl ketone, 2-heptanone cyclopentanone, methyl isobutyl ketone, methyl isopentyl ketone, and 2-heptanone.

Specific examples of the alcohols include isopropanol, butanol, isobutanol, n-pentanol, isopentanol, tert-pentanol, 4-methyl-2-pentanol, 3-methyl-3-pentanol, 2,3-dimethyl-2-pentanol, n-hexanol, n-heptanol, 2-heptanol, n-octanol, n-decanol, s-amyl alcohol, t-amyl alcohol, isoamyl alcohol, 2-ethyl-1-butanol, lauryl alcohol, hexyl decanol, and oleyl alcohol.

Specific examples of the polyhydric alcohols and their derivatives include ethylene glycol, ethylene glycol monoacetate, ethylene glycol dimethyl ether, diethylene glycol, diethylene glycol dimethyl ether, diethylene glycol monoacetate, propylene glycol, propylene glycol monoacetate, propylene glycol monomethyl ether (PGME), propylene glycol monoethyl ether, propylene glycol monopropyl ether, propylene glycol monobutyl ether, propylene glycol monomethyl ether acetate (PGMEA), and monomethyl ether, monoethyl ether, monopropyl ether, monobutyl ether, and monophenyl ether of dipropylene glycol or dipropylene glycol monoacetate.

Specific examples of the ethers include diethyl ether, diisopropyl ether, tetrahydrofuran, dioxane, and anisole.

Specific examples of the esters include methyl lactate, ethyl lactate (EL), methyl acetate, ethyl acetate, butyl acetate, methyl pyruvate, ethyl pyruvate, methyl methoxypropionate, ethyl ethoxypropionate, and γ-butyrolactone.

Examples of the aromatic solvents include xylene and toluene.

Examples of the fluorine solvents include chlorofluorocarbons, hydrochlorofluorocarbons, perfluoro compounds, and hexafluoroisopropyl alcohol.

Other solvents such as terpene-based petroleum naphtha solvents and paraffinic solvents, which are high-boiling-point weak solvents, can also be used to improve coating properties.

Of these, preferably, the solvent is at least one selected from the group consisting of methyl ethyl ketone, cyclohexanone, methyl isoamyl ketone, 2-heptanone, ethylene glycol, ethylene glycol dimethyl ether, ethylene glycol monoacetate, diethylene glycol, diethylene glycol monoacetate, diethylene glycol dimethyl ether, propylene glycol, propylene glycol monoacetate, propylene glycol monomethyl ether (PGME), propylene glycol monomethyl ether acetate (PGMEA), dipropylene glycol, dipropylene glycol monoacetate monomethyl ether, dipropylene glycol monoacetate monoethyl ether, dipropylene glycol monoacetate monopropyl ether, dipropylene glycol monoacetate monobutyl ether, dipropylene glycol monoacetate monophenyl ether, 1,4-dioxane, methyl lactate, ethyl lactate, methyl acetate, ethyl acetate, butyl acetate, methyl methoxypropionate, ethyl ethoxypropionate, γ-butyrolactone, and hexafluoroisopropyl alcohol. More preferred are methyl ethyl ketone, propylene glycol monomethyl ether acetate (PGMEA), propylene glycol monomethyl ether (PGME), cyclohexanone, ethyl lactate, butyl acetate, and γ-butyrolactone.

The amount of the solvent in the photosensitive resin composition according to the third embodiment of the present disclosure is usually 50 mass % or more and 2000 mass % or less, preferably 100 mass % or more and 1000 mass % or less, relative to the concentration (100 mass %) of the fluororesin (when the photosensitive resin composition contains the later-described alkali-soluble resin, the concentration is the sum including the alkali-soluble resin). The thickness of the resulting resin film can be adjusted by adjusting the amount of the solvent. When the amount is in the above ranges, the resulting resin film has a thickness particularly suitable to obtain banks for organic EL.

In the photosensitive resin composition according to the third embodiment of the present disclosure, any photopolymerization initiator can be used as long as it polymerizes the monomers having a polymerizable double bond exemplified in "3-1-7. Method of producing fluororesin" by electromagnetic waves or electron beams, and any known photopolymerization initiator can be used.

The photopolymerization initiator can be a photo-radical initiator or a photoacid initiator. These may be used alone or may be used in combination with a photo-radical initiator and a photoacid initiator. Two or more photo-radical initiators or photoacid initiators may be mixed. Use of the photopolymerization initiator in combination with additives enables living polymerization in some cases. Known additives can be used.

Specifically, the photo-radical initiators can be classified into the following types, for example: the intramolecular cleavage type that cleaves the intermolecular bond by absorption of electromagnetic waves or electron beams to generate radicals; and the hydrogen extraction type that, when used in combination with a hydrogen donor such as a tertiary amine or ether, generates radicals. Either type can be used. A photo-radical initiator of a type different from those described above can also be used.

Specific examples of the photo-radical initiators include benzophenone-based, acetophenone-based, diketone-based, acylphosphine oxide-based, quinone-based, and acyloin-based photo-radical initiators.

Specific examples of the benzophenone-based photoradical initiators include benzophenone, 4-hydroxybenzophenone, 2-benzoylbenzoic acid, 4-benzoylbenzoic acid, 4,4'-bis(dimethylamino)benzophenone, and 4,4'-bis(diethylamino)benzophenone. Preferred of these are 2-benzoylbenzoic acid, 4-benzoylbenzoic acid, and 4,4'-bis(diethylamino) benzophenone.

Specific examples of the acetophenone-based photo-radical initiators include acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl-[4-(methylthio)phenyl]-2-morphorino-1-propanone, and 2-benzyl-2-dimethylamino-1-(4-morphorinophenyl)-butan-1-one. Preferred of these are p-dimethylaminoacetophenone and p-methoxyacetophenone.

Specific examples of the diketone-based photo-radical initiators include 4,4'-dimethoxybenzyl, methyl benzoylformate, and 9,10-phenanthrenequinone. Preferred of these are 4,4'-dimethoxybenzyl and methyl benzoylformate.

Specific examples of the acylphosphine oxide-based photo-radical initiators include bis(2,4,6-trimethylbenzoyl)-phenylphosphine oxide.

Specific examples of the quinone-based photo-radical initiators include anthraquinone, 2-ethylanthraquinone, camphorquinone, and 1,4-naphthoquinone. Preferred of these are camphorquinone and 1,4-naphthoquinone.

Specific examples of the acyloin-based photo-radical initiators include benzoin, benzoin methyl ether, benzoin ethyl ether, and benzoin isopropyl ether. Preferred of these are benzoin and benzoin methyl ether.

Preferred are benzophenone-based, acetophenone-based, and diketone-based photo-radical initiators. More preferred are benzophenone-based photo-radical initiators.

Examples of preferred commercially available photo-radical initiators include Irgacure 127, Irgacure 184, Irgacure 369, Irgacure 651, Irgacure 819, Irgacure 907, Irgacure 2959, Irgacure OXE-01, Darocur 1173, and Lucirin TPO (trade names) available from BASF. More preferred of these are Irgacure 651 and Irgacure 369.

Specifically, the photoacid initiator is an onium salt of a pair of cation and anion, the cation being at least one selected from the group consisting of aromatic sulfonic acid, aromatic iodonium, aromatic diazonium, aromatic ammonium, thianthrenium, thioxanthonium, and (2,4-cyclopentadien-1-yl) (1-methylethylbenzene)-iron, the anion being at least one selected from the group consisting of tetrafluoroborate, hexafluorophosphate, hexafluoroantimonate, and pentafluorophenyl borate. Particularly preferred of these are bis[4-(diphenylsulfonio)phenyl]sulfide bishexafluorophosphate, bis[4-(diphenylsulfonio)phenyl]sulfide tetrakis(pentafluorophenyl)borate, and diphenyliodonium hexafluorophosphate.

Examples of commercially available photoacid generators include CPI-100P, CPI-110P, CPI-101A, CPI-200K, and CPI-210S (trade names) available from San-Apro Ltd.; CYRACURE Photoinitiator UVI-6990, CYRACURE Photoinitiator UVI-6992, and CYRACURE Photoinitiator UVI-6976 (trade names) available from Dow Chemical Japan Limited; ADECA OPTOMER SP-150, ADECA OPTOMER SP-152, ADECA OPTOMER SP-170, ADECA OPTOMER SP-172, and ADECA OPTOMER SP-300 (trade names) available from ADEKA; CI-5102 and CI-2855 (trade names) available from Nippon Soda Co., Ltd.; SAN AID SI-60L, SAN AID SI-80L, SAN AID SI-100L, SAN AID SI-110L, SAN AID SI-180L, SAN AID SI-110, and SAN AID SI-180 (trade names) available from Sanshin Chemical Industry Co. Ltd; Esacure 1064 and Esacure 1187 (trade names) available from Lamberti; and Irgacure 250 (trade name) available from Ciba Specialty Chemicals.

The amount of the photopolymerization initiator in the photosensitive resin composition according to the third embodiment of the present disclosure is 0.1 mass % or more and 30 mass % or less, preferably 1 mass % or more and 20 mass % or less, relative to 100 mass % of the fluororesin (when the photosensitive resin composition contains the later-described alkali-soluble resin, the concentration is the sum including the alkali-soluble resin). When the amount of the photopolymerization initiator is less than 0.1 mass %, the crosslinking effect tends to be insufficient. When the amount thereof is more than 30 mass %, the resolution and sensitivity tend to be low.

Preferably, the photosensitive resin composition according to the third embodiment of the present disclosure essentially contains the fluororesin according to the third embodiment of the present disclosure, a solvent, and a photopolymerization initiator, and further contains a crosslinking agent (a) and an alkali-soluble resin (b). The photosensitive resin composition may further contain, for example, a naphthoquinonediazide group-containing compound (c), a basic compound (d), and other additives (e), if necessary.

(a) Crosslinking Agent

The crosslinking agent reacts with a repeating unit represented by the formula (3-2), whereby the resin can have a crosslinked structure. This can improve the mechanical strength of the resulting film.

A known crosslinking agent can be used. Specific examples thereof include compounds obtained by reacting an amino group-containing compound such as melamine, acetoguanamine, benzoguanamine, urea, ethylene urea, propylene urea, or glycoluril with formaldehyde or formaldehyde and a lower alcohol, and substituting a hydrogen atom of the amino group by a hydroxymethyl group or a lower alkoxymethyl group; polyfunctional epoxy compounds; polyfunctional oxetane compounds; polyfunctional isocyanate compounds; and polyfunctional acrylate compounds. Here, those that use melamine are referred to as melamine-based crosslinking agents, those that use urea are referred to as urea-based crosslinking agents, those that use alkylene urea such ethylene urea or propylene urea are referred to as alkylene urea-based crosslinking agents, and those that use glycoluril are referred to as glycoluril-based crosslinking agents. These crosslinking agents may be used alone or in combination of two or more thereof.

Preferably, the crosslinking agent is at least one selected from these crosslinking agents. Particularly preferred are glycoluril-based crosslinking agents and polyfunctional acrylate compounds.

Examples of the melamine-based crosslinking agents include hexamethoxymethyl melamine, hexaethoxymethyl melamine, hexapropoxymethyl melamine, and hexabutoxybutyl melamine. Preferred of these is hexamethoxymethyl melamine.

Examples of the urea-based crosslinking agents include bismethoxymethylurea, bisethoxymethylurea, bispropoxymethylurea, and bisbutoxymethylurea. Preferred of these is bismethoxymethylurea.

Examples of the alkylene urea-based crosslinking agents include ethylene urea-based crosslinking agents such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based crosslinking agents such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; 1,3-di(methoxymethyl)-4,5-dihydroxy-2-imidazolidinone; and 1,3-di(methoxymethyl)-4,5-dimethoxy-2-imidazolidinone.

Examples of the glycoluril-based crosslinking agents include mono-, di-, tri-, and/or tetra-hydroxymethylated glycoluril; mono-, di-, tri-, and/or tetra-methoxymethylated glycoluril; mono-, di-, tri-, and/or tetra-ethoxymethylated glycoluril; mono-, di-, tri-, and/or tetra-propoxymethylated glycoluril; and mono-, di-, tri-, and/or tetra-butoxymethylated glycoluril.

Examples of the polyfunctional acrylate compounds include polyfunctional acrylates (e.g., A-TMM-3, A-TMM-3L, A-TMM-3LM-N, A-TMPT, and AD-TMP (trade names) available from Shin-Nakamura Chemical Co., Ltd.); polyethylene glycol diacrylates (e.g., A-200, A-400, and A-600 (trade names) available from Shin-Nakamura Chemical Co., Ltd.); urethane acrylates (e.g., UA-122P, UA-4HA, UA-6HA, UA-6LPA, UA-11003H, UA-53H, UA-4200, UA-200PA, UA-33H, UA-7100, and UA-7200 (trade names) available from Shin-Nakamura Chemical Co., Ltd.); and pentaerythritol tetraacrylate.

The following are examples of preferred polyfunctional acrylate compounds.

[Chem. 119]

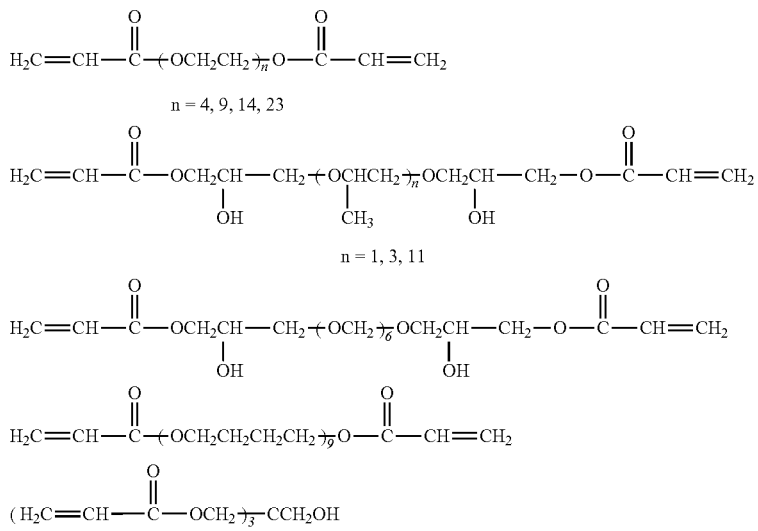

[Chem. 120]

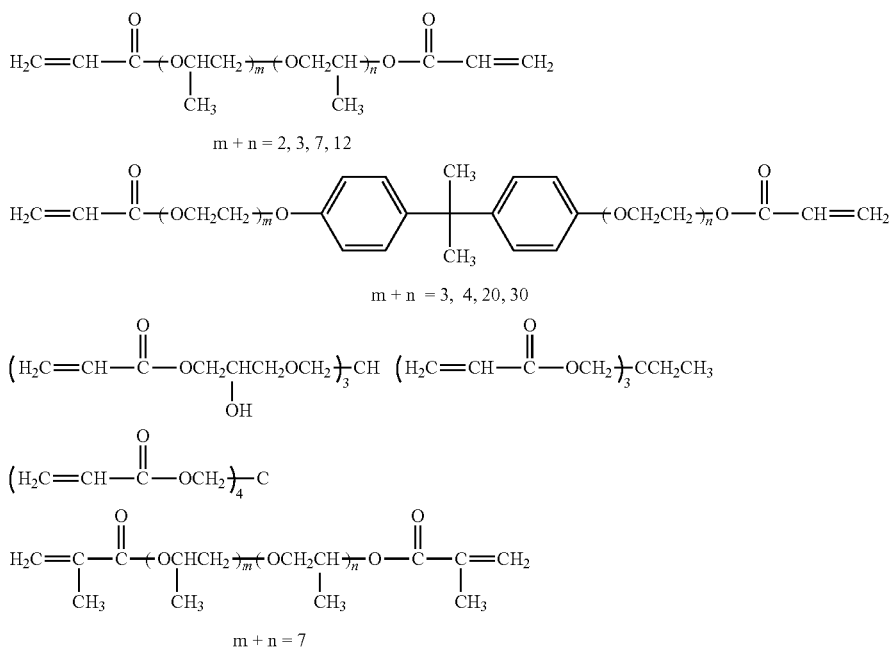

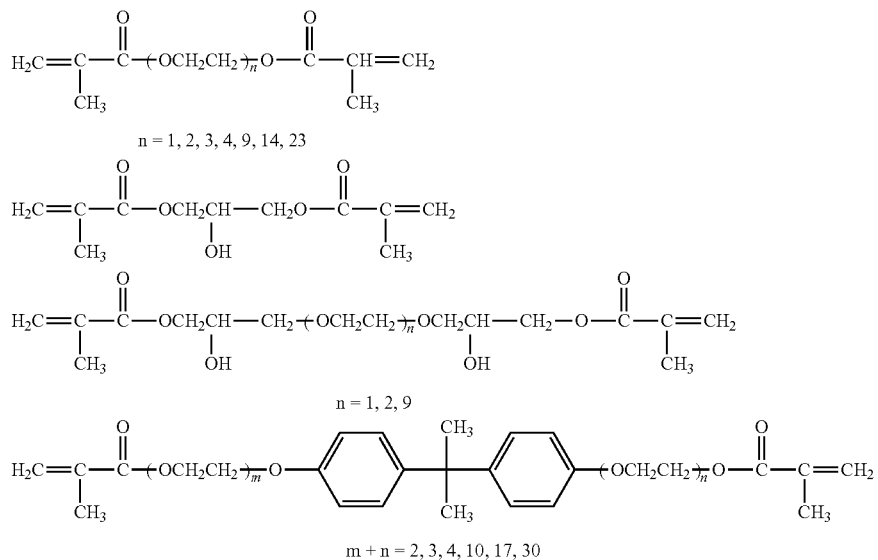

The amount of the crosslinking agent in the photosensitive resin composition according to the third embodiment of the present disclosure is 10 mass % or more and 300 mass % or less, preferably 50 mass % or more and 200 mass % or less, relative to 100 mass % of the fluororesin (when the photosensitive resin composition contains the later-described alkali-soluble resin, the concentration is the sum including the alkali-soluble resin). When the amount of the crosslinking agent is less than 10 mass %, the crosslinking effect tends to be insufficient. When the amount thereof is more than 300 mass %, the resolution and sensitivity tend to be low.

(b) Alkali-Soluble Resin

The alkali-soluble resin has an effect of improving the shape of banks obtainable from the photosensitive resin composition according to the third embodiment of the present disclosure, thus providing one preferred embodiment.

Examples of the alkali-soluble resin include alkali-soluble novolac resins.

Alkali-soluble novolac resins can be obtained by condensation of phenol with aldehyde in the presence of an acid catalyst.

Specific examples of the phenol include phenol, o-cresol, m-cresol, p-cresol, 2,3-dimethylphenol, 2,4-dimethylphenol, 2,5-dimethylphenol, 3,4-dimethylphenol, 3,5-dimethylphenol, 2,3,5-trimethylphenol, 3,4,5-trimethylphenol, resorcinol, 2-methylresorcinol, 4-ethylresorcinol, hydroquinone, methylhydroquinone, catechol, 4-methyl-catechol, pyrogallol, phloroglucinol, thymol, and isothymol. These phenols may be used alone or in combination of two or more thereof.

Specific examples of the aldehyde include formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, nitrobenzaldehyde, furfural, glyoxal, glutaraldehyde, terephthalaldehyde, and isophthalaldehyde.

Specific examples of the acid catalyst include hydrochloric acid, nitric acid, sulfuric acid, phosphoric acid, phosphorous acid, formic acid, oxalic acid, acetic acid, methanesulfonic acid, diethyl sulfate, and p-toluenesulfonic acid. These acid catalysts may be used alone or in combination of two or more thereof.

Other examples of the alkali-soluble resin include acid-modified epoxy acrylic resins. Examples of commercially available acid-modified epoxy acrylic resins include CCR-1218H, CCR-1159H, CCR-1222H, CCR-1291H, CCR-1235, PCR-1050, TCR-1335H, UXE-3024, ZAR-1035, ZAR-2001H, ZFR-1185, and ZCR-1569H (trade names) available from Nippon Kayaku Co., Ltd.

The weight average molecular weight of the alkali-soluble resin is preferably 1000 to 50000 in terms of developability and resolution of the photosensitive resin composition.

The amount of the alkali-soluble resin in the photosensitive resin composition according to the third embodiment of the present disclosure is 500 mass % or more and 10000 mass % or less, preferably 1000 mass % or more and 7000 mass % or less, relative to 100 mass % of the fluororesin. When the amount of the alkali-soluble resin is more than 10000 mass %, the fluororesin according to the third embodiment of the present disclosure tends to have insufficient ink repellency after UV-ozone treatment or oxygen plasma treatment.

(c) Naphthoquinonediazide Group-Containing Compound

Any naphthoquinonediazide group-containing compound can be used, and one commonly used as a photosensitive component of a resist composition for i-rays can be used. The naphthoquinonediazide group-containing compound has an effect of improving the shape of banks obtainable from the photosensitive resin composition according to the third embodiment of the present disclosure, thus providing one preferred embodiment.

Specific examples of the naphthoquinonediazide group-containing compounds include a naphthoquinone-1,2-diazide-4-sulfonate compound, a naphthoquinone-1,2-diazide-5-sulfonate compound, a naphthoquinone-1,2-diazide-6-sulfonate compound, a naphthoquinone-1,2-diazide sulfonate compound, an orthobenzoquinonediazide sulfonate compound, and an orthoanthraquinonediazide sulfonate compound. Preferred of these are a naphthoquinone-1,2-diazide-4-sulfonate compound, a naphthoquinone-1,2-diazide-5-sulfonate compound, and a naphthoquinone-1,2-diazide-6-sulfonate compound, because they have excellent solubility. These compounds may be used alone or in combination of two or more thereof.

The amount of the naphthoquinonediazide group-containing compound in the photosensitive resin composition according to the third embodiment of the present disclosure is usually 10 mass % to 60 mass %, preferably 20 mass % to 50 mass %, relative to 100 mass % of the fluororesin (when the photosensitive resin composition contains the above-described alkali-soluble resin, the concentration is the sum including the alkali-soluble resin). When the amount thereof is more than 60 wt %, the photosensitive resin composition tends to lack sensitivity.

(d) Basic Compound

The basic compound functions to decrease the diffusion rate of an acid generated by the photoacid generator when the acid is diffused into the film according to the third embodiment of the present disclosure. The presence of the basic compound is likely to improve the shape of banks by adjusting the acid diffusion distance and increase the stability to obtain a bank shape with desired accuracy even when the banks formed are left to stand for a long time before being exposed.

Examples of the basic compound include aliphatic amines, aromatic amines, heterocyclic amines, and aliphatic polycyclic amines. Preferred of these are aliphatic amines. Specific examples thereof include secondary or tertiary aliphatic amines and alkyl alcohol amines. These basic compounds may be used alone or in combination of two or more thereof.

Examples of the aliphatic amines include alkylamines and alkyl alcohol amines each in which at least one hydrogen atom of ammonia ($NH_3$) is substituted by a C12 or lower alkyl group or a hydroxyalkyl group. Specific examples thereof include trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, tri-n-dodecylamine, dimethylamine, diethylamine, di-n-propylamine, di-n-butylamine, di-n-pentylamine, di-n-hexylamine, di-n-heptylamine, di-n-octylamine, di-n-nonylamine, di-n-decanylamine, di-n-dodecylamine, dicyclohexylamine, methylamine, ethylamine, n-propylamine, n-butylamine, n-pentylamine, n-hexylamine, n-heptylamine, n-octylamine, n-nonylamine, n-decanylamine, n-dodecylamine, diethanolamine, triethanolamine, diisopropanolamine, triisopropanolamine, di-n-octanolamine, and tri-n-octanolamine.

Preferred of these are dialkylamine, trialkylamine, and alkyl alcohol amines. More preferred are alkyl alcohol amines. Particularly preferred of these alkyl alcohol amines are triethanolamine and triisopropanolamine.

Examples of the aromatic amines and heterocyclic amines include aniline and aniline derivatives such as N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine; heterocyclic amines such as 1,5-diazabicyclo[4.3.0]non-5-en, 1,8-diazabicyclo[5.4.0]undec-7-en, 1,4-diazabicyclo[2.2.2]octane, pyridine, bipyridine, 4-dimethylaminopyridine, hexamethylenetetramine, and 4,4-dimethylimidazoline; hindered amines such as bis(1,2,2,6,6-pentamethyl-4-piperidyl)sebacate;

alcoholic nitrogen-containing compounds such as 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, and 1-[2-(2-hydroxyethoxy)ethyl]piperazine; and amines such as picoline, lutidine, pyrrole, piperidine, piperazine, indole, and hexamethylenetetramine.

The amount of the basic compound in the photosensitive resin composition according to the third embodiment of the present disclosure is usually 0.001 mass % to 2 mass %, preferably 0.01 mass % to 1 mass %, relative to 100 mass % of the fluororesin (when the photosensitive resin composition contains the above-described alkali-soluble resin, the concentration is the sum including the alkali-soluble resin). When the amount of the basic compound is less than 0.001 mass %, the effect thereof as an additive tends to be insufficient. When the amount thereof is more than 2 mass %, the resolution and sensitivity tend to be low.

(e) Other Additives

The photosensitive resin composition according to the third embodiment of the present disclosure may contain other additives if necessary. Known additives may be suitably used as the other additives, and examples thereof include various additives such as dissolution inhibitors, plasticizers, stabilizers, colorants, surfactants, thickeners, leveling agents, defoamers, compatibility agents, adhesives, and antioxidants.

Preferably, the surfactant contains any one or more of fluorine-based surfactants and silicone-based surfactants (fluorine-based surfactants, silicone-based surfactants, and surfactants containing both fluorine atoms and silicon atoms).

3-3. Fluororesin Film

The fluororesin film according to the third embodiment of the present disclosure contains a repeating unit represented by the formula (3-1) and a repeating unit represented by the formula (3-2A). Specifically, the fluororesin film according to the third embodiment of the present disclosure is obtained by curing the photosensitive resin composition described above.

[Chem. 122]

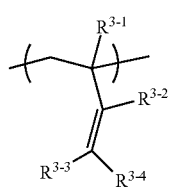

(3-1)

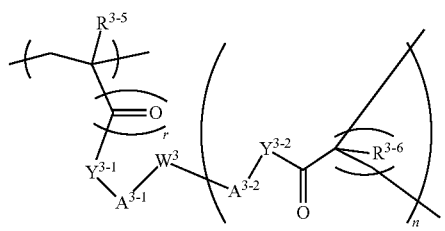

(3-2A)

In the formula (3-1), $R^{3-1}$ represents a hydrogen atom, a fluorine atom, or a methyl group; $R^{3-2}$ represents a hydrogen atom or a C1-C6 linear, C3-C6 branched, or C3-C6 cyclic alkyl group; $R^{3-3}$ and $R^{3-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{3-1}$, $R^{3-3}$, and $R^{3-4}$ are fluorine atoms or the fluoroalkyl groups.

In the formula (3-2A), $R^{3-5}$ and $R^{3-6}$ each independently represent a hydrogen atom or a methyl group; $W^3$ is a divalent linking group and represents —O—, —O—C(=O)—, —C(=O)—O—, —O—C(=O)—NH—, —C(=O)—O—C(=O)—NH—, or —C(=O)—NH—; $A^{3-1}$ and $A^{3-2}$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—CH$_3$; $Y^{3-1}$ and $Y^{3-2}$ are divalent linking groups and each independently represent —O— or —NH—; n represents an integer of 1 to 3; and r represents an integer of 0 or 1.

Examples of preferred structures of the repeating unit represented by the formula (3-1) may include those described in "3-1-1. Repeating unit represented by formula (3-1)".

The repeating unit represented by the formula (3-2A) is formed by cleavage of the polymerizable double bond of the repeating unit represented by the formula (3-2). No structural changes occur and the original structure is maintained, except for the changes in the polymerizable double bond during polymerization. Thus, in the repeating unit represented by the formula (3-2A), $R^{3-5}$, $R^{3-6}$, $W^3$, $A^{3-1}$, $A^{3-2}$, $Y^{3-1}$, $Y^{3-2}$, n, and r are the same as $R^{3-5}$, $R^{3-6}$, $W^3$, $A^{3-1}$, $A^{3-2}$, $Y^{3-1}$, $Y^{3-2}$, n, and r in the repeating unit represented by the formula (3-2), respectively. Examples of specific substituents may include those described in "3-1-2. Repeating unit represented by formula (3-2)". Examples of preferred structures of the repeating unit represented by the formula (3-2) may include the preferred structures described in "3-1-2. Repeating unit represented by formula (3-2)", except that they are formed by cleavage of the polymerizable double bond.

The fluororesin film according to the third embodiment of the present disclosure can be suitably used as a simple film not having a pattern. It can also be suitably used as a film having a pattern, i.e., banks (described later). Herein, the term "fluororesin film" refers to a film not having a pattern.

The fluororesin film according to the third embodiment of the present disclosure has excellent water repellency and oil repellency owing to its low surface free energy. For example, the fluororesin film can be used as a water- and oil-repellent agent for treating fabrics (base materials) for clothes or the like, or a sealing agent for protecting substrates (base materials) for microfabricated semiconductors. The fluororesin film can be used as a film to protect base materials in various applications.

When forming a fluororesin film, it is particularly preferred that the photosensitive resin composition essentially contains a fluororesin, a solvent, and a photopolymerization initiator and further contains a crosslinking agent. The photosensitive resin composition may contain other additives if necessary. Examples of the solvent, the photopolymerization initiator, the crosslinking agent, and the other additives may include those described above in "3-2. Photosensitive resin composition".

When pursuing properties other than the ink repellency of the fluororesin according to the third embodiment of the present disclosure after UV-ozone treatment or oxygen plasma treatment, the fluororesin is mixed (blended) with other resins, whereby characteristics of other resins can be incorporated.

The types of monomers of such "other resins" are not limited. Examples thereof include styrene compounds, acrylic acid esters, and methacrylic acid esters. These may be homopolymers of one type or copolymers of two or more types. Fluorine-free monomers are particularly preferred.

When forming a fluororesin film by mixing the fluororesin with the "other resins" as described above, the mass % of the fluororesin according to the third embodiment of the present disclosure relative to 100 mass % of the fluororesin film is usually 50 mass % to 99 mass %, more preferably 60 mass % to 99 mass %, particularly preferably 70 mass % to 99 mass %. The rest are the "other resins" or "various additives" described above. When the amount of the fluororesin according to the third embodiment of the present disclosure is less than 50 mass %, the ink repellency tends to decrease after UV-ozone treatment or oxygen plasma treatment.

When forming a fluororesin film, the concentration of the fluororesin relative to 100 mass % of the photosensitive resin composition is preferably 1 mass % or more and 30 mass % or less, more preferably 2 mass % or more and 20 mass % or less, to facilitate coating and film formation.

A technique similar to conventionally known coating methods can be appropriately used as the method of forming a film using the photosensitive resin composition according to the third embodiment of the present disclosure. A suitable method can be selected according to a coating target. For example, the fluororesin according to the third embodiment of the present disclosure can be suitably applied with an appropriate coating device such as a slit coater, die coater, gravure coater, dip coater, or spin coater. A method such as immersion coating, spray coating, or roller coating can also be used.

After a fluororesin film is applied to a substrate, preferably, the solvent contained in the photosensitive resin composition is dried and removed from the fluororesin film.

The solvent can be removed by heating the substrate coated with the fluororesin film at 80° C. or higher and 300° C. or lower. Preferably, the heating is performed until a decrease in weight of the fluororesin film is no longer observed. The heating may be performed under atmospheric pressure, increased pressure, or reduced pressure. Further, the heating may be performed in air or inert atmospheres, or may be performed under flow of a predetermined gas.

When the heating temperature is lower than 80° C., the solvent tends to remain. When the heating temperature is higher than 300° C., the fluororesin tends to decompose. More preferably, the heating temperature is 100° C. or higher and 250° C. or lower, so that the solvent can be removed without causing decomposition of the fluororesin.

The coating target may be a substrate for a microfabricated semiconductor or a fabric for clothes or the like.

Here, the fluororesin film to be formed on a base material may be formed on the entire or partial surface of the base material.

Preferably, the thickness of the resulting fluororesin film is 1 μm or more and 500 μm or less. A fluororesin film thinner than 1 μm may have low mechanical strength. A fluororesin film thicker than 500 μm tends not to be flat due to large recesses and protrusions on its surface.

3-4. Banks

The banks according to the third embodiment of the present disclosure contain a repeating unit represented by the formula (3-1) and a repeating unit represented by the formula (3-2A). Specifically, the banks according to the third embodiment of the present disclosure are obtained by curing the photosensitive resin composition described above.

When forming the banks according to the third embodiment of the present disclosure, it is particularly preferred that the photosensitive resin composition essentially contains a fluororesin, a solvent, and a photopolymerization initiator, and further contains a crosslinking agent and an alkali-soluble resin. The photosensitive resin composition may further contain, for example, a naphthoquinonediazide group-containing compound (c), a basic compound (d), and other additives (e), if necessary.

Examples of the compounds may include those described above in "3-2. Photosensitive resin composition".

A resist pattern formation method of a conventional photoresist technique can be used as a method of forming the banks according to the third embodiment of the present disclosure. The method of forming the banks is described below.

The banks can be formed by a film forming step (4-1), an exposing step (4-2), a developing step (4-3), and a UV-ozone treatment or oxygen plasma treatment step (4-4). In the film forming step (4-1), the photosensitive resin composition is applied to a substrate to form a film. In the exposing step (4-2), the substrate is irradiated with electromagnetic waves or electron beams through a photo mask to transfer a photo mask pattern to the film. In the developing step (4-3), the film is developed using a developer to form banks. In the UV-ozone treatment or oxygen plasma treatment step (4-4), the residual organic matter or the like in recesses between the banks is removed. Subsequently, a heating step (4-5) may be included if necessary.

Each step is described below with examples.

4-1. Film Forming Step

The film forming step is a step of forming a film on a substrate such as a silicon wafer by applying the photosensitive resin composition thereto by spin coating or the like and subsequently heating the silicon wafer on a hot plate to remove a solvent. The solvent is removed by heating usually at a temperature of 60° C. or higher and 200° C. or lower for 10 seconds or more and 10 minutes or less, preferably at a temperature of 80° C. or higher and 150° C. or lower for 30 seconds or more and 2 minutes or less.

The substrate may be a silicon wafer, metal, glass, ITO substrate, or the like. The substrate may include an organic or inorganic film formed thereon in advance. For example, the substrate may include an anti-reflective film and/or a multilayer resist underlayer, and such a film and/or underlayer may have a pattern formed thereon. The substrate may be pre-washed. For example, the substrate may be washed with ultrapure water, acetone, an alcohol (methanol, ethanol, or isopropyl alcohol), or the like.

4-2. Exposing Step

The exposing step is a step of setting a desired photo mask in an exposure device, irradiating the film with electromagnetic waves or electron beams through the photo mask, and then heating the film on a hot plate.

The wavelength of electromagnetic waves or electron beams used for exposure is preferably 100 to 600 nm, more preferably 300 to 500 nm, and those containing i-rays (365 nm), h-rays (405 nm), and g-rays (436 nm) are particularly preferred. Light with a wavelength of 330 nm or less may be cut off if necessary.

Examples of light sources include KrF excimer laser light (wavelength: 248 nm), ArF excimer laser light (wavelength: 193 nm), and F2 excimer laser light (wavelength: 157 nm).

The amount of electromagnetic wave or electron beam exposure is 1 mJ/cm$^2$ or more and 200 mJ/cm$^2$ or less, preferably 10 mJ/cm$^2$ or more and 100 mJ/cm$^2$ or less.

The heating after exposure is performed on a hot plate usually at a temperature of 60° C. or higher and 150° C. or lower for 10 seconds or more and 5 minutes or less, preferably at a temperature of 80° C. or higher and 130° C. or lower for 30 seconds or more and 3 minutes or less.

4-3. Developing Step

The developing step is a step of forming banks by dissolving, in a developer, the exposed or non-exposed portions of the film obtained in the exposing step described above.

The developer may be, for example, an alkaline aqueous solution such as a tetramethylammonium hydroxide (TMAH) aqueous solution or a tetrabutylammonium hydroxide (TBAH) aqueous solution, or an organic solvent such as propylene glycol monomethyl ether acetate (PGMEA) or butyl acetate.

The concentration of the tetramethylammonium hydroxide (TMAH) aqueous solution is usually 0.1 mass % or more and 5 mass % or less, preferably 2 mass % or more and 3 mass % or less.

Any known development method, such as dipping, paddling, or spraying, can be used.

The development time (contact time of the developer with the film) is usually 10 seconds or more and 3 minutes or less, preferably 30 seconds or more and 2 minutes or less.

After development, a step of washing the formed banks film with deionized water or the like may be included if necessary. The washing method and washing time are as described above for the development method using a developer and development time.

The film after development is subjected to a heating step for crosslinking and removing low-boiling fractions. The heating is performed on a hot plate usually at a temperature of 60° C. or higher and 300° C. or lower for 10 seconds or more and 120 minutes or less, preferably at a temperature of 140° C. or higher and 250° C. or lower for 10 minutes or more and 90 minutes or less.

4-4. UV-Ozone Treatment or Oxygen Plasma Treatment Step

The UV-ozone treatment or oxygen plasma treatment step is a step of irradiating the entire surface of the substrate having the banks formed thereon with UV-ozone or oxygen plasma to remove residual organic matter or the like in the recesses between the banks.

The UV-ozone treatment time is usually 10 seconds or more and 30 minutes or less, preferably 1 minute or more and 15 minutes or less.

The oxygen plasma treatment time is usually 10 seconds or more and 30 minutes or less, preferably 1 minute or more and 15 minutes or less.

When the UV-ozone treatment or oxygen plasma treatment time is less than 10 seconds, removal of residual organic matter tends to be incomplete. When the UV-ozone treatment or oxygen plasma treatment time is more than 30 minutes, the thickness of the patterned film tends to decrease.

4-5. Heating Step

After the UV-ozone treatment or oxygen plasma treatment step, a heating step of heating the resulting banks may be performed if necessary. This step can improve the liquid repellency of the upper surfaces of the banks according to the third embodiment of the present disclosure.

The heating is performed on a hot plate usually at a temperature of 60° C. or higher and 300° C. or lower for 10 seconds or more and 30120 minutes or less, preferably at a temperature of 140° C. or higher and 250° C. or lower for 10 minutes or more and 1590 minutes or less.

Preferably, the heat treatment step is performed when the banks according to the third embodiment of the present disclosure contain a repeating unit represented by the formula (3-4) wherein $B^3$ is a carboxy group. Such banks are one embodiment especially capable of improving the ink repellency by the heat treatment step.

3-5. Display Device

The display element according to the third embodiment of the present disclosure includes the banks.

Examples of the display element according to the third embodiment of the present disclosure include organic electroluminescence displays (hereinafter organic EL displays), micro-LED displays, and quantum dot displays.

Examples According to Third Embodiment

The third embodiment of the present disclosure is described in detail below with reference to examples but the present disclosure is not limited to these examples.

1. Synthesis of Monomers

[Synthesis Example 3-1] Synthesis of 1,1-bistrifluoromethylbutadiene (BTFBE)

Synthesis of 1,1-bistrifluoromethylbutadiene (BTFBE) A 1000-ml glass flask equipped with a stirrer was charged with concentrated sulfuric acid (400 g) and heated to 100° C. Then, 1,1,1-trifluoro-2-trifluoromethyl-4-penten-2-ol (300 g) was gradually dropped thereto over one hour. After dropping, the mixture was stirred at 100° C. for 60 minutes. No residual raw materials were detected by $^{19}$F-NMR analysis of the reaction solution. Then, a fraction at 68° C. to 70° C. was collected by atmospheric distillation from the reaction solution, whereby 1,1-bistrifluoromethylbutadiene (hereinafter described as BTFBE) was obtained (yield: 58%).

[Chem. 123]

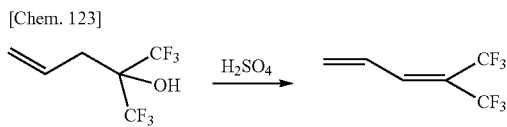

<Results of NMR Analysis>

$^1$H-NMR (solvent: deuterated chloroform; standard substance: TMS); δ (ppm) 5.95 (1H, dd) 6.05 (1H, dd), 6.85 (1H, m), 7.04 (1H, m) $^{19}$F-NMR (solvent: deuterated chloroform; standard substance: $C_6D_6$); δ (ppm) −65.3 (3F, m), −58.4 (3F, m)

[Synthesis Example 3-2] Synthesis of 4-hydroxystyrene (p-HO-St)

(The synthesis was performed with reference to Examples in JP 2016-98181 A.)

A 1000-ml glass flask equipped with a stirrer was charged at room temperature (about 20° C.) with 4-acetoxystyrene (a product of Tokyo Chemical Industry Co., Ltd., hereinafter described as "p-AcO-St") (100 g) and methanol (300 g), which were mixed therein, and 1,3,5-trihydroxybenzene (0.50 g; equivalent to 0.5 mass % of p-AcO-St) as a polymerization inhibitor was added to the mixture. Then, after the solution was cooled to 0° C. in an ice bath, a sodium hydroxide aqueous solution having a concentration of 12 mass % (corresponding to 1.0 equivalent of p-AcO-St) was gradually dropped over 40 minutes, followed by stirring at 0° C. for 30 minutes. No residual raw materials were detected by $^1$H-NMR analysis of the reaction solution. Then, a hydrochloric acid aqueous solution having a concentration of 18 mass % (corresponding to 0.8 equivalents of p-AcO-St) was dropped over 30 minutes, followed by stirring for 30 minutes. The pH of the solution was measured to be 6. The resulting reaction solution was subjected to extraction with methyl-t-butylether (360 g) at room temperature (about 20° C.), followed by washing twice with purified water (330 g). To the resulting organic layer was added 1,3,5-trihydroxybenzene in an amount equivalent to 1 mass % of 4-hydroxystyrene. Subsequently, 4-hydroxystyrene was concentrated to 72 mass %, and added to n-octane (a poor solvent) cooled to 0° C. Then, the solution was placed in an ice bath and stirred for one hour to precipitate crystals of 4-hydroxystyrene. The crystals were filtered and further washed with n-octane. Then, the crystals were vacuum dried at 25° C. Thus, white crystals of 4-hydroxystyrene (hereinafter described as p-HO-St) were obtained (yield: 66%).

[Chem. 124]

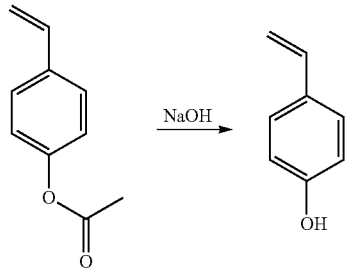

[Synthesis Example 3-3] Synthesis of 1-glycerol Acrylate (GLMA)

A 1-L glass four-neck flask equipped with a reflux condenser, a dropping funnel, a thermometer, an air inlet tube, and a stirrer was provided. A 1 mass % sulfuric acid aqueous solution was added to the reaction vessel and stirred at 80° C. for two hours to wash the inside of the reaction vessel before reaction. After the sulfuric acid aqueous solution was discharged, the reaction vessel was charged with water (140 g (7.80 mol)) and 98 mass % sulfuric acid (76.5 mg (0.78 mmol)), and heated in an oil bath with stirring. Subsequently, glycidyl acrylate (100 g (0.78 mol)) premixed with hydroquinone (0.05 g) was dropped into the reaction vessel over five hours for reaction while air was introduced thereinto. The reaction was further continued for two hours with the temperature maintained at 80° C. to 85° C. After completion of the reaction, the acid value of the reaction solution was measured, and a 2% sodium hydroxide aqueous solution was added in an amount equivalent to the acid value for neutralization. Further, hydroquinone (0.05 g) was added to the reaction vessel, and the reaction vessel was heated to 70° C. in the oil bath while air was blown thereinto, followed by dehydration under pressure (about 4.0 to 13.3 kPa). Samples were taken at non-specific time points during the reaction and dehydration. Examination for the presence of a polymer in the sample solutions found no polymers. After completion of the dehydration, filtration was performed, whereby 1-glycerol acrylate (hereinafter described as GLMA) with a purity of 96.2% was obtained (103 g; yield: 90.3%). No polymers were found in the resulting GLMA.

[Chem. 125]

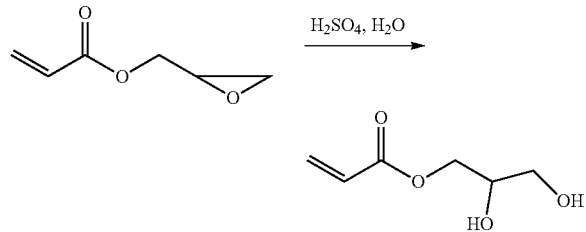

2. Production of Fluororesin (First Step: Polymerization)
[Measurement of Molar Ratio of Repeating Units] NMR
The molar ratio of the repeating units of the polymer was determined from the measurements of $^1$H-NMR, $^{19}$F-NMR, or $^{13}$C-NMR.
[Measurement of Polymer Molecular Weight] GPC
The weight average molecular weight Mw and the molecular weight dispersity (Mw/Mn: ratio of the weight average molecular weight Mw to the number average molecular weight Mn) of the polymer were measured by a high-speed gel permeation chromatograph (hereinafter sometimes referred to as GPC; model: HLC-8320 GPC available from Tosoh Corporation) with an ALPHA-M column and an ALPHA-2500 column (both available from Tosoh Corporation) connected in series, using tetrahydrofuran (THF) as a developing solvent. A refractive index difference detector was used.
2-1. Polymerization of Fluororesin Precursors
[Synthesis of Fluororesin Precursor 3-1]
A 300-ml glass flask equipped with a stirrer was charged at room temperature (about 20° C.) with BTFBE obtained in Synthesis Example 3-1 (9.5 g (0.05 mol)), 2-hydroxyethyl vinyl ether (a product of Tokyo Chemical Industry Co., Ltd., hereinafter described as HEVE) (8.8 g (0.10 mol)), 2-(perfluorohexyl)ethyl methacrylate (a product of Tokyo Chemical Industry Co., Ltd., hereinafter described as MA-C6F) (43.2 g (0.1 mol)), p-HO-St obtained in Synthesis Example 3-2 (9.0 g (0.75 mol)), and MEK (70 g). Then, 2,2'-azobis(2-methylbutyronitrile) (a product of Tokyo Chemical Industry Co., Ltd., hereinafter described as AIBN) (1.6 g (0.005 mol)) was added thereto, followed by degassing with stirring. Subsequently, the flask was purged with nitrogen gas, and the temperature inside the flask was raised to 75° C. for reaction for six hours. n-Heptane (350 g) was dropped into the reaction system, whereby a transparent viscous substance was precipitated. This viscous substance was isolated by decantation. Vacuum drying was performed at 60° C. Thus, a fluororesin precursor 3-1 as a transparent viscous substance was obtained (60 g; yield: 85%).
<Results of NMR Measurement>
The ratio (in mol %) of the repeating units of the fluororesin precursor 3-1 was as follows: BTFBE repeating unit:HEVE repeating unit:MA-C6F repeating unit:p-HO-St repeating unit=16:26:33:25.

[Chem. 126]

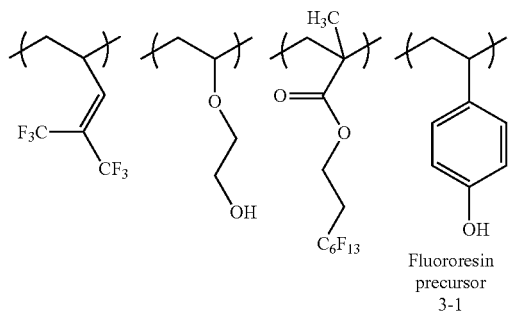

<Results of GPC Measurement>
Mw=4100, Mw/Mn=1.3
[Synthesis of Fluororesin Precursor 3-2]
The same procedure as in the synthesis of the fluororesin precursor 3-1 was performed, except that p-HO-St was replaced by vinyl benzoic acid (a product of Tokyo Chemical Industry Co., Ltd., hereinafter described as VBA). Thus, a fluororesin precursor 3-2 containing the following repeating units was obtained (yield: 87%).
<Results of NMR Measurement>
The ratio (in mol %) of the repeating units of the fluororesin precursor 3-2 was as follows: BTFBE repeating unit:HEVE repeating unit:MA-C6F repeating unit:VBA repeating unit=17:25:33:25.

[Chem. 127]

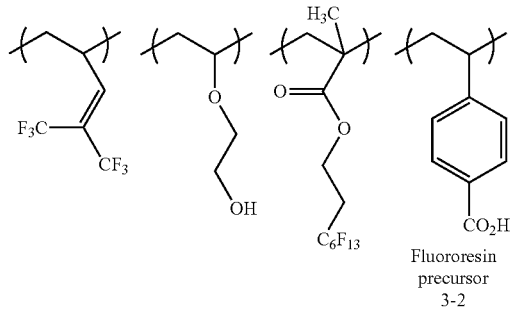

<Results of GPC Measurement>
Mw=3900, Mw/Mn=1.3
[Synthesis of Fluororesin Precursor 3-3]
The same procedure as in the synthesis of the fluororesin precursor 3-1 was performed, except that HEVE was replaced by 2-hydroxyethyl methacrylate (a product of Tokyo Chemical Industry Co., Ltd., hereinafter described as HEMA). Thus, a fluororesin precursor 3-3 containing the following repeating units was obtained (yield: 90%).
<Results of NMR Measurement>
The ratio (in mol %) of the repeating units of the fluororesin precursor 3-3 was as follows: BTFBE repeating unit:HEMA repeating unit:MA-C6F repeating unit:HO-St repeating unit=20:28:30:22.

[Chem. 128]

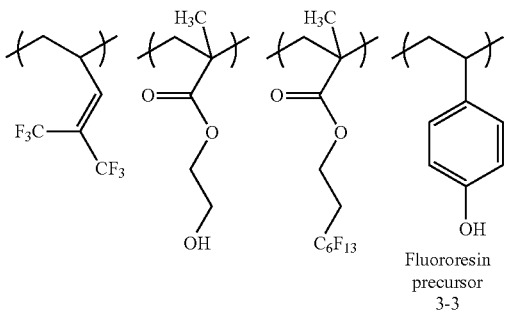

Fluororesin precursor 3-3

<Results of GPC Measurement>
Mw=6500, Mw/Mn=1.3

[Synthesis of Fluororesin Precursor 3-4]

The same procedure as in the synthesis of the fluororesin precursor 3-2 was performed, except that HEVE was replaced by 2-hydroxyethyl methacrylate (a product of Tokyo Chemical Industry Co., Ltd., hereinafter described as HEMA). Thus, a fluororesin precursor 3-4 containing the following repeating units was obtained (yield: 91%).

<Results of NMR Measurement>

The ratio (in mol %) of the repeating units of the fluororesin precursor 3-4 was as follows: BTFBE repeating unit:HEMA repeating unit:MA-C6F repeating unit:VBA repeating unit=19:27:31:23.

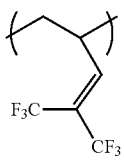

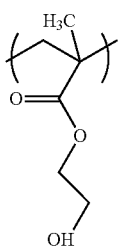

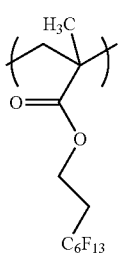

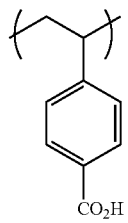

Fluororesin precursor 3-4

<Results of GPC Measurement>
Mw=6800, Mw/Mn=1.3

[Synthesis of Fluororesin Precursor 3-5]

The same procedure as in the synthesis of the fluororesin precursor 3-3 was performed, except that p-HO-St was replaced by 1,1,1,3,3,3-hexafluoro-2-(4-vinylphenyl)propan-2-ol (a product of Central Glass Co., Ltd., hereinafter described as 4-HFA-St). Thus, a fluororesin precursor 3-5 containing the following repeating units was obtained (yield: 87%).

<Results of NMR Measurement>

The ratio (in mol %) of the repeating units of the fluororesin precursor 3-5 was as follows: BTFBE repeating unit:HEMA repeating unit:MA-C6F repeating unit:4-HFA-St repeating unit=16:26:33:25.

[Chem. 130]

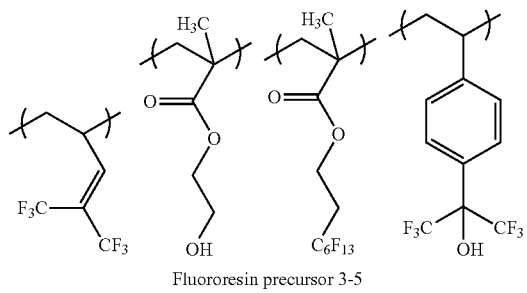

Fluororesin precursor 3-5

<Results of GPC Measurement>
Mw=7100, Mw/Mn=1.3

[Synthesis of Fluororesin Precursor 3-6]

The same procedure as in the synthesis of the fluororesin precursor 3-3 was performed, except that p-HO-St was replaced by p-acetoxystyrene (a product of Tokyo Chemical Industry Co., Ltd., hereinafter described as p-AcO-St). Thus, a fluororesin precursor 3-6 containing the following repeating units was obtained (yield: 88%).

<Results of NMR Measurement>

The ratio (in mol %) of the repeating units of the fluororesin precursor 3-6 was as follows: BTFBE repeating unit:HEMA repeating unit:MA-C6F repeating unit:p-AcO-St repeating unit=16:32:30:22.

[Chem. 131]

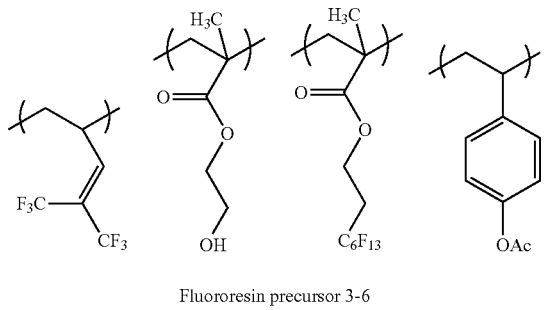

Fluororesin precursor 3-6

<Results of GPC Measurement>
Mw=7200, Mw/Mn=1.3

[Synthesis of Fluororesin Precursor 3-7]

A 300-ml glass flask equipped with a stirrer was charged at room temperature (about 20° C.) with BTFBE obtained in Synthesis Example 3-1 (9.5 g (0.05 mol)), HEMA (13.0 g (0.10 mol)), MA-C6F (43.2 g (0.1 mol)), methacrylic acid (8.6 g (0.10 mol)), a product of Tokyo Chemical Industry Co., Ltd., hereinafter described as MAA), styrene (7.8 g (0.75 mol)), a product of Tokyo Chemical Industry Co., Ltd., hereinafter described as St), and MEK (82 g). Then, AIBN (1.6 g (0.005 mol) was added thereto, followed by degassing with stirring. Subsequently, the flask was purged with nitrogen gas, and the temperature inside the flask was raised to 75° C. for reaction for six hours. n-Heptane (350 g) was dropped into the reaction system, whereby a transparent viscous substance was precipitated. This viscous substance was isolated by decantation. Vacuum drying was performed at 60° C. Thus, a fluororesin precursor 3-7 as a transparent viscous substance was obtained (73 g; yield: 89%).

<Results of NMR Measurement>

The ratio (in mol %) of the repeating units of the fluororesin precursor 3-7 was as follows: BTFBE repeating unit:HEMA repeating unit:MA-C6F repeating unit:MAA repeating unit:St repeating unit=15:25:30:10:20.

[Chem. 132]

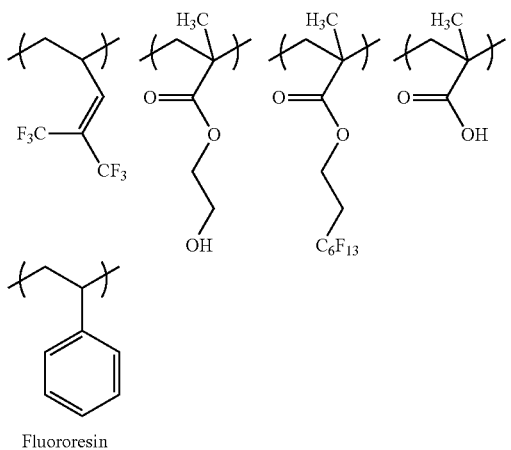

Fluororesin precursor 3-7

<Results of GPC Measurement>
Mw=7200, Mw/Mn=1.3

[Synthesis of Fluororesin Precursor 3-8]

The procedure as in the synthesis of the fluororesin precursor 3-7 was performed, except that methacrylic acid was replaced by acrylic acid (a product of Tokyo Chemical Industry Co., Ltd., hereinafter described as AA). Thus, a fluororesin precursor 3-8 containing the following repeating units was obtained (yield: 89%).

<Results of NMR Measurement>

The ratio (in mol %) of the repeating units of the fluororesin precursor 3-8 was as follows: BTFBE repeating unit:HEMA repeating unit:MA-C6F repeating unit:AA repeating unit:St repeating unit=16:24:31:9:20.

[Chem. 133]

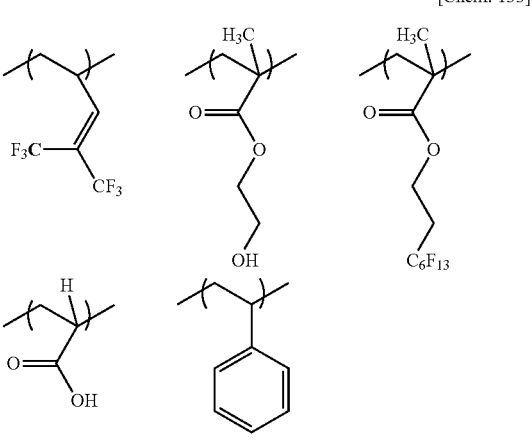

Fluororesin precursor 3-8

<Results of GPC Measurement>
Mw=6800, Mw/Mn=1.4

[Synthesis of Fluororesin Precursor 3-9]

A 300-ml glass flask equipped with a stirrer was charged at room temperature (about 20° C.) with BTFBE obtained in Synthesis Example 3-1 (9.5 g (0.05 mol)), GLMA obtained in Synthesis Example 3-3 (14.6 g (0.10 mol)), 2-(perfluorohexyl)ethyl methacrylate (a product of Tokyo Chemical Industry Co., Ltd., hereinafter described as MA-C6F) (43.2 g (0.10 mol)), p-HO-St obtained in Synthesis Example 3-2 (9.0 g (0.75 mol)), and MEK (70 g). Then, 2,2'-azobis(2-methylbutyronitrile) (a product of Tokyo Chemical Industry Co., Ltd., hereinafter descried as AIBN) (1.6 g (0.005 mol)) was added thereto, followed by degassing with stirring. Subsequently, the flask was purged with nitrogen gas, and the temperature inside the flask was raised to 75° C. for reaction for six hours. n-Heptane (350 g) was dropped into the reaction system, whereby a transparent viscous substance was precipitated. This viscous substance was isolated by decantation. Vacuum drying was performed at 60° C. Thus, a fluororesin precursor 3-9 as a transparent viscous substance was obtained (61 g; yield: 80%).

<Results of NMR Measurement>

The ratio (in mol %) of the repeating units of the fluororesin precursor 3-9 was as follows: BTFBE repeating unit:GLMA repeating unit:MA-C6F repeating unit:p-HO-St repeating unit=16:26:33:25.

[Chem. 134]

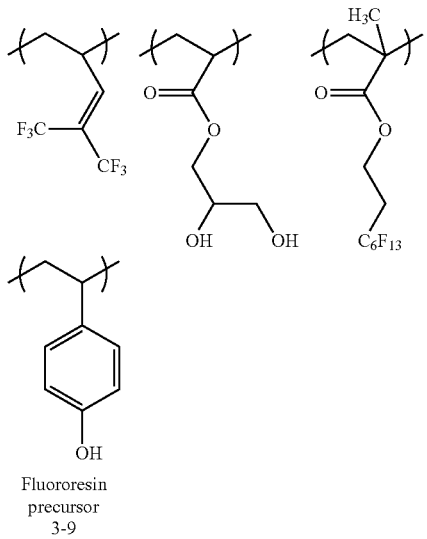

Fluororesin precursor 3-9

<Results of GPC Measurement>
Mw=5600, Mw/Mn=1.3

[Synthesis of Fluororesin Precursor 3-10]

The same procedure as in the synthesis of the fluororesin precursor 3-1 was performed, except that p-HO-St was replaced by vinyl benzoic acid (a product of Tokyo Chemical Industry Co., Ltd., hereinafter described as VBA). Thus, a fluororesin precursor 3-10 containing the following repeating units was obtained (yield: 90%).

<Results of NMR Measurement>

The ratio (in mol %) of the repeating units of the fluororesin precursor 3-10 was as follows: BTFBE repeating unit:GLMA repeating unit:MA-C6F repeating unit:VBA repeating unit=17:25:33:25.

[Chem. 135]

Fluororesin precursor 3-10

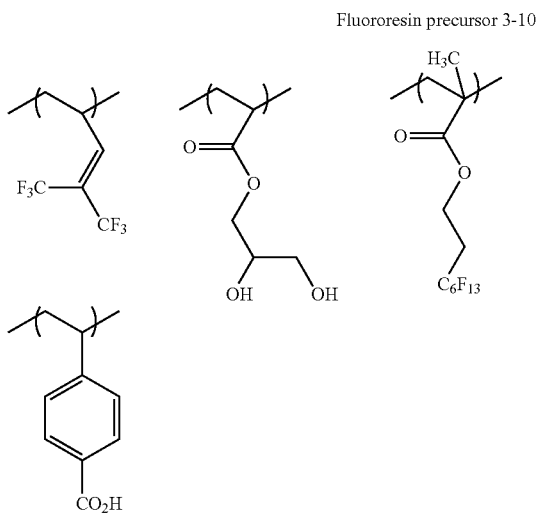

<Results of GPC Measurement>
Mw=5400, Mw/Mn=1.3

[Synthesis of Fluororesin Precursor 3-11]

The same procedure as in the synthesis of the fluororesin precursor 3-9 was performed except that GLMA was replaced by 1-glycerol methacrylate (a product of NOF Corporation, hereinafter GLMM). Thus, a fluororesin precursor 3-11 containing the following repeating units was obtained (yield: 92%).

<Results of NMR Measurement>

The ratio (in mol %) of the repeating units of the fluororesin precursor 3-11 was as follows: BTFBE repeating unit:GLMM repeating unit:MA-C6F repeating unit:HO-St repeating unit=20:28:30:22.

[Chem. 136]

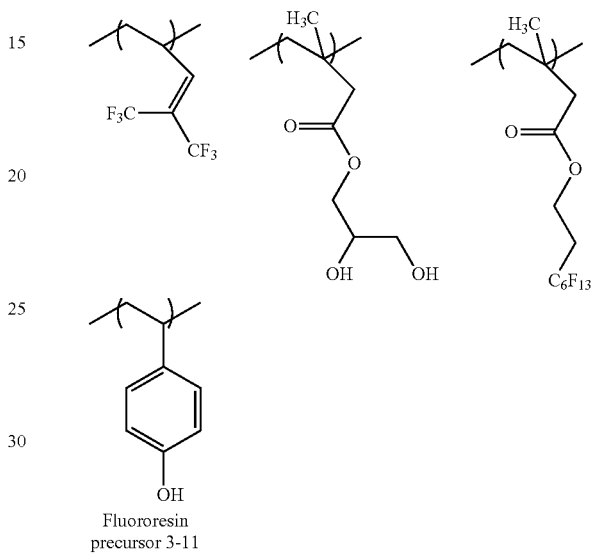

Fluororesin precursor 3-11

<Results of GPC Measurement>
Mw=7400, Mw/Mn=1.3

[Synthesis of Fluororesin Precursor 3-12]

The same procedure as in the synthesis of the fluororesin precursor 3-10 was performed, except that GLMA was replaced by GLMM. Thus, a fluororesin precursor 3-12 containing the following repeating units was obtained (yield: 91%).

<Results of NMR Measurement>

The ratio (in mol %) of the repeating units of the fluororesin precursor 3-12 was as follows: BTFBE repeating unit:GLMM repeating unit:MA-C6F repeating unit:VBA repeating unit=19:27:31:23.

[Chem. 137]

Fluororesin precursur 3-12

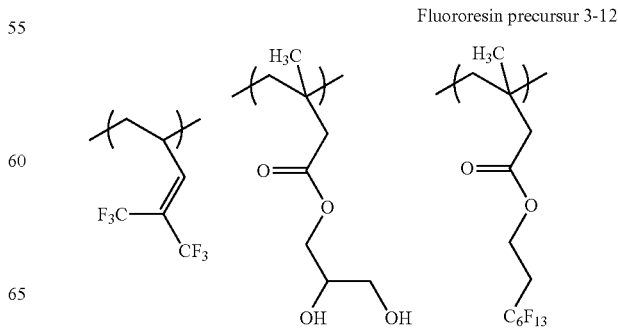

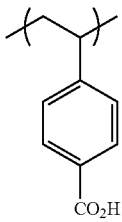

<Results of GPC Measurement>
Mw=7700, Mw/Mn=1.3

[Synthesis of Fluororesin Precursor 3-13]

The same procedure as in the synthesis of the fluororesin precursor 3-11 was performed, except that p-HO-St was replaced by 1,1,1,3,3,3-hexafluoro-2-(4-vinylphenyl)propan-2-ol (a product of Central Glass Co., Ltd., hereinafter described as 4-HFA-St). Thus, a fluororesin precursor 3-13 containing the following repeating units was obtained (yield: 85%).

<Results of NMR Measurement>

The ratio (in mol %) of the repeating units of the fluororesin precursor 3-13 was as follows: BTFBE repeating unit:GLMM repeating unit:MA-C6F repeating unit:4-HFA-St repeating unit=16:26:33:25.

[Chem. 138]

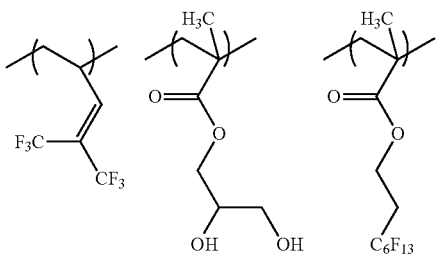

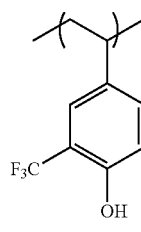

Fluororesin precursor 3-12

<Results of GPC Measurement>
Mw=7900, Mw/Mn=1.3

[Synthesis of Fluororesin Precursor 3-14]

The same procedure as in the synthesis of the fluororesin precursor 3-11 was performed, except that p-HO-St was replaced by p-acetoxystyrene (a product of Tokyo Chemical Industry Co., Ltd., hereinafter described as p-AcO-St). Thus, a fluororesin precursor 3-14 containing the following repeating units was obtained (yield: 89%).

<Results of NMR Measurement>

The ratio (in mol %) of the repeating units of the fluororesin precursor 3-14 was as follows: BTFBE repeating unit:GLMM repeating unit:MA-C6F repeating unit:p-AcO-St repeating unit=16:32:30:22.

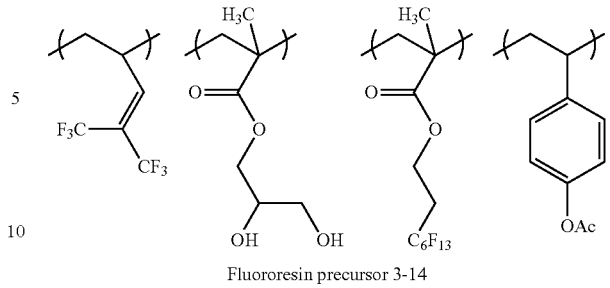

Fluororesin precursor 3-14

<Results of GPC Measurement>
Mw=8200, Mw/Mn=1.3

[Synthesis of Fluororesin Precursor 3-15]

A 300-ml glass flask equipped with a stirrer was charged at room temperature (about 20° C.) with BTFBE obtained in Synthesis Example 3-1 (9.5 g (0.05 mol)), GLMM (16.0 g (0.10 mol)), MA-C6F (43.2 g (0.1 mol)), methacrylic acid (8.6 g (0.10 mol)), a product of Tokyo Chemical Industry Co., Ltd., hereinafter described as MAA), styrene (7.8 g (0.75 mol)), a product of Tokyo Chemical Industry Co., Ltd., hereinafter described as St), and MEK (82 g). Then, AIBN (1.6 g (0.005 mol)) was added thereto, followed by degassing with stirring. Subsequently, the flask was purged with nitrogen gas, and the temperature inside the flask was raised to 75° C. for reaction for six hours. n-Heptane (350 g) was dropped into the reaction system, whereby a transparent viscous substance was precipitated. This viscous substance was isolated by decantation. Vacuum drying was performed at 60° C. Thus, a fluororesin precursor 3-15 as a transparent viscous substance was obtained (75 g; yield: 88%).

<Results of NMR Measurement>

The ratio (in mol %) of the repeating units of the fluororesin precursor 3-15 was as follows: BTFBE repeating unit:GLMM repeating unit:MA-C6F repeating unit:MAA repeating unit:St repeating unit=15:25:30:10:20.

[Chem. 140]

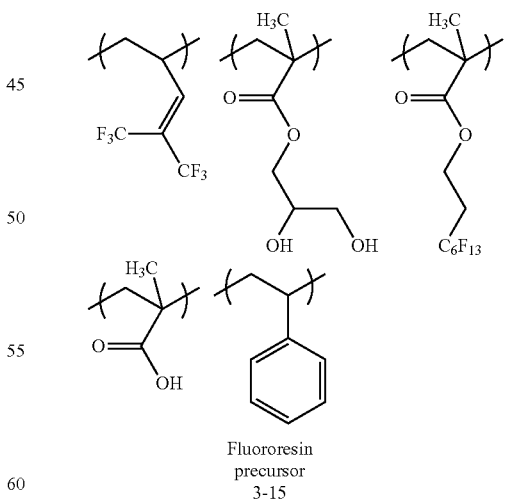

Fluororesin precursor 3-15

<Results of GPC Measurement>
Mw=8000, Mw/Mn=1.3

[Synthesis of Fluororesin Precursor 3-16]

The same procedure as in the synthesis of the fluororesin precursor 3-11 was performed, except that p-HO-St was replaced by St. Thus, a fluororesin precursor 3-16 containing the following repeating units was obtained (yield: 89%).
<Results of NMR Measurement>

The ratio (in mol %) of the repeating units of the fluororesin precursor 3-16 was as follows: BTFBE repeating unit:GLMM repeating unit:MA-C6F repeating unit:St repeating unit=16:24:31:29.

[Chem. 141]

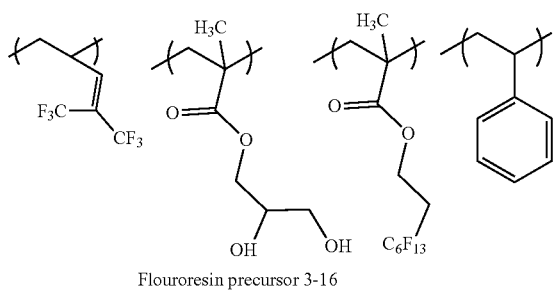

Flouroresin precursor 3-16

<Results of GPC Measurement>
Mw=7600, Mw/Mn=1.4

2-2. Synthesis of Comparative Fluororesin Precursor

Comparative Polymerization Example 3-1

A 300-ml glass flask equipped with a stirrer was charged at room temperature (about 20° C.) with MA-C6F (43.2 g (0.1 mol)), hexafluoroisopropyl methacrylate (Central Glass Co., Ltd., hereinafter described as HFIP-M) (23.6 g (0.1 mol)), MAA (17.32 g (0.2 mol)), and MEK (84 g). Then, AIBN (1.6 g (0.010 mol)) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (500 g), whereby a white precipitate was obtained. The precipitate was filtered and vacuum dried at 60° C., a comparative fluororesin precursor 3-1 as a white solid was obtained (55 g; yield: 64%).
<Results of NMR Measurement>

The molar ratio of the repeating units of the comparative fluororesin precursor 3-1 was as follows: MA-C6F repeating unit:HFIP-M repeating unit:MAA repeating unit=26:20:54.

[Chem. 142]

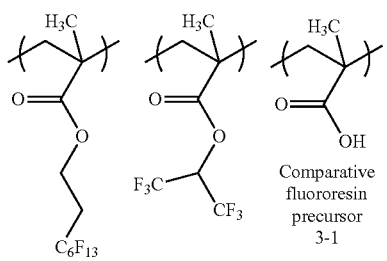

Comparative fluororesin precursor 3-1

<Results of GPC Measurement>
Mw=9700, Mw/Mn=1.5

Comparative Polymerization Example 3-2

A 300-ml glass flask equipped with a stirrer was charged at room temperature with HEMA (13.01 g (0.1 mol)), MA-C6F (43.2 g (0.1 mol)), HFIP-M (23.6 g (0.1 mol)), MAA (8.66 g (0.1 mol)), and MEK (88 g). Then, AIBN (1.6 g (0.010 mol)) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (500 g), whereby a white precipitate was obtained. The precipitate was filtered and vacuum dried at 60° C., whereby a comparative fluororesin precursor 3-2 as a white solid was obtained (60 g; yield: 68%).
<Results of NMR Measurement>

The molar ratio of the repeating units of the comparative fluororesin precursor 3-2 was as follows: HEMA repeating unit:MA-C6F repeating unit:HFIP-M repeating unit:MAA repeating unit=24:26:24:26.

[Chem. 143]

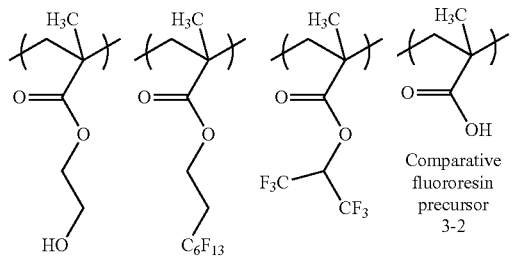

Comparative fluororesin precursor 3-2

<Results of GPC Measurement>
Mw=10700, Mw/Mn=1.5

Comparative Polymerization Example 3-3

A 300-ml glass flask equipped with a stirrer was charged at room temperature with p-HO-St (12.2 g (0.10 mol)), MA-C6F (43.2 g (0.1 mol)), HEVE (8.8 g (0.1 mol)), and MEK (63 g). Then, AIBN (1.6 g (0.010 mol)) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (500 g), whereby a white precipitate was obtained. The precipitate was filtered and vacuum dried at 60° C., whereby a comparative fluororesin precursor 3-3 as a white solid was obtained (51 g; yield: 81%).
<Results of NMR Measurement>

The molar ratio of the repeating units of the comparative fluororesin precursor 3-3 was as follows: HEVE repeating unit:MA-C6F repeating unit:p-HO-St repeating unit=34:31:35.

[Chem. 144]

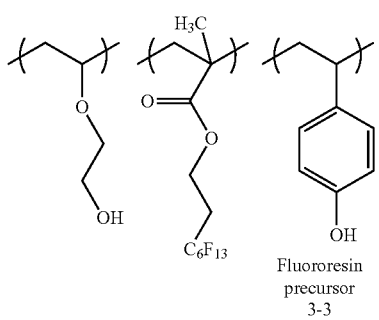

Fluororesin precursor 3-3

<Results of GPC Measurement>
Mw=14700, Mw/Mn=1.7

Comparative Polymerization Example 3-4

The same procedure as in the synthesis of the comparative fluororesin precursor 3-3 was performed, except that p-HO-St was replaced by VBA. Thus, a comparative fluororesin precursor 3-4 containing the following repeating units was obtained (yield: 82%).
<Results of NMR Measurement>

The molar ratio of the repeating units of the comparative fluororesin precursor 3-4 was as follows: HEVE repeating unit:MA-C6F repeating unit:VBA repeating unit=35:31:34.

[Chem. 145]

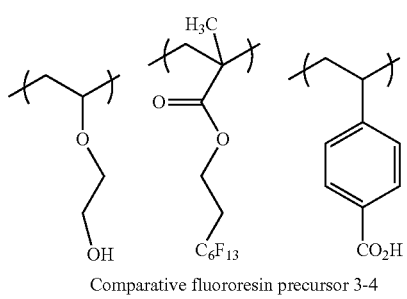

Comparative fluororesin precursor 3-4

<Results of GPC Measurement>
Mw=17300, Mw/Mn=1.7

Comparative Polymerization Example 3-5

The same procedure as in the synthesis of the comparative fluororesin precursor 3-3 was performed, except that HEVE was replaced by HEMA. Thus, a comparative fluororesin precursor 3-5 containing the following repeating units was obtained (yield: 86%).
<Results of NMR Measurement>

The molar ratio of the repeating units of the comparative fluororesin precursor 3-5 was as follows: HEMA repeating unit:MA-C6F repeating unit:p-HO-St repeating unit=34:33:33.

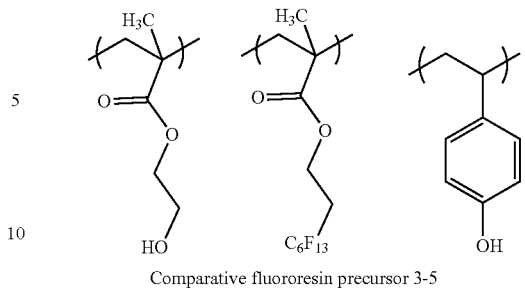

Comparative fluororesin precursor 3-5

<Results of GPC Measurement>
Mw=19300, Mw/Mn=1.8

Comparative Polymerization Example 3-6

The same procedure as in the synthesis of the comparative fluororesin precursor 3-4 was performed, except that HEVE was replaced by HEMA. Thus, a comparative fluororesin precursor 3-6 containing the following repeating units was obtained (yield: 83%).
<Results of NMR Measurement>

The molar ratio of the repeating units of the comparative fluororesin precursor 3-6 was as follows: HEMA repeating unit:MA-C6F repeating unit:VBA repeating unit=32:33:35.

[Chem. 147]

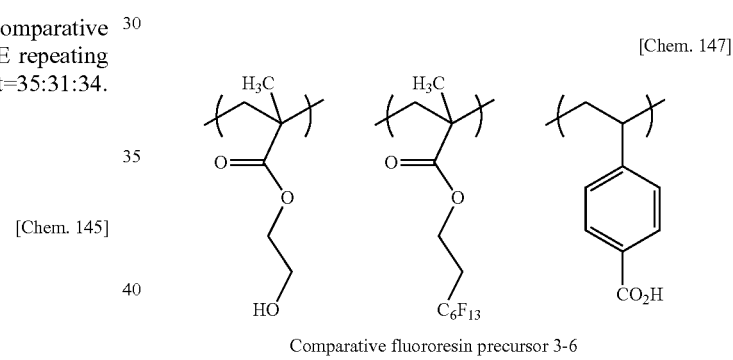

Comparative fluororesin precursor 3-6

<Results of GPC Measurement>
Mw=17300, Mw/Mn=1.7

Comparative Polymerization Example 3-7

A 300-ml glass flask equipped with a stirrer was charged at room temperature (about 20° C.) with MA-C6F (43.2 g (0.1 mol)), hexafluoroisopropyl methacrylate (Central Glass Co., Ltd., hereinafter described as HFIP-M) (23.6 g (0.1 mol)), MAA (17.32 g (0.2 mol)), and MEK (84 g). Then, AIBN (1.6 g (0.010 mol)) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (500 g), whereby a white precipitate was obtained. The precipitate was filtered and vacuum dried at 60° C., whereby a comparative fluororesin precursor 3-7 as a white solid was obtained (55 g; yield: 64%).
<Results of NMR Measurement>

The molar ratio of the repeating units of the comparative fluororesin precursor 3-7 was as follows: MA-C6F repeating unit:HFIP-M repeating unit:MAA repeating unit=26:20:54.

[Chem. 148]

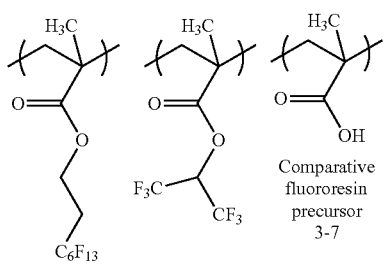

Comparative fluororesin precursor 3-7

<Results of GPC Measurement>
Mw=9700, Mw/Mn=1.5

Comparative Polymerization Example 3-8

A 300-ml glass flask equipped with a stirrer was charged at room temperature with GLMM (16.02 g (0.1 mol)), MA-C6F (43.2 g (0.1 mol)), HFIP-M (23.6 g (0.1 mol)), MAA (8.66 g (0.1 mol)), and MEK (88 g). Then, AIBN (1.6 g (0.010 mol)) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (500 g), whereby a white precipitate was obtained. The precipitate was filtered and vacuum dried at 60° C., whereby a comparative fluororesin precursor 3-8 as a white solid was obtained (65 g; yield: 71%).
<Results of NMR Measurement>
The molar ratio of the repeating units of the comparative fluororesin precursor 3-8 was as follows: GLMM repeating unit:MA-C6F repeating unit:HFIP-M repeating unit:MAA repeating unit=24:26:24:26.

[Chem. 149]

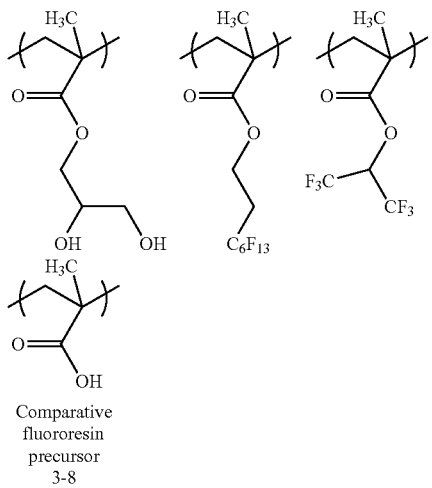

Comparative fluororesin precursor 3-8

<Results of GPC Measurement>
Mw=11500, Mw/Mn=1.5

Comparative Polymerization Example 3-9

A 300-ml glass flask equipped with a stirrer was charged at room temperature with GLMA (14.6 g (0.10 mol)), MA-C6F (43.2 g (0.1 mol)), p-HO-St (12.2 g (0.10 mol)), and MEK (63 g). Then, AIBN (1.6 g (0.010 mol)) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (500 g), whereby a white precipitate was obtained. The precipitate was filtered and vacuum dried at 60° C., whereby a comparative fluororesin precursor 3-9 as a white solid was obtained (59 g; yield: 84%).
<Results of NMR Measurement>
The molar ratio of the repeating units of the comparative fluororesin precursor 3-9 was as follows: GLMA repeating unit:MA-C6F repeating unit:p-HO-St repeating unit=34:31:35.

[Chem. 150]

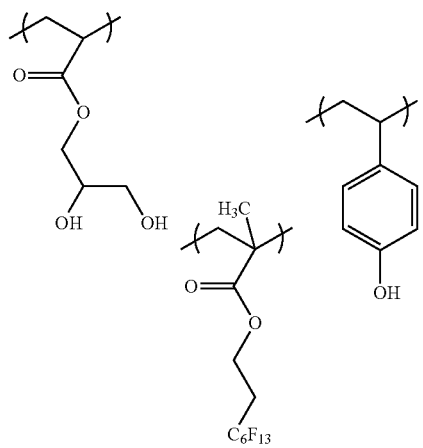

Comparative fluororesin precursor 3-9

<Results of GPC Measurement>
Mw=16700, Mw/Mn=1.7

Comparative Polymerization Example 3-10

The same procedure as in the synthesis of the comparative fluororesin precursor 3-9 was performed, except that p-HO-St was replaced by VBA. Thus, a comparative fluororesin precursor 3-10 containing the following repeating units was obtained (yield: 86%).
<Results of NMR Measurement>
The molar ratio of the repeating units of the comparative fluororesin precursor 3-10 was as follows: GLMA repeating unit:MA-C6F repeating unit:VBA repeating unit=35:31:34.

[Chem. 151]

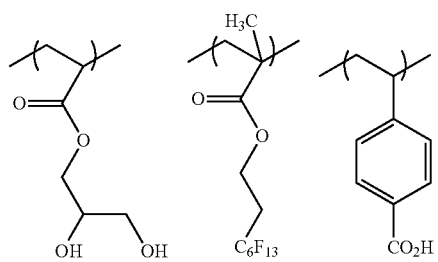

Comparative fluororesin precursor 3-10

<Results of GPC Measurement>
Mw=19300, Mw/Mn=1.7

Comparative Polymerization Example 3-11

The same procedure as in the synthesis of the comparative fluororesin precursor 3-9 was performed, except that GLMA was replaced by GLMM. Thus, a comparative fluororesin precursor 3-11 containing the following repeating units was obtained (yield: 86%).
<Results of NMR Measurement>

The molar ratio of the repeating units of the comparative fluororesin precursor 3-11 was as follows: GLMM repeating unit:MA-C6F repeating unit:p-HO-St repeating unit=33:34:33.

[Chem. 152]

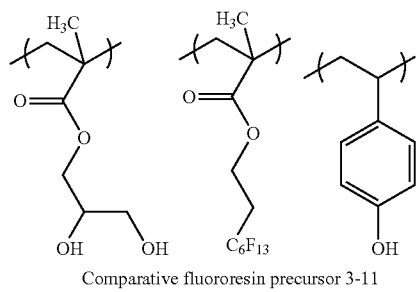

Comparative fluororesin precursor 3-11

<Results of GPC Measurement>
Mw=20400, Mw/Mn=1.8

Comparative Polymerization Example 3-12

The same procedure as in the synthesis of the comparative fluororesin precursor 3-10 was performed, except that GLMA was replaced by GLMM. Thus, a comparative fluororesin precursor 3-12 containing the following repeating units was obtained (yield: 88%).
<Results of NMR Measurement>

The molar ratio of the repeating units of the comparative fluororesin precursor 3-12 was as follows: GLMM repeating unit:MA-C6F repeating unit:VBA repeating unit=32:33:35.

[Chem. 153]

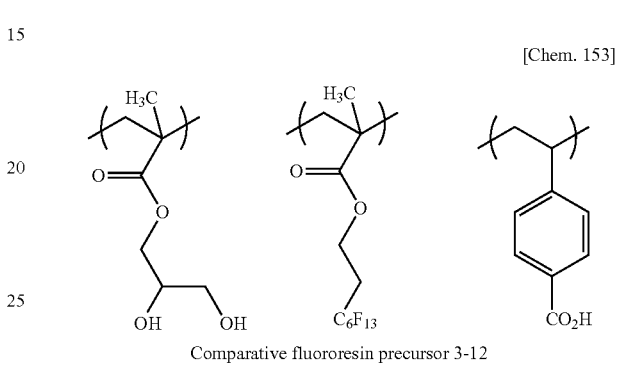

Comparative fluororesin precursor 3-12

<Results of GPC Measurement>
Mw=18300, Mw/Mn=1.7

Tables 3-1 and 3-2 show the repeating units of the resulting fluororesin precursors 3-1 to 3-16 and comparative fluororesin precursors 3-1 to 3-12, molar ratio of the repeating units, and weight average molecular weight (Mw), molecular weight distribution (Mw/Mn), and yield of each of the fluororesin precursors and comparative fluororesin precursors.

TABLE 3-1

| Polymer | Composition (repeating units) (mol %) | | | | | Molecular weight | | |
|---|---|---|---|---|---|---|---|---|
| | 3-1 | 3-2b | 3-3 | 3-4 | 3-5 | Mw | Mw/Mn | Yield (%) |
| Fluororesin precursor 3-1 | BTFBE 16 | HEVE 26 | MA-C6F 33 | — | p-HO-St 25 | 4,100 | 1.3 | 85 |
| Fluororesin precursor 3-2 | BTFBE 17 | HEVE 25 | MA-C6F 33 | — | VBA 25 | 3,900 | 1.3 | 87 |
| Fluororesin precursor 3-3 | BTFBE 20 | HEMA 28 | MA-C6F 30 | — | p-HO-St 22 | 6,500 | 1.3 | 90 |
| Fluororesin precursor 3-4 | BTFBE 19 | HEMA 27 | MA-C6F 31 | — | VBA 23 | 6,800 | 1.3 | 91 |
| Fluororesin precursor 3-5 | BTFBE 16 | HEMA 26 | MA-C6F 33 | — | 4-HFA-St 25 | 7,100 | 1.3 | 87 |
| Fluororesin precursor 3-6 | BTFBE 16 | HEMA 32 | MA-C6F 30 | — | p-AcO-St 22 | 7,200 | 1.3 | 88 |
| Fluororesin precursor 3-7 | BTFBE 15 | HEMA 25 | MA-C6F 30 | MAA 10 | St 20 | 7,200 | 1.3 | 89 |
| Fluororesin precursor 3-8 | BTFBE 16 | HEMA 24 | MA-C6F 31 | AA 9 | St 20 | 6,800 | 1.4 | 89 |
| Fluororesin precursor 3-9 | BTFBE 16 | GLMA 26 | MA-C6F 33 | — | p-HO-St 25 | 5,600 | 1.3 | 80 |
| Fluororesin precursor 3-10 | BTFBE 17 | GLMA 25 | MA-C6F 33 | — | VBA 25 | 5,400 | 1.3 | 90 |
| Fluororesin precursor 3-11 | BTFBE 20 | GLMM 28 | MA-C6F 30 | — | p-HO-St 22 | 7,400 | 1.3 | 92 |
| Fluororesin precursor 3-12 | BTFBE 19 | GLMM 27 | MA-C6F 31 | — | VBA 23 | 7,700 | 1.3 | 91 |
| Fluororesin precursor 3-13 | BTFBE 16 | GLMM 26 | MA-C6F 33 | — | 4-HFA-St 25 | 7,900 | 1.3 | 85 |
| Fluororesin precursor 3-14 | BTFBE 16 | GLMM 32 | MA-C6F 30 | — | p-AcO-St 22 | 8,200 | 1.3 | 89 |

TABLE 3-1-continued

| Polymer | Composition (repeating units) (mol %) | | | | | Molecular weight | | Yield (%) |
|---|---|---|---|---|---|---|---|---|
| | 3-1 | 3-2b | 3-3 | 3-4 | 3-5 | Mw | Mw/Mn | |
| Fluororesin precursor 3-15 | BTFBE 15 | GLMM 25 | MA-C6F 30 | MAA 10 | St 20 | 8,000 | 1.3 | 88 |
| Fluororesin precursor 3-16 | BTFBE 16 | GLMM 24 | MA-C6F 31 | — | St 29 | 7,600 | 1.4 | 89 |

TABLE 3-2

| Polymer | Composition (repeating units) (mol %) | | | | | Molecular weight | | Yield (%) |
|---|---|---|---|---|---|---|---|---|
| | 3-1 | 3-2b | 3-3 | 3-4 | 3-5 | Mw | Mw/IVh | |
| Comparative fluororesin precursor 3-1 | — | — | MA-C6F 26 HFIP-M 20 | — | MAA 54 | 9,700 | 1.5 | 64 |
| Comparative fluororesin precursor 3-2 | — | HEMA 24 | MA-C6F 26 HFIP-M 24 | — | MAA 26 | 10,700 | 1.5 | 68 |
| Comparative fluororesin precursor 3-3 | — | HEVE 34 | MA-C6F 31 | — | p-HO-St 35 | 14,700 | 1.7 | 81 |
| Comparative fluororesin precursor 3-4 | — | HEVE 35 | MA-C6F 31 | — | VBA 34 | 17,300 | 1.7 | 82 |
| Comparative fluororesin precursor 3-5 | — | HEMA 33 | MA-C6F 34 | — | p-HO-St 33 | 19,300 | 1.8 | 86 |
| Comparative fluororesin precursor 3-6 | — | HEMA 32 | MA-C6F 33 | — | VBA 35 | 17,300 | 1.7 | 83 |
| Comparative fluororesin precursor 3-7 | — | — | MA-C6F 26 HFIP-M 20 | — | MAA 54 | 9,700 | 1.5 | 64 |
| Comparative fluororesin precursor 3-8 | — | GLMM 24 | MA-C6F 26 HFIP-M 24 | — | MAA 26 | 11,500 | 1.5 | 71 |
| Comparative fluororesin precursor 3-9 | — | GLMA 34 | MA-C6F 31 | — | p-HO-St 35 | 16,700 | 1.7 | 84 |
| Comparative fluororesin precursor 3-10 | — | GLMA 35 | MA-C6F 31 | — | VBA 34 | 19,300 | 1.7 | 86 |
| Comparative fluororesin precursor 3-11 | — | GLMM 33 | MA-C6F 34 | — | p-HO-St 33 | 20,400 | 1.8 | 86 |
| Comparative fluororesin precursor 3-12 | — | GLMM 32 | MA-C6F 33 | — | VBA 35 | 18,300 | 1.7 | 88 |

3. Production of Fluororesin (Second Step: Addition Reaction)

The fluororesin precursors 3-1 to 3-16 and comparative fluororesin precursors 3-1 to 3-12 obtained in "2. Production of fluororesin (first step: polymerization)" were each reacted with an acrylic acid derivative, whereby fluororesins were synthesized. The acrylic acid derivative was KarenzAOI, KarenzBEI (products of Showa Denko K.K.), or glycidyl acrylate (a product of Tokyo Chemical Industry Co., Ltd.). This reaction is an addition reaction of hydroxy groups of each fluororesin precursor and the acrylic acid derivative.

Described below are fluororesin synthesis examples. The resulting fluororesins were named as follows. The first number represents the number of the fluororesin precursor. The subsequent alphabet letter represents the acrylic acid derivative used. KarenzAOI is represented by "A", KarenzBEI is represented by "B", and glycidyl acrylate is represented by "G". The last number in the parenthesis indicates the nominal amount of acrylic acid derivative introduced relative to the resin precursor.

[Chem. 154]

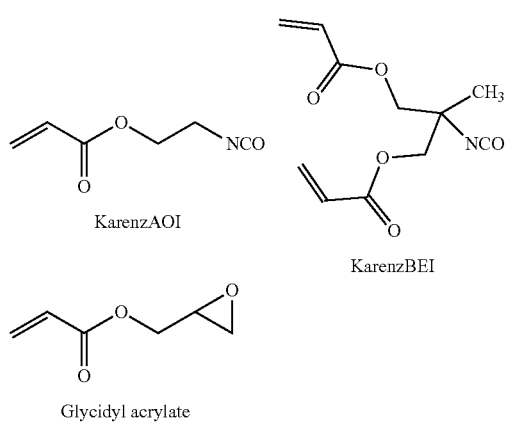

[Synthesis of Fluororesin 3-1-A (50)]

A 300-ml glass flask equipped with a stirrer was charged with the fluororesin precursor 3-1 (10 g) (hydroxy equivalent: 0.0115 mol) and PGMEA (20 g). Then, KarenzAOI (0.81 g (0.0058 mol)) was added thereto, and a reaction was carried out at 45° C. for four hours. After completion of the reaction, the reaction solution was concentrated, and n-heptane (150 g) was then added to obtain a precipitate. The precipitate was filtered and vacuum dried at 40° C., whereby a fluororesin 3-1-A (50) as a white solid was obtained (9.1 g; yield: 84%).

<Results of NMR Measurement>

In the fluororesin 3-1-A (50), the molar ratio of the amount of KarenzAOI-derived acrylic acid derivative introduced (reaction rate) to the amount of residual hydroxy groups (non-reaction rate) was 46:54. The ratio of the repeating units (BTFBE repeating unit, MA-C6F repeating unit, and p-HO-St repeating unit) that do not react with a crosslinking group site was found to be unchanged from that in the fluororesin precursor 3-1 used (i.e., same as before the introduction of the crosslinking group). The newly formed bond ($W^3$ in the formula (3-2)) was "—O—C(=O)—NH—".

[Synthesis of Fluororesin 3-1-A (100)]

The same procedure as in the synthesis of the fluororesin 3-1-A (50) was performed, except that KarenzAOI was used in an amount of 1.62 g (0.0114 mol). Thus, a fluororesin 3-1-A (100) containing the following repeating units was obtained (yield: 96%).

<Results of $^{13}$C-NMR Measurement>

In the fluororesin 3-1-A (100), the molar ratio of the amount of KarenzAOI-derived acrylic acid derivative introduced (reaction rate) to the amount of residual hydroxy groups (non-reaction rate) was 96:4. The ratio of the repeating units (BTFBE repeating unit, MA-C6F repeating unit, and p-HO-St repeating unit) that do not react with a crosslinking group site was found to be unchanged from that in the fluororesin precursor 3-1 used (i.e., same as before the introduction of the crosslinking group). The newly formed bond ($W^3$ in the formula (3-2)) was "—O—C(=O)—NH—".

[Synthesis of Fluororesin 3-1-B (50)]

The same procedure as in the synthesis of the fluororesin 3-1-A (50) was performed, except that KarenzAOI was replaced by KarenzBEI (1.38 g (0.0058 mol)). Thus, a fluororesin 3-1-B (50) containing the following repeating units was obtained (yield: 93%).

<Results of $^{13}$C-NMR Measurement>

In the fluororesin 3-1-B (50), the molar ratio of the amount of KarenzBEI-derived acrylic groups introduced (reaction rate) to the amount of residual hydroxy groups (non-reaction rate) was 49:51. In the fluororesin 3-1-A (100), the molar ratio of the amount of KarenzAOI-derived acrylic acid derivative introduced (reaction rate) to the amount of residual hydroxy groups (non-reaction rate) was 96:4. The ratio of the repeating units (BTFBE repeating unit, MA-C6F repeating unit, and p-HO-St repeating unit) that do not react with a crosslinking group site was found to be unchanged from that in the fluororesin precursor 3-1 used (i.e., same as before the introduction of the crosslinking group). The newly formed bond ($W^3$ in the formula (3-2)) was "—O—C(=O)—NH—".

[Synthesis of Fluororesin 3-1-G (50)]

A 300-ml glass flask equipped with a stirrer was charged with the fluororesin precursor 3-1 (10 g) (hydroxy equivalent: 0.0115 mol) and PGMEA (20 g). Then, glycidyl acrylate (1.4 g (0.0113 mol)) was added thereto, and a reaction was carried out at 80° C. for 18 hours. The content after the reaction was concentrated, and heptane (150 g) was then added to obtain a precipitate. The precipitate was filtered and vacuum dried at 40° C., whereby a fluororesin 3-1-G (50) as a white solid was obtained (10 g; yield: 88%).

<Results of $^{13}$C-NMR Measurement>

In the fluororesin 3-1-G (50), the molar ratio of the amount of KarenzAOI-derived acrylic acid derivative introduced (reaction rate) to the amount of residual hydroxy groups (non-reaction rate) was 55:45. The ratio of the repeating units (BTFBE repeating unit, MA-C6F repeating unit, and p-HO-St repeating unit) that do not react with a crosslinking group site was found to be unchanged from that in the fluororesin precursor 3-1 used (i.e., same as before the introduction of the crosslinking group). The newly formed bond ($W^3$ in the formula (3-2)) was "—O—".

[Synthesis of Fluororesins 3-2-A (50) to 3-8-G (50)]

Fluororesins 3-2-A (50) to 3-8-G (50) were produced as in the fluororesin 3-1-A (50), 3-1-A (100), or 3-1-G (50). Table 3-3 shows the fluororesin precursors used, acrylic acid derivative, crosslinking group structure formed ($W^3$ in the formula (3-2)), amount of crosslinking groups introduced (reaction rate), amount of residual hydroxy groups (non-reaction rate), weight average molecular weight (Mw), and molecular weight distribution (Mw/Mn).

[Synthesis of Fluororesin 3-9-A (50)]

A 300-ml glass flask equipped with a stirrer was charged with the fluororesin precursor 3-9 (10 g (hydroxy equivalent: 0.0230 mol)) and PGMEA (20 g). Then, KarenzAOI (1.62 g (0.0115 mol)) was added thereto, and a reaction was carried out at 45° C. for four hours. After completion of the reaction, the reaction solution was concentrated, and n-heptane (150 g) was then added to obtain a precipitate. The precipitate was filtered and vacuum dried at 40° C., whereby a fluororesin 3-9-A (50) as a white solid was obtained (9.3 g; yield: 80%).

<Results of NMR Measurement>

In the fluororesin 3-9-A (50), the molar ratio of the amount of KarenzAOI-derived acrylic acid derivative introduced (reaction rate) to the amount of residual hydroxy groups (non-reaction rate) was 47:53. The ratio of the repeating units (BTFBE repeating unit, MA-C6F repeating unit, and p-HO-St repeating unit) that do not react with a crosslinking group site was found to be unchanged from that in the fluororesin precursor 3-9 used (i.e., same as before the introduction of the crosslinking group). The newly formed bond ($W^3$ in the formula (3-2)) was "—O—C(=O)—NH—".

[Synthesis of Fluororesin 3-9-A (100)]

The same procedure as in the synthesis of the fluororesin 3-9-A (50) was performed, except that KarenzAOI was used in an amount of 3.24 g (0.0230 mol). Thus, a fluororesin 3-9-A (100) containing the following repeating units was obtained (yield: 90%).

<Results of $^{13}$C-NMR Measurement>

In the fluororesin 3-9-A (100), the molar ratio of the amount of KarenzAOI-derived acrylic acid derivative introduced (reaction rate) to the amount of residual hydroxy groups (non-reaction rate) was 95:5. The ratio of the repeating units (BTFBE repeating unit, MA-C6F repeating unit, and p-HO-St repeating unit) that do not react with a crosslinking group site was found to be unchanged from that in the fluororesin precursor 3-9 used (i.e., same as before the introduction of the crosslinking group). The newly formed bond ($W^3$ in the formula (3-2)) was "—O—C(=O)—NH—".

[Synthesis of Fluororesin 3-9-B (50)]

The same procedure as in the synthesis of the fluororesin 3-9-A (50) was performed, except that KarenzAOI was replaced by KarenzBEI (2.75 g (0.0115 mol)). Thus, a fluororesin 3-9-B (50) containing the following repeating units was obtained (yield: 92%).

<Results of $^{13}$C-NMR Measurement>

In the fluororesin 3-9-B (50), the molar ratio of the amount of KarenzBEI-derived acrylic groups introduced (reaction rate) to the amount of residual hydroxy groups (non-reaction rate) was 49:51. The ratio of the repeating units (BTFBE repeating unit, MA-C6F repeating unit, and p-HO-St repeating unit) that do not react with a crosslinking group site was found to be unchanged from that in the fluororesin precursor 3-9 used (i.e., same as before the introduction of the crosslinking group). The newly formed bond ($W^3$ in the formula (3-2)) was "—O—C(=O)—NH—".

[Synthesis of Fluororesin 3-9-G (50)]

A 300-ml glass flask equipped with a stirrer was charged with the fluororesin precursor 3-9 (10 g) (hydroxy equivalent: 0.0230 mol) and PGMEA (20 g). Then, glycidyl acrylate (1.5 g (0.0115 mol)) was added thereto, and a reaction was carried out at 80° C. for 18 hours. The content after the reaction was concentrated, and heptane (150 g) was then added to obtain a precipitate. The precipitate was filtered and vacuum dried at 40° C., whereby a fluororesin 3-9-G (50) as a white solid was obtained (10 g; yield: 87%).

<Results of $^{13}$C-NMR Measurement>

In the fluororesin 3-9-G (50), the molar ratio of the amount of KarenzAOI-derived acrylic acid derivative introduced (reaction rate) to the amount (non-reaction rate) of residual hydroxy groups was 53:47. The ratio of the repeating units (BTFBE repeating unit, MA-C6F repeating unit, and p-HO-St repeating unit) that do not react with a crosslinking group site was found to be unchanged from that in the fluororesin precursor 3-9 used (i.e., same as before the introduction of the crosslinking group). The newly formed bond ($W^3$ in the formula (3-2)) was "—O—".

[Synthesis of Fluororesins 3-10-A (50) to 3-16-G (50)]

Fluororesins 3-10-A (50) to 3-16-G (50) were produced as in the fluororesin 3-9-A (50), 3-9-A (100), or 3-9-G (50). Table 3-4 shows the fluororesin precursors used, acrylic acid derivative, crosslinking group structure formed ($W^3$ in the formula (3-2)), amount of crosslinking groups introduced (reaction rate), amount of residual hydroxy groups (non-reaction rate), weight average molecular weight (Mw), and molecular weight distribution (Mw/Mn).

[Synthesis of Comparative Fluororesins 3-1-A (50) to 3-6-G (50)]

Comparative fluororesins 3-1-A (50) to 3-6-G (50) were produced as in the fluororesin 3-1-A (50), 3-1-A (100), or 3-1-G (50). Table 3-5 shows the comparative fluororesin precursors used, acrylic acid derivative, crosslinking group structure formed, amount of crosslinking groups introduced (reaction rate), amount of residual hydroxy groups (non-reaction rate), weight average molecular weight (Mw), and molecular weight distribution (Mw/Mn).

Comparative fluororesins 3-7-A (50) to 3-12-G (50) were produced as in the fluororesin 3-9-A (50), 3-9-A (100), or 3-9-G (50). Table 3-5 shows the comparative fluororesin precursors used, acrylic acid derivative, crosslinking group structure formed, amount of crosslinking groups introduced (reaction rate), amount of residual hydroxy groups (non-reaction rate), weight average molecular weight (Mw), and molecular weight distribution (Mw/Mn).

TABLE 3-3

| Fluororesin No. | Fluororesin precursor No. | Introduced crosslinking group site (3-2c) | Formed bond ($W^3$ in formula (3-2)) | Ratio of acrylic acid derivative introduced (mol %) | | Molecular weight | |
|---|---|---|---|---|---|---|---|
| | | | | Amount of acrylic acid derivative introduced | Amount of residual hydroxy groups | Mw | Mw/Mn |
| 3-1-A (50) | 3-1 | A | —O—C(=O)—NH— | 46 | 54 | 5,600 | 1.4 |
| 3-1-A (100) | 3-1 | A | —O—C(=O)—NH— | 96 | 4 | 7,100 | 1.4 |
| 3-1-B (50) | 3-1 | B | —O—C(=O)—NH— | 49 | 51 | 6,100 | 1.4 |
| 3-1-G (50) | 3-1 | G | —O— | 55 | 45 | 5,600 | 1.4 |
| 3-2-A (50) | 3-2 | A | —O—C(=O)—NH— | 51 | 49 | 5,300 | 1.3 |

TABLE 3-3-continued

| Fluororesin No. | Fluororesin precursor No. | Introduced crosslinking group site (3-2c) | Formed bond (W³ in formula (3-2)) | Ratio of acrylic acid derivative introduced (mol %) Amount of acrylic acid derivative introduced | Amount of residual hydroxy groups | Molecular weight Mw | Mw/Mn |
|---|---|---|---|---|---|---|---|
| 3-2-B (50) | 3-2 | B | —O—C(=O)—NH— | 47 | 53 | 5,700 | 1.3 |
| 3-2-G (50) | 3-2 | G | —O— | 48 | 52 | 5,300 | 1.3 |
| 3-3-A (50) | 3-3 | A | —O—C(=O)—NH— | 52 | 48 | 8,000 | 1.3 |
| 3-3-B (40) | 3-3 | B | —O—C(=O)—NH— | 45 | 55 | 8,300 | 1.3 |
| 3-3-G (50) | 3-3 | G | —O— | 47 | 53 | 8,000 | 1.3 |
| 3-4-A (50) | 3-4 | A | —O—C(=O)—NH— | 51 | 49 | 8,300 | 1.3 |
| 3-4-B (40) | 3-4 | B | —O—C(=O)—NH— | 48 | 52 | 8,600 | 1.3 |
| 3-4-G (50) | 3-4 | G | —O— | 53 | 47 | 8,300 | 1.3 |
| 3-5-A (50) | 3-5 | A | —O—C(=O)—NH— | 54 | 46 | 8,600 | 1.3 |
| 3-5-B (45) | 3-5 | B | —O—C(=O)—NH— | 47 | 53 | 9,100 | 1.3 |
| 3-5-G (50) | 3-5 | G | —O— | 48 | 52 | 8,600 | 1.3 |
| 3-6-A (50) | 3-6 | A | —O—C(=O)—NH— | 53 | 47 | 8,700 | 1.4 |
| 3-6-B (40) | 3-6 | B | —O—C(=O)—NH— | 40 | 60 | 8,900 | 1.4 |
| 3-6-G (50) | 3-6 | G | —O— | 46 | 54 | 8,700 | 1.4 |
| 3-7-A (50) | 3-5 | A | —O—C(=O)—NH— | 54 | 46 | 8,700 | 1.3 |
| 3-7-B (45) | 3-5 | B | —O—C(=O)—NH— | 44 | 56 | 9,200 | 1.3 |
| 3-7-G (50) | 3-5 | G | —O— | 48 | 52 | 8,700 | 1.3 |
| 3-S-A (50) | 3-6 | A | —O—C(=O)—NH— | 53 | 47 | 8,300 | 1.4 |
| 3-8-B (40) | 3-6 | B | —O—C(=O)—NH— | 38 | 52 | 8,500 | 1.4 |
| 3-8-G (50) | 3-6 | G | —O— | 46 | 54 | 8,300 | 1.4 |

TABLE 3-4

| Fluororesin No. | Fluororesin precursor No. | Introduced crosslinking group site (3-2c) | Formed bond (W³ in formula (3-2)) | Ratio of acrylic acid derivative introduced (mol %) Amount of acrylic acid derivative introduced | Amount of residual hydroxy groups | Molecular weight Mw | Mw/Mn |
|---|---|---|---|---|---|---|---|
| 3-9-A (50) | 3-1 | A | —O—C(=O)—NH— | 47 | 53 | 8,500 | 1.4 |
| 3-9-A (100) | 3-1 | A | —O—C(=O)—NH— | 95 | 5 | 11,600 | 1.5 |
| 3-9-B (50) | 3-1 | B | —O—C(=O)—NH— | 49 | 51 | 9,400 | 1.4 |
| 3-9-G (50) | 3-1 | G | —O— | 53 | 47 | 8,400 | 1.4 |
| 3-10-A (50) | 3-2 | A | —O—C(=O)—NH— | 50 | 50 | 8,200 | 1.3 |
| 3-10-B (50) | 3-2 | B | —O—C(=O)—NH— | 48 | 52 | 9,000 | 1.3 |
| 3-10-G (50) | 3-2 | G | —O— | 49 | 51 | 8,100 | 1.3 |
| 3-11-A (50) | 3-3 | A | —O—C(=O)—NH— | 51 | 49 | 10,600 | 1.3 |
| 3-11-B (40) | 3-3 | B | —O—C(=O)—NH— | 43 | 57 | 11,600 | 1.3 |
| 3-11-G (50) | 3-3 | G | —O— | 50 | 50 | 10,500 | 1.3 |
| 3-12-A (50) | 3-4 | A | —O—C(=O)—NH— | 52 | 48 | 10,800 | 1.4 |
| 3-12-B (40) | 3-4 | B | —O—C(=O)—NH— | 46 | 54 | 11,700 | 1.4 |
| 3-12-G (50) | 3-4 | G | —O— | 54 | 46 | 10,600 | 1.4 |
| 3-13-A (50) | 3-5 | A | —O—C(=O)—NH— | 55 | 45 | 10,800 | 1.3 |
| 3-13-B (45) | 3-5 | B | —O—C(=O)—NH— | 46 | 54 | 11,600 | 1.3 |
| 3-13-G (50) | 3-5 | G | —O— | 48 | 52 | 10,800 | 1.3 |
| 3-14-A (50) | 3-6 | A | —O—C(=O)—NH— | 53 | 47 | 11,900 | 1.4 |
| 3-14-B (40) | 3-6 | B | —O—C(=O)—NH— | 41 | 59 | 13,000 | 1.4 |
| 3-14-G (50) | 3-6 | G | —O— | 48 | 52 | 11,800 | 1.4 |
| 3-15-A (50) | 3-5 | A | —O—C(=O)—NH— | 52 | 48 | 10,900 | 1.3 |
| 3-15-B (45) | 3-5 | B | —O—C(=O)—NH— | 44 | 56 | 11,800 | 1.3 |
| 3-15-G (50) | 3-5 | G | —O— | 49 | 51 | 10,800 | 1.3 |
| 3-16-A (50) | 3-6 | A | —O—C(=O)—NH— | 51 | 49 | 10,300 | 1.4 |
| 3-16-B (40) | 3-6 | B | —O—C(=O)—NH— | 49 | 51 | 11,100 | 1.4 |
| 3-16-G (50) | 3-6 | G | —O— | 46 | 54 | 10,300 | 1.4 |

TABLE 3-5

| Comparative fluororesin No. | Comparative fluororesin precursor No. | Introduced crosslinking group site (3-2c) | Formed bond | Ratio of acrylic acid derivative introduced (mol %) | | Molecular weight | |
|---|---|---|---|---|---|---|---|
| | | | | Amount of acrylic acid derivative introduced | Amount of residual hydroxy groups | Mw | Mw/Mn |
| Comparative 3-1-A (50) | Comparative 3-1 | A | —O—C(=O)—NH— | 50 | 50 | 11,200 | 1.5 |
| Comparative 3-1-B (50) | Comparative 3-1 | B | —O—C(=O)—NH— | 53 | 47 | 11,700 | 1.5 |
| Comparative 3-1-G (50) | Comparative 3-1 | G | —O— | 52 | 48 | 11,200 | 1.5 |
| Comparative 3-2-A (50) | Comparative 3-2 | A | —O—C(=O)—NH— | 49 | 51 | 12,200 | 1.5 |
| Comparative 3-2-B (45) | Comparative 3-2 | B | —O—C(=O)—NH— | 44 | 56 | 12,700 | 1.5 |
| Comparative 3-2-G (50) | Comparative 3-2 | G | —O— | 52 | 48 | 12,200 | 1.5 |
| Comparative 3-3-A (50) | Comparative 3-3 | A | —O—C(=O)—NH— | 51 | 49 | 16,200 | 1.7 |
| Comparative 3-3-B (40) | Comparative 3-3 | B | —O—C(=O)—NH— | 41 | 59 | 16,700 | 1.7 |
| Comparative 3-3-G (50) | Comparative 3-3 | G | —O— | 48 | 52 | 16,200 | 1.7 |
| Comparative 3-4-A (50) | Comparative 3-4 | A | —O—C(=O)—NH— | 49 | 51 | 18,800 | 1.7 |
| Comparative 3-4-B (45) | Comparative 3-4 | B | —O—C(=O)—NH— | 51 | 49 | 18,800 | 1.7 |
| Comparative 3-4-G (50) | Comparative 3-4 | G | —O— | 50 | 50 | 19,300 | 1.7 |
| Comparative 3-5-A (50) | Comparative 3-3 | A | —O—C(=O)—NH— | 51 | 49 | 20,800 | 1.7 |
| Comparative 3-5-B (40) | Comparative 3-3 | B | —O—C(=O)—NH— | 41 | 59 | 21,300 | 1.7 |
| Comparative 3-5-G (50) | Comparative 3-3 | G | —O— | 47 | 53 | 20,800 | 1.7 |
| Comparative 3-6-A (50) | Comparative 3-4 | A | —O—C(=O)—NH— | 51 | 49 | 18,800 | 1.7 |
| Comparative 3-6-B (50) | Comparative 3-4 | B | O—C(=O)—NH— | 49 | 51 | 19,300 | 1.7 |
| Comparative 3-6-G (50) | Comparative 3-4 | G | —O— | 52 | 48 | 18,800 | 1.7 |
| Comparative 3-7-A (50) | Comparative 3-7 | A | —O—C(=O)—NH— | 50 | 50 | 11,200 | 1.5 |
| Comparative 3-7-B (50) | Comparative 3-7 | B | —O—C(=O)—NH— | 53 | 47 | 11,700 | 1.5 |
| Comparative 3-7-G (50) | Comparative 3-7 | G | —O— | 52 | 48 | 11,200 | 1.5 |
| Comparative 3-8-A (50) | Comparative 3-8 | A | —O—C(=O)—NH— | 51 | 49 | 14,100 | 1.5 |
| Comparative 3-8-B (45) | Comparative 3-8 | B | —O—C(=O)—NH— | 45 | 55 | 14,800 | 1.5 |
| Comparative 3-8-G (50) | Comparative 3-8 | G | —O— | 52 | 48 | 14,000 | 1.5 |
| Comparative 3-9-A (50) | Comparative 3-9 | A | —O—C(=O)—NH— | 51 | 49 | 20,600 | 1.7 |
| Comparative 3-9-B (40) | Comparative 3-9 | B | O—C(=O)—NH— | 39 | 61 | 21,600 | 1.7 |
| Comparative 3-9-G (50) | Comparative 3-9 | G | —O— | 49 | 51 | 20,500 | 1.7 |
| Comparative 3-10-A (50) | Comparative 3-10 | A | O—C(=O)—NH— | 50 | 50 | 22,300 | 1.7 |
| Comparative 3-10-B (45) | Comparative 3-10 | B | —O—C(=O)—NH— | 48 | 52 | 23,200 | 1.7 |
| Comparative 3-10-G (50) | Comparative 3-10 | G | —O— | 51 | 49 | 22,200 | 1.7 |
| Comparative 3-11-A (50) | Comparative 3-9 | A | —O—C(=O)—NH— | 52 | 48 | 24,400 | 1.7 |
| Comparative 3-11-B (40) | Comparative 3-9 | B | —O—C(=O)—NH— | 39 | 61 | 25,300 | 1.7 |
| Comparative 3-11-G (50) | Comparative 3-9 | G | —O— | 48 | 52 | 24,300 | 1.7 |
| Comparative 3-12-A (50) | Comparative 3-10 | A | —O—C(=O)—NH— | 51 | 49 | 22,000 | 1.7 |
| Comparative 3-12-B (50) | Comparative 3-10 | B | —O—C(=O)—NH— | 48 | 52 | 23,100 | 1.7 |
| Comparative 3-12-G (50) | Comparative 3-10 | G | —O— | 53 | 47 | 21,900 | 1.7 |

4. Preparation of Photosensitive Resin Compositions

[Preparation of Photosensitive Resin Compositions 3-1 to 3-82 and Comparative Photosensitive Resin Compositions 3-1 to 3-36]

The fluororesins or comparative fluororesins produced above, solvents, photopolymerization initiators, crosslinking agents, alkali-soluble resins, naphthoquinonediazide group-containing compounds, and basic compounds were blended according to Tables 3-6 to 3-11. The resulting solutions were filtered through a 0.2-μm membrane filter, whereby photosensitive resin compositions 3-1 to 3-38 and comparative photosensitive resin compositions 3-1 to 3-12 were prepared. In the tables, the symbol "-" means no addition of the component.

The following solvents, photopolymerization initiators, crosslinking agents, alkali-soluble resin, naphthoquinonediazide group-containing compound, and basic compound were used.

Solvents:
S-1: propylene glycol monomethyl ether acetate (PGMEA); S-2: γ-butyrolactone; S-3: propylene glycol monomethyl ether (PGME); S-4: methyl ethyl ketone; S-5: cyclohexanone; S-6: ethyl lactate; S-7: butyl acetate photopolymerization initiator; Ini-1: 4-benzoyl benzoic acid; Ini-2: Irgacure 651 (a product of BASF); Ini-3: Irgacure 369 (a product of BASF)
Crosslinking Agents:
CL-1: pentaerythritol tetraacrylate (a product of Tokyo Chemical Industry Co., Ltd.); CL-2: A-TMM-3 (a product of Shin-Nakamura Chemical Co., Ltd.)
Alkali-Soluble Resin:
ASP-1: CCR-1235 (a product of Nippon Kayaku Co., Ltd.)
Naphthoquinonediazide Group-Containing Compound:
N-1: naphthoquinone-1,2-diazide-5-sulfonate compound (PC-5, a product of Toyo Gosei Co., Ltd.)
Basic Compound:
B-1: triethanolamine (a product of Tokyo Chemical Industry Co., Ltd.)

TABLE 3-6

| Photosensitive resin composition No. | Fluororesin Type | Parts by mass | Solvent Type | Parts by mass | Photopolymerization initiator Type | Parts by mass | Crosslinking agent Type | Parts by mass | Alkali-soluble resin Type | Parts by mass | Naphthoquinonediazide group-containing compound Type | Parts by mass | Basic compound Type | Parts by mass |
|---|---|---|---|---|---|---|---|---|---|---|---|---|---|---|
| 3-1 | 3-1-A (50) | 1.0 | S-1 / S-3 | 65 / 35 | Ini-2 | 7.5 | — | — | — | — | — | — | — | — |
| 3-2 | 3-1-A (50) | 1.0 | S-1 / S-3 | 70 / 30 | Ini-2 | 7.5 | CL-1 | 50 | ASP-1 | 50 | — | — | — | — |
| 3-3 | 3-1-A (100) | 1.0 | S-7 | 100 | Ini-3 | 7.5 | — | — | — | — | — | — | — | — |
| 3-4 | 3-1-A (100) | 1.0 | S-1 / S-3 | 65 / 35 | Ini-2 | 5.0 | CL-2 | 25 | ASP-1 | 50 | N-1 | 10 | B-1 | 0.5 |
| 3-5 | 3-1-B (50) | 1.0 | S-4 | 100 | Ini-1 | 7.5 | — | — | — | — | — | — | — | — |
| 3-6 | 3-1-B (50) | 0.5 | S-1 / S-3 | 65 / 35 | Ini-2 | 7.5 | CL-1 | 50 | ASP-1 | 50 | — | — | — | — |
| 3-7 | 3-1-G (50) | 1.0 | S-6 | 100 | Ini-1 | 7.5 | — | — | — | — | — | — | — | — |
| 3-8 | 3-1-G (50) | 1.0 | S-1 / S-3 | 70 / 30 | Ini-2 | 7.5 | CL-1 | 50 | ASP-1 | 50 | — | — | — | — |
| 3-9 | 3-2-A (50) | 1.0 | S-4 | 100 | Ini-3 | 7.5 | — | — | — | — | — | — | — | — |
| 3-10 | 3-2-A (50) | 1.0 | S-1 / S-3 | 50 / 50 | Ini-2 | 7.5 | CL-1 | 50 | ASP-1 | 50 | — | — | — | — |
| 3-11 | 3-2-B (50) | 1.0 | S-4 | 100 | Ini-2 | 7.5 | — | — | — | — | — | — | — | — |
| 3-12 | 3-2-B (50) | 0.8 | S-1 / S-3 | 55 / 45 | Ini-3 | 7.5 | CL-1 | 50 | ASP-1 | 50 | N-1 | 10 | B-1 | 0.5 |
| 3-13 | 3-2-G (50) | 1.0 | S-4 | 100 | Ini-3 | 7.5 | — | — | — | — | — | — | — | — |
| 3-14 | 3-2-G (50) | 1.0 | S-1 / S-3 | 60 / 40 | Ini-3 | 7.5 | CL-1 | 50 | ASP-1 | 50 | — | — | — | — |
| 3-15 | 3-3-A (50) | 1.0 | S-4 | 100 | Ini-2 | 7.5 | — | — | — | — | — | — | — | — |
| 3-16 | 3-3-A (50) | 1.0 | S-1 / S-3 | 60 / 40 | Ini-2 | 7.5 | CL-1 | 50 | ASP-1 | 50 | — | — | — | — |
| 3-17 | 3-3-B (40) | 1.0 | S-4 | 100 | Ini-1 | 7.5 | — | — | — | — | — | — | — | — |
| 3-18 | 3-3-B (40) | 1.5 | S-1 / S-3 | 80 / 20 | Ini-3 | 7.5 | CL-1 | 50 | ASP-1 | 45 | — | — | — | — |
| 3-19 | 3-3-G (50) | 1.0 | S-4 | 100 | Ini-3 | 7.5 | — | — | — | — | — | — | — | — |
| 3-20 | 3-3-G (50) | 1.0 | S-1 / S-3 | 70 / 30 | Ini-2 | 7.5 | CL-1 | 65 | ASP-1 | 50 | N-1 | 10 | B-1 | 0.5 |

TABLE 3-7

| Photosensitive resin composition No. | Fluororesin Type | Parts by mass | Solvent Type | Parts by mass | Photopolymerization initiator Type | Parts by mass | Crosslinking agent Type | Parts by mass | Alkali-soluble resin Type | Parts by mass | Naphthoquinonediazide group-containing compound Type | Parts by mass | Basic compound Type | Parts by mass |
|---|---|---|---|---|---|---|---|---|---|---|---|---|---|---|
| 3-21 | 3-4-A (50) | 0.8 | S-7 | 100 | Ini-1 | 7.5 | — | — | — | — | — | — | — | — |
| 3-22 | 3-4-A (50) | 1.0 | S-1 / S-3 | 70 / 30 | Ini-3 | 7.5 | CL-1 | 50 | ASP-1 | 50 | — | — | — | — |
| 3-23 | 3-4-B (40) | 1.0 | S-1 | 100 | Ini-2 | 7.5 | — | — | — | — | — | — | — | — |
| 3-24 | 3-4-B (40) | 1.0 | S-1 / S-3 | 60 / 40 | Ini-2 | 7.5 | CL-2 | 70 | ASP-1 | 40 | — | — | — | — |
| 3-25 | 3-4-G (50) | 1.0 | S-7 | 100 | Ini-3 | 7.5 | — | — | — | — | — | — | — | — |
| 3-26 | 3-4-G (50) | 1.0 | S-1 / S-3 | 60 / 40 | Ini-2 | 7.5 | CL-1 | 50 | ASP-1 | 50 | — | — | — | — |
| 3-27 | 3-5-A (50) | 1.0 | S-1 / S-3 | 60 / 40 | Ini-2 | 7.5 | CL-1 | 50 | ASP-1 | 50 | — | — | — | — |
| 3-28 | 3-5-B (45) | 1.0 | S-8 | 100 | Ini-2 | 7.5 | — | — | — | — | — | — | — | — |
| 3-29 | 3-5-B (45) | 1.0 | S-1 / S-3 | 70 / 30 | Ini-1 | 7.5 | CL-2 | 30 | ASP-1 | 50 | N-1 | 10 | B-1 | 0.5 |
| 3-30 | 3-5-G (50) | 1.0 | S-1 / S-3 | 70 / 30 | Ini-3 | 7.5 | CL-1 | 50 | ASP-1 | 60 | N-1 | 10 | B-1 | 0.5 |
| 3-31 | 3-6-A (50) | 0.5 | S-1 | 100 | Ini-2 | 7.5 | — | — | — | — | — | — | — | — |
| 3-32 | 3-6-A (50) | 1.0 | S-1 / S-3 | 65 / 35 | Ini-2 | 7.5 | CL-1 | 50 | ASP-1 | 50 | — | — | — | — |
| 3-33 | 3-6-B (40) | 1.0 | S-1 | 100 | Ini-3 | 7.5 | — | — | — | — | — | — | — | — |
| 3-34 | 3-6-B (40) | 1.5 | S-7 | 100 | Ini-3 | 7.5 | CL-2 | 75 | ASP-1 | 70 | — | — | — | — |
| 3-35 | 3-6-G (50) | 1.3 | S-5 | 100 | Ini-2 | 5.0 | CL-2 | 75 | ASP-1 | 50 | — | — | — | — |
| 3-36 | 3-7-A (50) | 1.0 | S-1 / S-3 | 60 / 40 | Ini-2 | 7.5 | CL-1 | 50 | ASP-1 | 50 | — | — | — | — |
| 3-37 | 3-7-B (45) | 0.8 | S-7 | 100 | Ini-3 | 7.5 | CL-1 | 75 | ASP-1 | 70 | — | — | — | — |
| 3-38 | 3-7-G (50) | 1.0 | S-5 | 100 | Ini-2 | 7.5 | CL-2 | 75 | ASP-1 | 50 | — | — | — | — |

TABLE 3-7-continued

| Photosensitive resin composition No. | Fluororesin Type | Parts by mass | Solvent Type | Parts by mass | Photopolymerization initiator Type | Parts by mass | Crosslinking agent Type | Parts by mass | Alkali-soluble resin Type | Parts by mass | Naphthoquinonediazide group-containing compound Type | Parts by mass | Basic compound Type | Parts by mass |
|---|---|---|---|---|---|---|---|---|---|---|---|---|---|---|
| 3-39 | 3-8-A (50) | 1.5 | S-1<br>S-3 | 70<br>30 | Ini-3 | 5.0 | CL-1 | 50 | ASP-1 | 50 | — | — | — | — |
| 3-40 | 3-8-B (41) | 1.0 | S-7 | 100 | Ini-3 | 7.5 | CL-1 | 75 | ASP-1 | 70 | — | — | — | — |
| 3-41 | 3-8-G (51) | 1.0 | S-5 | 100 | Ini-3 | 7.5 | CL-2 | 50 | ASP-1 | 50 | — | — | — | — |

TABLE 3-8

| Photosensitive resin composition No. | Fluororesin Type | Parts by mass | Solvent Type | Parts by mass | Photopolymerization initiator Type | Parts by mass | Crosslinking agent Type | Parts by mass | Alkali-soluble resin Type | Parts by mass | Naphthoquinonediazide group-containing compound Type | Parts by mass | Basic compound Type | Parts by mass |
|---|---|---|---|---|---|---|---|---|---|---|---|---|---|---|
| 3-42 | 3-9-A (50) | 1.0 | S-1<br>S-3 | 65<br>35 | Ini-2 | 7.5 | — | — | — | — | — | — | — | — |
| 3-43 | 3-9-A (50) | 1.0 | S-1<br>S-3 | 70<br>30 | Ini-2 | 7.5 | CL-1 | 50 | ASP-1 | 50 | — | — | — | — |
| 3-44 | 3-9-A (100) | 1.0 | S-7 | 100 | Ini-3 | 7.5 | — | — | — | — | — | — | — | — |
| 3-45 | 3-9-A (100) | 1.0 | S-1<br>S-3 | 65<br>35 | Ini-2 | 5.0 | CL-2 | 25 | ASP-1 | 50 | N-1 | 10 | B-1 | 0.5 |
| 3-46 | 3-9-B (50) | 1.0 | S-4 | 100 | Ini-1 | 7.5 | — | — | — | — | — | — | — | — |
| 3-47 | 3-9-B (50) | 0.5 | S-1<br>S-3 | 65<br>35 | Ini-2 | 7.5 | CL-1 | 50 | ASP-1 | 50 | — | — | — | — |
| 3-48 | 3-9-G (50) | 1.0 | S-6 | 100 | Ini-1 | 7.5 | — | — | — | — | — | — | — | — |
| 3-49 | 3-9-G (50) | 1.0 | S-1<br>S-3 | 70<br>30 | Ini-2 | 7.5 | CL-1 | 50 | ASP-1 | 50 | — | — | — | — |
| 3-50 | 3-10-A (50) | 1.0 | S-4 | 100 | Ini-3 | 7.5 | — | — | — | — | — | — | — | — |
| 3-51 | 3-10-A (50) | 1.0 | S-1<br>S-3 | 50<br>50 | Ini-2 | 7.5 | CL-1 | 50 | ASP-1 | 50 | — | — | — | — |
| 3-52 | 3-10-B (50) | 1.0 | S-4 | 100 | Ini-2 | 7.5 | — | — | — | — | — | — | — | — |
| 3-53 | 3-10-B (50) | 0.8 | S-1<br>S-3 | 55<br>45 | Ini-3 | 7.5 | CL-1 | 50 | ASP-1 | 50 | N-1 | 10 | B-1 | 0.5 |
| 3-54 | 3-10-G (50) | 1.0 | S-4 | 100 | Ini-3 | 7.5 | — | — | — | — | — | — | — | — |
| 3-55 | 3-10-G (50) | 1.0 | S-1<br>S-3 | 60<br>40 | Ini-3 | 7.5 | CL-1 | 50 | ASP-1 | 50 | — | — | — | — |
| 3-56 | 3-11-A (50) | 1.0 | S-4 | 100 | Ini-2 | 7.5 | — | — | — | — | — | — | — | — |
| 3-57 | 3-11-A (50) | 1.0 | S-1<br>S-3 | 60<br>40 | Ini-2 | 7.5 | CL-1 | 50 | ASP-1 | 50 | — | — | — | — |
| 3-58 | 3-11-B (40) | 1.0 | S-4 | 100 | Ini-1 | 7.5 | — | — | — | — | — | — | — | — |
| 3-59 | 3-11-B (40) | 1.5 | S-1<br>S-3 | 80<br>20 | Ini-3 | 7.5 | CL-1 | 50 | ASP-1 | 45 | — | — | — | — |
| 3-60 | 3-11-G (50) | 1.0 | S-4 | 100 | Ini-3 | 7.5 | — | — | — | — | — | — | — | — |
| 3-61 | 3-11-G (50) | 1.0 | S-1<br>S-3 | 70<br>30 | Ini-2 | 7.5 | CL-1 | 65 | ASP-1 | 50 | N-1 | 10 | B-1 | 0.5 |

TABLE 3-9

| Photosensitive resin composition No. | Fluororesin Type | Parts by mass | Solvent Type | Parts by mass | Photopolymerization initiator Type | Parts by mass | Crosslinking agent Type | Parts by mass | Alkali-soluble resin Type | Parts by mass | Naphthoquinonediazide group-containing compound Type | Parts by mass | Basic compound Type | Parts by mass |
|---|---|---|---|---|---|---|---|---|---|---|---|---|---|---|
| 3-62 | 3-12-A (50) | 0.8 | S-7 | 100 | Ini-1 | 7.5 | — | — | — | — | — | — | — | — |
| 3-63 | 3-12-A (50) | 1.0 | S-1<br>S-3 | 70<br>30 | Ini-3 | 7.5 | CL-1 | 50 | ASP-1 | 50 | — | — | — | — |
| 3-64 | 3-12-B (40) | 1.0 | S-1 | 100 | Ini-2 | 7.5 | — | — | — | — | — | — | — | — |
| 3-65 | 3-12-B (40) | 1.0 | S-1<br>S-3 | 60<br>40 | Ini-2 | 7.5 | CL-2 | 70 | ASP-1 | 40 | — | — | — | — |

TABLE 3-9-continued

| Photosensitive resin composition No. | Fluororesin Type | Fluororesin Parts by mass | Solvent Type | Solvent Parts by mass | Photopolymerization initiator Type | Photopolymerization initiator Parts by mass | Crosslinking agent Type | Crosslinking agent Parts by mass | Alkali-soluble resin Type | Alkali-soluble resin Parts by mass | Naphthoquinonediazide group-containing compound Type | Naphthoquinonediazide group-containing compound Parts by mass | Basic compound Type | Basic compound Parts by mass |
|---|---|---|---|---|---|---|---|---|---|---|---|---|---|---|
| 3-66 | 3-12-G (50) | 1.0 | S-7 | 100 | Ini-3 | 7.5 | — | — | — | — | — | — | — | — |
| 3-67 | 3-12-G (50) | 1.0 | S-1 S-3 | 60 40 | Ini-2 | 7.5 | CL-1 | 50 | ASP-1 | 50 | — | — | — | — |
| 3-68 | 3-13-A (50) | 1.0 | S-1 S-3 | 60 40 | Ini-2 | 7.5 | CL-1 | 50 | ASP-1 | 50 | — | — | — | — |
| 3-69 | 3-13-B (45) | 1.0 | S-8 | 100 | Ini-2 | 7.5 | — | — | — | — | — | — | — | — |
| 3-70 | 3-13-B (45) | 1.0 | S-1 S-3 | 70 30 | Ini-1 | 7.5 | CL-2 | 30 | ASP-1 | 50 | N-1 | 10 | B-1 | 0.5 |
| 3-71 | 3-13-G (50) | 1.0 | S-1 S-3 | 70 30 | Ini-3 | 7.5 | CL-1 | 50 | ASP-1 | 60 | N-1 | 10 | B-1 | 0.5 |
| 3-72 | 3-14-A (50) | 0.5 | S-1 | 100 | Ini-2 | 7.5 | — | — | — | — | — | — | — | — |
| 3-73 | 3-14-A (50) | 1.0 | S-1 S-3 | 65 35 | Ini-2 | 7.5 | CL-1 | 50 | ASP-1 | 50 | — | — | — | — |
| 3-74 | 3-14-B (40) | 1.0 | S-1 | 100 | Ini-3 | 7.5 | — | — | — | — | — | — | — | — |
| 3-75 | 3-14-B (40) | 1.5 | S-7 | 100 | Ini-3 | 7.5 | CL-2 | 75 | ASP-1 | 70 | — | — | — | — |
| 3-76 | 3-14-G (50) | 1.3 | S-5 | 100 | Ini-2 | 5.0 | CL-2 | 50 | ASP-1 | 50 | — | — | — | — |
| 3-77 | 3-15-A (50) | 1.0 | S-1 S-3 | 60 40 | Ini-2 | 7.5 | CL-1 | 50 | ASP-1 | 50 | — | — | — | — |
| 3-78 | 3-15-B (45) | 0.8 | S-7 | 100 | Ini-3 | 7.5 | CL-1 | 75 | ASP-1 | 70 | — | — | — | — |
| 3-79 | 3-15-G (50) | 1.0 | S-5 | 100 | Ini-2 | 7.5 | CL-2 | 75 | ASP-1 | 50 | — | — | — | — |
| 3-80 | 3-16-A (50) | 1.5 | S-1 S-3 | 70 30 | Ini-3 | 5.0 | CL-1 | 50 | ASP-1 | 50 | — | — | — | — |
| 3-81 | 3-16-B (41) | 1.0 | S-7 | 100 | Ini-3 | 7.5 | CL-1 | 75 | ASP-1 | 70 | — | — | — | — |
| 3-82 | 3-16-G (51) | 1.0 | S-5 | 100 | Ini-3 | 7.5 | CL-2 | 50 | ASP-1 | 50 | — | — | — | — |

TABLE 3-10

| Comparative photosensitive resin composition No. | Comparative fluororesin Type | Comparative fluororesin Parts by mass | Solvent Type | Solvent Parts by mass | Photopolymerization initiator Type | Photopolymerization initiator Parts by mass | Crosslinking agent Type | Crosslinking agent Parts by mass | Alkali-soluble resin Type | Alkali-soluble resin Parts by mass | Naphthoquinonediazide group-containing compound Type | Naphthoquinonediazide group-containing compound Parts by mass | Basic compound Type | Basic compound Parts by mass |
|---|---|---|---|---|---|---|---|---|---|---|---|---|---|---|
| 3-1 | Comparative 3-1-A (50) | 1.0 | S-1 S-3 | 68 32 | Ini-2 | 7.5 | CL-1 | 50 | ASP-1 | 50 | — | — | — | — |
| 3-2 | Comparative 3-1-B (50) | 1.0 | S-3 | 100 | Ini-1 | 7.5 | CL-1 | 50 | ASP-1 | 50 | N-1 | 10 | B-1 | 0.5 |
| 3-3 | Comparative 3-1-G (50) | 1.0 | S-4 | 100 | Ini-1 | 7.5 | CL-1 | 50 | ASP-1 | 50 | — | — | — | — |
| 3-4 | Comparative 3-2-A (50) | 1.0 | S-1 S-3 | 50 50 | Ini-2 | 7.5 | CL-1 | 50 | ASP-1 | 50 | — | — | — | — |
| 3-5 | Comparative 3-2-B (45) | 1.0 | S-1 S-3 | 55 45 | Ini-3 | 7.5 | CL-1 | 50 | ASP-1 | 50 | N-1 | 10 | B-1 | 0.5 |
| 3-6 | Comparative 3-2-G (50) | 1.0 | S-7 | 100 | Ini-3 | 7.5 | CL-1 | 50 | ASP-1 | 50 | — | — | — | — |
| 3-7 | Comparative 3-3-A (50) | 1.0 | S-1 S-3 | 60 40 | Ini-2 | 7.5 | CL-1 | 50 | ASP-1 | 50 | — | — | — | — |
| 3-8 | Comparative 3-3-B (40) | 1.0 | S-1 S-3 | 70 30 | Ini-3 | 7.5 | CL-1 | 50 | ASP-1 | 50 | N-1 | 10 | B-1 | 0.5 |
| 3-9 | Comparative 3-3-G (50) | 1.0 | S-1 | 100 | Ini-3 | 7.5 | CL-1 | 50 | ASP-1 | 50 | — | — | — | — |
| 3-10 | Comparative 3-4-A (50) | 1.0 | S-1 | 100 | Ini-3 | 7.5 | CL-1 | 50 | ASP-1 | 50 | — | — | — | — |
| 3-11 | Comparative 3-4-B (45) | 1.0 | S-1 S-3 | 60 40 | Ini-2 | 7.5 | CL-2 | 50 | ASP-1 | 50 | — | — | — | — |
| 3-12 | Comparative 3-4-G (50) | 1.0 | S-1 S-3 | 70 30 | Ini-2 | 7.5 | CL-1 | 50 | ASP-1 | 50 | — | — | — | — |
| 3-13 | Comparative 3-5-A (50) | 1.0 | S-1 S-3 | 65 35 | Ini-2 | 7.5 | CL-1 | 50 | ASP-1 | 50 | — | — | — | — |
| 3-14 | Comparative 3-5-B (40) | 1.0 | S-1 S-3 | 70 30 | Ini-3 | 7.5 | CL-1 | 50 | ASP-1 | 50 | — | — | — | — |
| 3-15 | Comparative 3-5-G (50) | 1.0 | S-1 | 100 | Ini-3 | 7.5 | CL-1 | 50 | ASP-1 | 50 | — | — | — | — |
| 3-16 | Comparative 3-6-A (50) | 1.0 | S-1 S-3 | 65 35 | Ini-2 | 7.5 | CL-1 | 50 | ASP-1 | 50 | — | — | — | — |

TABLE 3-10-continued

| Comparative photosensitive resin composition No. | Comparative fluororesin Type | Parts by mass | Solvent Type | Parts by mass | Photopolymerization initiator Type | Parts by mass | Crosslinking agent Type | Parts by mass | Alkali-soluble resin Type | Parts by mass | Naphthoquinonediazide group-containing compound Type | Parts by mass | Basic compound Type | Parts by mass |
|---|---|---|---|---|---|---|---|---|---|---|---|---|---|---|
| 3-17 | Comparative 3-6-B (50) | 1.0 | S-1 S-3 | 60 40 | Ini-2 | 7.5 | CL-2 | 50 | ASP-1 | 50 | N-1 | 10 | B-1 | 0.5 |
| 3-18 | Comparative 3-6-G (50) | 1.0 | S-1 S-3 | 60 40 | Ini-3 | 7.5 | CL-1 | 50 | ASP-1 | 50 | — | — | B-1 | 0.5 |

TABLE 3-11

| Comparative photosensitive resin composition No. | Comparative fluororesin Type | Parts by mass | Solvent Type | Parts by mass | Photopolymerization initiator Type | Parts by mass | Crosslinking agent Type | Parts by mass | Alkali-soluble resin Type | Parts by mass | Naphthoquinonediazide group-containing compound Type | Parts by mass | Basic compound Type | Parts by mass |
|---|---|---|---|---|---|---|---|---|---|---|---|---|---|---|
| 3-19 | Comparative 3-7-A (50) | 1.0 | S-1 S-3 | 68 32 | Ini-2 | 7.5 | CL-1 | 50 | ASP-1 | 50 | — | — | — | — |
| 3-20 | Comparative 3-7-B (50) | 1.0 | S-3 | 100 | Ini-1 | 7.5 | CL-1 | 50 | ASP-1 | 50 | N-1 | 10 | B-1 | 0.5 |
| 3-21 | Comparative 3-7-G (50) | 1.0 | S-4 | 100 | Ini-1 | 7.5 | CL-1 | 50 | ASP-1 | 50 | — | — | — | — |
| 3-22 | Comparative 3-8-A (50) | 1.0 | S-1 S-3 | 50 50 | Ini-2 | 7.5 | CL-1 | 50 | ASP-1 | 50 | — | — | — | — |
| 3-23 | Comparative 3-8-B (45) | 1.0 | S-1 S-3 | 55 45 | Ini-3 | 7.5 | CL-1 | 50 | ASP-1 | 50 | N-1 | 10 | B-1 | 0.5 |
| 3-24 | Comparative 3-8-G (50) | 1.0 | S-7 | 100 | Ini-3 | 7.5 | CL-1 | 50 | ASP-1 | 50 | — | — | — | — |
| 3-25 | Comparative 3-9-A (50) | 1.0 | S-1 S-3 | 60 40 | Ini-2 | 7.5 | CL-1 | 50 | ASP-1 | 50 | — | — | — | — |
| 3-26 | Comparative 3-9-B (40) | 1.0 | S-1 S-3 | 70 30 | Ini-3 | 7.5 | CL-1 | 50 | ASP-1 | 50 | N-1 | 10 | B-1 | 0.5 |
| 3-27 | Comparative 3-9-G (50) | 1.0 | S-1 | 100 | Ini-3 | 7.5 | CL-1 | 50 | ASP-1 | 50 | — | — | — | — |
| 3-28 | Comparative 3-10-A (50) | 1.0 | S-1 | 100 | Ini-3 | 7.5 | CL-1 | 50 | ASP-1 | 50 | — | — | — | — |
| 3-29 | Comparative 3-10-B (45) | 1.0 | S-1 S-3 | 60 40 | Ini-2 | 7.5 | CL-2 | 50 | ASP-1 | 50 | — | — | — | — |
| 3-30 | Comparative 3-10-G (50) | 1.0 | S-1 S-3 | 70 30 | Ini-2 | 7.5 | CL-1 | 50 | ASP-1 | 50 | — | — | — | — |
| 3-31 | Comparative 3-11-A (50) | 1.0 | S-1 S-3 | 65 35 | Ini-2 | 7.5 | CL-1 | 50 | ASP-1 | 50 | — | — | — | — |
| 3-32 | Comparative 3-11-B (40) | 1.0 | S-1 S-3 | 70 30 | Ini-3 | 7.5 | CL-1 | 50 | ASP-1 | 50 | — | — | — | — |
| 3-33 | Comparative 3-11-G (50) | 1.0 | S-1 | 100 | Ini-3 | 7.5 | CL-1 | 50 | ASP-1 | 50 | — | — | — | — |
| 3-34 | Comparative 3-12-A (50) | 1.0 | S-1 S-3 | 65 35 | Ini-2 | 7.5 | CL-1 | 50 | ASP-1 | 50 | — | — | — | — |
| 3-35 | Comparative 3-12-B (50) | 1.0 | S-1 S-3 | 60 40 | Ini-2 | 7.5 | CL-2 | 50 | ASP-1 | 50 | N-1 | 10 | B-1 | 0.5 |
| 3-36 | Comparative 3-12-G (50) | 1.0 | S-1 S-3 | 60 40 | Ini-3 | 7.5 | CL-1 | 50 | ASP-1 | 50 | — | — | B-1 | 0.5 |

5. Evaluation of Liquid Repellency of Each Fluororesin Film Before and after UV-Ozone Treatment and after Heating Step

[Formation of Fluororesin Films 3-1 to 3-82 and Comparative Fluororesin Films 3-1 to 3-36]

The photosensitive resin compositions 3-1 to 3-82 and comparative photosensitive resin compositions 3-1 to 3-36 prepared were each applied to a silicon wafer using a spin coater at a rotation speed of 1000 rpm. Subsequently, these resin compositions were heated on a hot plate at 100° C. for 150 seconds, whereby fluororesin films 3-1 to 3-82 and comparative fluororesin films 3-1 to 3-36 (the numbers correspond to the respective numbers of the photosensitive resin compositions) were each formed on the silicon wafer.

The fluororesin films 3-2, 3-10, 3-16, 3-22, 3-27, 3-32, 3-36, 3-39, 3-43, 3-51, 3-57, 3-63, 3-68, 3-73, 3-77, and 3-80 and the comparative fluororesin films 3-1, 3-4, 3-7, 3-10, 3-13, 3-16, 3-19, 3-22, 3-25, 3-28, 3-31, and 3-34 obtained above were subjected to contact angle measurement with respect to water, anisole, and methyl benzoate before and after UV-ozone treatment and after heating. Water, anisole, and methyl benzoate were used as ink solvents.

[UV-Ozone Treatment Step and Heating Step]

The fluororesin films and comparative fluororesin films on the silicon wafer were each subjected to UV-ozone treatment for 10 minutes using a UV-ozone treatment device (available from Sen Lights Corporation; model number: PL17-110). Subsequently, heating was performed at 230° C. for 60 seconds.

[Contact Angle Measurement]

With a contact angle meter "DMs-601" available from Kyowa Interface Science Co., Ltd., each fluororesin film surface and each comparative fluororesin film surface were subjected to contact angles measurement with respect to water, anisole, and methyl benzoate before and after the UV-ozone treatment and after the subsequent heating step.

[Film Thickness Measurement]

Using a stylus-type surface shape measuring instrument "Dektak-8" available from Bruker Nano, the thickness of each of the fluororesin films and comparative fluororesin films was measured before and after the UV-ozone treatment and after the subsequent heating step.

[Measurement of Molecular Weight Changes]

The fluororesin films and the comparative fluororesin films were each scraped off with a spatula, and each resulting solid was dissolved in THF to determine the molecular weight by GPC before and after the UV-ozone treatment and after the subsequent heating step. The table shows multiple molecular weights with "multiple" in the cases where multiple peaks were detected.

Tables 3-12 and 3-13 show the results of the contact angle measurement. Tables 3-14 and 3-15 show the results of the film thickness measurement and weight average molecular weight (Mw) in each step.

TABLE 3-12

| Fluororesin film No. | Photosensitive resin composition No. | Anisole UV-ozone treatment Before | Anisole UV-ozone treatment After | Anisole After heating step | Methyl benzoate UV-ozone treatment Before | Methyl benzoate UV-ozone treatment After | Methyl benzoate After heating step | Water UV-ozone treatment Before | Water UV-ozone treatment After | Water After heating step |
|---|---|---|---|---|---|---|---|---|---|---|
| 3-2 | 3-2 | 69 | 52 | 68 | 69 | 51 | 57 | 106 | 87 | 105 |
| 3-10 | 3-10 | 71 | 39 | 70 | 71 | 35 | 69 | 106 | 98 | 105 |
| 3-16 | 3-16 | 68 | 44 | 68 | 67 | 42 | 66 | 105 | 96 | 104 |
| 3-22 | 3-22 | 72 | 38 | 68 | 71 | 31 | 70 | 105 | 98 | 104 |
| 3-27 | 3-27 | 66 | 44 | 65 | 65 | 28 | 64 | 103 | 96 | 103 |
| 3-32 | 3-32 | 67 | 34 | 65 | 68 | 31 | 65 | 103 | 95 | 103 |
| 3-36 | 3-36 | 68 | 47 | 67 | 67 | 38 | 66 | 105 | 95 | 104 |
| 3-39 | 3-39 | 67 | 46 | 65 | 67 | 36 | 65 | 104 | 95 | 103 |
| 3-43 | 3-43 | 67 | 52 | 66 | 70 | 52 | 57 | 106 | 86 | 105 |
| 3-51 | 3-51 | 72 | 42 | 70 | 72 | 40 | 70 | 105 | 97 | 104 |
| 3-57 | 3-57 | 68 | 48 | 67 | 66 | 48 | 66 | 103 | 96 | 103 |
| 3-63 | 3-63 | 74 | 43 | 69 | 72 | 53 | 75 | 104 | 97 | 103 |
| 3-68 | 3-68 | 70 | 49 | 68 | 67 | 38 | 65 | 103 | 97 | 103 |
| 3-73 | 3-73 | 67 | 48 | 66 | 69 | 53 | 65 | 104 | 95 | 103 |
| 3-77 | 3-77 | 69 | 50 | 68 | 68 | 46 | 66 | 104 | 94 | 104 |
| 3-80 | 3-80 | 68 | 51 | 67 | 68 | 49 | 67 | 104 | 96 | 102 |

TABLE 3-13

| Fluororesin film No. | Photosensitive resin composition No. | Anisole UV-ozone treatment Before | Anisole UV-ozone treatment After | Anisole After heating step | Methyl benzoate UV-ozone treatment Before | Methyl benzoate UV-ozone treatment After | Methyl benzoate After heating step | Water UV-ozone treatment Before | Water UV-ozone treatment After | Water After heating step |
|---|---|---|---|---|---|---|---|---|---|---|
| Comparative 3-1 | Comparative 3-1 | 77 | 47 | 46 | 74 | 32 | 28 | 106 | 33 | 21 |
| Comparative 3-4 | Comparative 3-4 | 75 | 43 | 45 | 75 | 31 | 27 | 107 | 37 | 25 |
| Comparative 3-7 | Comparative 3-7 | 68 | 38 | 41 | 65 | 37 | 33 | 107 | 61 | 63 |
| Comparative 3-10 | Comparative 3-10 | 67 | 31 | 21 | 70 | 32 | 25 | 107 | 51 | 40 |

TABLE 3-13-continued

| Fluororesin film No. | Photosensitive resin composition No. | Contact angle (°) | | | | | | | | |
|---|---|---|---|---|---|---|---|---|---|---|
| | | Anisole | | | Methyl benzoate | | | Water | | |
| | | UV-ozone treatment | | After heating step | UV-ozone treatment | | After heating step | UV-ozone treatment | | After heating step |
| | | Before | After | | Before | After | | Before | After | |
| Comparative 3-13 | Comparative 3-13 | 69 | 41 | 43 | 71 | 38 | 31 | 108 | 54 | 61 |
| Comparative 3-16 | Comparative 3-16 | 71 | 37 | 44 | 70 | 27 | 28 | 108 | 44 | 55 |
| Comparative 3-19 | Comparative 3-19 | 77 | 47 | 46 | 74 | 32 | 28 | 106 | 33 | 21 |
| Comparative 3-22 | Comparative 3-22 | 75 | 45 | 42 | 72 | 32 | 29 | 107 | 40 | 28 |
| Comparative 3-25 | Comparative 3-25 | 69 | 40 | 39 | 66 | 40 | 35 | 106 | 60 | 61 |
| Comparative 3-28 | Comparative 3-28 | 68 | 33 | 22 | 69 | 38 | 30 | 105 | 52 | 39 |
| Comparative 3-31 | Comparative 3-31 | 70 | 42 | 42 | 70 | 40 | 36 | 108 | 55 | 60 |
| Comparative 3-34 | Comparative 3-34 | 71 | 39 | 42 | 71 | 33 | 29 | 107 | 46 | 54 |

TABLE 3-14

| Fluororesin film No. | Photosensitive resin composition No. | Film thickness (nm) | | | Molecular weight | | |
|---|---|---|---|---|---|---|---|
| | | UV-ozone treatment | | After heating step | UV-ozone treatment | | After heating step |
| | | Before | After | | Before | After | |
| 3-2 | 3-2 | 1100 | 1045 | 990 | 5,600 | 5,300 | 5,100 |
| 3-10 | 3-10 | 1210 | 1150 | 1089 | 5,300 | 5,200 | 5,000 |
| 3-16 | 3-16 | 1240 | 1178 | 1116 | 8,000 | 7,800 | 7,500 |
| 3-22 | 3-22 | 1180 | 1121 | 1062 | 8,300 | 8,200 | 7,900 |
| 3-27 | 3-27 | 1090 | 1036 | 981 | 8,600 | 8,500 | 8,300 |
| 3-32 | 3-32 | 1150 | 1093 | 1035 | 8,700 | 8,600 | 8,300 |
| 3-36 | 3-36 | 1130 | 1074 | 1017 | 8,700 | 8,600 | 8,100 |
| 3-39 | 3-39 | 1200 | 1140 | 1080 | 8,300 | 8,100 | 7,500 |
| 3-43 | 3-43 | 1120 | 1064 | 1008 | 8,500 | 8,400 | 8,100 |
| 3-51 | 3-51 | 1250 | 1188 | 1125 | 8,200 | 8,000 | 7,900 |
| 3-57 | 3-57 | 1270 | 1207 | 1143 | 10,600 | 10,300 | 10,000 |
| 3-63 | 3-63 | 1210 | 1080 | 1080 | 10,800 | 10,600 | 10,100 |
| 3-68 | 3-68 | 1120 | 1064 | 1008 | 10,800 | 10,500 | 10,000 |
| 3-73 | 3-73 | 1470 | 1340 | 1230 | 11,900 | 11,700 | 11,300 |
| 3-77 | 3-77 | 1150 | 1093 | 1035 | 10,900 | 10,600 | 10,200 |
| 3-80 | 3-80 | 1240 | 1178 | 1116 | 10,300 | 10,200 | 9,900 |

TABLE 3-15

| Fluororesin film No. | Photosensitive resin composition No. | Film thickness (nm) | | | Molecular weight | | |
|---|---|---|---|---|---|---|---|
| | | UV-ozone treatment | | After heating step | UV-ozone treatment | | After heating step |
| | | Before | After | | Before | After | |
| Comparative 3-1 | Comparative 3-1 | 1250 | 320 | <100 | 11,200 | <1000 multiple | <1000 multiple |
| Comparative 3-4 | Comparative 3-4 | 1180 | 400 | 230 | 11,700 | <1000 multiple | <1000 multiple |
| Comparative 3-7 | Comparative 3-7 | 1160 | 480 | 300 | 16,200 | 4000, <1000 multiple | 4000, <1000 multiple |
| Comparative 3-10 | Comparative 3-10 | 1070 | 370 | 250 | 18,800 | 4200, <1000 multiple | 3800, <1000 multiple |
| Comparative 3-13 | Comparative 3-13 | 1100 | 400 | 310 | 20,800 | 5000, <1000 multiple | 2000, <1000 multiple |
| Comparative 3-16 | Comparative 3-16 | 1030 | 360 | 240 | 18,800 | 4000, <1000 multiple | 2800, <1000 multiple |
| Comparative 3-19 | Comparative 3-19 | 1250 | 320 | <100 | 11,200 | <1000 multiple | <1000 multiple |

TABLE 3-15-continued

| Fluororesin film No. | Photosensitive resin composition No. | Film thickness (nm) | | | Molecular weight | | |
|---|---|---|---|---|---|---|---|
| | | UV-ozone treatment | | After heating step | UV-ozone treatment | | After heating step |
| | | Before | After | | Before | After | |
| Comparative 3-22 | Comparative 3-22 | 1210 | 410 | 240 | 14,100 | <1000 multiple | <1000 multiple |
| Comparative 3-25 | Comparative 3-25 | 1180 | 490 | 290 | 20,600 | 5000, <1000 multiple | 5000, <1000 multiple |
| Comparative 3-28 | Comparative 3-28 | 1100 | 380 | 260 | 22,300 | 5300, <1000 multiple | 4700, <1000 multiple |
| Comparative 3-31 | Comparative 3-31 | 1120 | 390 | 310 | 24,400 | 6500, <1000 multiple | 3000, <1000 multiple |
| Comparative 3-34 | Comparative 3-34 | 1070 | 380 | 250 | 22,000 | 5300, <1000 multiple | 3700, <1000 multiple |

According to the results in Tables 3-12 and 3-13, in the fluororesin films 3-2, 3-10, 3-16, 3-22, 3-27, 3-32, 3-36, 3-39, 3-43, 3-51, 3-57, 3-63, 3-68, 3-73, 3-77, and 3-80 of the present disclosure, the contact angle that decreased after the UV-ozone treatment tended to be restored by the subsequent heat treatment step to a degree comparable to that before the UV-ozone treatment. In contrast, in the comparative fluororesin films 3-1, 3-4, 3-7, 3-10, 3-13, 3-16, 3-19, 3-22, 3-25, 3-28, 3-31, and 3-34, although a high contact angle was observed before the UV-ozone treatment, the contact angle that decreased after the treatment showed no significant restoration after the heating step.

According to Tables 3-14 and 3-15, in the fluororesin films 3-2, 3-10, 3-16, 3-22, 3-27, 3-32, 3-36, 3-39, 3-43, 3-51, 3-57, 3-63, 3-68, 3-73, 3-77, and 3-80 of the present disclosure, although a slight decrease in film thickness was observed after the UV-ozone treatment, the molecular weight of the remaining film was comparable, indicating excellent resistance to the UV-ozone treatment. In contrast, in the comparative fluororesin films 3-1, 3-4, 3-7, 3-10, 3-13, 3-16, 3-19, 3-22, 3-25, 3-28, 3-31, and 3-34, a significant decrease in film thickness was confirmed after the UV-ozone treatment, and the molecular weight of the remaining film significantly decreased as compared to that before the UV-ozone treatment, indicating insufficient resistance to the UV-ozone treatment.

6. Evaluation of Banks

The photosensitive resin compositions 3-2, 3-6, 3-8, 3-10, 3-14, 3-16, 3-26, 3-27, 3-32, 3-36, 3-43, 3-47, 3-49, 3-51, 3-55, 3-57, 3-67, 3-68, 3-73, and 3-77 and the comparative photosensitive resin compositions 3-1, 3-4, 3-7, 3-12, 3-13, 3-16, 3-19, 3-22, 3-25, 3-30, 3-31, and 3-34 obtained in "4. Preparation of photosensitive resin compositions" were used to form banks 3-2, 3-6, 3-8, 3-10, 3-14, 3-16, 3-26, 3-27, 3-32, 3-36, 3-43, 3-47, 3-49, 3-51, 3-55, 3-57, 3-67, 3-68, 3-73, and 3-77 and comparative banks 3-1, 3-4, 3-7, 3-12, 3-13, 3-16, 3-19, 3-22, 3-25, 3-30, 3-31, and 3-34, respectively, and the bank properties were evaluated and compared. Table 3-16 shows the results of the banks of the present disclosure, and Table 3-17 shows the results of the comparative banks. The components used for the above photosensitive resin compositions, except for the fluororesin or comparative fluororesin, were standardized to compare the properties.

[Formation of Banks]

A 10-cm square ITO substrate was washed with ultrapure water and then acetone. Subsequently, the substrate was subjected to UV-ozone treatment for five minutes using the UV-ozone treatment described above. Then, the photosensitive resin compositions 3-2, 3-6, 3-8, 3-10, 3-14, 3-16, 3-26, 3-27, 3-32, 3-36, 3-43, 3-47, 3-49, 3-51, 3-55, 3-57, 3-67, 3-68, 3-73, and 3-77 the comparative photosensitive resin compositions 3-1, 3-4, 3-7, 3-12, 3-13, 3-16, 3-19, 3-22, 3-25, 3-30, 3-31, and 3-34 obtained in "4. Preparation of photosensitive resin compositions" were each applied to the UV-ozone-treated substrate using a spin coater at a rotation speed of 1000 rpm, followed by heating on a hot plate at 100° C. for 150 seconds. Thus, fluororesin films and comparative fluororesin films each having a thickness of 2 μm were formed. Each resulting resin film was exposed to i-rays (wavelength: 365 nm) using a mask aligner (a product of SUSS MicroTec Group) with a mask having a 5-μm line-and-space pattern.

The resulting resin film after exposure was subjected to evaluation of solubility in a developer, evaluation of bank properties (sensitivity and resolution), and contact angle measurement.

[Solubility in Developer]

The resin film on the ITO substrate after exposure was immersed in an alkali developer at room temperature for 80 seconds to evaluate the solubility in the alkali developer. The alkali developer was a 2.38 mass % tetramethylammonium hydroxide aqueous solution (hereinafter sometimes referred to as TMAH). The solubility of the banks was evaluated by measuring the thickness of the banks after immersion using a contact film thickness meter. The banks were determined to be "soluble" when completely dissolved, and "insoluble" when the resist film remained undissolved.

[Resist Properties (Sensitivity and Resolution)]

The optimal exposure Eop (mJ/cm$^2$) for forming banks arranged in the line-and-space pattern was determined and used as an index for sensitivity.

The resulting pattern of banks was observed under a microscope to evaluate the resolution. A pattern without visible line-edge roughness was evaluated as "excellent"; a pattern with slightly visible line-edge roughness was evaluated as "good"; and a pattern with significant line-edge roughness was evaluated as "poor".

[Contact Angle]

Each substrate having the banks obtained in the above step was heated at 230° C. for 60 minutes. Then, the entire substrate surface was subjected to UV-ozone treatment or oxygen plasma treatment for 10 minutes. Subsequently, heating was performed at 230° C. for 60 seconds. The contact angle between the bank or comparative surface and anisole was measured before and after the UV-ozone treatment and after the subsequent heating step.

The UV-ozone treatment device and the contact angle meter described above were used. An oxygen plasma treatment device was Plasma Dry Cleaner PDC-210 available from Yamato Scientific Co., Ltd. The oxygen plasma treatment was performed at an oxygen gas flow rate of 30 cc/min and an output of 300 W.

TABLE 3-16

| Banks | | 3-2 | 3-6 | 3-8 | 3-10 | 3-14 | 3-16 | 3-26 |
|---|---|---|---|---|---|---|---|---|
| Photosensitive resin composition | | 3-2 | 3-6 | 3-8 | 3-10 | 3-14 | 3-16 | 3-26 |
| Solubility in developer | Non-exposed portion | Soluble | Soluble | Soluble | Soluble | Soluble | Soluble | Soluble |
| | Exposed portion | Insoluble | Insoluble | Insoluble | Insoluble | Insoluble | Insoluble | Insoluble |
| Resist properties | Sensitivity (mJ/cm$^2$) | 102 | 101 | 100 | 101 | 102 | 100 | 103 |
| | Resolution | Excellent | Excellent | Excellent | Excellent | Excellent | Excellent | Excellent |
| Contact angle (°) Non-exposed portions | Before UV-ozone treatment | 34 | 36 | 33 | 29 | 35 | 36 | 38 |
| | After UV-ozone treatment | 10 | 10 | 10 | 10 | 10 | 10 | 10 |
| | After heating step | 10 | 10 | 10 | 10 | 10 | 10 | 10 |
| Contact angle (°) Exposed portions | Before UV-ozone treatment | 60 | 70 | 71 | 71 | 70 | 69 | 68 |
| | After UV-ozone treatment | 52 | 53 | 52 | 37 | 38 | 45 | 44 |
| | After heating step | 68 | 67 | 67 | 70 | 68 | 68 | 67 |
| Contact angle (°) Non-exposed portionn | Before oxygen plasma treatment | 33 | 34 | 29 | 25 | 33 | 35 | 37 |
| | After oxygen plasma treatment | 10 | 10 | 10 | 10 | 10 | 10 | 10 |
| | After heating step | 10 | 10 | 10 | 10 | 10 | 10 | 10 |
| Contact angle (°) Exposed portionn | Before oxygen plasma treatment | 70 | 71 | 71 | 71 | 70 | 69 | 68 |
| | After oxygen plasma treatment | 40 | 45 | 42 | 30 | 28 | 38 | 33 |
| | After heating step | 68 | 66 | 69 | 70 | 69 | 67 | 67 |

| Banks | | 3-27 | 3-32 | 3-36 | 3-43 | 3-47 | 3-49 | 3-51 |
|---|---|---|---|---|---|---|---|---|
| Photosensitive resin composition | | 3-27 | 3-32 | 3-36 | 3-43 | 3-47 | 3-49 | 3-51 |
| Solubility in developer | Non-exposed portion | Soluble | Soluble | Soluble | Soluble | Soluble | Soluble | Soluble |
| | Exposed portion | Insoluble | Insoluble | Insoluble | Insoluble | Insoluble | Insoluble | Insoluble |
| Resist properties | Sensitivity (mJ/cm$^2$) | 105 | 105 | 105 | 74 | 74 | 73 | 79 |
| | Resolution | Excellent | Excellent | Excellent | Excellent | Excellent | Excellent | Excellent |
| Contact angle (°) Non-exposed portions | Before UV-ozone treatment | 40 | 39 | 38 | 33 | 35 | 31 | 28 |
| | After UV-ozone treatment | 10 | 10 | 10 | 10 | 10 | 10 | 10 |
| | After heating step | 10 | 10 | 10 | 10 | 10 | 10 | 10 |
| Contact angle (°) Exposed portions | Before UV-ozone treatment | 70 | 69 | 70 | 70 | 71 | 72 | 72 |
| | After UV-ozone treatment | 48 | 45 | 47 | 54 | 53 | 52 | 39 |
| | After heating step | 68 | 68 | 69 | 58 | 55 | 56 | 71 |
| Contact angle (°) Non-exposed portionn | Before oxygen plasma treatment | 37 | 37 | 37 | 31 | 33 | 29 | 26 |
| | After oxygen plasma treatment | 10 | 10 | 10 | 10 | 10 | 10 | 10 |
| | After heating step | 10 | 10 | 10 | 10 | 10 | 10 | 10 |
| Contact angle (°) Exposed portionn | Before oxygen plasma treatment | 68 | 69 | 69 | 71 | 70 | 71 | 72 |
| | After oxygen plasma treatment | 35 | 35 | 34 | 47 | 46 | 43 | 31 |
| | After heating step | 67 | 69 | 68 | 70 | 68 | 69 | 70 |

| Banks | | 3-55 | 3-57 | 3-67 | 3-68 | 3-73 | 3-77 |
|---|---|---|---|---|---|---|---|
| Photosensitive resin composition | | 3-55 | 3-57 | 3-67 | 3-68 | 3-73 | 3-77 |
| Solubility in developer | Non-exposed portion | Soluble | Soluble | Soluble | Soluble | Soluble | Soluble |
| | Exposed portion | Insoluble | Insoluble | Insoluble | Insoluble | Insoluble | Insoluble |
| Resist properties | Sensitivity (mJ/cm$^2$) | 78 | 73 | 78 | 75 | 70 | 71 |
| | Resolution | Excellent | Excellent | Excellent | Excellent | Excellent | Excellent |
| Contact angle (°) Non-exposed portions | Before UV-ozone treatment | 37 | 35 | 39 | 39 | 40 | 39 |
| | After UV-ozone treatment | 10 | 10 | 10 | 10 | 10 | 10 |
| | After heating step | 10 | 10 | 10 | 10 | 10 | 10 |
| Contact angle (°) Exposed portions | Before UV-ozone treatment | 73 | 68 | 69 | 69 | 69 | 70 |
| | After UV-ozone treatment | 41 | 47 | 48 | 55 | 53 | 53 |
| | After heating step | 69 | 66 | 68 | 67 | 65 | 68 |
| Contact angle (°) Non-exposed portionn | Before oxygen plasma treatment | 34 | 35 | 38 | 37 | 38 | 36 |
| | After oxygen plasma treatment | 10 | 10 | 10 | 10 | 10 | 10 |
| | After heating step | 10 | 10 | 10 | 10 | 10 | 10 |
| Contact angle (°) Exposed portionn | Before oxygen plasma treatment | 72 | 66 | 69 | 68 | 68 | 68 |
| | After oxygen plasma treatment | 32 | 40 | 36 | 40 | 42 | 40 |
| | After heating step | 70 | 64 | 67 | 67 | 67 | 66 |

TABLE 3-17

| Banks | | Comparative 3-1 | Comparative 3-4 | Comparative 3-7 | Comparative 3-12 |
|---|---|---|---|---|---|
| Photosensitive resin composition | | Comparative 3-1 | Comparative 3-4 | Comparative 3-7 | Comparative 3-12 |
| Solubility in developer | Non-exposed portion | Soluble | Soluble | Soluble | Soluble |
| | Exposed portion | Insoluble | Insoluble | Insoluble | Insoluble |
| Resist properties | Sensitivity (mJ/cm$^2$) | 105 | 103 | 102 | 101 |
| | Resolution | Excellent | Excellent | Excellent | Excellent |
| Contact angle (°) Non-exposed portions | Before UV-ozone treatment | 39 | 32 | 33 | 35 |
| | After UV-ozone treatment | 10 | 10 | 10 | 10 |
| | Ater heating step | 10 | 10 | 10 | 10 |
| Contact angle (°) Exposed portions | Before UV-ozone treatment | 75 | 74 | 73 | 72 |
| | Ater UV-ozone treatment | 45 | 42 | 41 | 37 |
| | Ater heating step | 34 | 34 | 29 | 35 |
| Contact angle (°) Non-exposed portions | Before oxygen plasma treatment | 38 | 35 | 35 | 33 |
| | Ater oxygen plasma treatment | 10 | 10 | 10 | 10 |
| | Ater heating step | 10 | 10 | 10 | 10 |
| Contact angle (°) Exposed portions | Before oxygen plasma treatment | 75 | 74 | 72 | 72 |
| | Ater oxygen plasma treatment | 35 | 30 | 31 | 27 |
| | Ater heating step | 25 | 25 | 24 | 27 |

| Banks | | Comparative 3-13 | Comparative 3-16 | Comparative 3-19 | Comparative 3-22 |
|---|---|---|---|---|---|
| Photosensitive resin composition | | Comparative 3-13 | Comparative 3-16 | Comparative 3-19 | Comparative 3-22 |
| Solubility in developer | Non-exposed portion | Soluble | Soluble | Soluble | Soluble |
| | Exposed portion | Insoluble | Insoluble | Insoluble | Insoluble |
| Resist properties | Sensitivity (mJ/cm$^2$) | 102 | 103 | 105 | 78 |
| | Resolution | Excellent | Excellent | Excellent | Excellent |
| Contact angle (°) Non-exposed portions | Before UV-ozone treatment | 32 | 33 | 39 | 31 |
| | After UV-ozone treatment | 10 | 10 | 10 | 10 |
| | Ater heating step | 10 | 10 | 10 | 10 |
| Contact angle (°) Exposed portions | Before UV-ozone treatment | 71 | 72 | 75 | 73 |
| | Ater UV-ozone treatment | 35 | 35 | 45 | 40 |
| | Ater heating step | 34 | 35 | 34 | 34 |
| Contact angle (°) Non-exposed portions | Before oxygen plasma treatment | 33 | 33 | 38 | 33 |
| | Ater oxygen plasma treatment | 10 | 10 | 10 | 10 |
| | Ater heating step | 10 | 10 | 10 | 10 |
| Contact angle (°) Exposed portions | Before oxygen plasma treatment | 73 | 72 | 75 | 71 |
| | Ater oxygen plasma treatment | 27 | 27 | 35 | 30 |
| | Ater heating step | 25 | 25 | 25 | 26 |

| Banks | | Comparative 3-25 | Comparative 3-30 | Comparative 3-31 | Comparative 3-34 |
|---|---|---|---|---|---|
| Photosensitive resin composition | | Comparative 3-25 | Comparative 3-30 | Comparative 3-31 | Comparative 3-34 |
| Solubility in developer | Non-exposed portion | Soluble | Soluble | Soluble | Soluble |
| | Exposed portion | Insoluble | Insoluble | Insoluble | Insoluble |
| Resist properties | Sensitivity (mJ/cm$^2$) | 74 | 77 | 75 | 78 |
| | Resolution | Excellent | Excellent | Excellent | Excellent |
| Contact angle (°) Non-exposed portions | Before UV-ozone treatment | 32 | 36 | 31 | 32 |
| | After UV-ozone treatment | 10 | 10 | 10 | 10 |
| | Ater heating step | 10 | 10 | 10 | 10 |
| Contact angle (°) Exposed portions | Before UV-ozone treatment | 71 | 71 | 69 | 71 |
| | Ater UV-ozone treatment | 43 | 40 | 38 | 38 |
| | Ater heating step | 35 | 34 | 36 | 35 |
| Contact angle (°) Non-exposed portions | Before oxygen plasma treatment | 34 | 33 | 32 | 33 |
| | Ater oxygen plasma treatment | 10 | 10 | 10 | 10 |
| | Ater heating step | 10 | 10 | 10 | 10 |
| Contact angle (°) Exposed portions | Before oxygen plasma treatment | 67 | 72 | 70 | 71 |
| | Ater oxygen plasma treatment | 35 | 29 | 32 | 28 |
| | Ater heating step | 27 | 27 | 28 | 27 |

As shown in Tables 3-16 and 3-17, the evaluation of solubility in the developer shows that the banks and the comparative banks were made of a negative resist in which only the non-exposed portions are soluble. The evaluation of the bank properties shows that all the banks had comparable sensitivity and "excellent" resolution in which the 5-μm line-and-space pattern of the mask was transferred with good resolution without visible line-edge roughness. Specifically, these evaluations show that the fluororesins of the present disclosure and the comparative fluororesins only slightly influenced the banks.

In contrast, in the banks of the present disclosure, although the contact angle between the exposed portions (corresponding to the upper surfaces of the banks) and anisole decreased due to the UV-ozone treatment or oxygen plasma treatment, the contact angle increased due to the subsequent heating step, indicating good liquid repellency. In the comparative banks, the contact angle decreased due to the UV-ozone treatment or oxygen plasma treatment and remained small even after the subsequent heating step, indicating insufficient liquid repellency.

The invention claimed is:

1. A fluororesin comprising:
a repeating unit represented by a formula (3-1) and a repeating unit represented by a formula (3-2):

[Chem. 8]

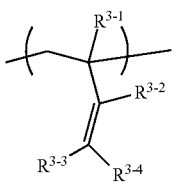

(3-1)

wherein $R^{3-1}$ represents a hydrogen atom, a fluorine atom, or a methyl group; $R^{3-2}$ represents a hydrogen atom or a C1-C6 linear, C3-C6 branched, or C3-C6 cyclic alkyl group; $R^{3-3}$ and $R^{3-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{3-1}$, $R^{3-3}$, and $R^{3-4}$ are fluorine atoms or the fluoroalkyl groups,

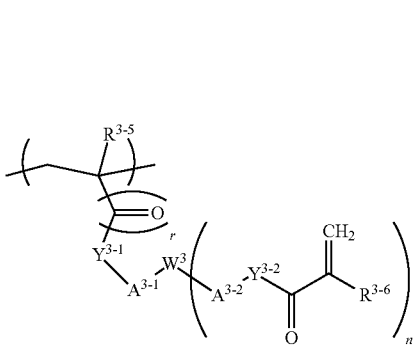

(3-2)

wherein $R^{3-5}$ and $R^{3-6}$ each independently represent a hydrogen atom or a methyl group; $W^3$ is a divalent linking group and represents —O—, —O—C(=O)—, —C(=O)—O—, —O—C(=O)—NH—, —C(=O)—O—C(=O)—NH—, or —C(=O)—NH—; $A^{3-1}$ and $A^{3-2}$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—CH$_3$; $Y^{3-1}$ and $Y^{3-2}$ are divalent linking groups and each independently represent —O— or —NH—; n represents an integer of 1 to 3; and r represents 0 or 1.

2. The fluororesin according to claim 1, wherein $R^{3-3}$ and $R^{3-4}$ each independently represent a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, or a hexafluoroisopropyl group.

3. The fluororesin according to claim 1, further comprising a repeating unit represented by a formula (3-3):

[Chem. 9]

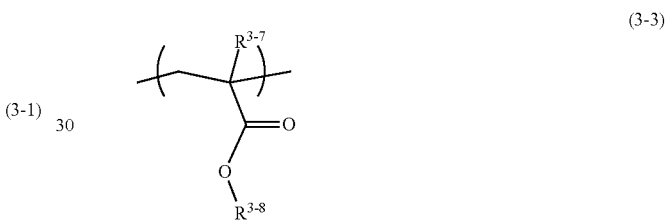

(3-3)

wherein $R^{3-7}$ represents a hydrogen atom or a methyl group; $R^{3-8}$ represents a C1-C15 linear, C3-C15 branched, or C3-C15 cyclic alkyl group in which one or more hydrogen atoms in the alkyl group are substituted by fluorine atoms; and the repeating unit has a fluorine content of 30 mass % or more.

4. The fluororesin according to claim 1, further comprising a repeating unit represented by a formula (3-4):

[Chem. 10]

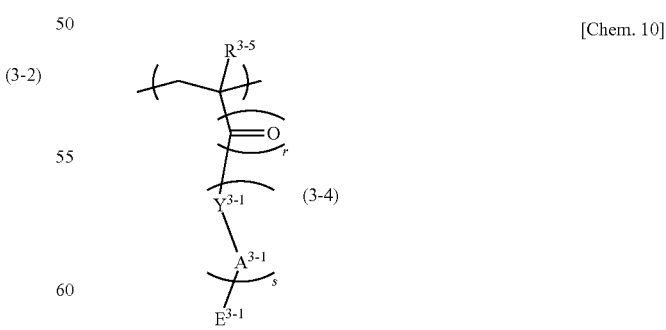

(3-4)

wherein $R^{3-5}$, $Y^{3-1}$, $A^{3-1}$, and r are the same as $R^{3-5}$, $Y^{3-1}$, $A^{3-1}$, and r in the formula (3-2), respectively; $E^{3-1}$ represents a hydroxy group, a carboxy group, or an oxirane group; and s represents 0 or 1.

5. The fluororesin according to claim 1, further comprising a repeating unit represented by a formula (3-6):

[Chem. 11]

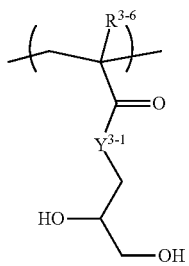

(3-6)

wherein $R^{3-6}$ and $Y^{3-1}$ are the same as $R^{3-6}$ and $Y^{3-1}$ in the formula (3-2), respectively.

6. The fluororesin according to claim 1, further comprising a repeating unit represented by a formula (3-5):

[Chem. 12]

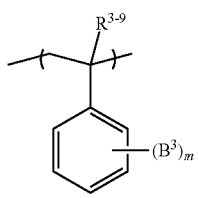

(3-5)

wherein $R^{3-9}$ represents a hydrogen atom or a methyl group; each $B^3$ independently represents a hydroxy group, a carboxy group, —C(=O)—O—$R^{3-10}$ wherein $R^{3-10}$ represents a C1-C15 linear, C3-C15 branched, or C3-C15 cyclic alkyl group in which one or more hydrogen atoms in the alkyl group are substituted by fluorine atoms, and $R^{3-10}$ has a fluorine content of 30 mass % or more, or —O—C(=O)—$R^{3-11}$ wherein $R^{3-11}$ represents a C1-C6 linear, C3-C6 branched, or C3-C6 cyclic alkyl group; and m represents an integer of 0 to 3.

7. A photosensitive resin composition at least comprising:
the fluororesin according to claim 1;
a solvent; and
a photopolymerization initiator.

8. The photosensitive resin composition according to claim 7,
wherein the solvent is at least one selected from the group consisting of methyl ethyl ketone, cyclohexanone, methyl isoamyl ketone, 2-heptanone, ethylene glycol, ethylene glycol dimethyl ether, ethylene glycol monoacetate, diethylene glycol, diethylene glycol monoacetate, diethylene glycol dimethyl ether, propylene glycol, propylene glycol monoacetate, propylene glycol monomethyl ether (PGME), propylene glycol monom- ethyl ether acetate (PGMEA), dipropylene glycol, dipropylene glycol monoacetate monomethyl ether, dipropylene glycol monoacetate monoethyl ether, dipropylene glycol monoacetate monopropyl ether, dipropylene glycol monoacetate monobutyl ether, dipropylene glycol monoacetate monophenyl ether, 1,4-dioxane, methyl lactate, ethyl lactate, methyl acetate, ethyl acetate, butyl acetate, methyl methoxypropionate, ethyl ethoxypropionate, γ-butyrolactone, and hexafluoroisopropyl alcohol.

9. The photosensitive resin composition according to claim 7, further comprising a crosslinking agent and an alkali-soluble resin.

10. A fluororesin film comprising:
a repeating unit represented by a formula (3-1) and a repeating unit represented by a formula (3-2A):

[Chem. 13]

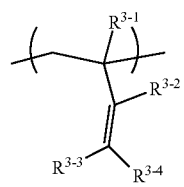

(3-1)

wherein $R^{3-1}$ represents a hydrogen atom, a fluorine atom, or a methyl group; $R^{3-2}$ represents a hydrogen atom or a C1-C6 linear, C3-C6 branched, or C3-C6 cyclic alkyl group; $R^{3-3}$ and $R^{3-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{3-1}$, $R^{3-3}$, and $R^{3-4}$ are fluorine atoms or the fluoroalkyl groups,

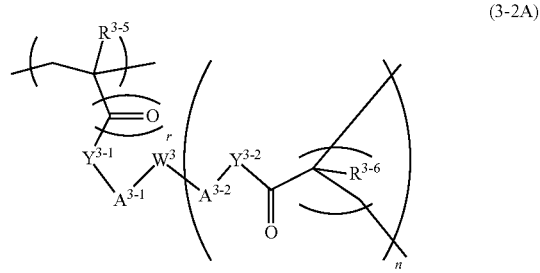

(3-2A)

wherein $R^{3-5}$ and $R^{3-6}$ each independently represent a hydrogen atom or a methyl group; $W^3$ is a divalent linking group and represents —O—, —O—C(=O)—, —C(=O)—O—, —O—C(=O)—NH—, —C(=O)—O—C(=O)—NH—, or —C(=O)—NH—; $A^{3-1}$ and $A^{3-2}$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—$CH_3$; $Y^{3-1}$ and $Y^{3-2}$ are divalent linking groups and each independently represent —O— or —NH—; n represents an integer of 1 to 3; and r represents 0 or 1.

11. A bank comprising:

a repeating unit represented by a formula (3-1) and a repeating unit represented by a formula (3-2A):

[Chem. 14]

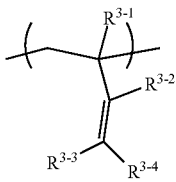
(3-1)

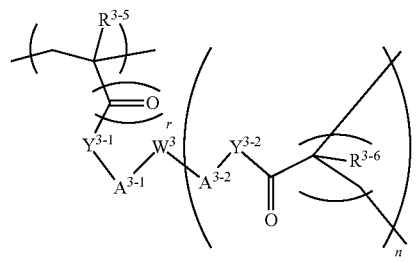
(3-2A)

wherein $R^{3-1}$ represents a hydrogen atom, a fluorine atom, or a methyl group; $R^{3-2}$ represents a hydrogen atom or a C1-C6 linear, C3-C6 branched, or C3-C6 cyclic alkyl group; $R^{3-3}$ and $R^{3-4}$ each independently represent a fluorine atom, a C1-C10 linear, C3-C10 branched, or C3-C10 cyclic alkyl group, or a C1-C10 linear, C3-C10 branched, or C3-C10 cyclic fluoroalkyl group; and one or more of $R^{3-1}$, $R^{3-3}$, and $R^{3-4}$ are fluorine atoms or the fluoroalkyl groups, wherein $R^{3-5}$ and $R^{3-6}$ each independently represent a hydrogen atom or a methyl group; $W^3$ is a divalent linking group and represents —O—, —O—C(=O)—, —C(=O)—O—, —O—C(=O)—NH—, —C(=O)—O—C(=O)—NH—, or —C(=O)—NH—; $A^{3-1}$ and $A^{3-2}$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—CH$_3$; $Y^{3-1}$ and $Y^{3-2}$ are divalent linking groups and each independently represent —O— or —NH—; n represents an integer of 1 to 3; and r represents 0 or 1.

12. A display element comprising:

the bank according to claim 11.

* * * * *